(12) United States Patent
Atanackovic

(10) Patent No.: US 11,342,484 B2
(45) Date of Patent: May 24, 2022

(54) METAL OXIDE SEMICONDUCTOR-BASED LIGHT EMITTING DEVICE

(71) Applicant: Silanna UV Technologies Pte Ltd, Singapore (SG)

(72) Inventor: Petar Atanackovic, Henley Beach South (AU)

(73) Assignee: Silanna UV Technologies Pte Ltd, Singapore (SG)

(*) Notice: Subject to any disclaimer, the term of this patent is extended or adjusted under 35 U.S.C. 154(b) by 0 days.

(21) Appl. No.: 16/990,349

(22) Filed: Aug. 11, 2020

(65) Prior Publication Data
US 2021/0351321 A1 Nov. 11, 2021

(30) Foreign Application Priority Data
May 11, 2020 (AU) .................. 2020901513

(51) Int. Cl.
*H01L 33/26* (2010.01)
*H01L 33/00* (2010.01)
(Continued)

(52) U.S. Cl.
CPC .......... *H01L 33/26* (2013.01); *H01L 21/2011* (2013.01); *H01L 33/005* (2013.01);
(Continued)

(58) Field of Classification Search
CPC ..... H01L 33/26; H01L 21/2011; H01L 33/12; H01L 33/18; H01L 33/005; H01L 33/504;
(Continued)

(56) References Cited

U.S. PATENT DOCUMENTS

| 5,450,812 A | 9/1995 | McKee et al. |
| 7,824,955 B2 | 11/2010 | White et al. |

(Continued)

FOREIGN PATENT DOCUMENTS

| EP | 1081256 B1 | 8/2011 |
| JP | 4465461 B2 | 5/2010 |

(Continued)

OTHER PUBLICATIONS

Krueger et al., Variation of Band Gap and Lattice Parameters of B-(AlxGa1-x)2O3 Powder Produced by Solution, J. Am. Ceram. Soc., 99 [7], pp. 2467-2473. (Year: 2016).*

(Continued)

*Primary Examiner* — Mary A Wilczewski
(74) *Attorney, Agent, or Firm* — MLO, a professional corp.

(57) ABSTRACT

An optoelectronic semiconductor light emitting device configured to emit light having a wavelength in the range from about 150 nm to about 425 nm is disclosed. In embodiments, the device comprises a substrate having at least one epitaxial semiconductor layer disposed thereon, wherein each of the one or more epitaxial semiconductor layers comprises a metal oxide. Also disclosed is an optoelectronic semiconductor device for generating light of a predetermined wavelength comprising a substrate and an optical emission region. The optical emission region has an optical emission region band structure configured for generating light of the predetermined wavelength and comprises one or more epitaxial metal oxide layers supported by the substrate.

32 Claims, 111 Drawing Sheets

(51) Int. Cl.
*H01L 33/50* (2010.01)
*H01L 33/18* (2010.01)
*H01L 21/20* (2006.01)
*H01L 33/12* (2010.01)

(52) U.S. Cl.
CPC .............. *H01L 33/12* (2013.01); *H01L 33/18* (2013.01); *H01L 33/504* (2013.01)

(58) Field of Classification Search
CPC ......... H01L 21/02414; H01L 21/02565; H01L 21/02631; H01L 21/02554; H01L 21/02433; H01L 21/0242; H01L 21/02507
See application file for complete search history.

(56) References Cited

U.S. PATENT DOCUMENTS

| | | | |
|---|---|---|---|
| 9,246,311 | B1 | 1/2016 | Raring et al. |
| 9,412,911 | B2 | 8/2016 | Atanackovic |
| 9,691,938 | B2 | 6/2017 | Atanackovic et al. |
| 10,475,956 | B2 | 11/2019 | Atanackovic |
| 2002/0025594 | A1 | 2/2002 | Iwata et al. |
| 2004/0079285 | A1 | 4/2004 | Li et al. |
| 2006/0150891 | A1* | 7/2006 | Ichinose ........... H01L 21/02631 117/2 |
| 2006/0220029 | A1 | 10/2006 | Ishikazi |
| 2007/0004226 | A1 | 1/2007 | Tweet et al. |
| 2011/0062440 | A1 | 3/2011 | Adekore et al. |
| 2012/0045661 | A1 | 2/2012 | Kumaran et al. |
| 2013/0240874 | A1 | 9/2013 | Maekawa et al. |
| 2014/0061486 | A1 | 3/2014 | Bao et al. |
| 2015/0001467 | A1* | 1/2015 | Cho ........................ H01L 33/06 257/22 |
| 2016/0149075 | A1* | 5/2016 | Atanackovic ........... H01L 33/18 257/13 |
| 2017/0288024 | A1 | 10/2017 | Reznicek |
| 2019/0028081 | A1 | 1/2019 | Pelzel et al. |
| 2019/0245130 | A1 | 8/2019 | Jha et al. |
| 2020/0168454 | A1 | 5/2020 | Dargis et al. |
| 2020/0411648 | A1 | 12/2020 | Yamazaki |

FOREIGN PATENT DOCUMENTS

| | | | | |
|---|---|---|---|---|
| KR | 1020060024421 | A | | 3/2006 |
| WO | WO 2009/152207 | | * 12/2009 | ....... H01L 21/02565 |
| WO | 2016052929 | A1 | | 4/2016 |
| WO | 2019155444 | A1 | | 8/2019 |

OTHER PUBLICATIONS

Wang et al., Band gap and band offset of Ga2O3 and (AlxGa1-x)2O3 alloys, arXiv:1806.03360v2 [cond-mat.mtrl-sci] Jul. 31, 2018 (Year: 2018).*
Jiao et al., The Structural and Photoelectrical Properties of Gallium Oxide Thin Film Grown by Radio Frequency Magnetron Sputtering, ECS Journal of Solid State Science and Technology, 8 (7) Q3086-Q3090 (Year: 2019).*
Swallow et al., Indium Gallium Oxide Alloys: Electronic Structure, Optical Gap, Surface Space Charge, and Chemical Trends within Common-Cation Semiconductors, ACS Appl. Mater. Interfaces 2021, 13, 2807-2819 (Year: 2021).*
Pearton et al., A review of Ga2O3 materials, and devices, Applied Physics Reviews, 5, 011301 (Year: 2018).*
Masataka Higashiwaki, Shizuo Fujita, Gallium Oxide: Materials Properties, Crystal Growth, and Devices, Springer International Publishing, Apr. 25, 2021—Technology & Engineering—764 pages, Section 8.4.1 β-(AlxGa1-x)2O3/β-Ga2O3 Heterostructures (Year: 2021).*
Wang et al., Band gap and band offset of Ga2O3 and (AlxGa1-x)2O3 alloys, Physical Review Applied 10, 011003-1 (Year: 2018).*
Lin and Lee, Ga2O3-based solar-blind deep ultraviolet light-emitting diodes, Journal of Luminescence vol. 224, 2020 117326, Apr. 2020, 4 pages.
Peelaers and Van De Walle, Brillouin zone and band structure of β-Ga2O3, Phys. Status Solidi B 252, No. 4, 828-832, Jan. 2015.
Anhar Uddin Bhuiyan et al., MOCVD epitaxy of β-(AlxGa1-x)2O3 thin films on (010) Ga2O3 substrates and N-type doping, Appl. Phys. Lett. 115, Sep. 2019, pp. 120602-1-120602-5.
Anhar Uddin Bhuiyan et al., Phase transformation in MOCVD growth of (AlxGa1-x)2O3 thin films, APL Mater. 8, 031104 (2020)—Published Online: Mar. 2, 2020.
Bosi et al., Ga2O3 polymorphs: tailoring the epitaxial growth conditions, J. Mater. Chem. C, 2020, 8, 10975, Jul. 2020.
Cheng et al., Phase formation and strain relaxation of Ga2O3 on c-plane and a-plane sapphire substrates as studied by synchrotron-based x-ray diffraction, Applied Physics Letters 111, 162104, Oct. 2017.
Dang et al., α-(AlxGa1-x)2O3 single-layer and heterostructure buffers for the growth of conductive Sn-doped α-Ga2O3 thin films via mist chemical vapor deposition, APL Mater. 8, 101101 (2020)—Published Online: Oct. 1, 2020.
Hilfiker et al., Dielectric function tensor (1.5 eV to 9.0 eV), anisotropy, and band to band transitions of monoclinic β-(Al x Ga 1-x) 2 O 3 (x < 0.21) films, Applied Physics Letters 114(23):231901, Jun. 2019.
Kato et al., Fabrication of coherent γ-Al2O3/Ga2O3 superlattices on MgAl2O4 substrates, Appl. Phys. Express 12 065503, May 2019.
Kaun et al., β-(AlxGa1-x)2O3/Ga2O3 (010) heterostructures grown on β-Ga2O3 (010) substrates by plasma-assisted molecular beam epitaxy, Journal of Vacuum Science & Technology A Vacuum Surfaces and Films 33(4):041508 Jul. 2015.
Kneiss et al., Growth, structural and optical properties of coherent κ-(AlxGa1-x )2O3/κ-Ga2O3 quantum well superlattice heterostructures, APL Mater. 8, 051112 (2020).—Published Online: May 19, 2020.
Oshima et al., Epitaxial growth of γ-(AlxGa1-x)O3 alloy films for band-gap engineering, Appl. Phys. Express 10 051104, Apr. 2017.
Oshima et al., α-Al2O3/Ga2O3 superlattices coherently grown on r-plane sapphire, Applied Physics Express, 11, 065501, Apr. 2018.
Oshima, Coherent gamma-Al2O3/Ga2O3 superlattices grown on MgAl2O4, (Conference Presentation), Proceedings vol. 10919, Oxide-based Materials and Devices X; 109190G (2019), Event: SPIE Opto, Mar. 2019, San Francisco, California, United States. Abstract Only.
Zhang et al., Recent progress on the electronic structure, defect, and doping properties of Ga2O3, APL Mater. 8, 020906 (2020)—Published Online: Feb. 21, 2020.
International Search Report and Written Opinion dated Aug. 6, 2021 for PCT Patent Application No. PCT/IB2021/053652.

* cited by examiner

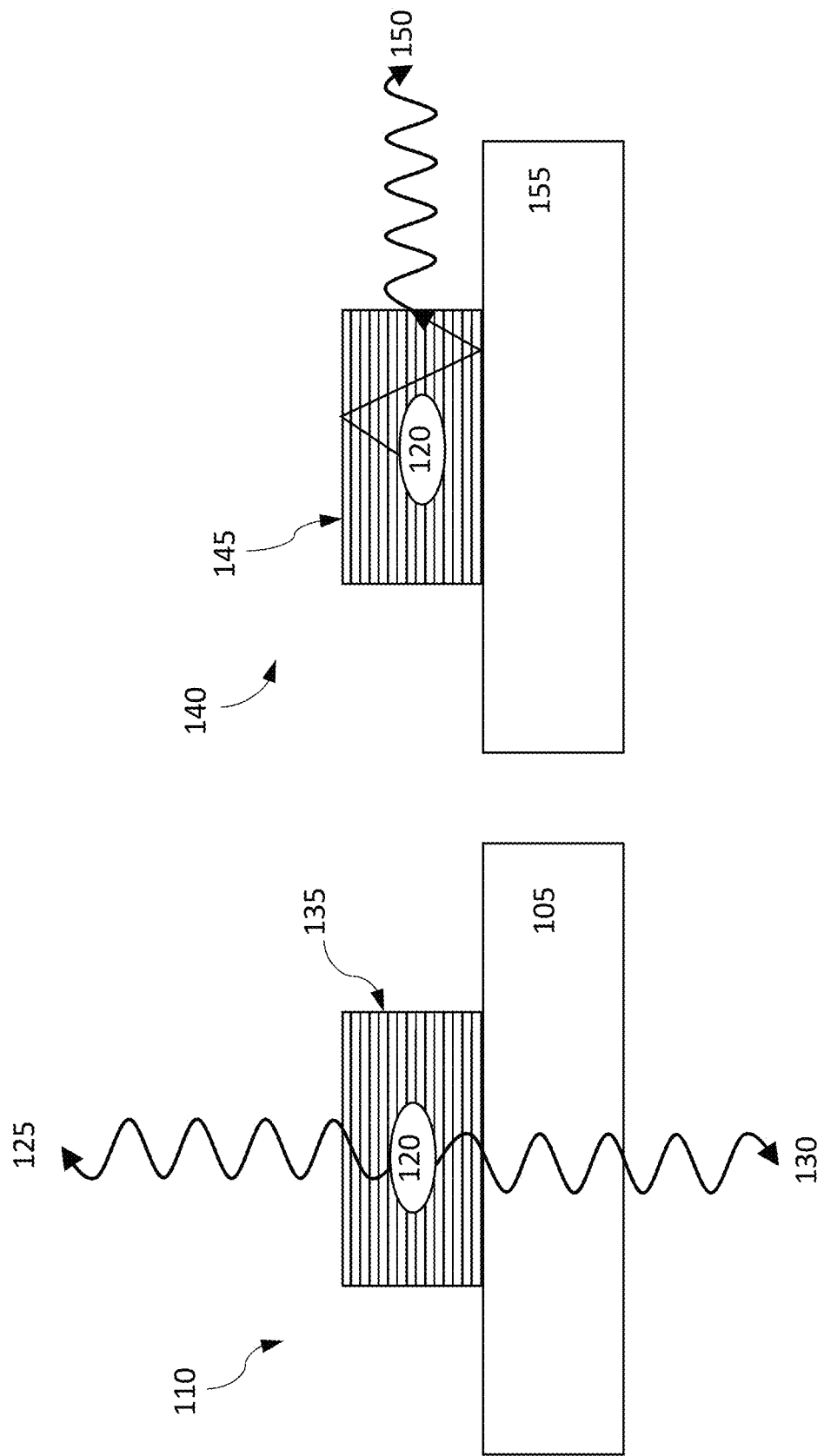

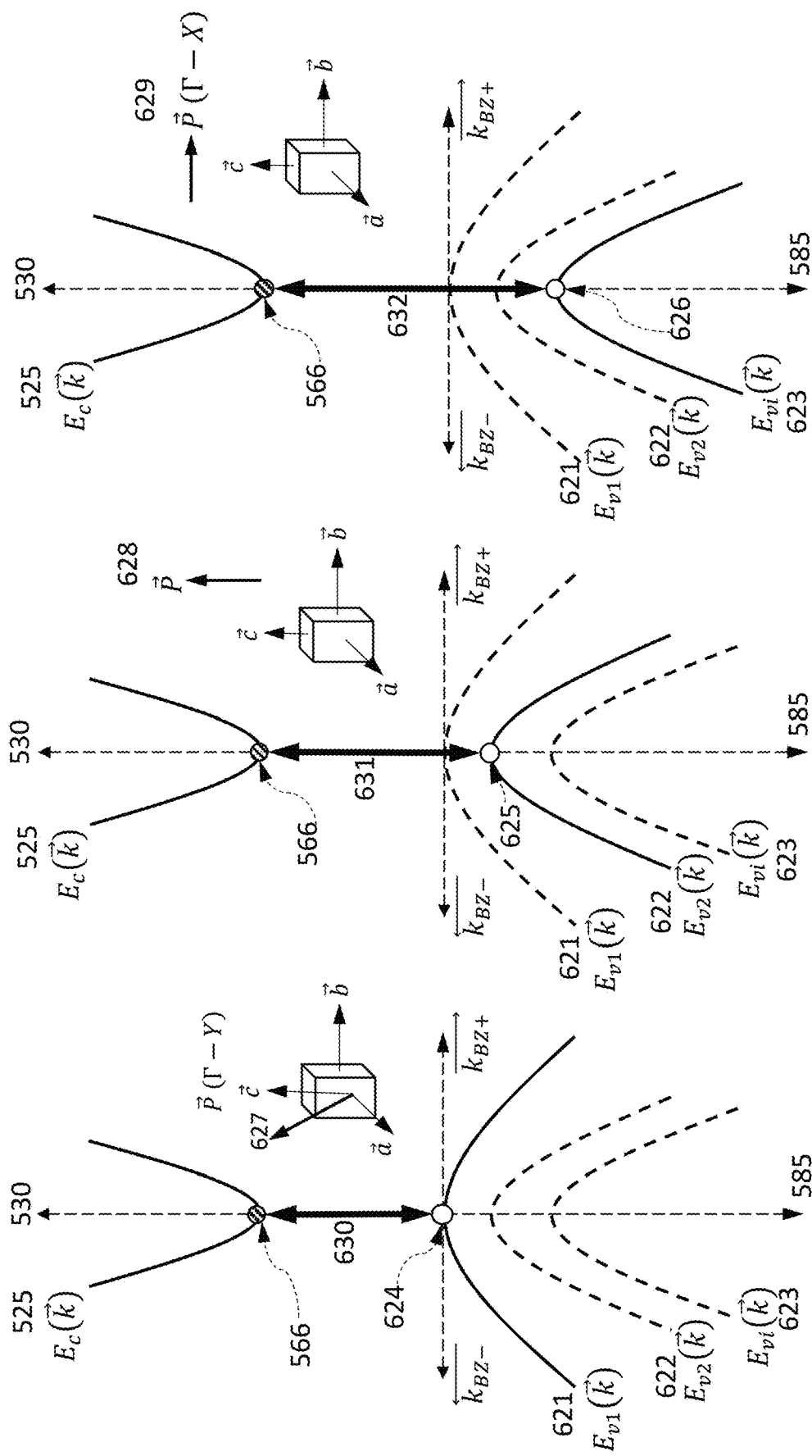

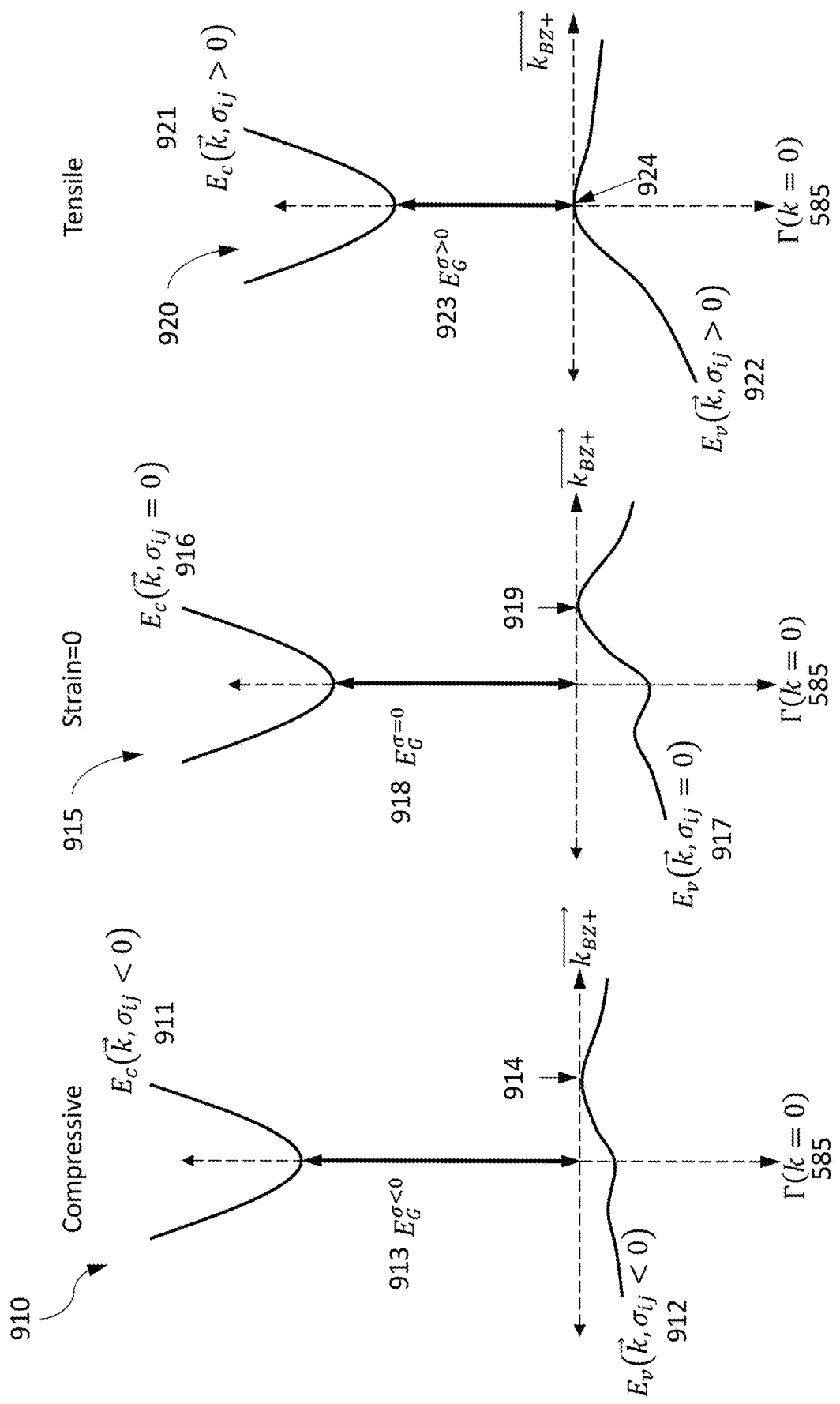

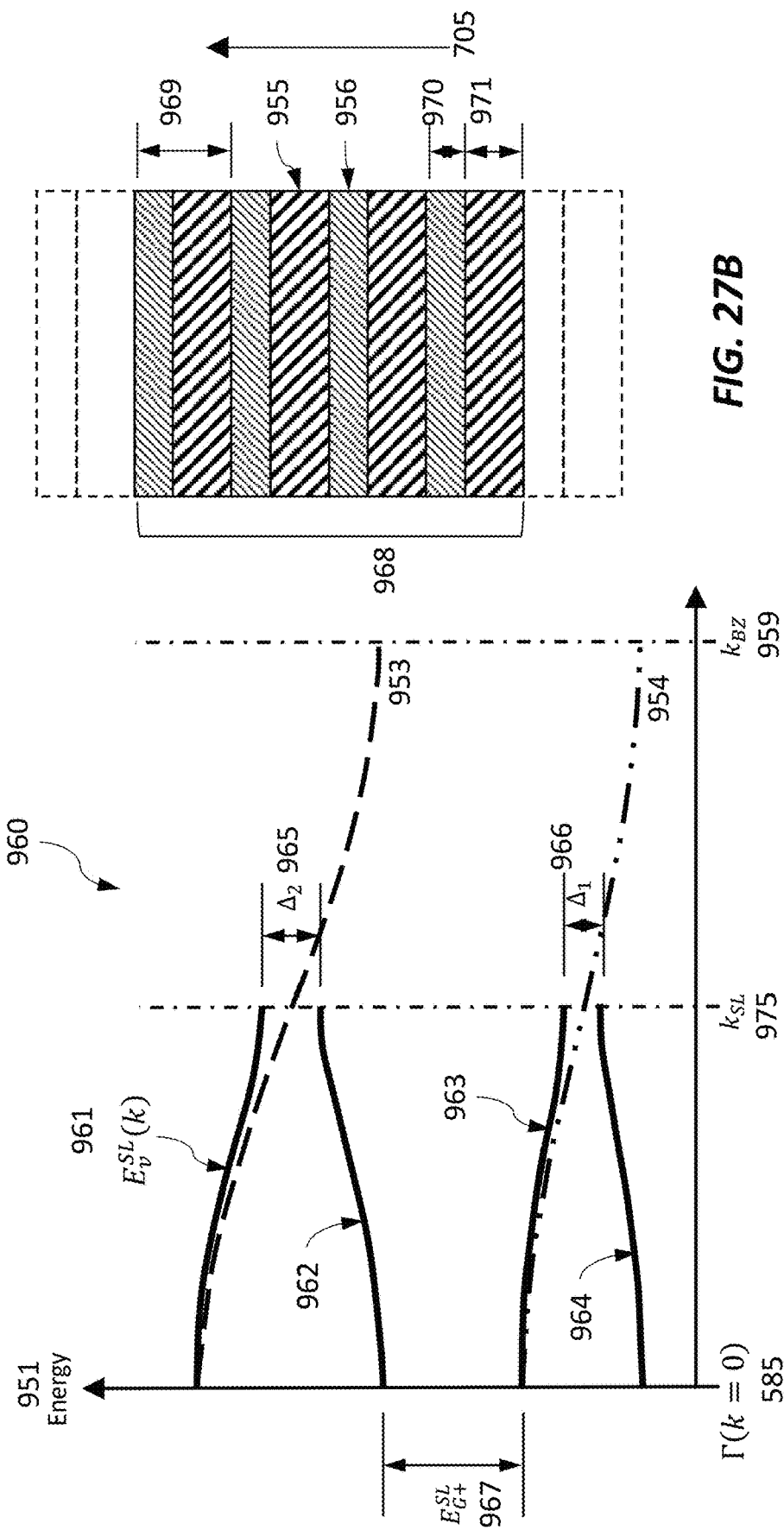

| x | Ga$_2$O$_3$ | Al$_2$O$_3$ | MgO | NiO | ZnO | Bi$_2$O$_3$ | r-GeO$_2$ | Ir$_2$O$_3$ | RE$_2$O$_3$ | Li$_2$O |
|---|---|---|---|---|---|---|---|---|---|---|
| Ga | Ga$_{2x}$O$_3$ | (Ga$_x$Al$_{1-x}$)$_2$O$_3$ | (Ga$_{2x}$Mg$_{1-x}$)O$_{2x+1}$ | (Ga$_{2x}$Ni$_{1-x}$)O$_{2x+1}$ | (Ga$_{2x}$Zn$_{1-x}$)O$_{2x+1}$ | (Ga$_x$Bi$_{1-x}$)$_2$O$_3$ | (Ga$_{2x}$Ge$_{1-x}$)O$_{2x}$ | (Ga$_x$Ir$_{1-x}$)$_2$O$_3$ | (Ga$_x$RE$_{1-x}$)O$_3$ | (Ga$_{2x}$Li$_{2(1-x)}$)O$_{2x+1}$ |
| Al |  | Al$_{2x}$O$_3$ | (Al$_{2x}$Mg$_{1-x}$)O$_{2x+1}$ | (Al$_{2x}$Ni$_{1-x}$)O$_{2x+1}$ | (Al$_{2x}$Zn$_{1-x}$)O$_{2x+1}$ | (Al$_x$Bi$_{1-x}$)$_2$O$_3$ | (Al$_x$Ge$_{1-x}$)O$_{2x}$ | (Al$_x$Ir$_{1-x}$)$_2$O$_3$ | (Al$_x$RE$_{1-x}$)O$_3$ | (Al$_{2x}$Li$_{2(1-x)}$)O$_{2x+1}$ |
| Mg |  |  | Mg$_x$O | (Mg$_x$Ni$_{1-x}$)O$_1$ | (Mg$_x$Zn$_{1-x}$)O$_1$ | (Mg$_{1-x}$Bi$_{2x}$)O$_{2x+1}$ | (Mg$_x$Ge$_{1-x}$)O$_{2x}$ | (Mg$_{1-x}$Ir$_{2x}$)O$_{2x+1}$ | (Mg$_{1-x}$RE$_{2x}$)O$_{2x+1}$ | (Mg$_x$Li$_{2(1-x)}$)O$_1$ |
| Ni |  |  |  | Ni$_x$O | (Ni$_x$Zn$_{1-x}$)O$_1$ | (Ni$_{1-x}$Bi$_{2x}$)O$_{2x+1}$ | (Ni$_x$Ge$_{1-x}$)O$_{2x}$ | (Ni$_{1-x}$Ir$_{2x}$)O$_{2x+1}$ | (Ni$_{1-x}$RE$_{2x}$)O$_{2x+1}$ | (Ni$_x$Li$_{2(1-x)}$)O$_1$ |
| Zn |  |  |  |  | Zn$_x$O | (Zn$_{1-x}$Bi$_{2x}$)O$_{2x+1}$ | (Zn$_x$Ge$_{1-x}$)O$_{2x}$ | (Zn$_{1-x}$Ir$_{2x}$)O$_{2x+1}$ | (Zn$_{1-x}$RE$_{2x}$)O$_{2x+1}$ | (Zn$_x$Li$_{2(1-x)}$)O$_1$ |
| Bi |  |  |  |  |  | Bi$_{2x}$O$_3$ | (Bi$_{2x}$Ge$_{1-x}$)O$_{2+x}$ | (Bi$_x$Ir$_{1-x}$)$_2$O$_3$ | (Bi$_{1-x}$RE$_{2x}$)O$_{2x+1}$ | (Bi$_{2x}$Li$_{2(1-x)}$)O$_{2x+1}$ |
| Ge |  |  |  |  |  |  | Ge$_x$O$_2$ | (Ge$_{1-x}$Ir$_{2x}$)O$_{2+x}$ | (Ge$_{1-x}$RE$_{2x}$)O$_{2+x}$ | (Ge$_x$Li$_{2(1-x)}$)O$_{2x+1}$ |
| Ir |  |  |  |  |  |  |  | Ir$_{2x}$O$_3$ | (Ir$_{1-x}$RE$_{1-x}$)$_2$O$_3$ | (Ir$_{2x}$Li$_{2(1-x)}$)O$_{2x+1}$ |
| RE |  |  |  |  |  |  |  |  | RE$_{2x}$O$_3$ | (RE$_{2x}$Li$_{2(1-x)}$)O$_{2x+1}$ |
| Li |  |  |  |  |  |  |  |  |  | Li$_2$O$_1$ |

Ga₂O₃ -trigonal (Corundum)

TABLE I

| Substrate Type | Crystal Symmetry Type | High Resistivity | N-type | P-type | Transparent UVC | Epitaxial Crystal Surface |
|---|---|---|---|---|---|---|
| Gallium-Oxide Ga$_2$O$_3$ | Monoclinic | Insulating | Si, Ge, Sn | Mg, Zn, Ni | $l_{min} > 250nm$ | (001), (-201), (110), (010) |
| | | Compensated | RE Ga-rich/O-vac | Bi, N, Li O-rich/Ga-vac | $l_{min} > 250nm$ | |
| Gallium-Oxide Ga$_2$O$_3$ | Trigonal, Hexagonal | Insulating | Si, Ge, Sn | Mg, Zn, Ni | $l_{min} > 250nm$ | R-plane, M-plane |
| | Corundum | Compensated | RE Ga-rich/O-vac | Bi, N, Li O-rich/Ga-vac | $l_{min} > 250nm$ | A-plane, C-plane |
| Aluminum-Gallium-Oxide (Ga$_x$Al$_{1-x}$)$_2$O$_3$ | Monoclinic: Al% < 50% | Insulating | Si, Ge, Sn | Mg, Zn, Ni | $l_{min} > 200nm$ | (001), (-201), (110), (010) |
| | Corundum: Al > 50% | Compensated | RE | Bi, N, Li | $l_{min} > 200nm$ | A-, R-, M-, C-plane |
| Aluminum-Oxide Al$_2$O$_3$ | Trigonal, Hexagonal | Insulating | F | / | $l_{min} > 172nm$ | R-plane, M-plane |
| | Corundum | Compensated | | / | $l_{min} > 172nm$ | A-plane, C-plane |

FIG. 43A

TABLE II

| Oxide | Crystal Symmetry | unit cells parameters | | | | | |
|---|---|---|---|---|---|---|---|
| | | a (Å) | b (Å) | c (Å) | α | β | γ |
| Ga$_2$O$_3$ | C2/m | 12.452 | 3.083 | 5.876 | 90 | 103.68 | 90 |
| Ga$_2$O$_3$ | R3c | 5.059 | 5.059 | 13.625 | 90 | 90 | 120 |
| Al$_2$O$_3$ | C2/m | 11.926 | 2.941 | 5.671 | 90 | 104.03 | 90 |
| Al$_2$O$_3$ | R3c | 4.805 | 4.805 | 13.116 | 90 | 90 | 120 |

FIG. 43B

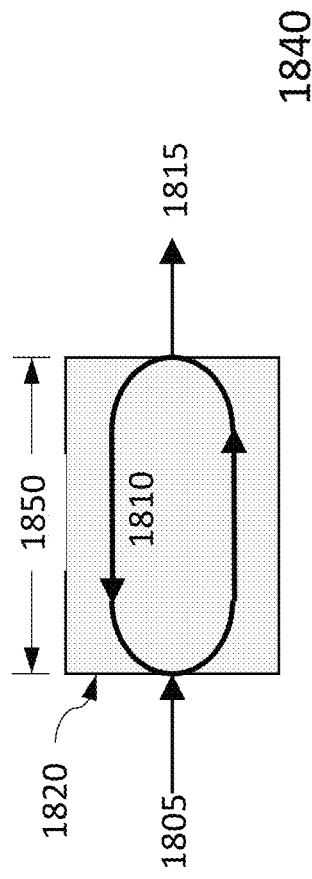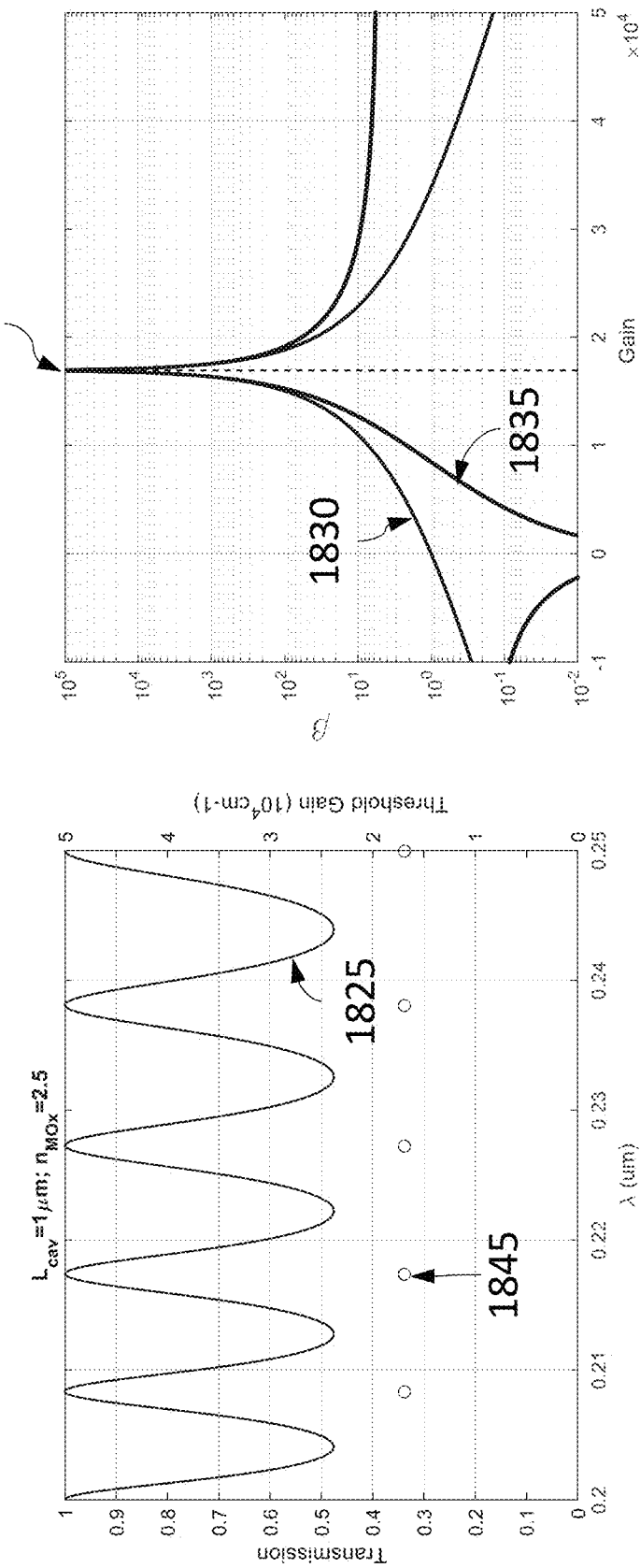
FIG. 58A
FIG. 58B

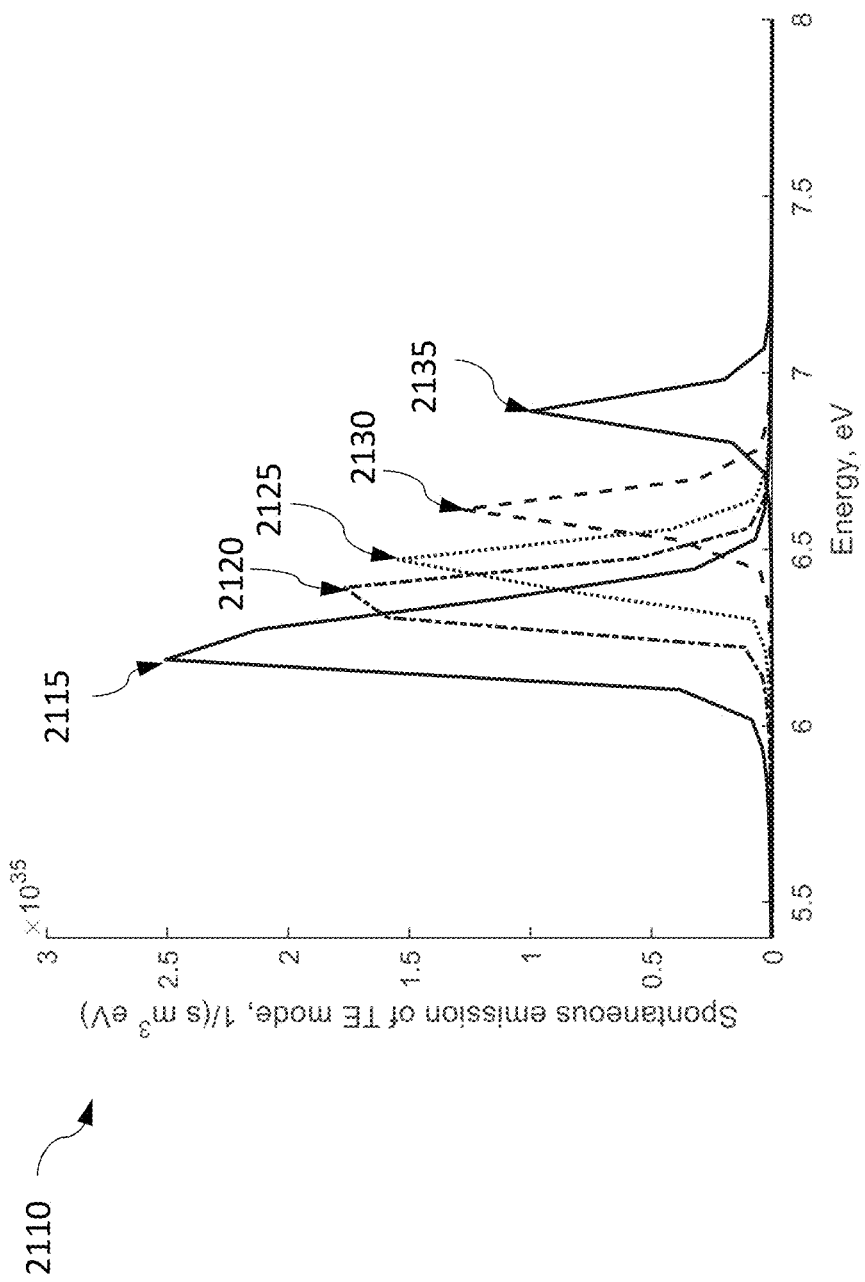

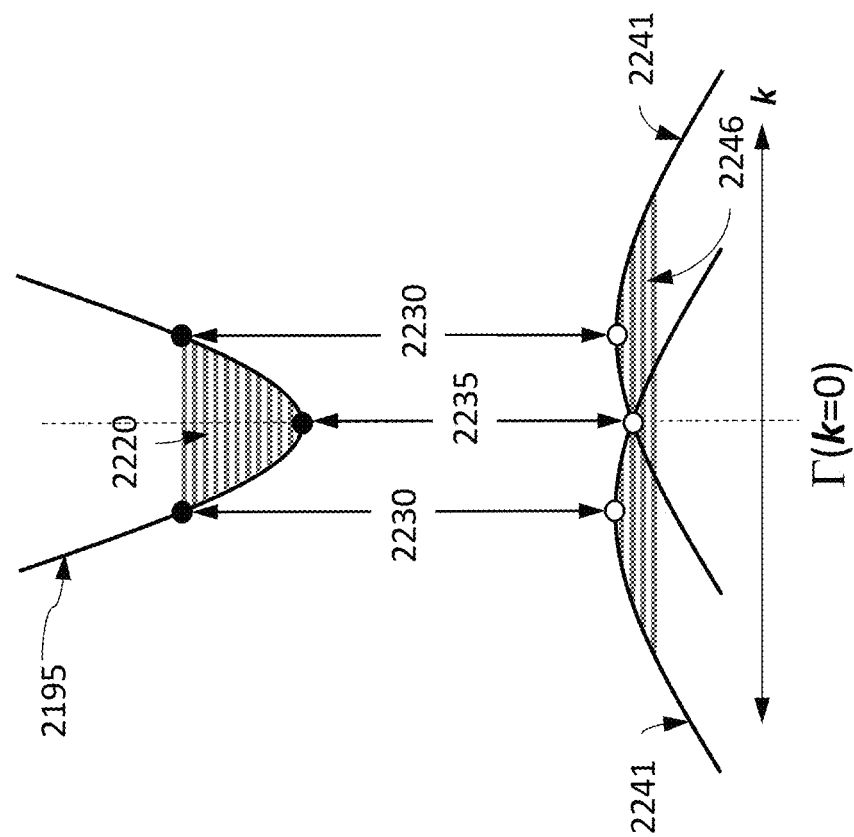
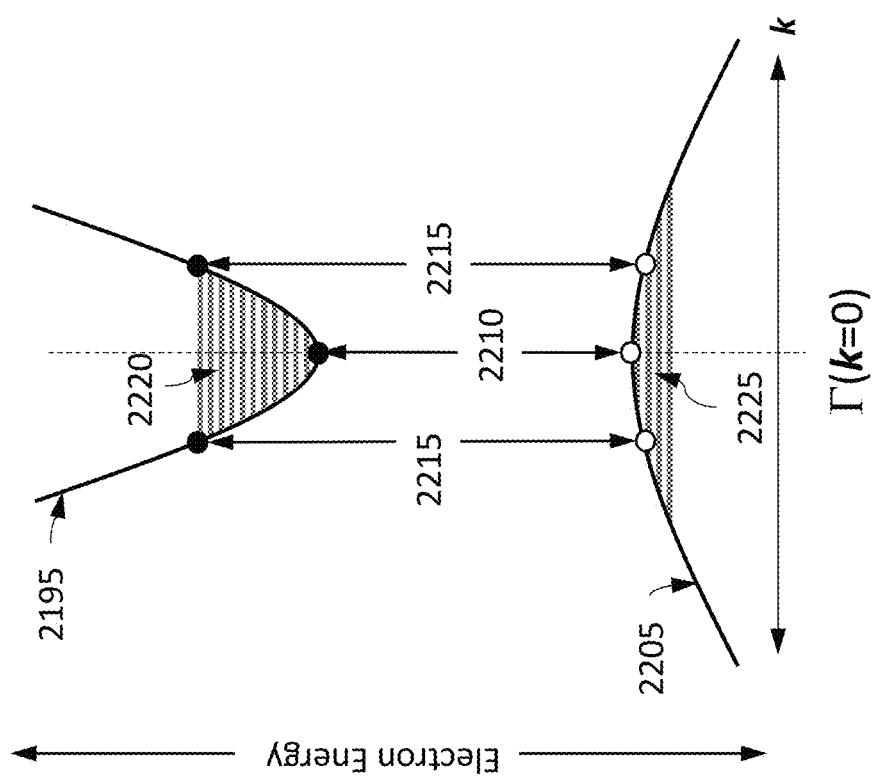

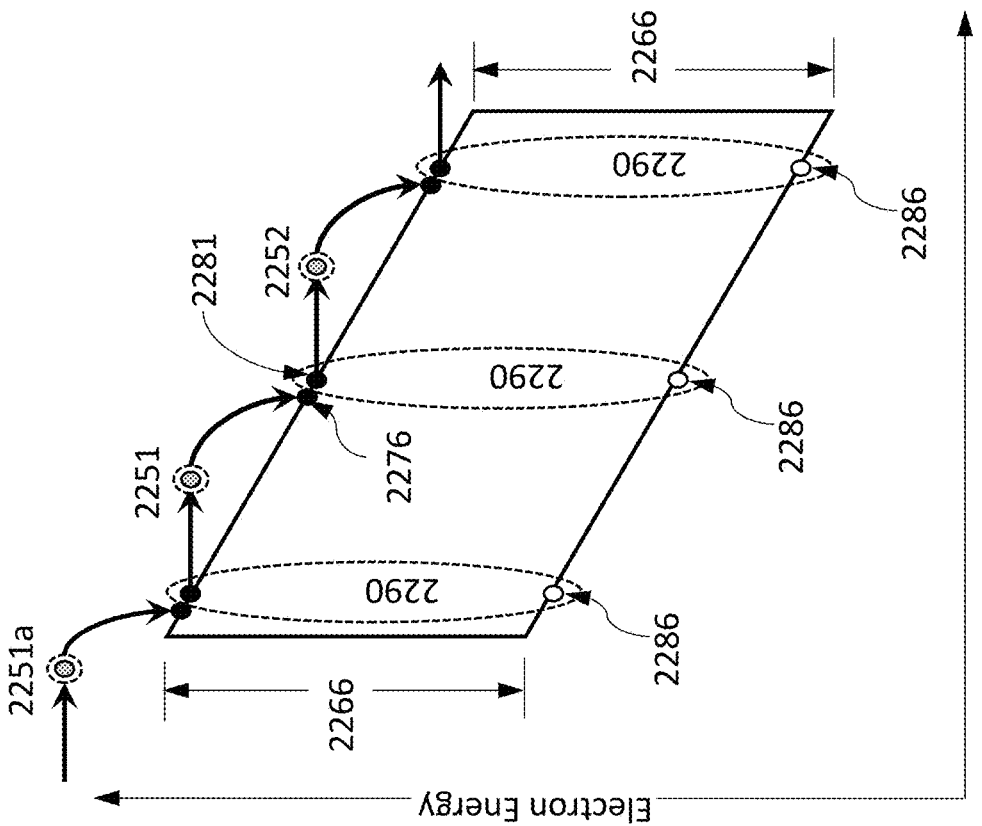
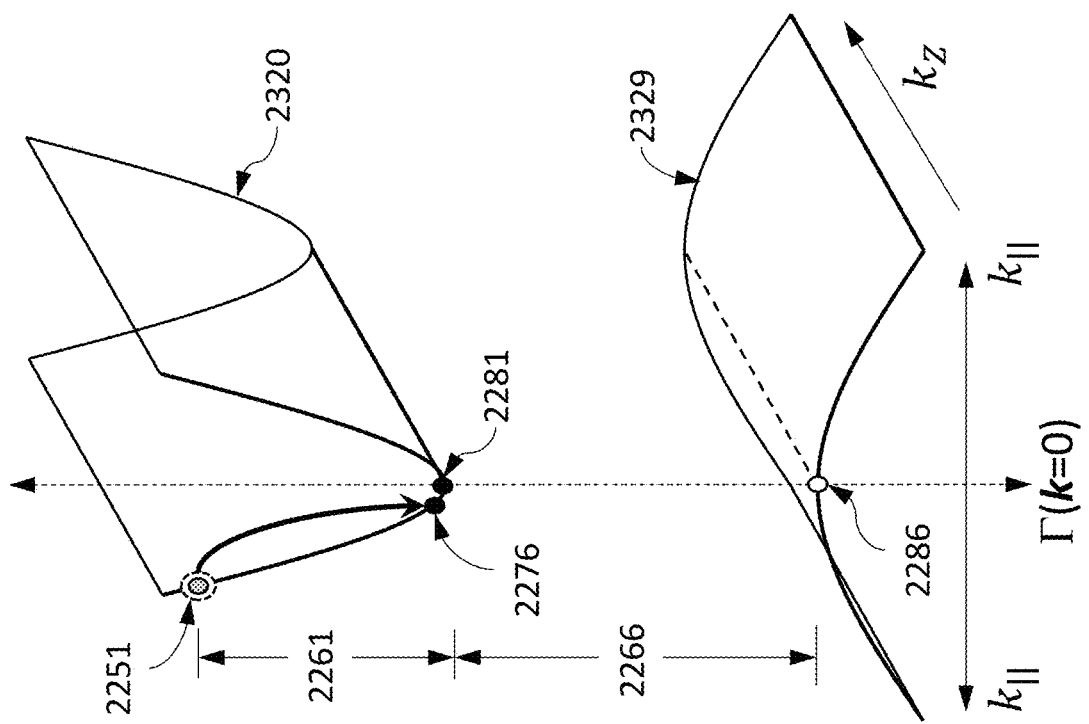
FIG. 72B
FIG. 72A

METAL OXIDE SEMICONDUCTOR-BASED LIGHT EMITTING DEVICE

RELATED APPLICATIONS

This application claims priority to Australian Provisional Patent Application No. 2020901513, filed on May 11, 2020 and entitled "Metal Oxide Semiconductor Based Light Emitting Device"; the contents of which are hereby incorporated by reference in their entirety.

The following publications are referred to in the present application and their contents are hereby incorporated by reference in their entirety:
- U.S. Pat. No. 9,412,911 titled "OPTICAL TUNING OF LIGHT EMITTING SEMICONDUCTOR JUNCTIONS", issued 9 Aug. 2016, and assigned to the applicant of the present application;
- U.S. Pat. No. 9,691,938 titled "ADVANCED ELECTRONIC DEVICE STRUCTURES USING SEMICONDUCTOR STRUCTURES AND SUPERLATTICES", issued 27 Jun. 2017, and assigned to the applicant of the present application;
- U.S. Pat. No. 10,475,956 titled "OPTOELECTRONIC DEVICE", issued 12 Nov. 2019, and assigned to the applicant of the present application; and The contents of each of the above publications are expressly incorporated by reference in their entirety.

BACKGROUND

Ultraviolet light emitting devices (UVLEDs) have many applications in medicine, medical diagnostics, water purification, food processing, sterilization, aseptic packaging and deep submicron lithographic processing. Emerging applications in bio-sensing, communications, pharmaceutical process industry and materials manufacturing are also enabled by delivering extremely short wavelength optical sources in a compact and lightweight package having high electrical conversion efficiency such as a UVLED.

Electro-optical conversion of electrical energy into discrete optical wavelengths with extremely high efficiency has generally been achieved using a tailor-made semiconductor having the required properties to achieve the spatial recombination of charge carriers of electrons and holes to emit light of the required wavelength. In the case where UV light is required, UVLEDs have been developed using almost exclusively Gallium-Indium-Aluminum-Nitride (GaInAlN) compositions forming wurtzite-type crystal structures.

Group-III-Nitrides have been used in semiconductor based UVLEDs that generate light in the UVC wavelength band (i.e., wavelength between approximately 200 nm to 280 nm) fundamentally based on heterojunction p-i-n diodes. Unfortunately, the efficiency and output optical power in the UVC region appears to be limited by the inherent low crystallographic structure quality of the AlInGaN epitaxially deposited layers fundamentally due to the lack of native substrates, such as AlN.

Sapphire (corundum $Al_2O_3$) has been suggested as a compromise starting surface crystal to heterogeneously seed two very different materials systems. However, there is a large structural mismatch between the sapphire crystal and the Group-III-Nitrides. The crystal lattice and symmetry mismatch creates a very large density of disadvantageous crystalline defects which detracts severely from the ultimate efficiency of Group-III-Nitride based UVLEDs. Even if this defect density could be reduced by several orders in magnitude, the highest bandgap material AlN limits UVC operation to approximately 215 nm, with a dramatic decline in output optical power as the wavelength is reduced below 280 nm.

SUMMARY

In some embodiments, an optoelectronic semiconductor light emitting device includes a substrate and a plurality of epitaxial semiconductor layers disposed on the substrate. Each of the epitaxial semiconductor layers comprises a metal oxide. The optoelectronic semiconductor light emitting device is configured to emit light having a wavelength in a range from 150 nm to 425 nm.

In some embodiments, an optoelectronic semiconductor device for generating light of a predetermined wavelength includes a substrate and an optical emission region. The optical emission region has an optical emission region band structure configured for generating light of the predetermined wavelength. The optical emission region has an epitaxial metal oxide layer supported by the substrate, where the epitaxial metal oxide layer has an optical emission region band gap energy capable of generating light of the predetermined wavelength.

BRIEF DESCRIPTION OF THE DRAWINGS

Embodiments of the present disclosure will be discussed with reference to the accompanying figures wherein:

FIGS. 2A and 2B depict schematically two classes of LED devices based on vertical and waveguide optical confinement and emission disposed upon a substrate in accordance with illustrative embodiments of the present disclosure;

FIGS. 13C-13E are electron energy-vs.-crystal momentum representations showing allowed optical emission and absorption transitions at k=0 with respect to the axes of $Ga_2O_3$ monoclinic crystal symmetry in accordance with an illustrative embodiment of the present disclosure;

FIGS. 23A-23C show the effect on the band structure of monoclinic gallium-oxide as a function of applied uniaxial strain to the crystal unit cell in accordance with an illustrative embodiment of the present disclosure;

Figures 25A, 25B, 25C:
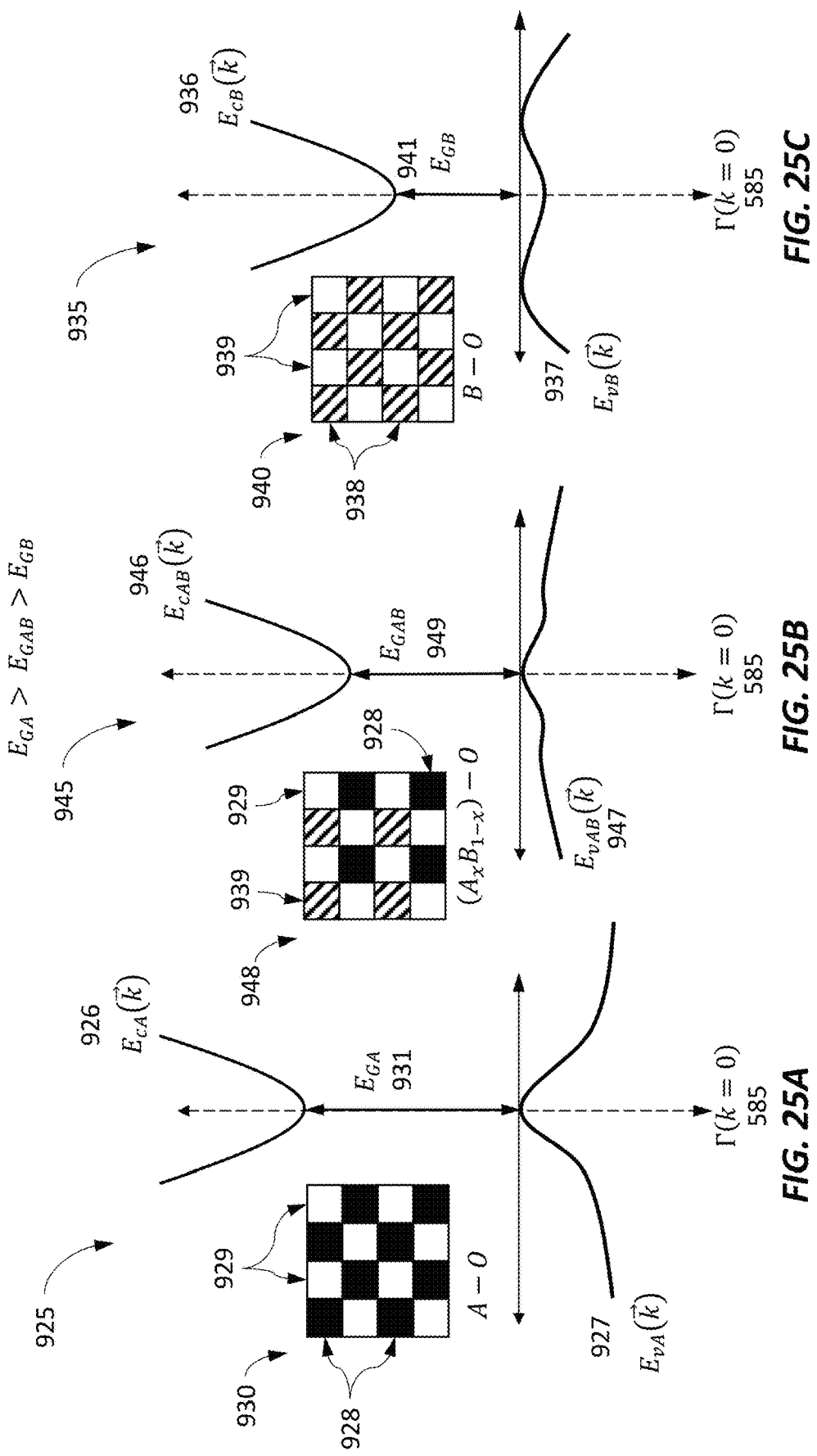
Figure 26:
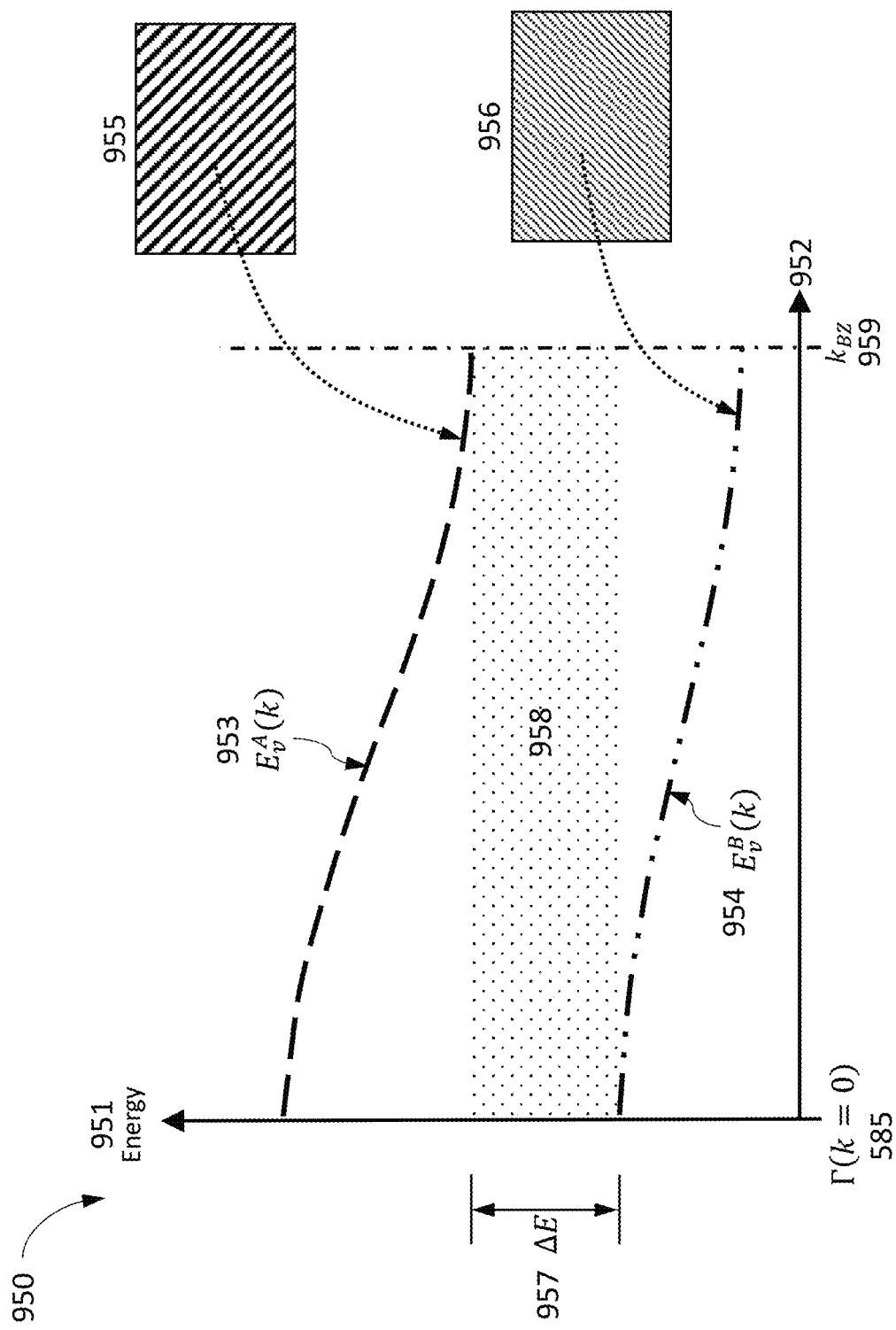
Figure 27C:
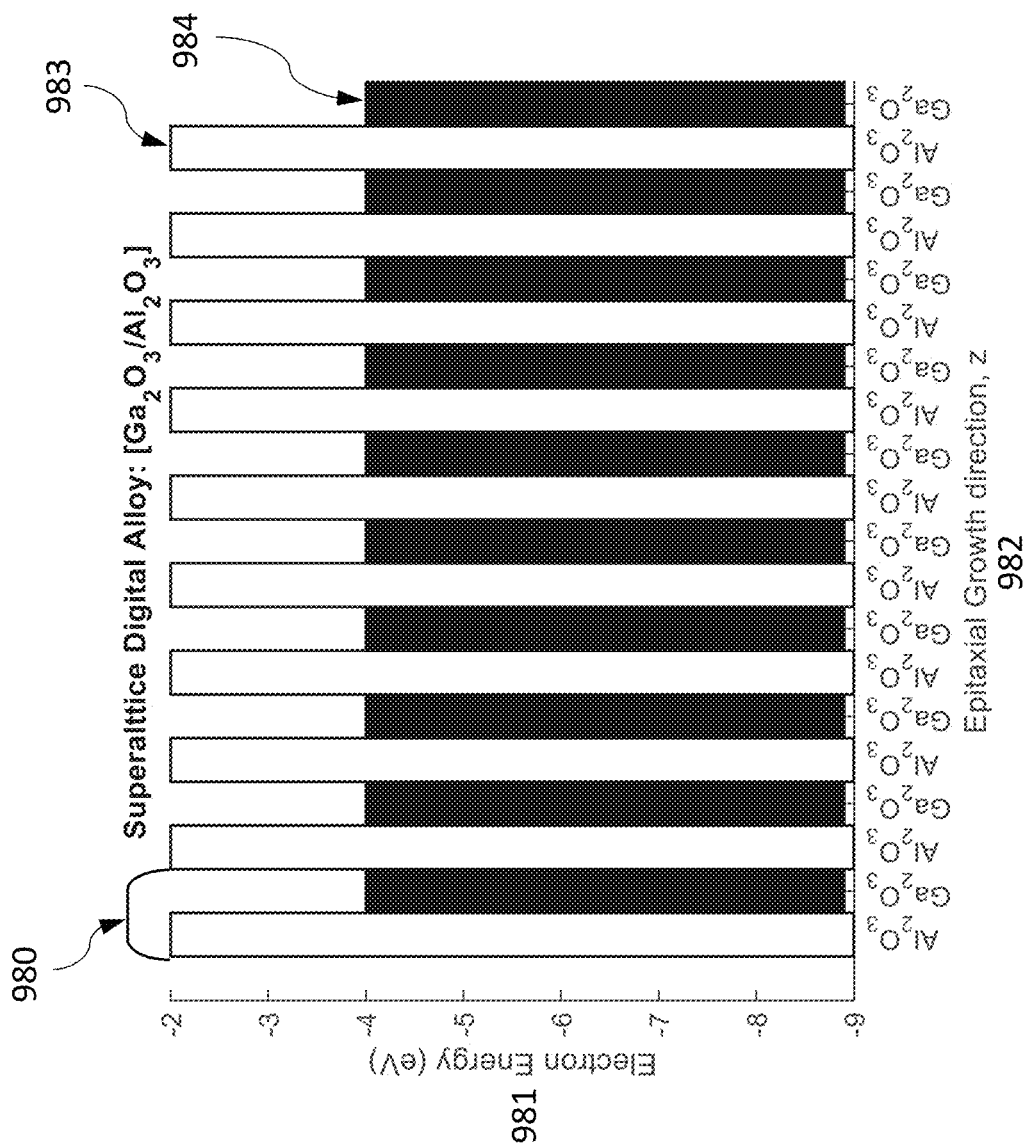
Figure 27D:
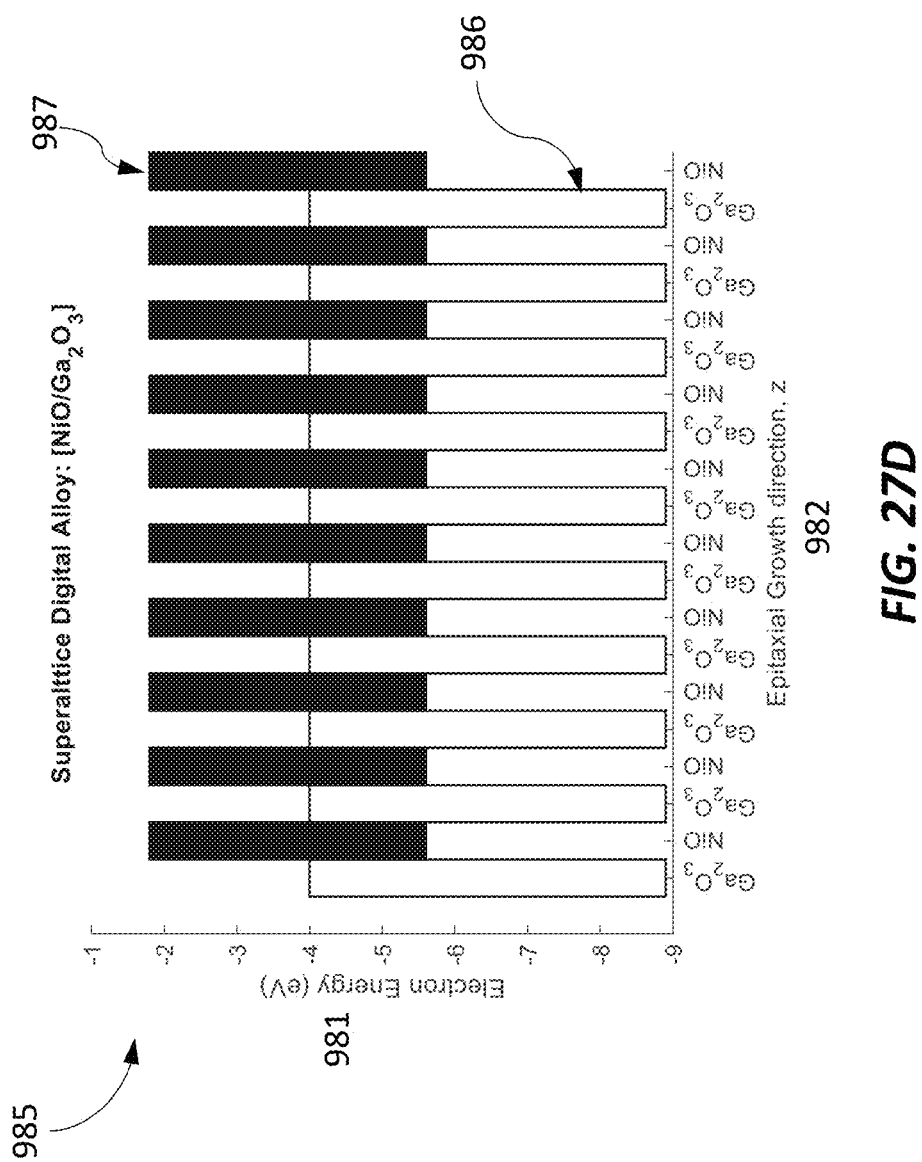
Figure 27E:
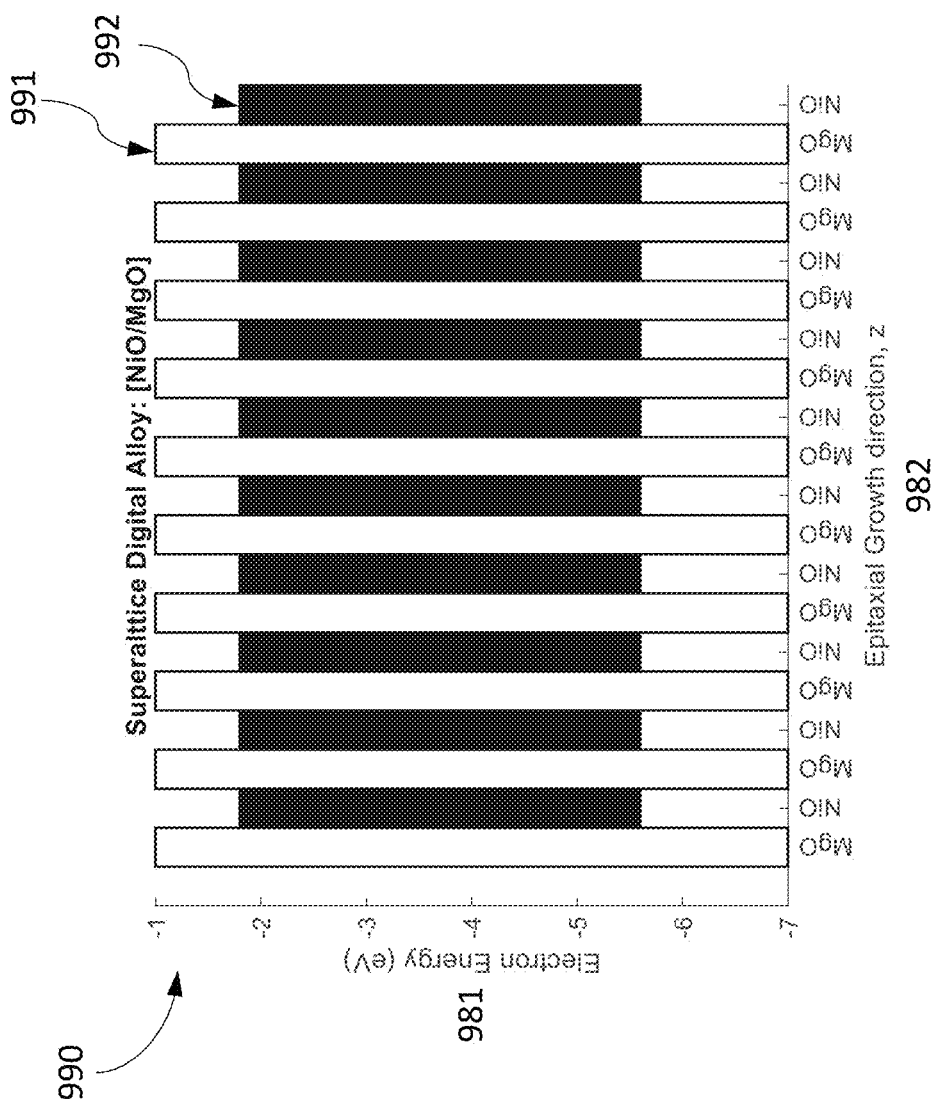

one having a wide direct-bandgap material and the other a narrow indirect-bandgap material;

FIGS. 25A-25C show the effect of valence band mixing of two binary dissimilar metal oxide materials that together form a ternary metal oxide alloy in accordance with an illustrative embodiment of the present disclosure;

FIG. 26 depicts schematically a portion of the energy-vs-crystal momentum of dominant valence bands sourced from two bulk-like metal oxide semiconductor materials up to the first Brillouin zone in accordance with an illustrative embodiment of the present disclosure;

FIGS. 27A-27B show an effect of a superlattice (SL) in one dimension on the E-k configuration for a layered structure having a superlattice period equal to approximately twice the bulk lattice constant of the host metal oxide semiconductors, depicting the creation of a superlattice Brillouin-zone that opens an artificial bandgap at a zone center in accordance with an illustrative embodiment of the present disclosure;

FIG. 27C shows a bi-layered binary superlattice comprising a plurality of thin epitaxial layers of $Al_2O_3$ and $Ga_2O_3$ repeating with a fixed unit cell period where the digital alloy simulates an equivalent ternary $Al_xGa_{1-x}O_3$ bulk alloy depending on the constituent layer thickness ratio of the superlattice period in accordance with an illustrative embodiment of the present disclosure;

FIG. 27D shows another bi-layered binary superlattice comprising a plurality of thin epitaxial layers of NiO and $Ga_2O_3$ repeating with a fixed unit cell period where the digital alloy simulates an equivalent ternary $(NiO)_x(Ga_2O_3)_{1-x}$ bulk alloy depending on the constituent layer thickness ratio of the superlattice period in accordance with an illustrative embodiment of the present disclosure;

FIG. 27E shows yet another triple material binary superlattice comprising a plurality of thin epitaxial layers of MgO, NiO repeating with a fixed unit cell period where the digital alloy simulates an equivalent ternary bulk alloy $(NiO)_x(MgO)_{1-x}$ depending on the constituent layer thickness ratio of the superlattice period and where the binary metal oxides used for the repeating unit are each selected to vary from between 1 to 10 unit cells in thickness respectively to together comprise the unit cell of the SL in accordance with an illustrative embodiment of the present disclosure.

Figure 27F:
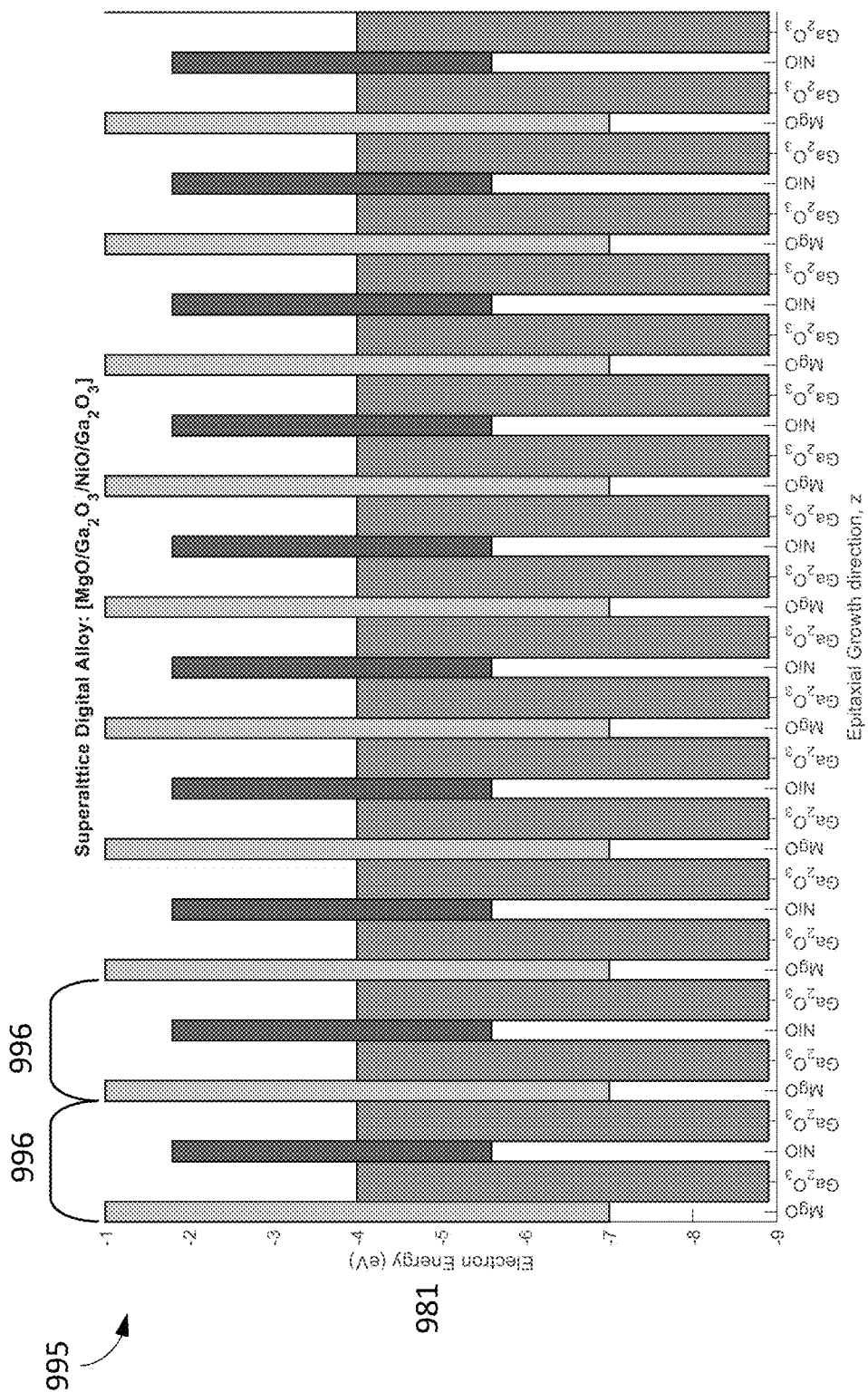
Figure 29:
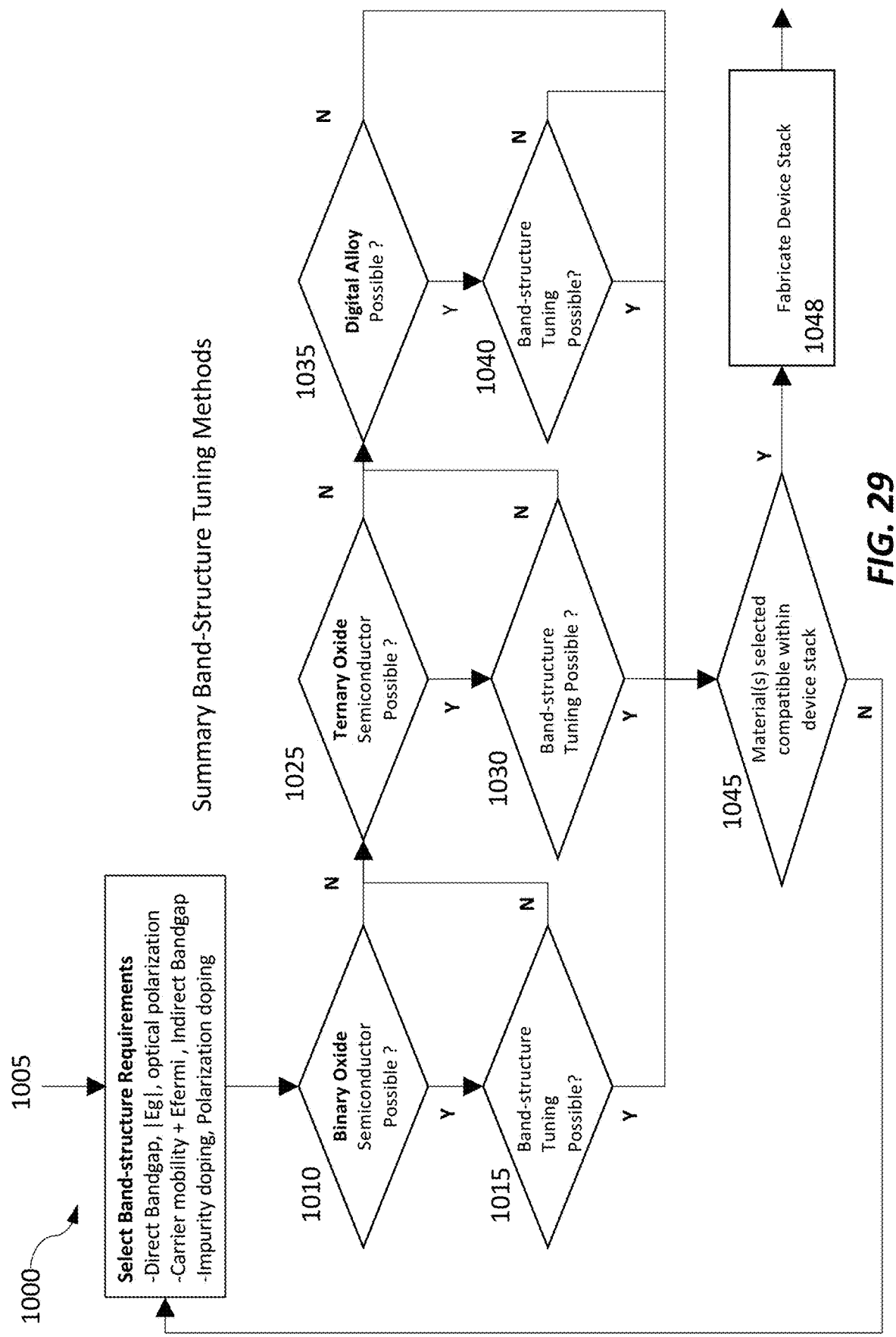
Figure 30:
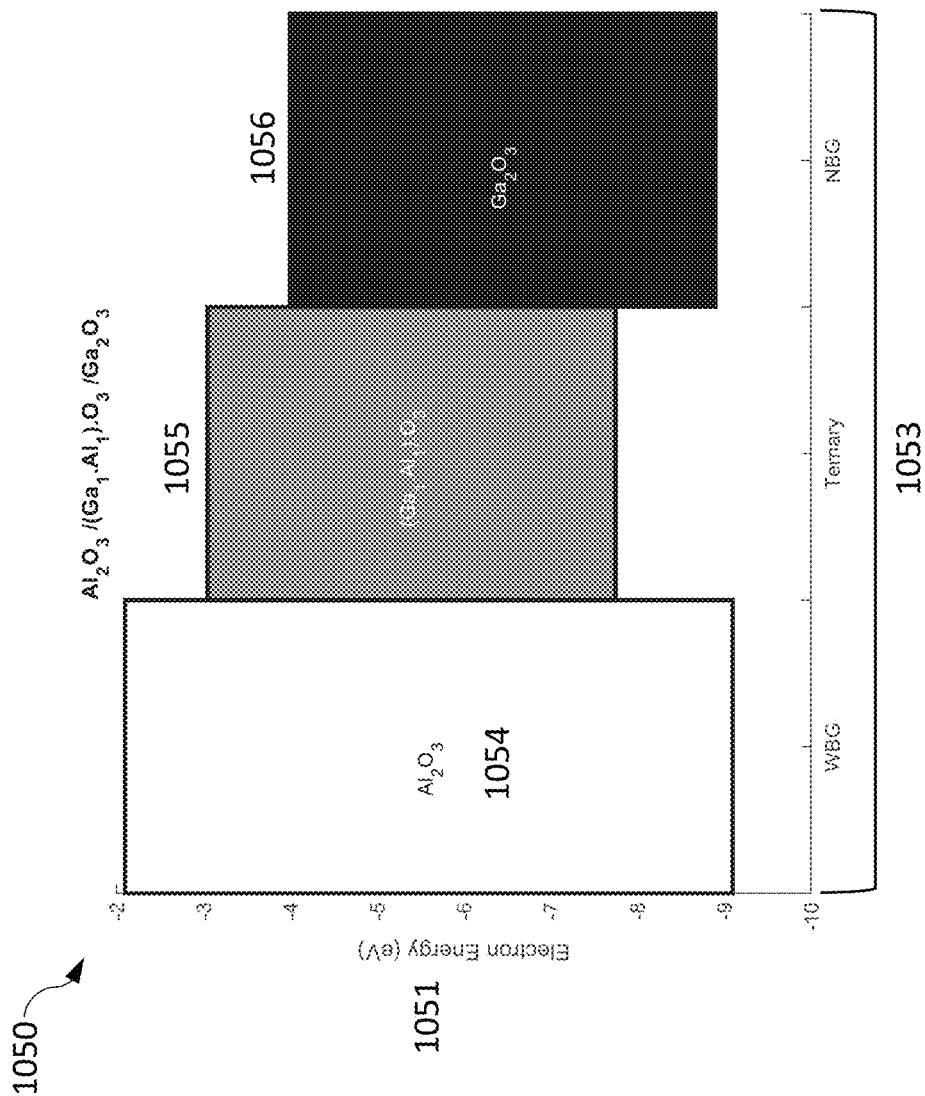
Figure 31:
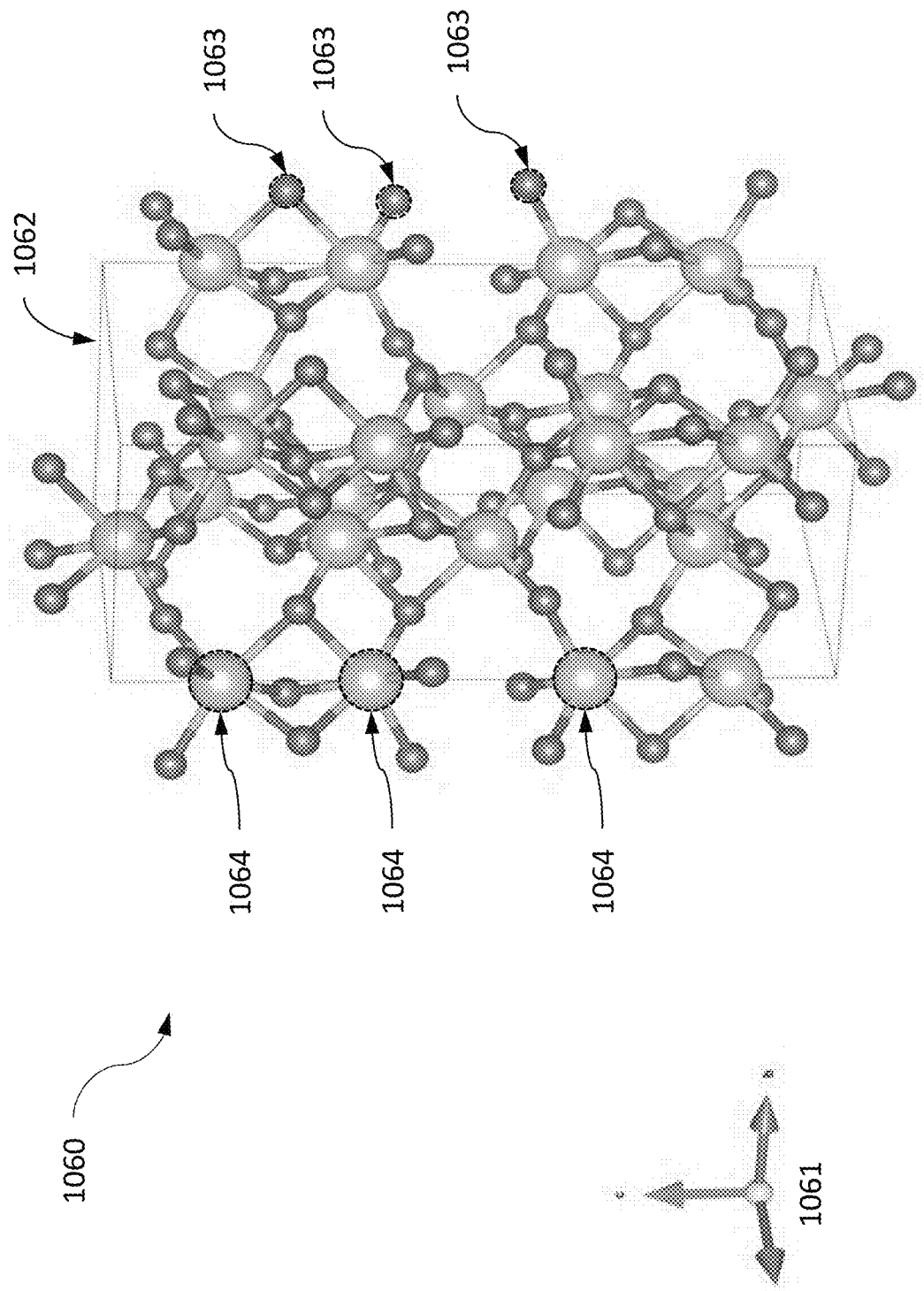
Figures 32A, 32B:
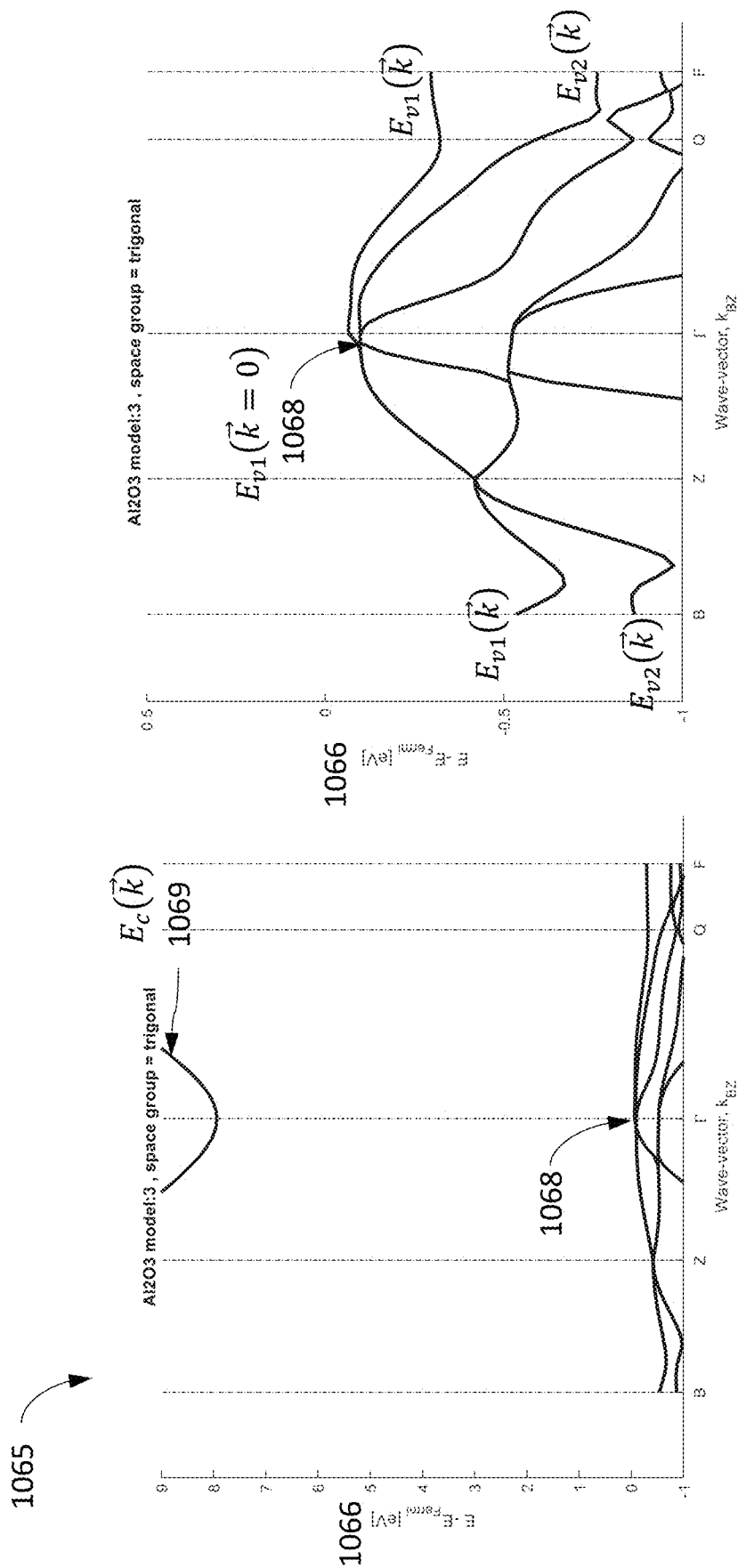
Figure 33:
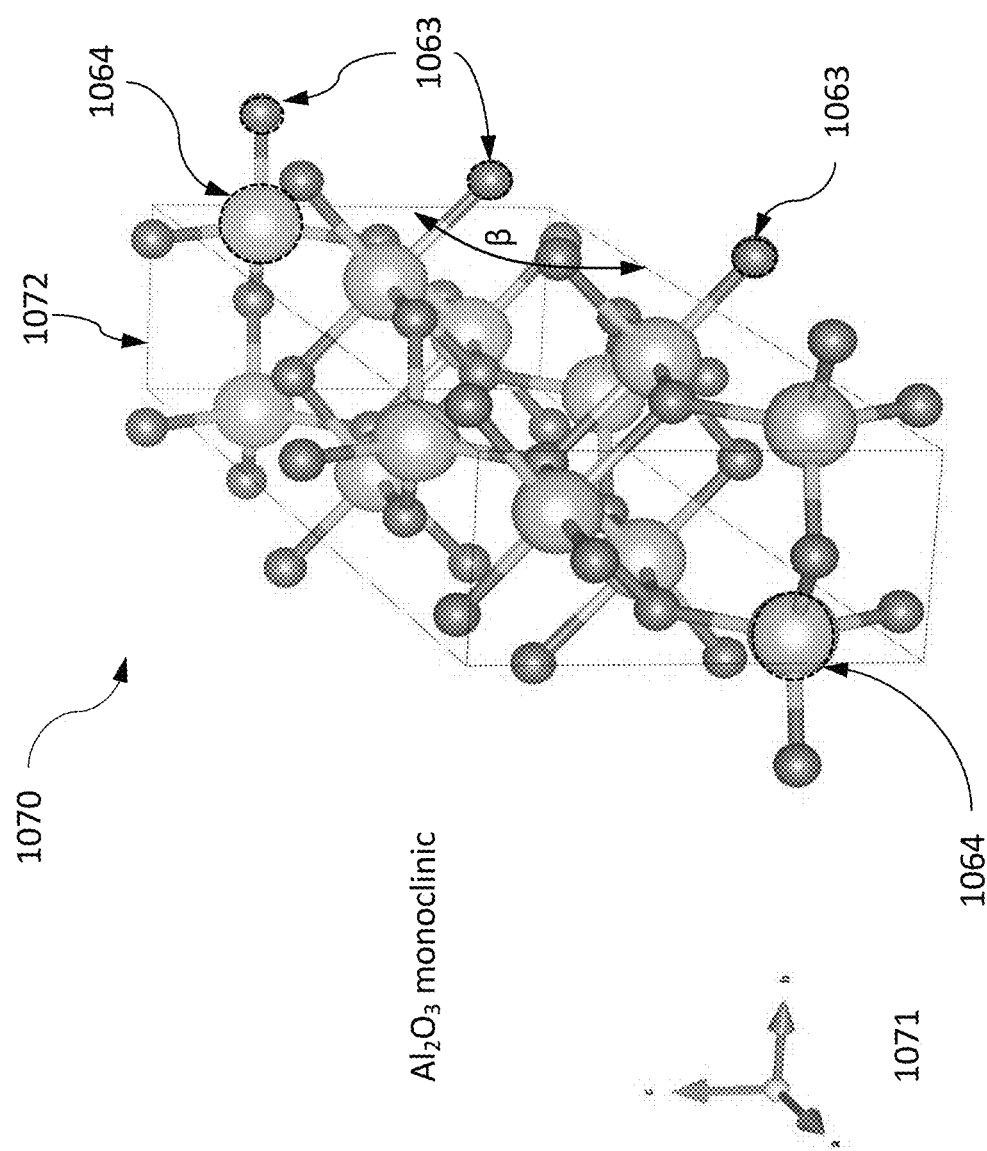
Figures 34A, 34B:
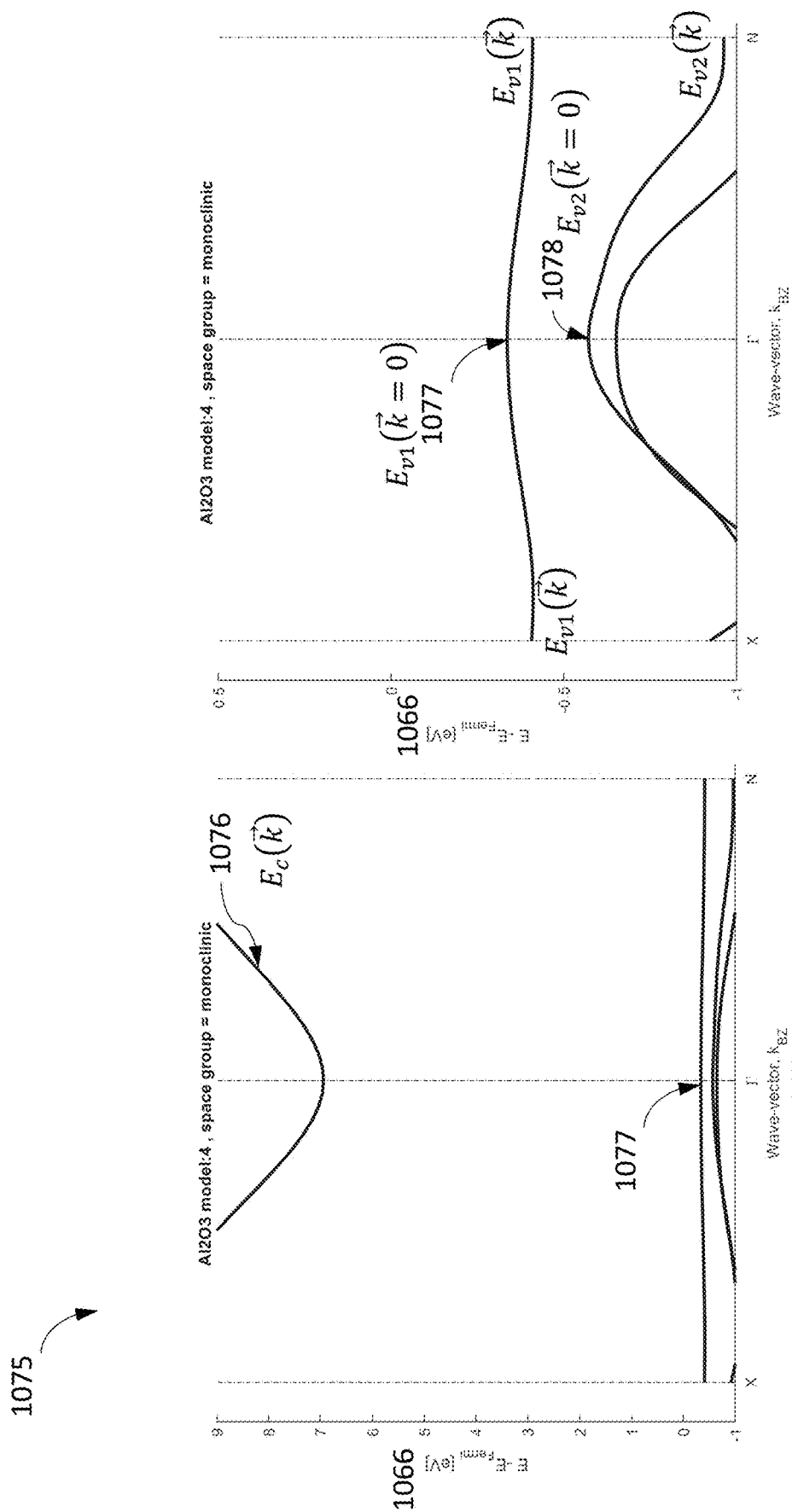
Figure 35:
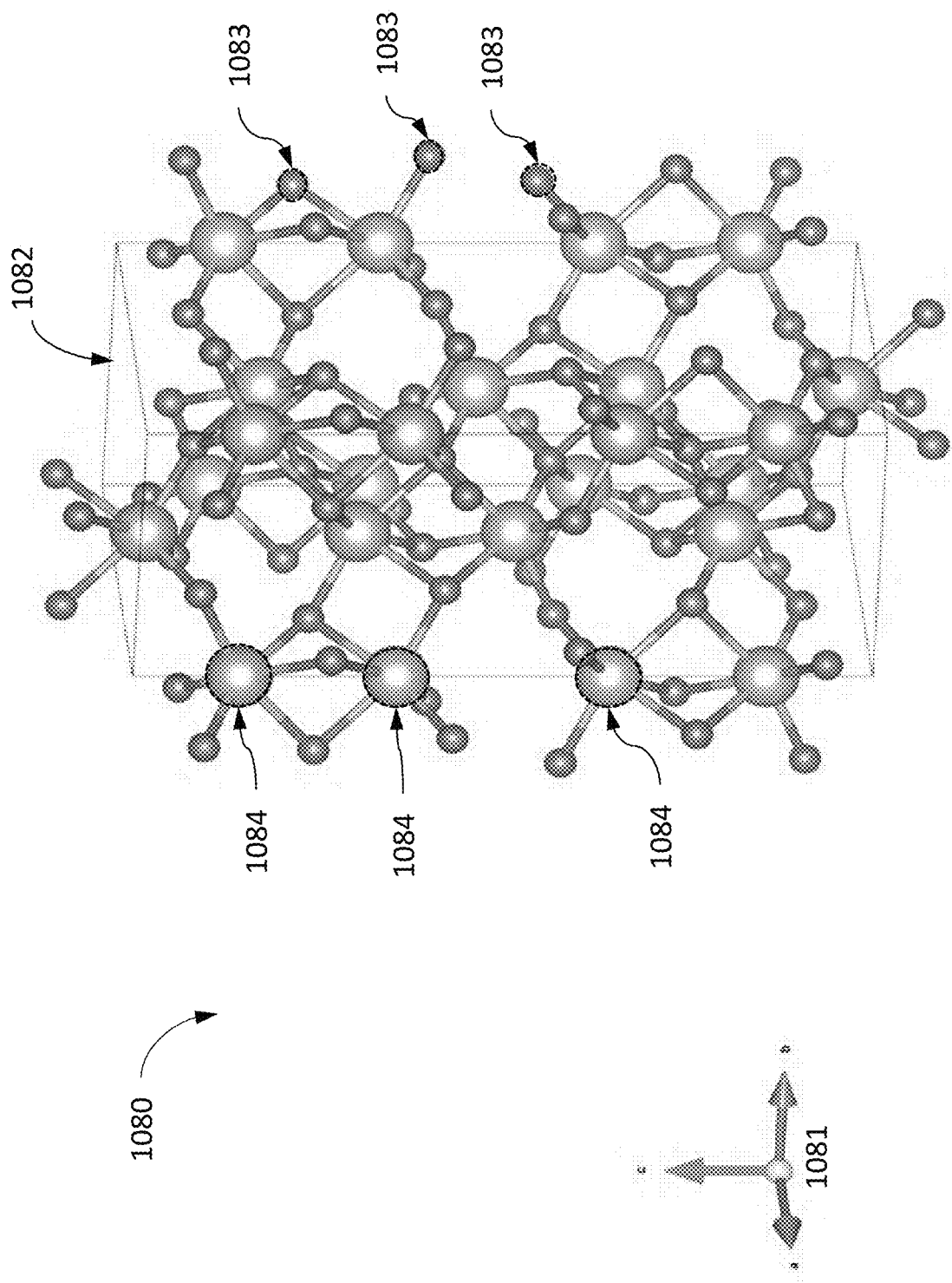
Figures 36A, 36B:
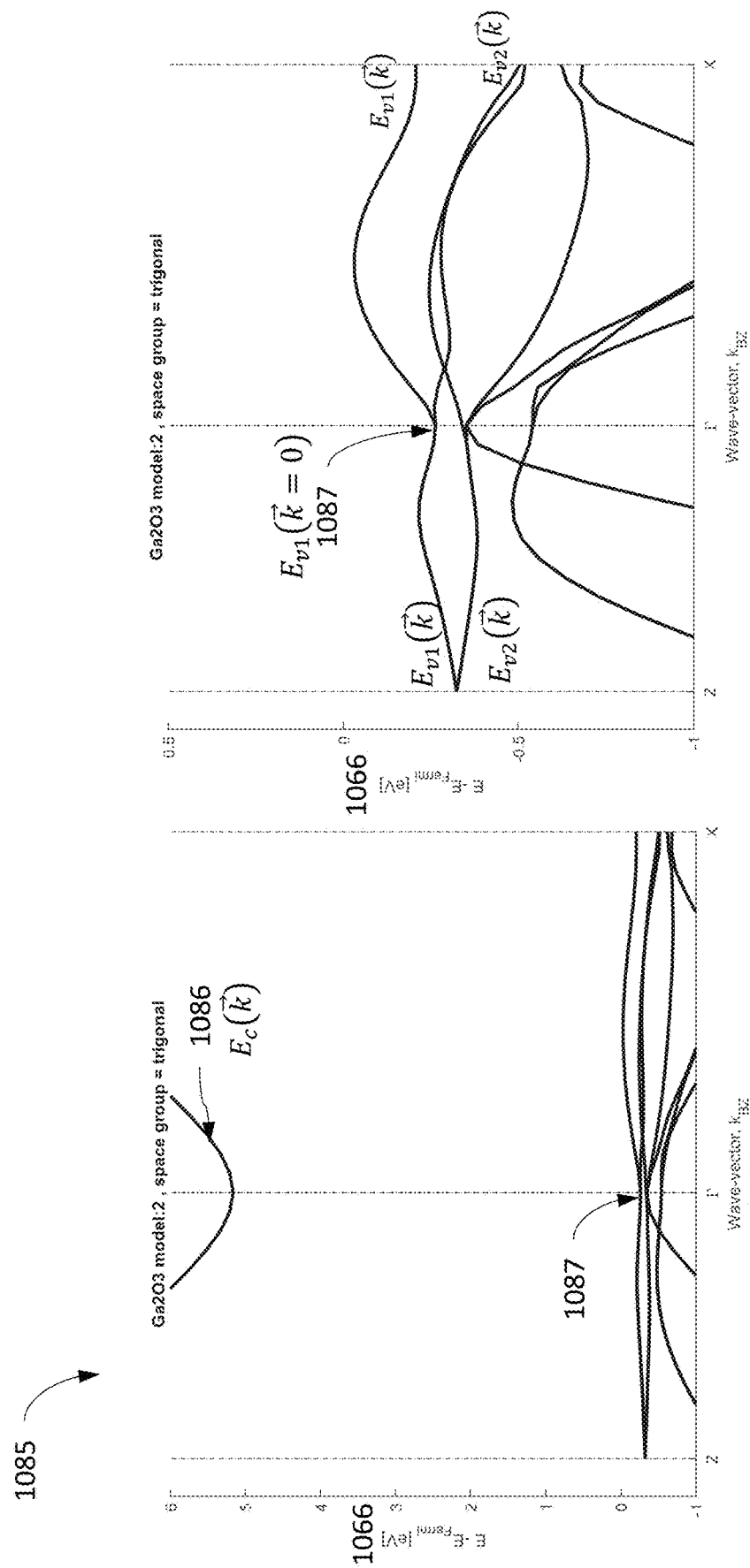
Figure 37:
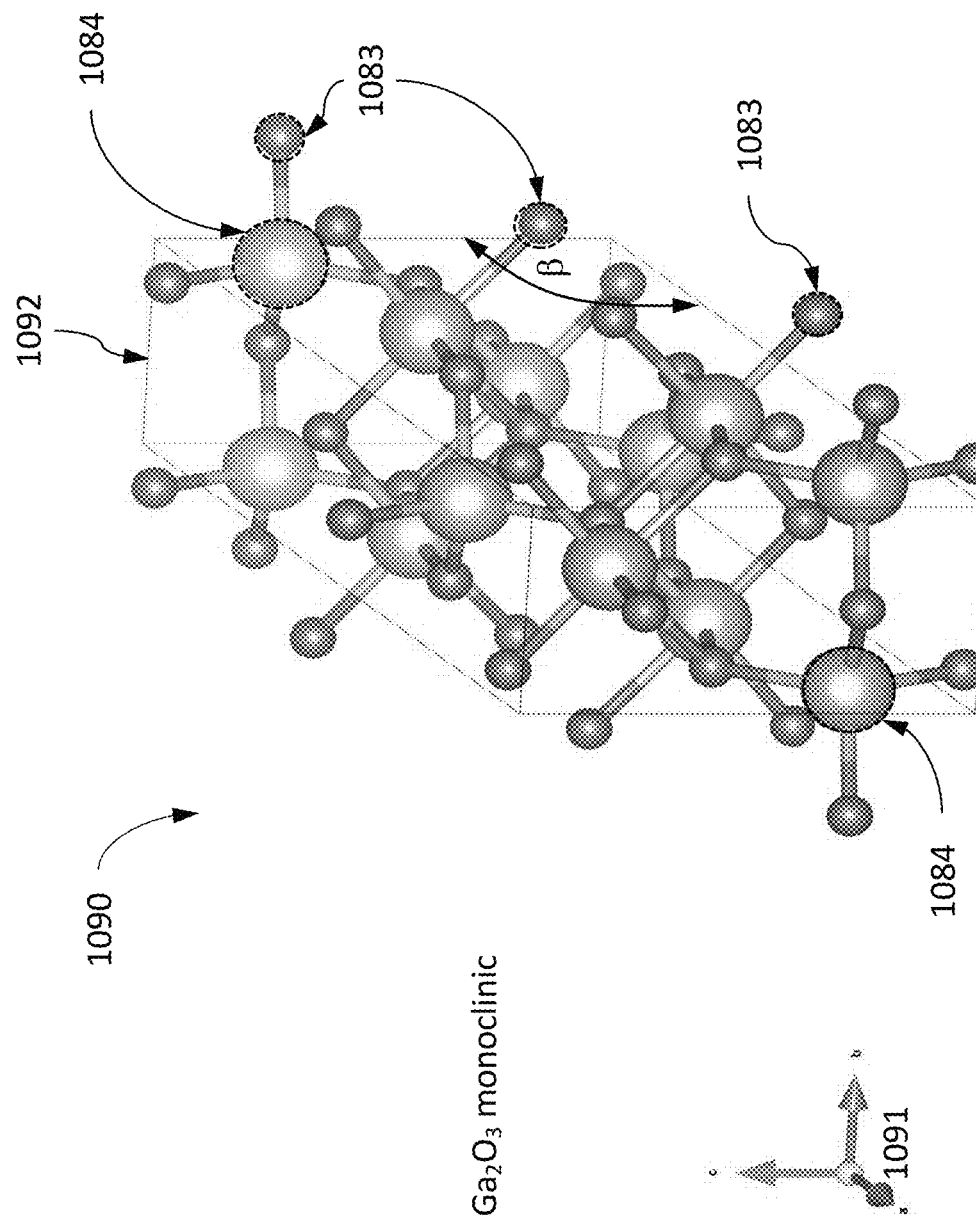
Figures 38A, 38B:
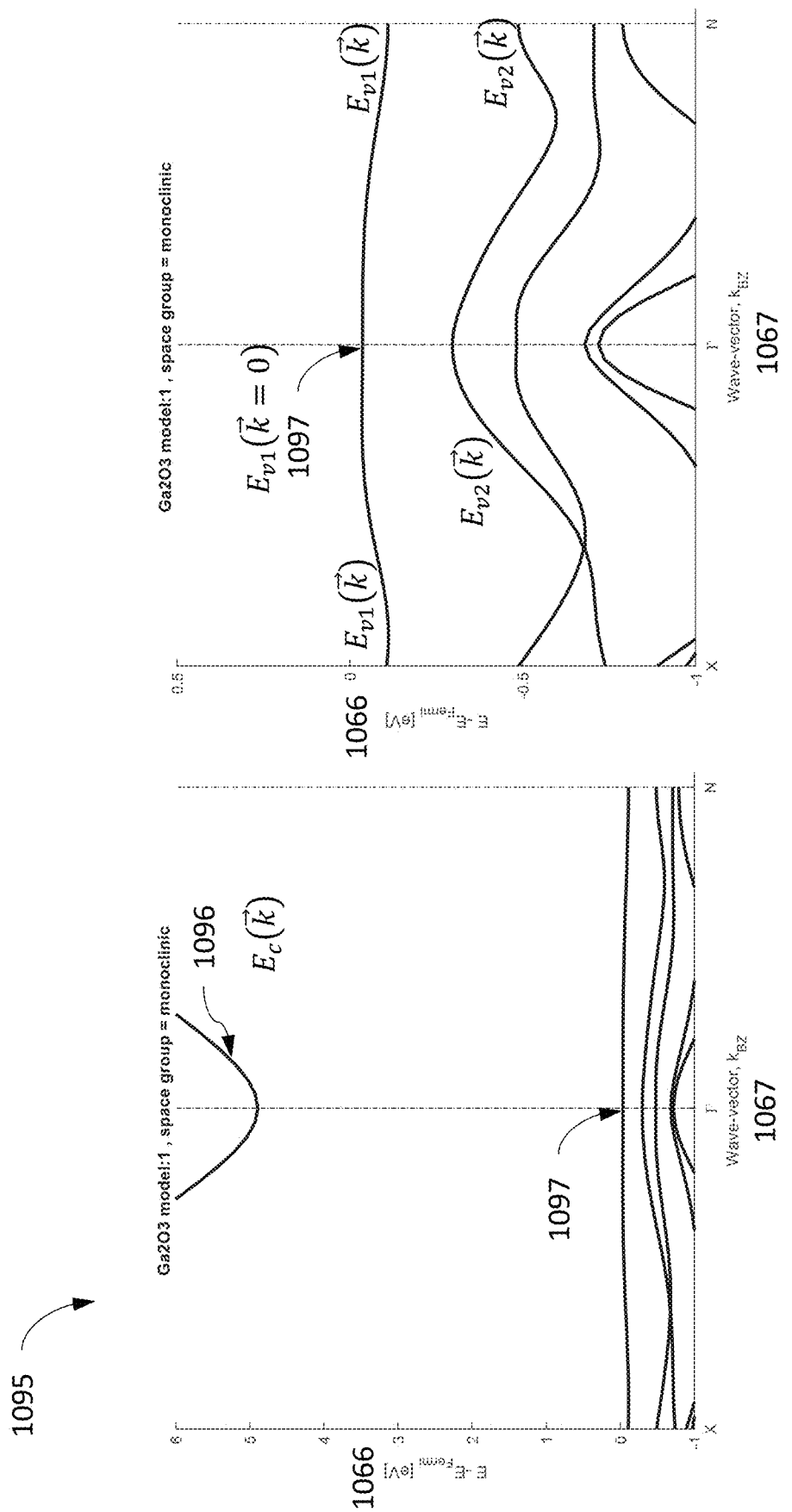
Figure 39:
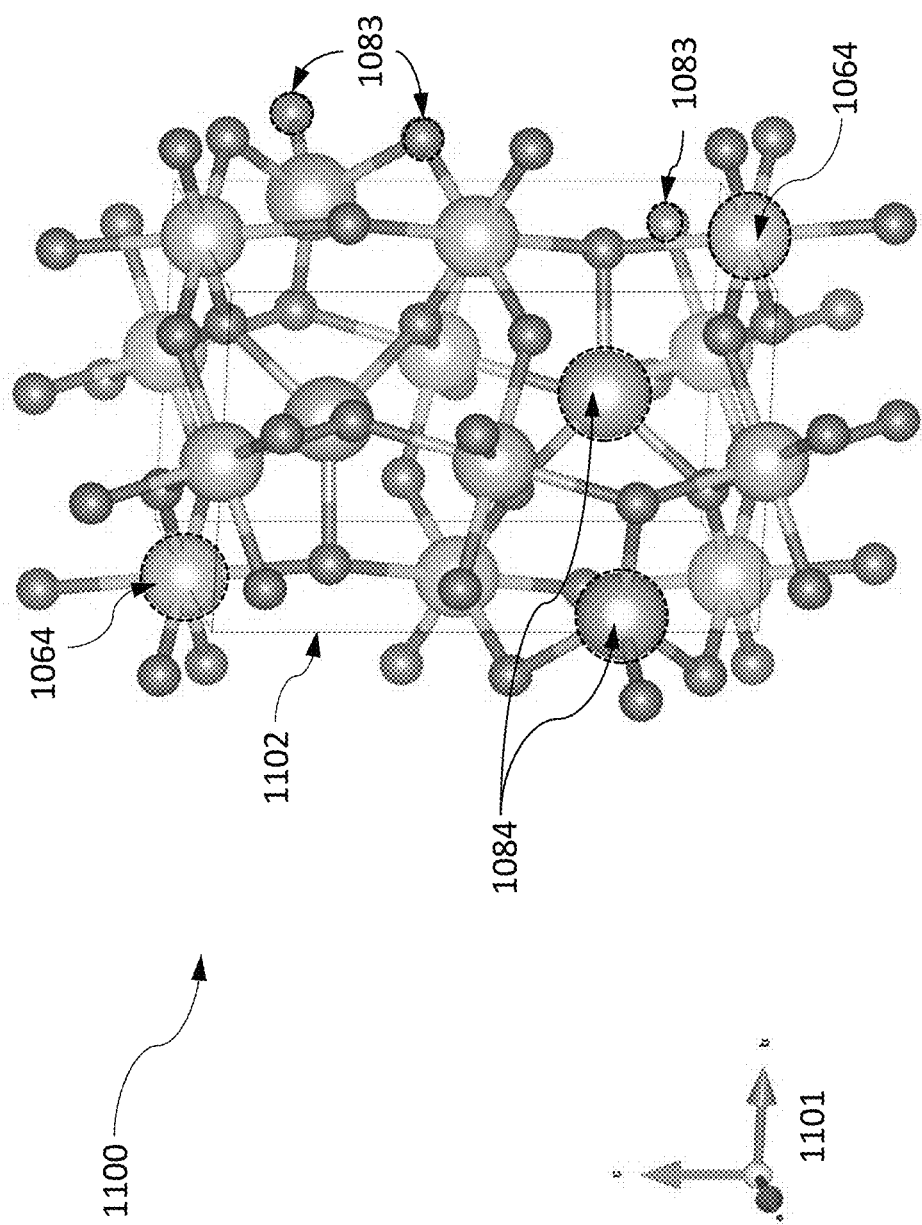
Figure 40:
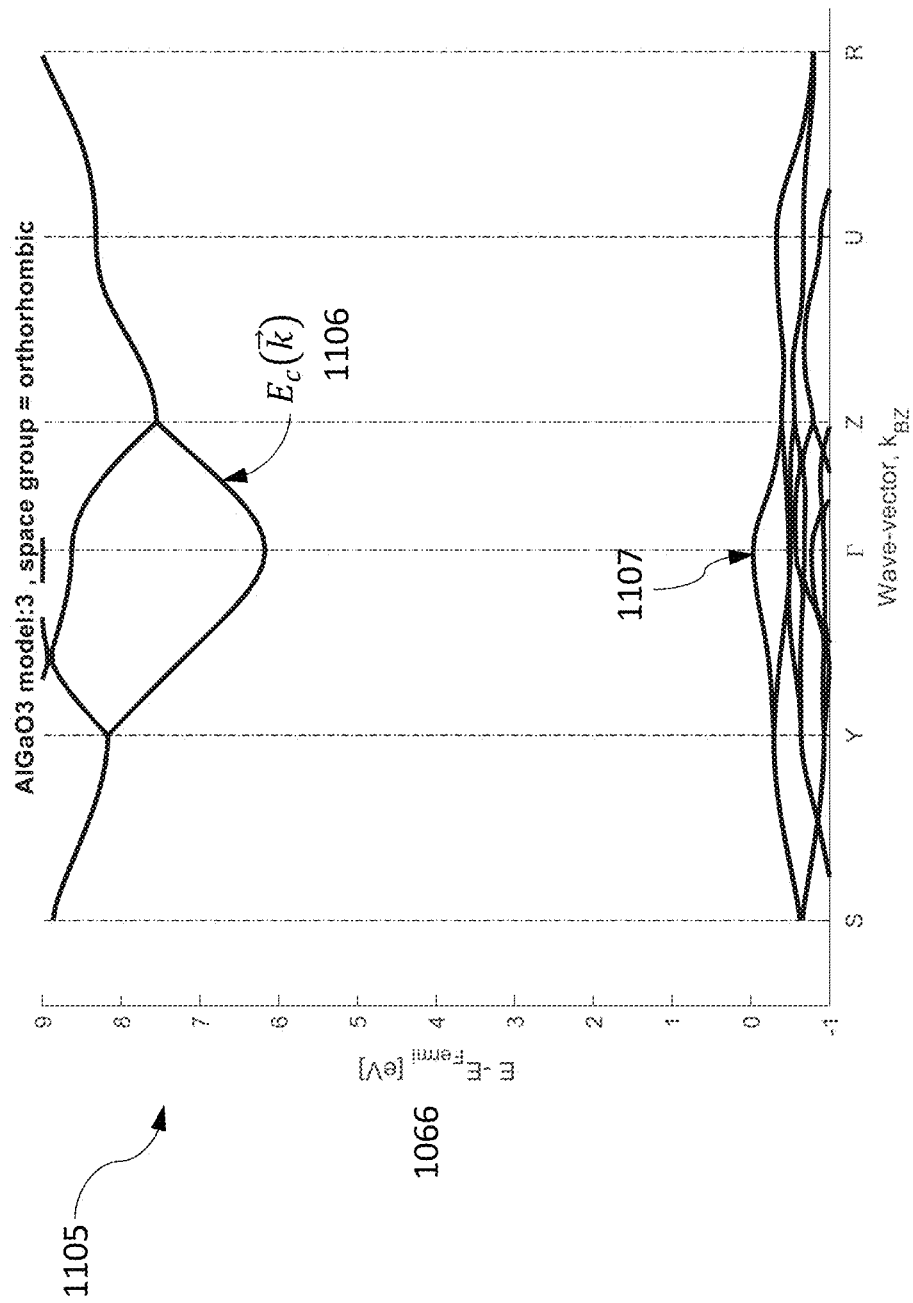
Figure 41:
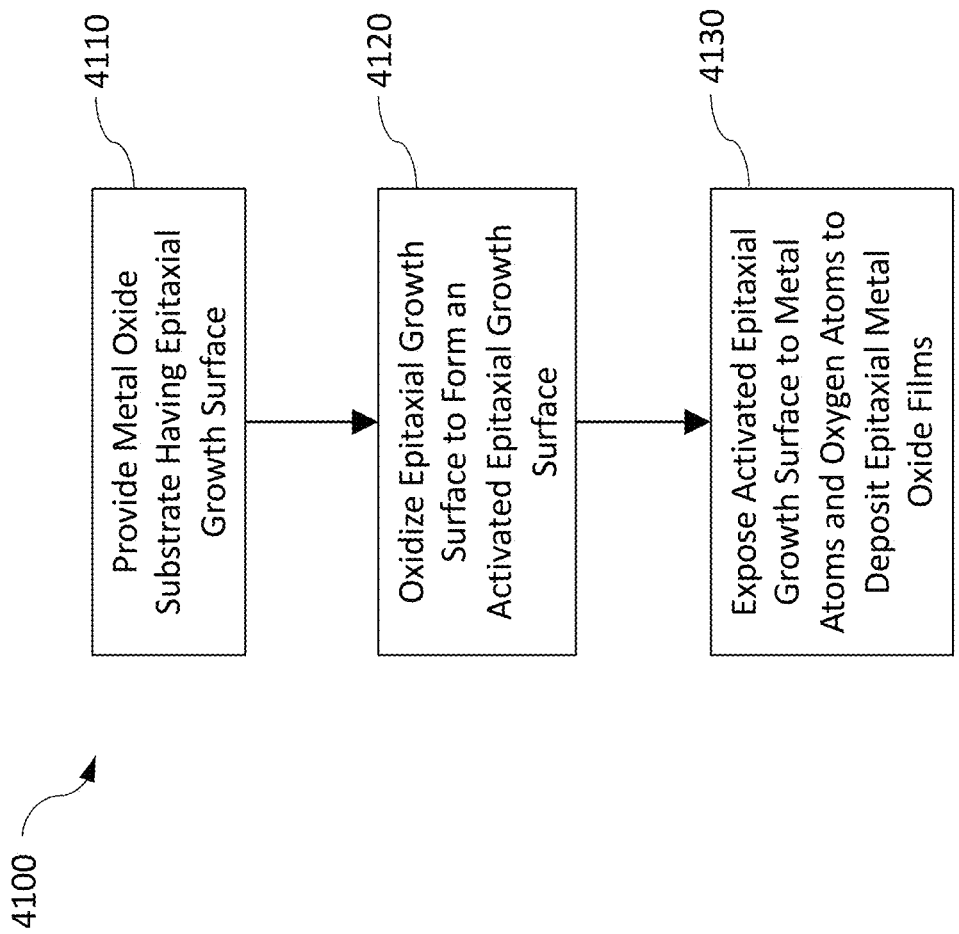
Figure 42:
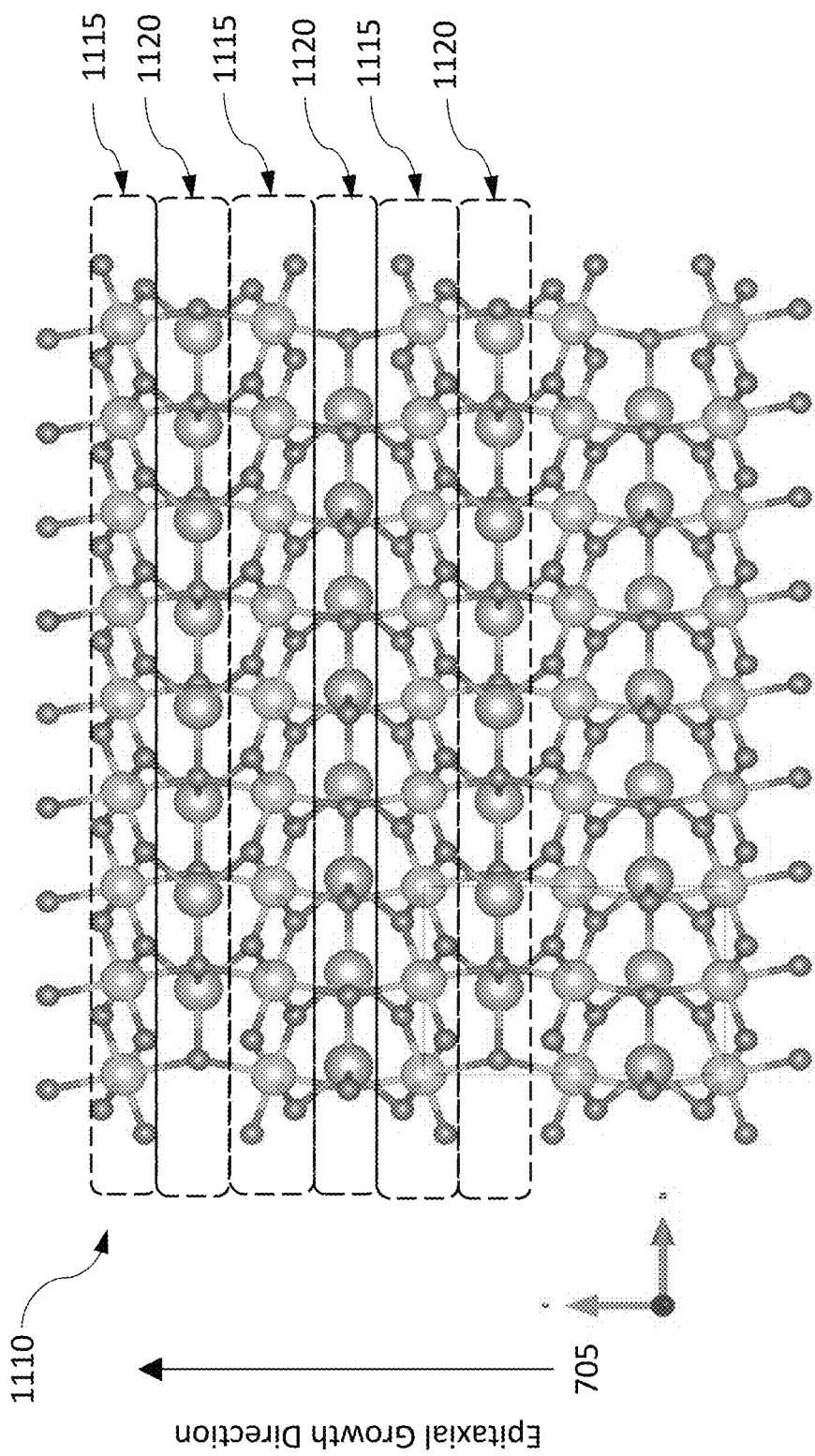
Figure 44A:
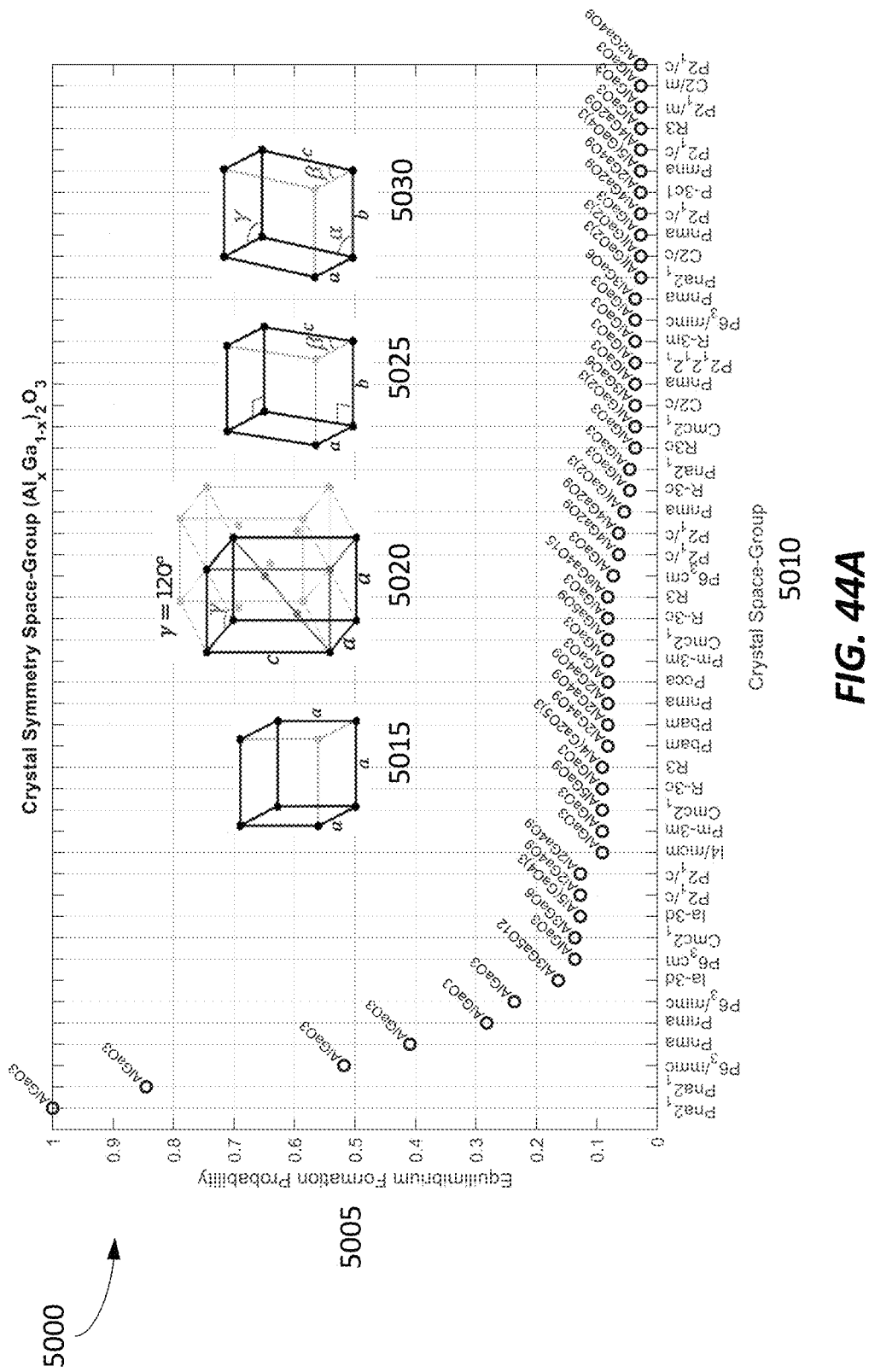
Figure 44B:
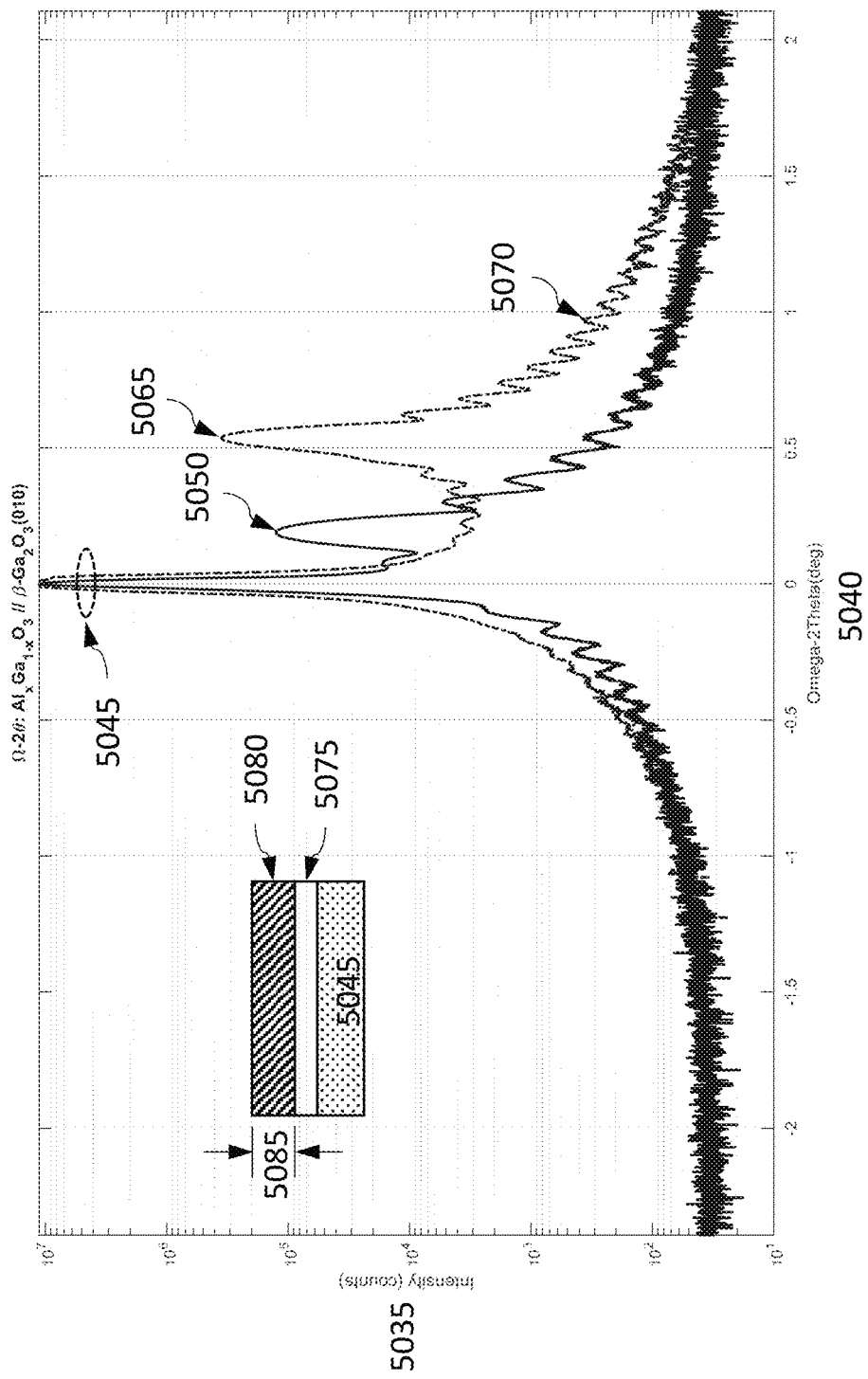
Figure 44C:
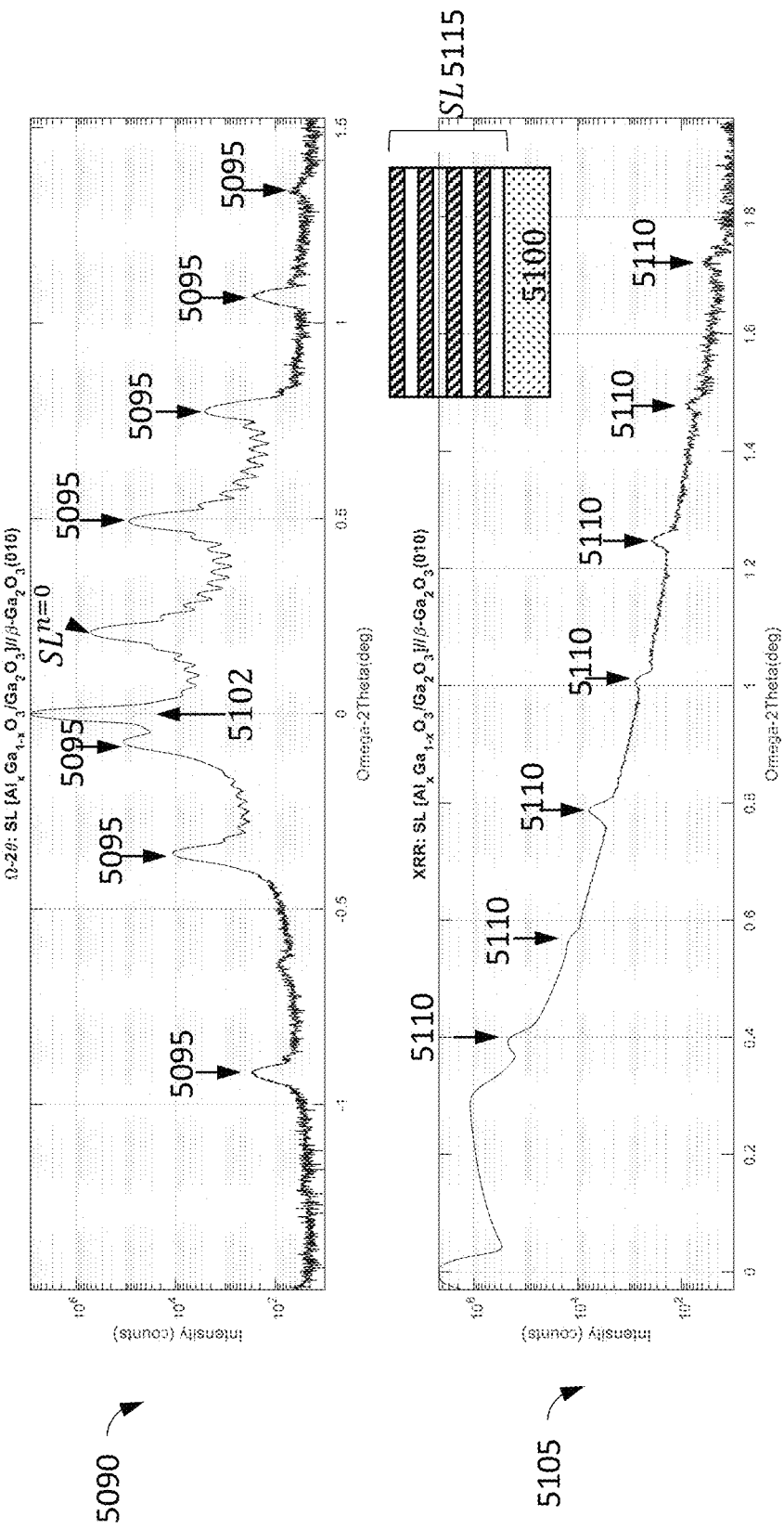
Figure 44D:
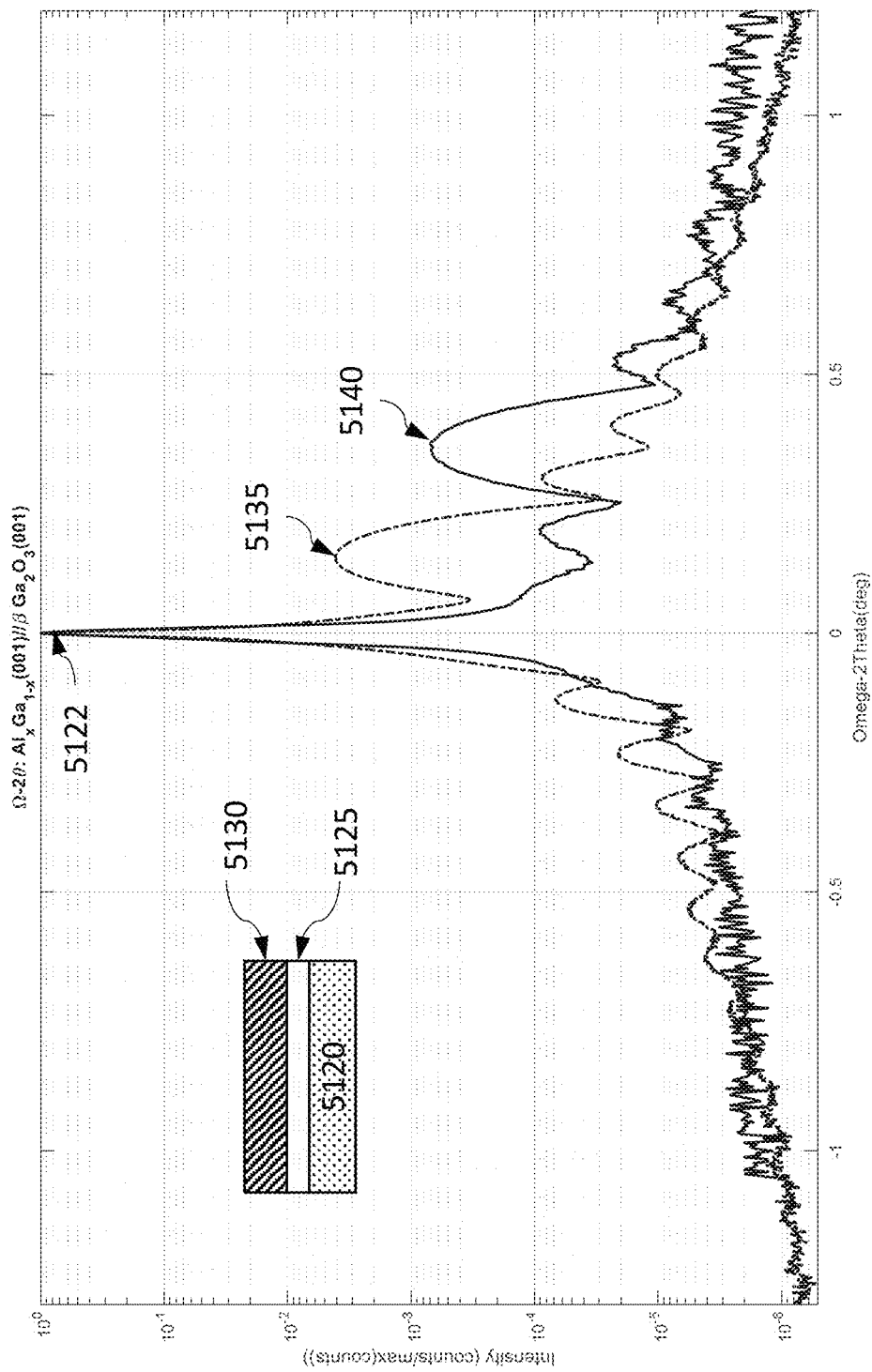
Figure 44E:
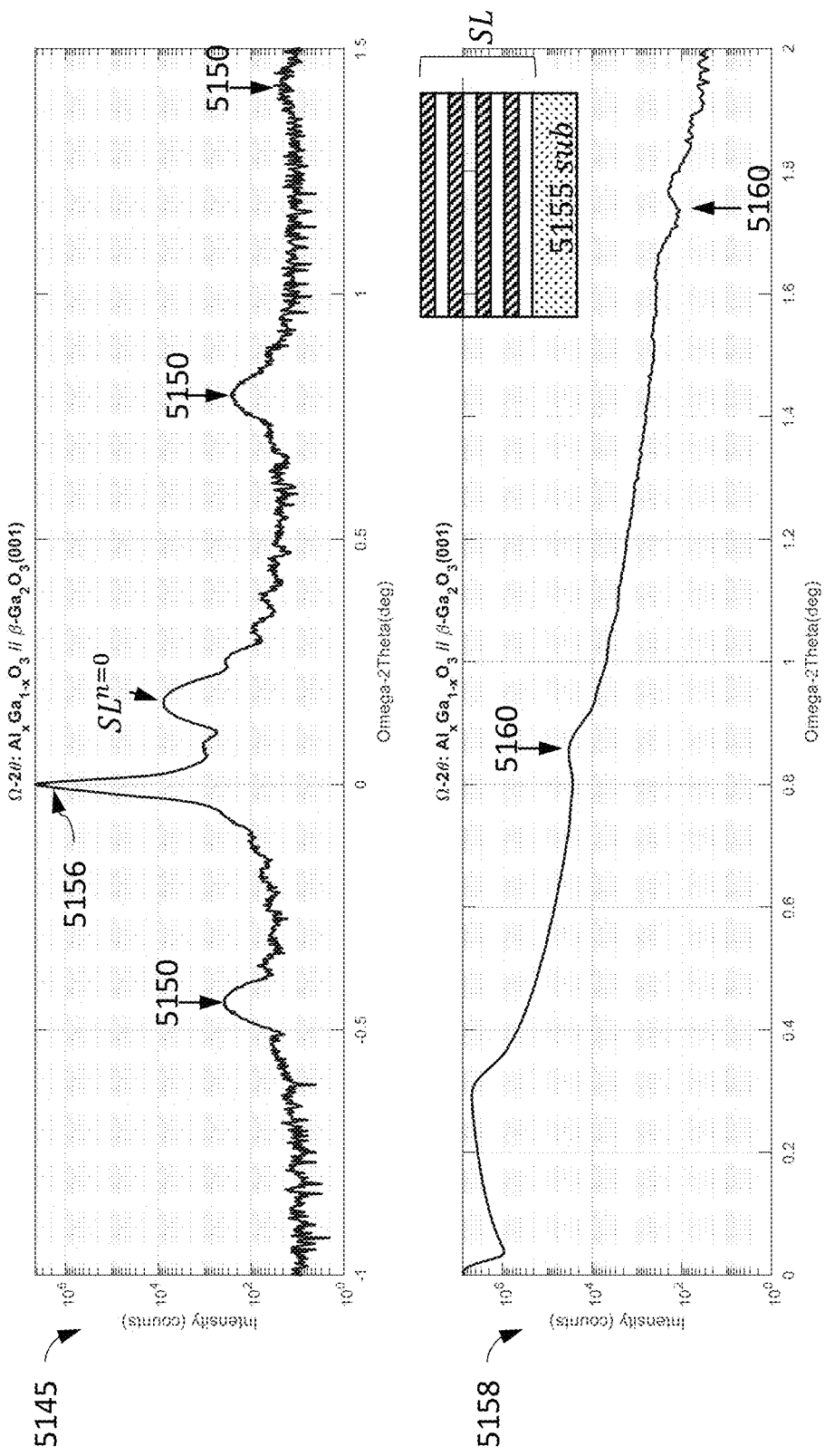
Figure 44F:
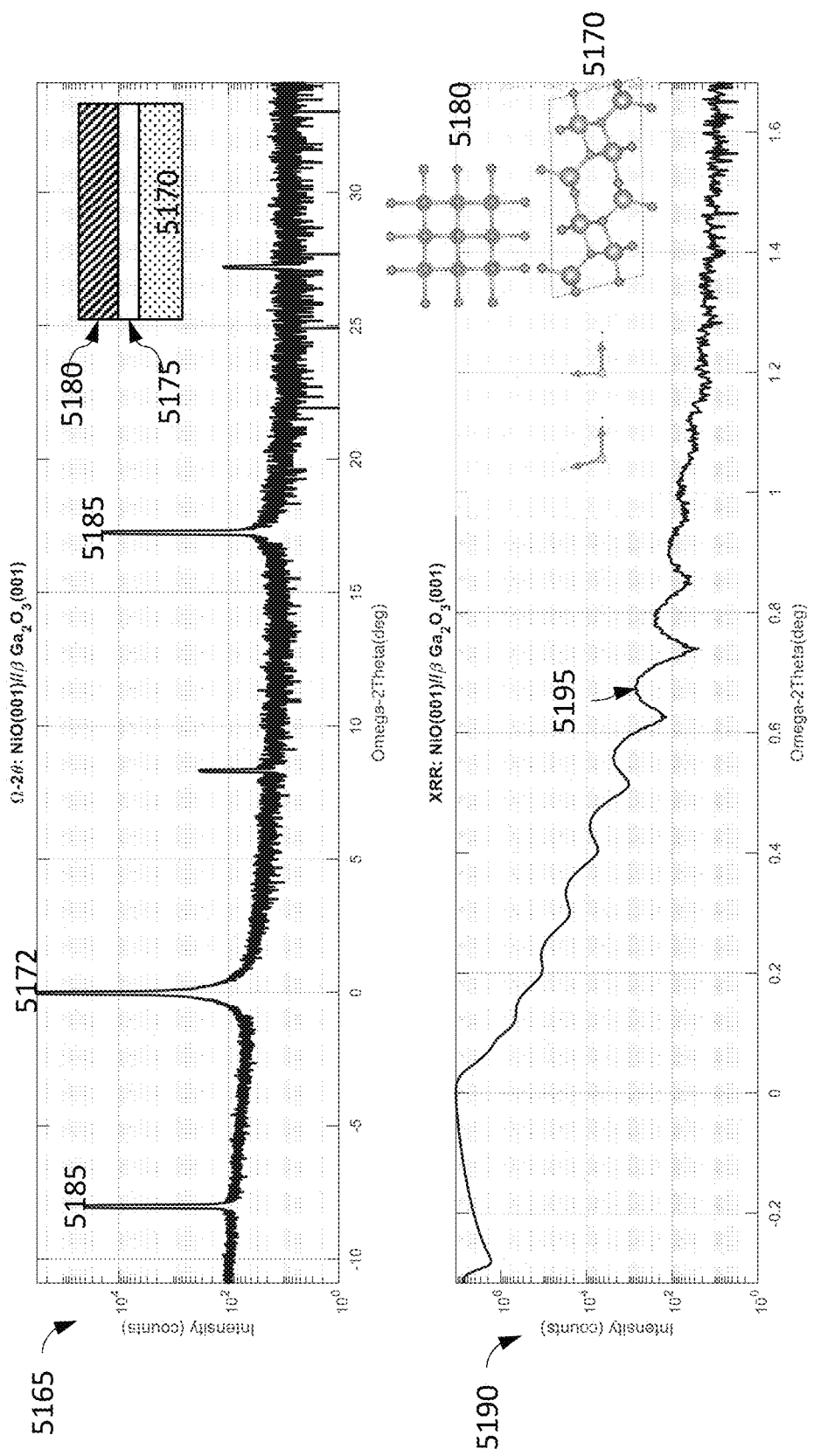
Figure 44G:
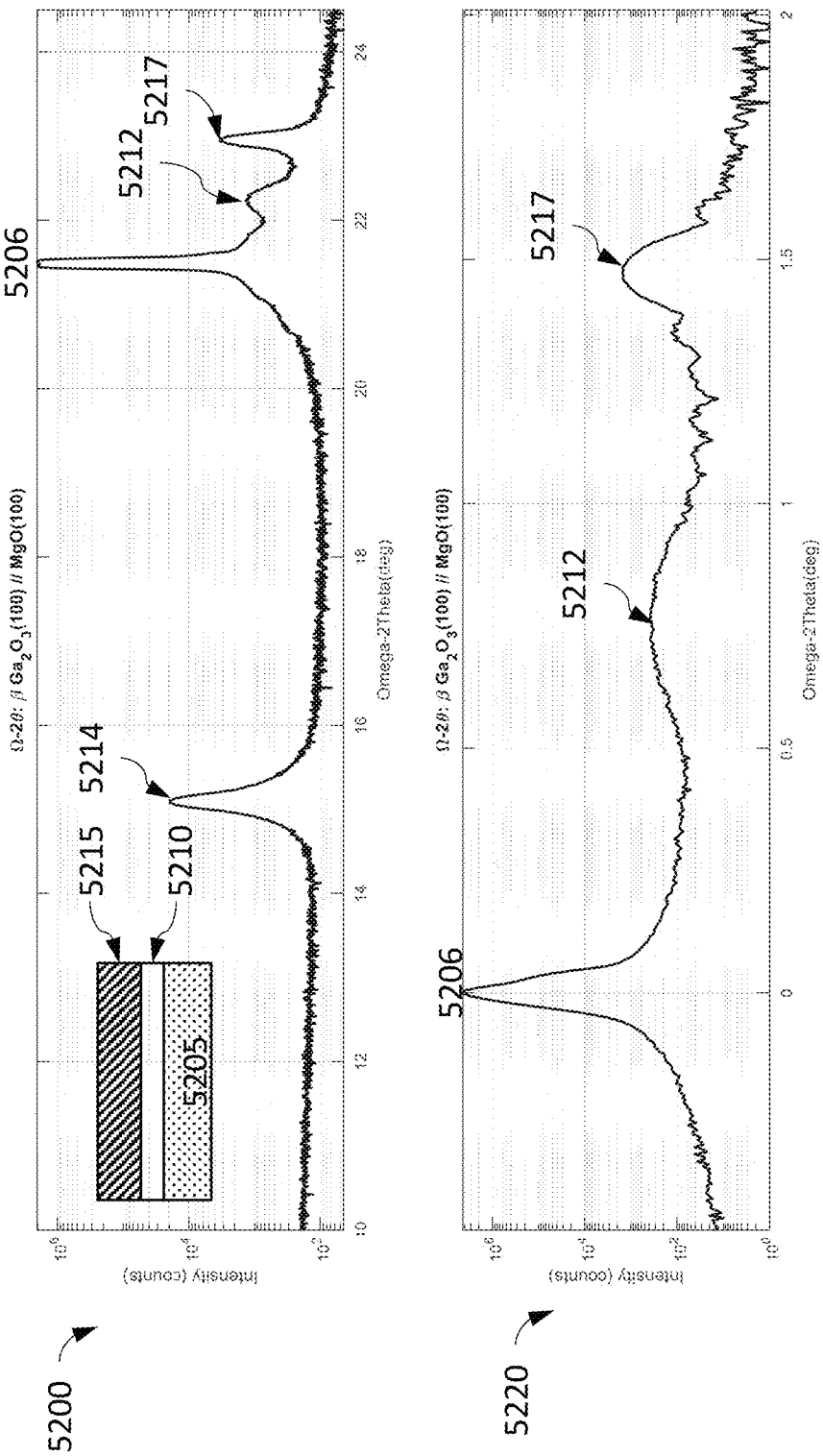
Figure 44H:
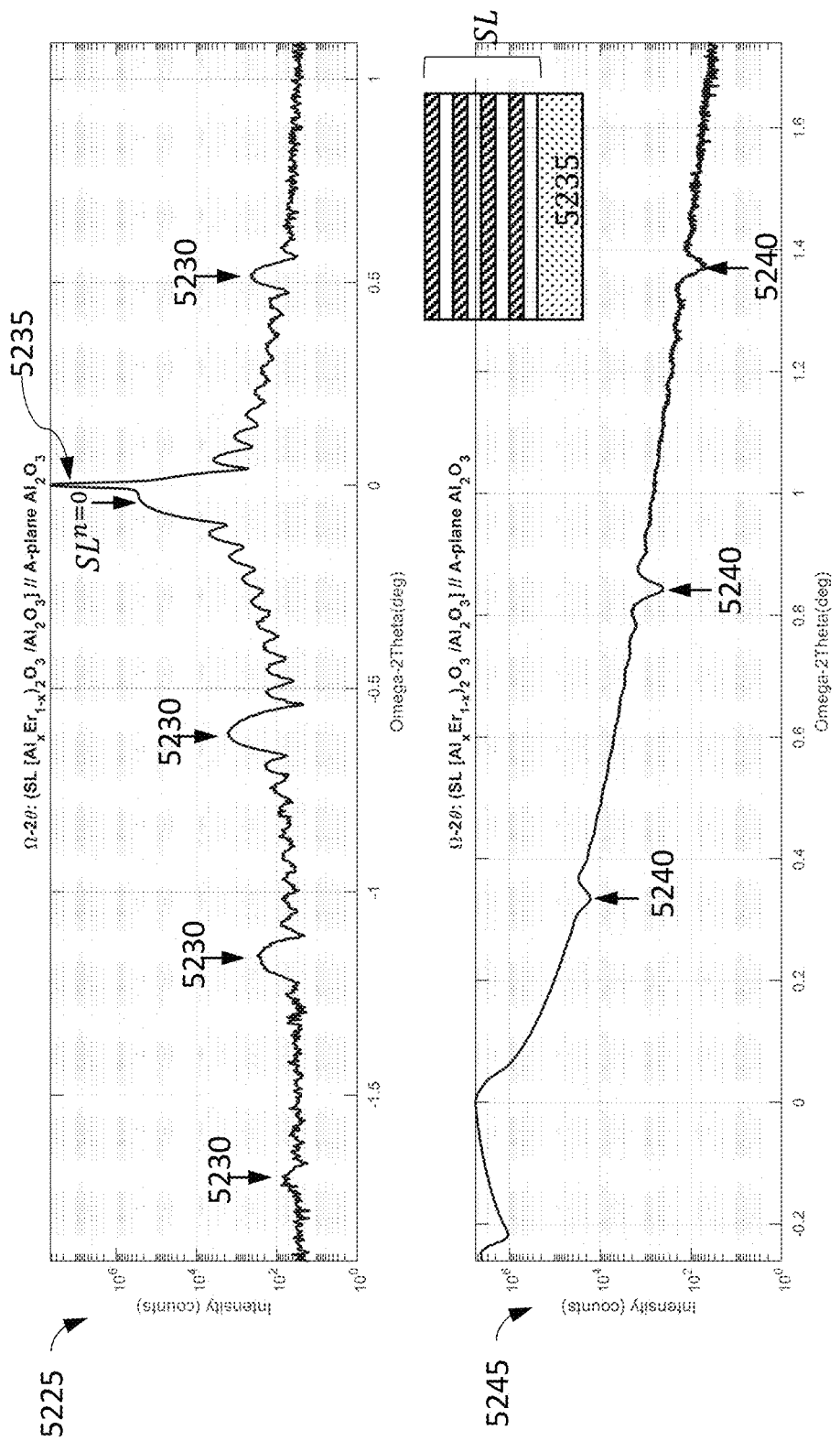
Figure 44I:
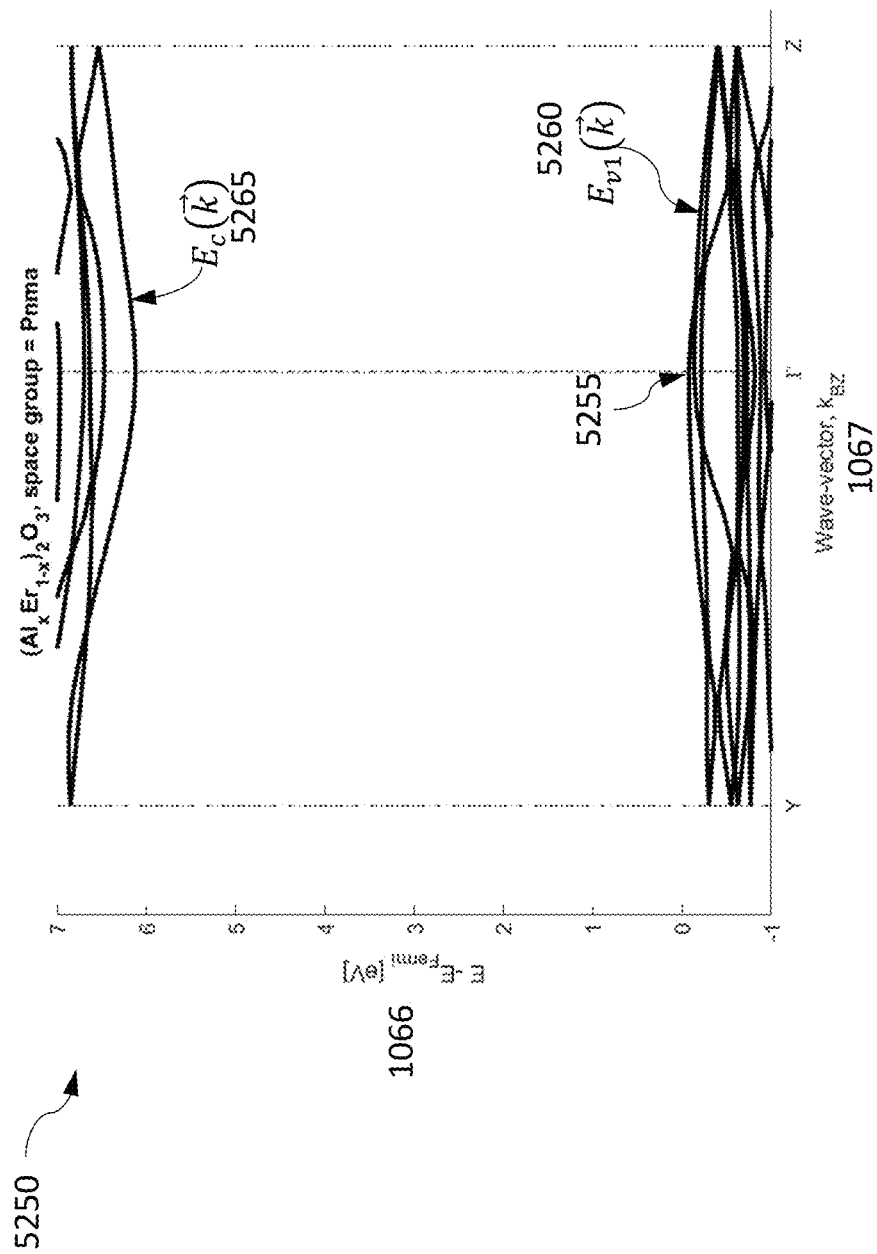
Figure 44J:
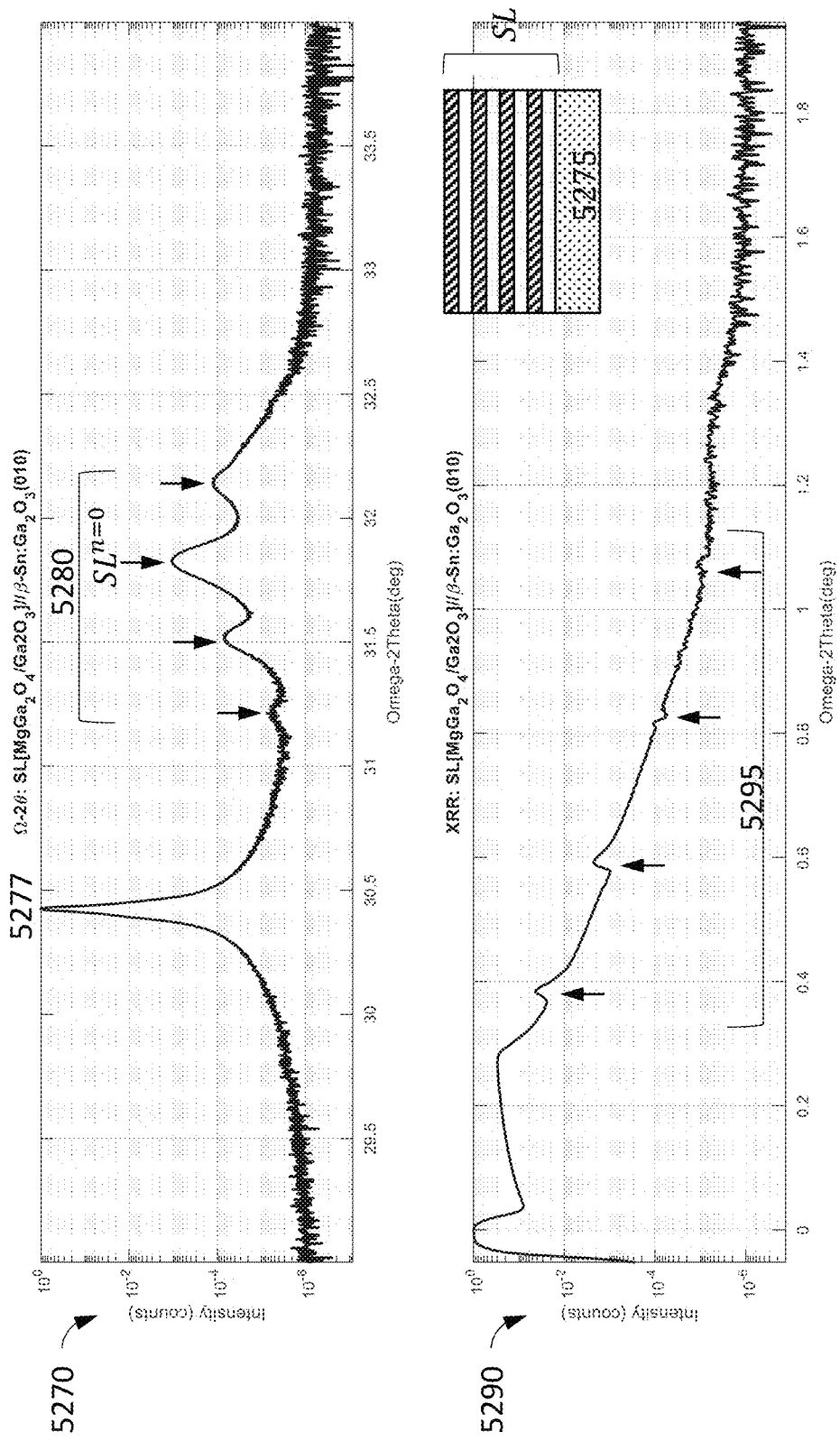
Figure 44K:
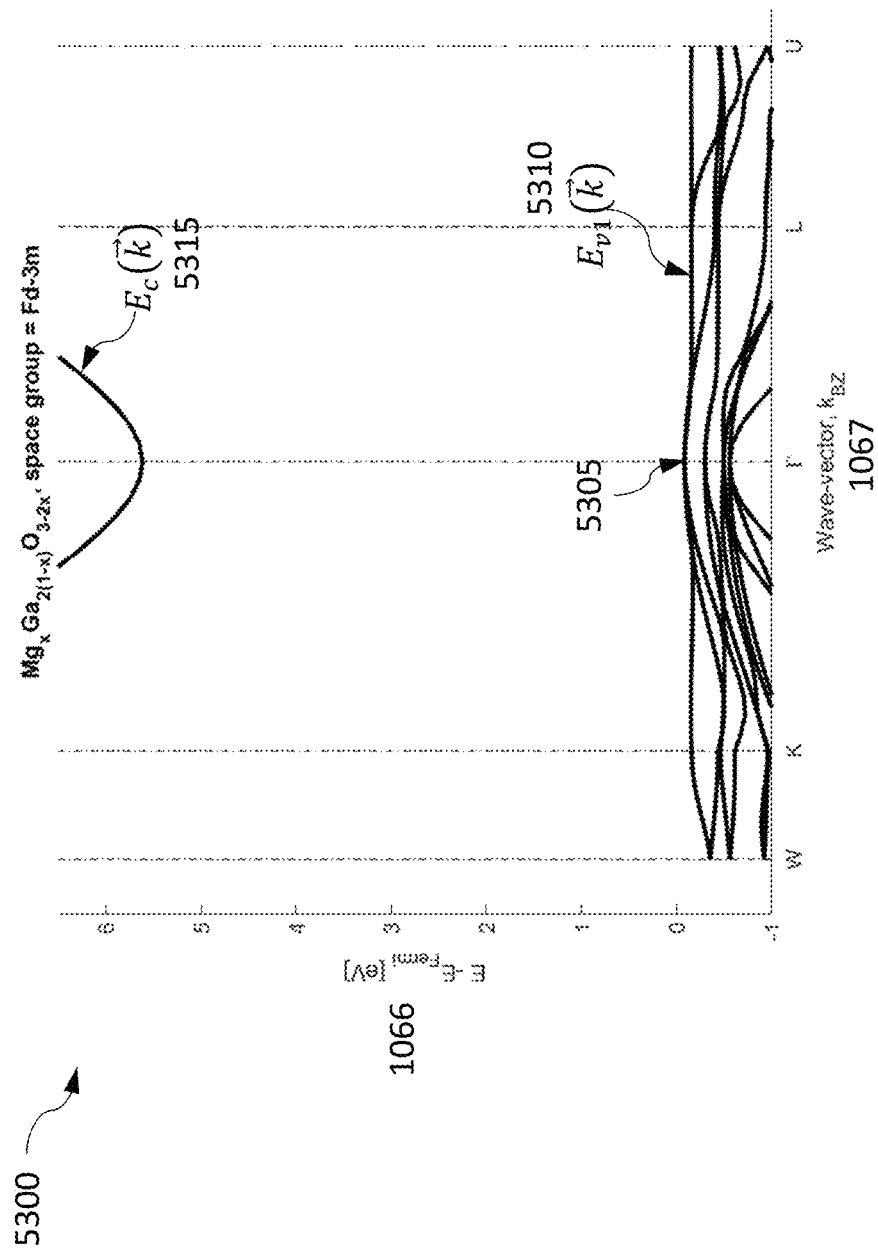
Figure 44L:
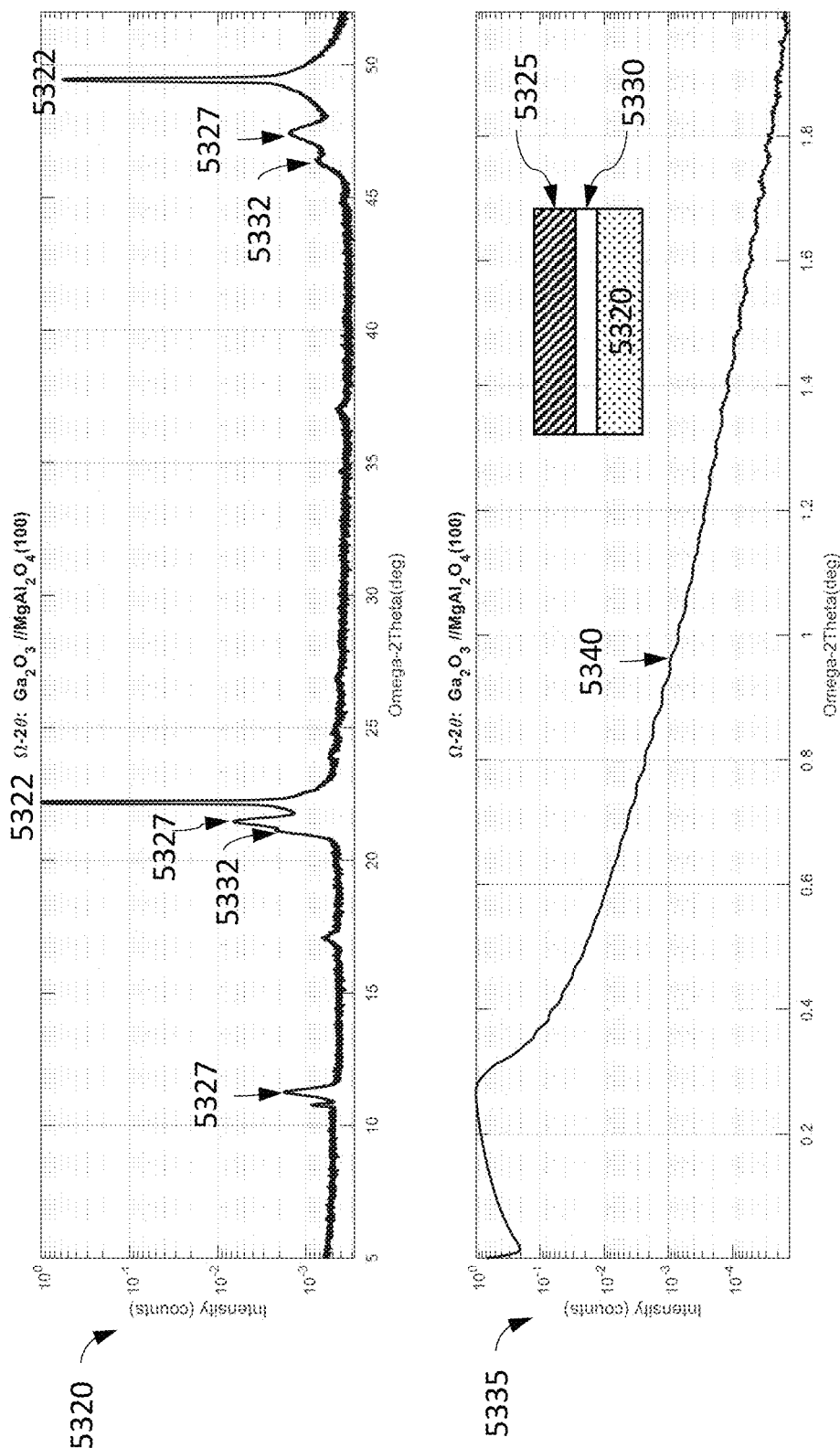
Figure 44M:
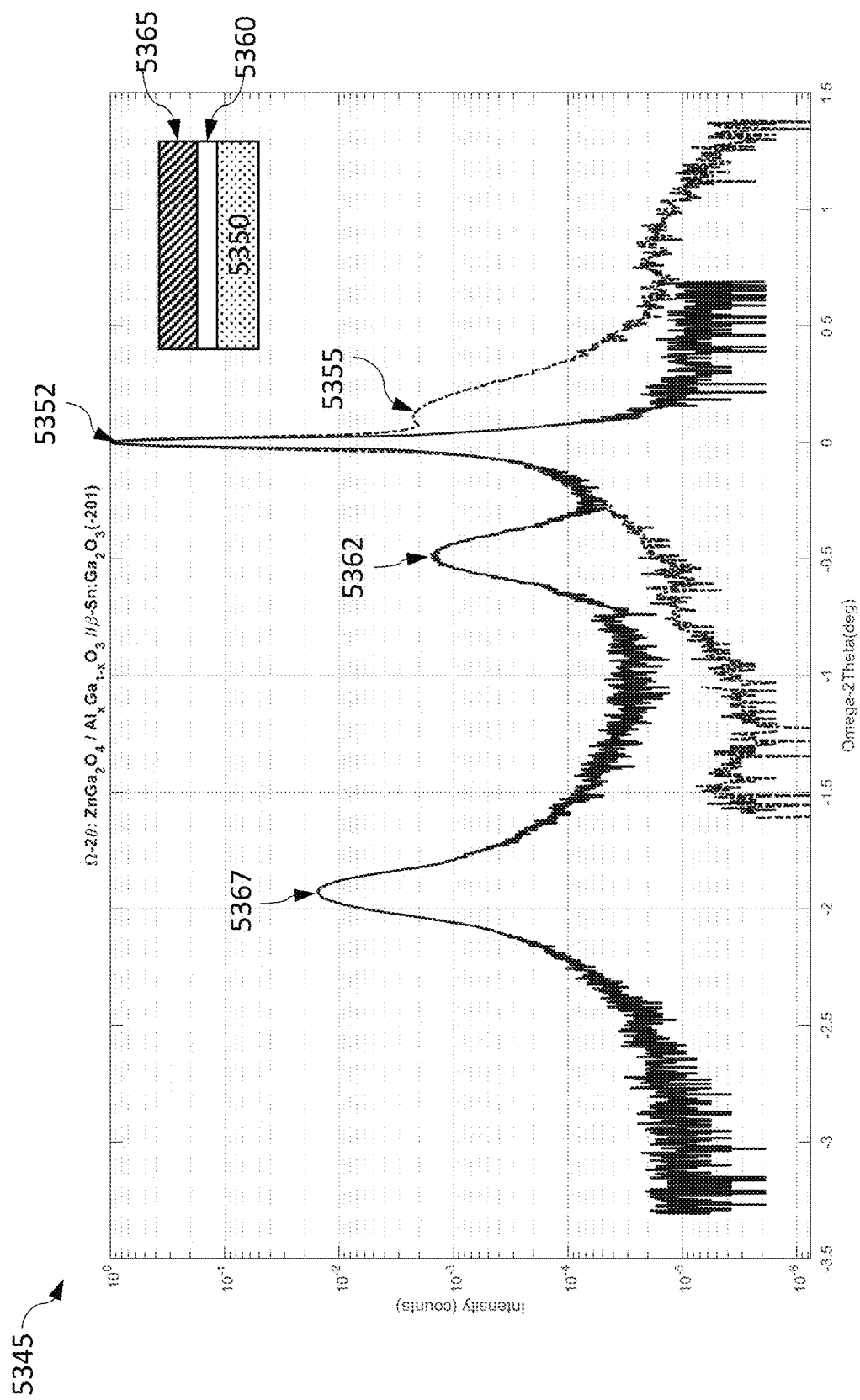
Figure 44N:
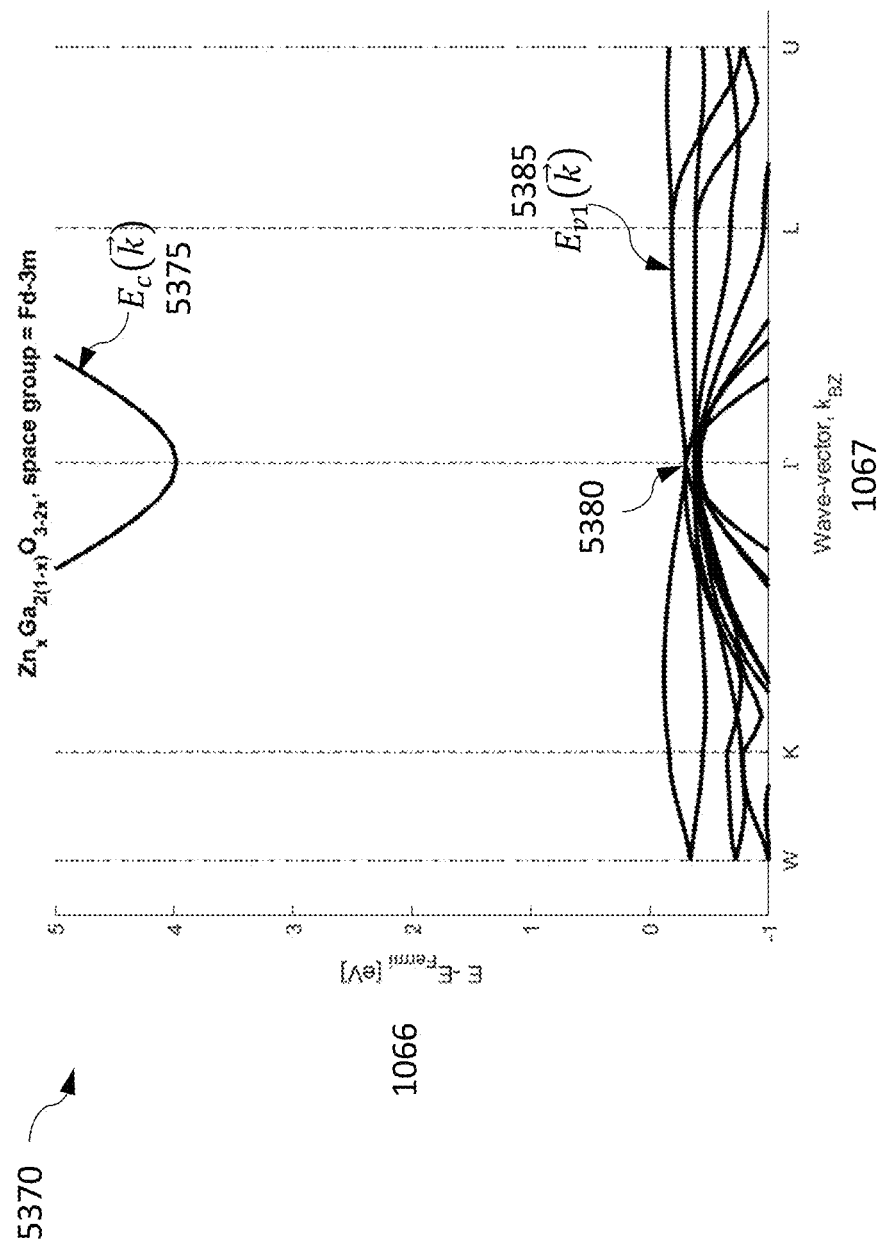
Figure 440:
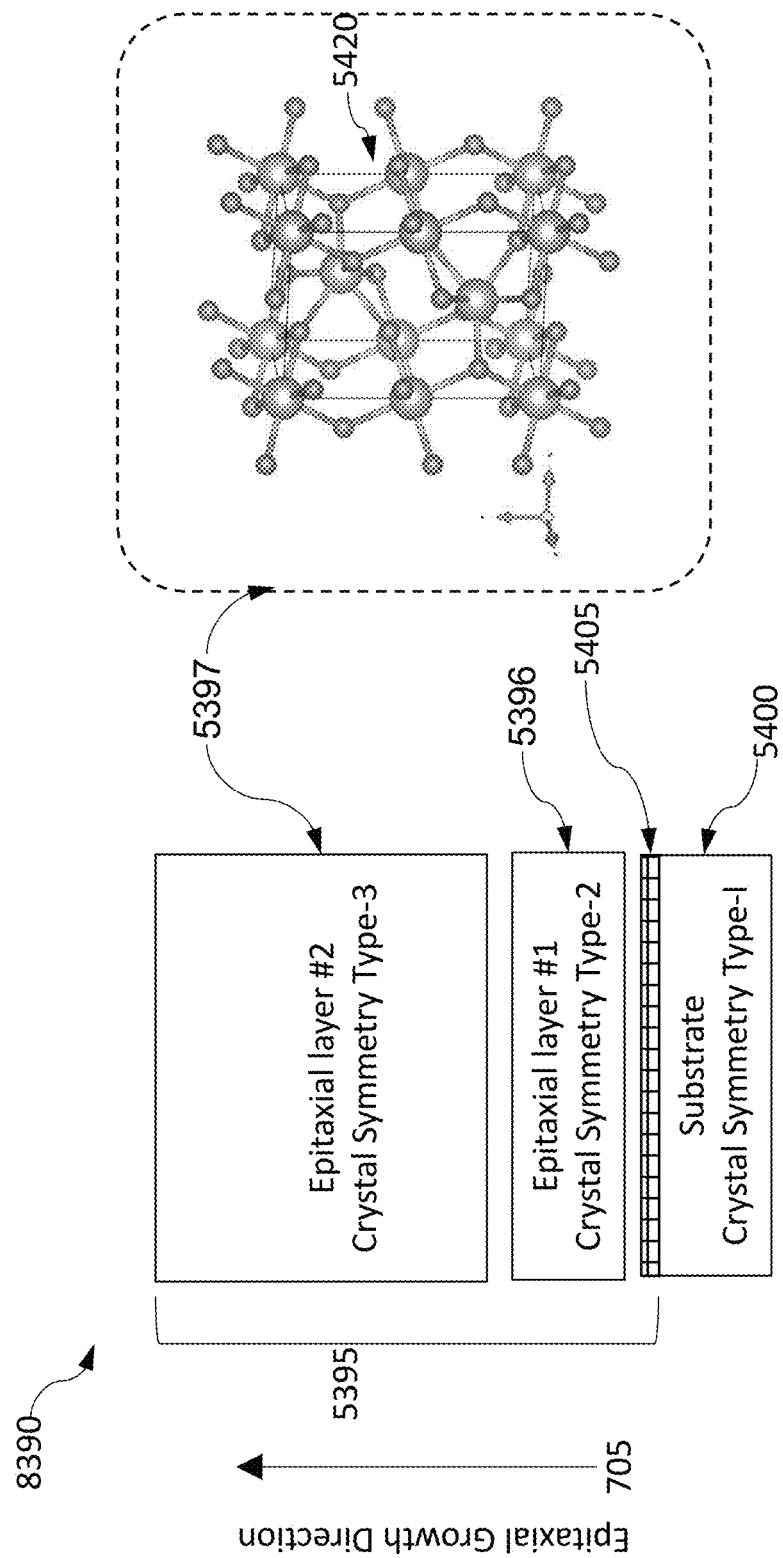
Figure 44P:
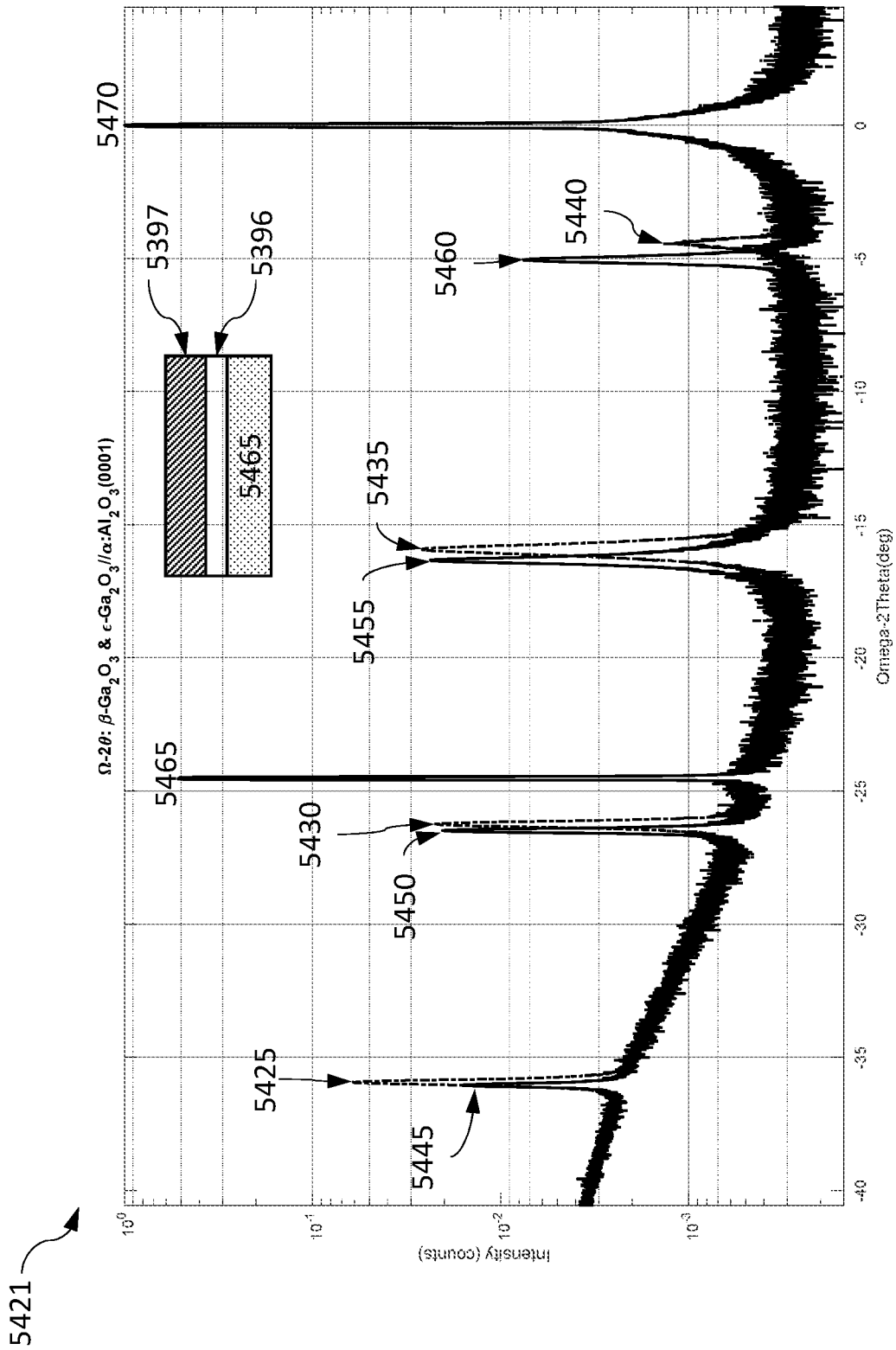
Figure 44Q:
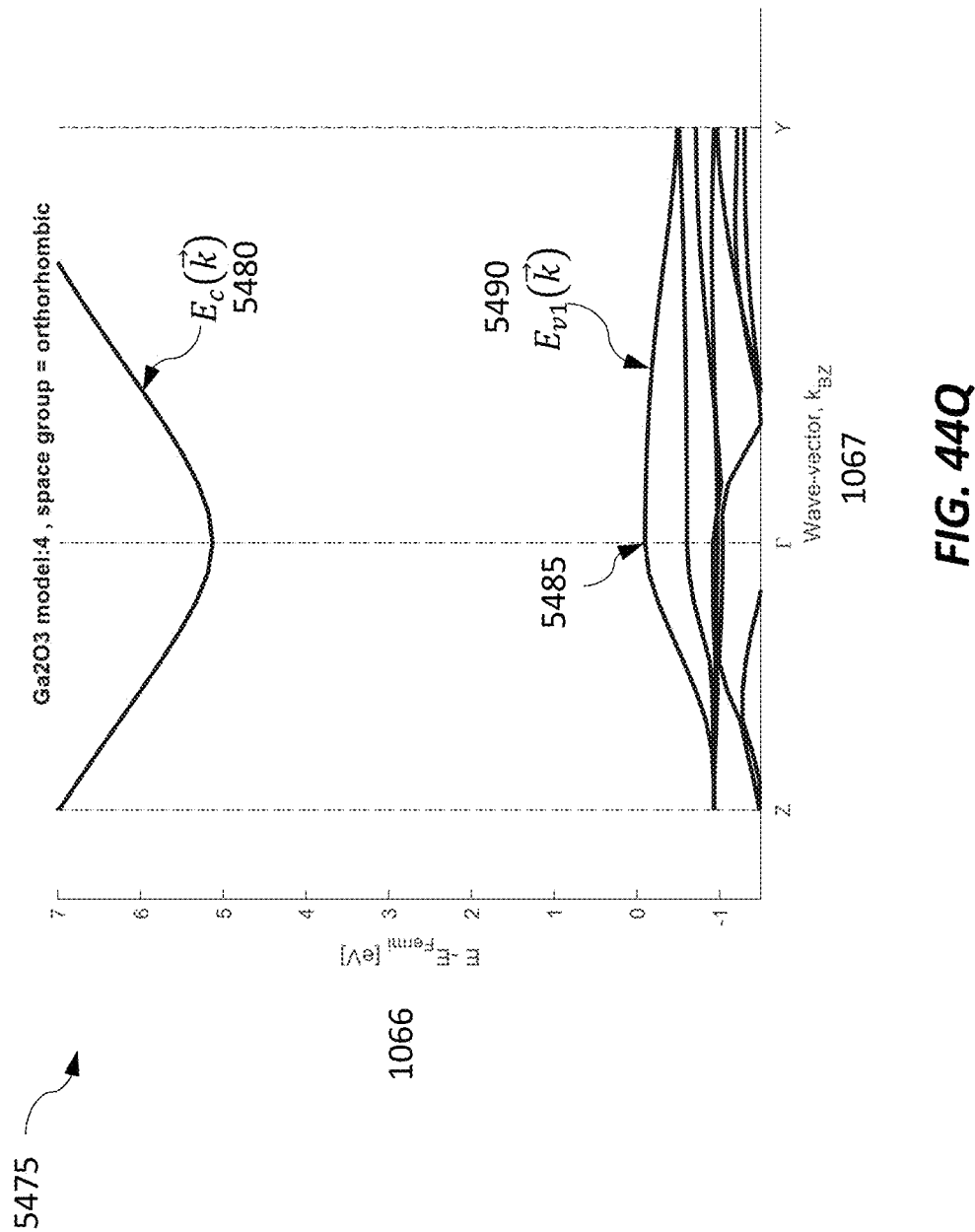
Figure 44R:
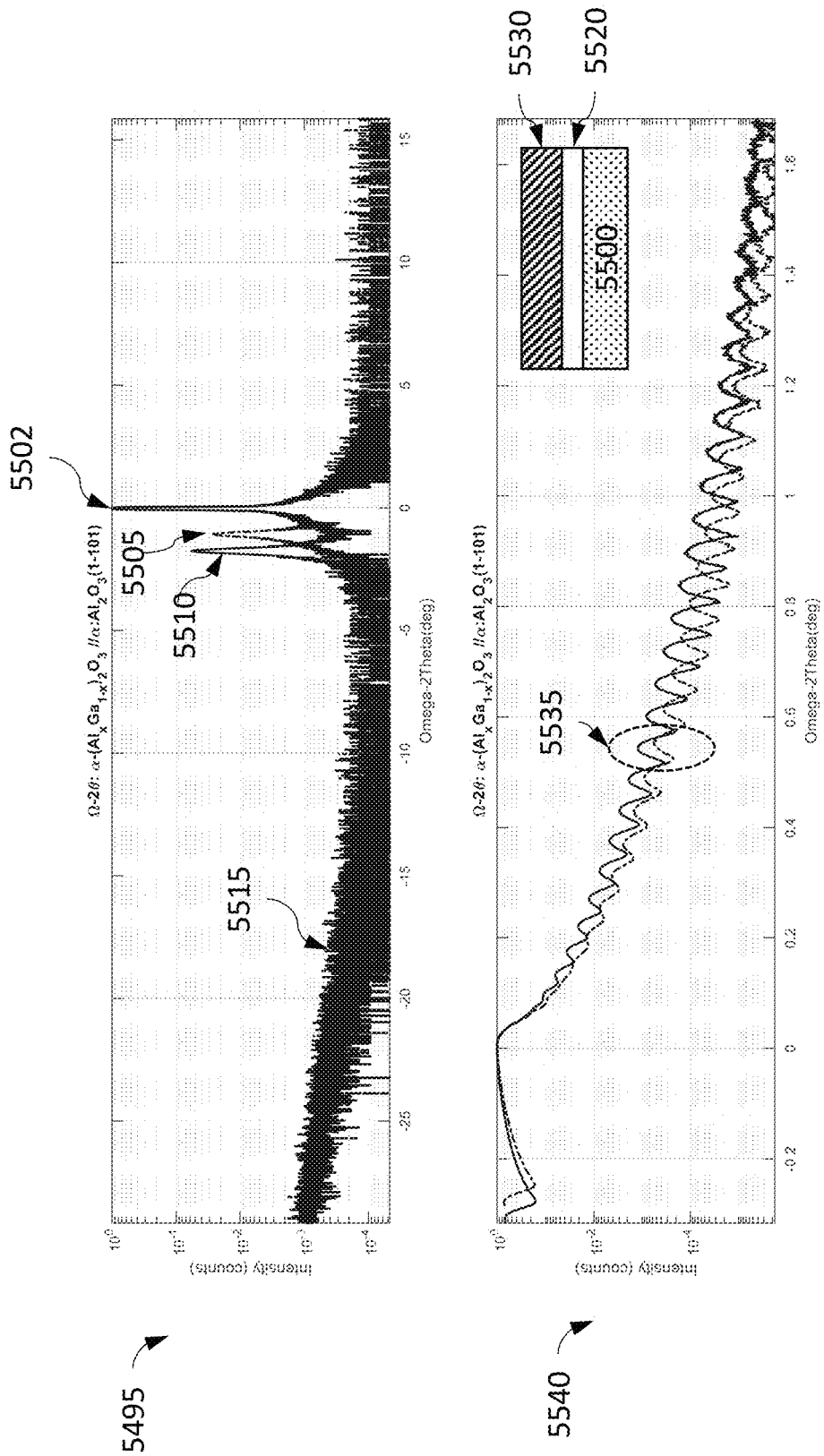
Figure 44S:
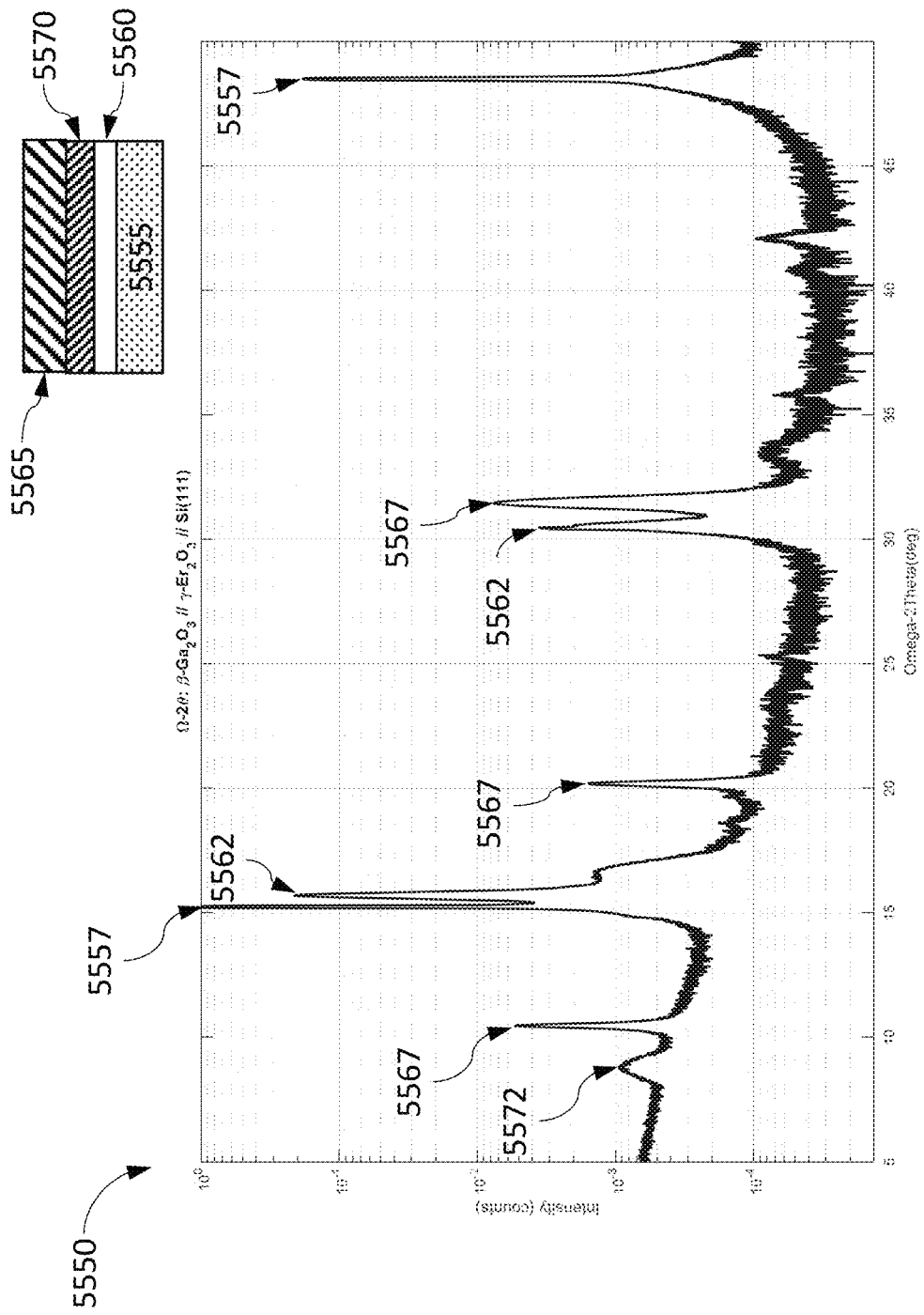
Figure 44T:
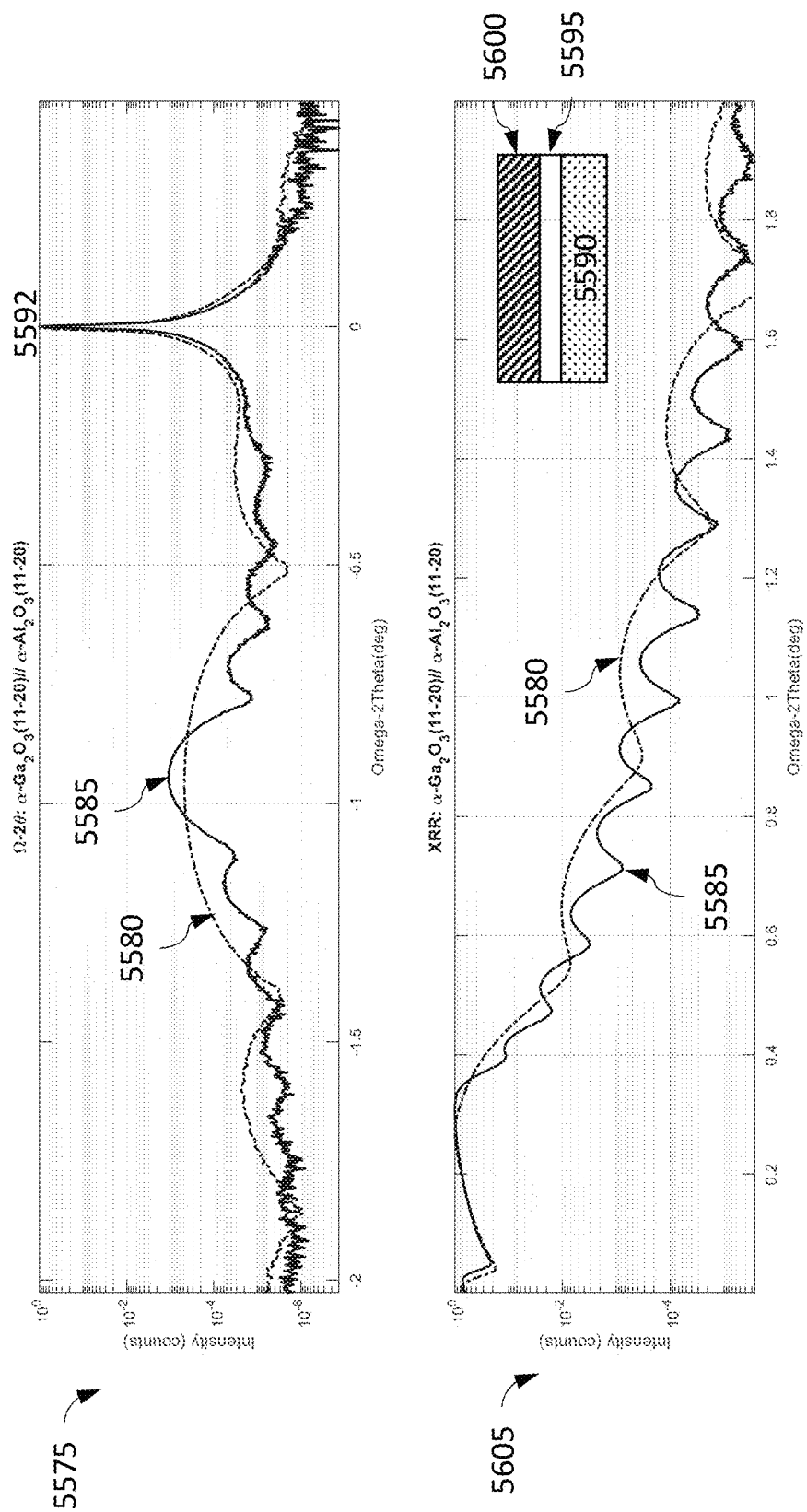
Figure 44U:
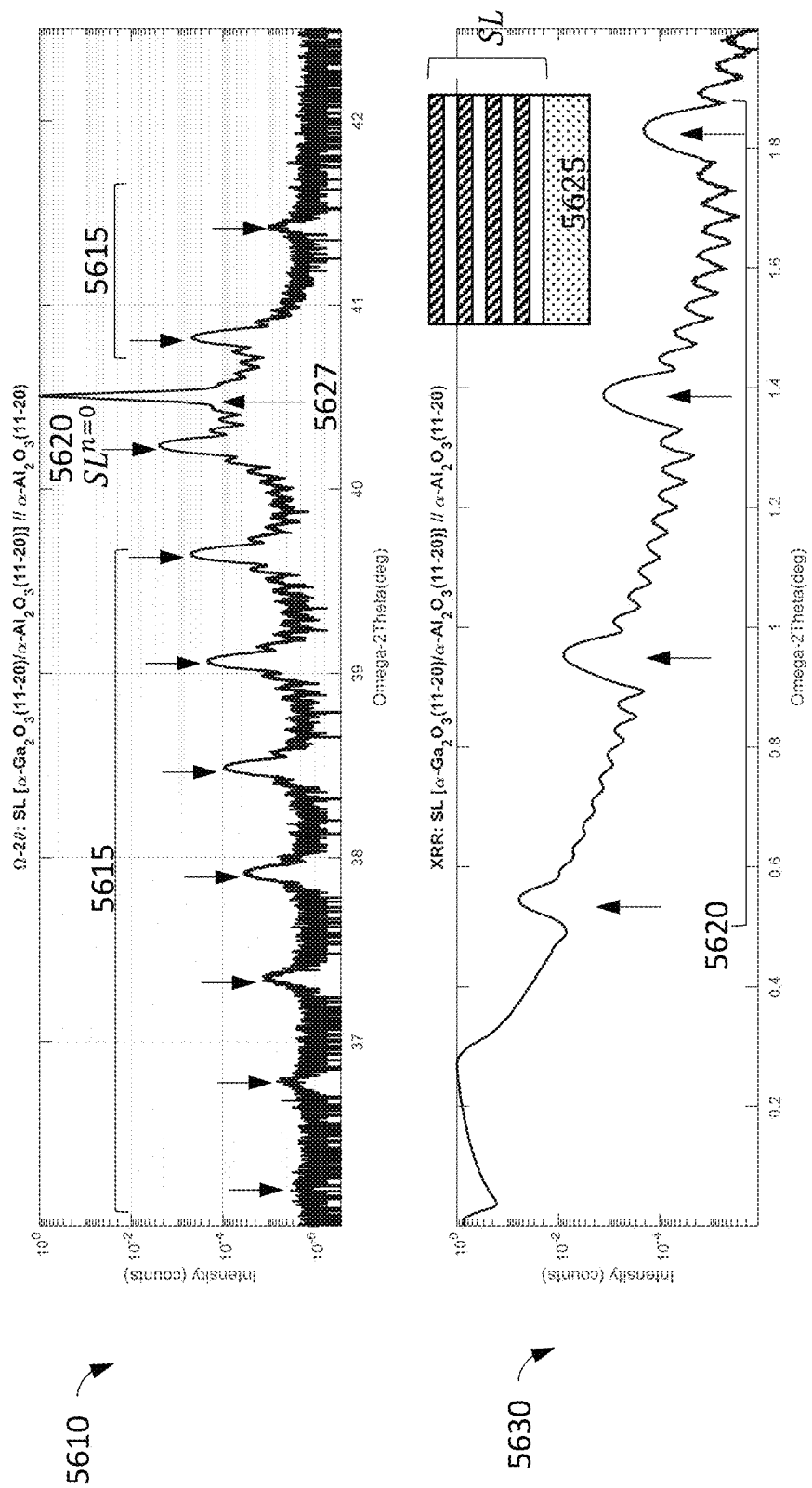
Figure 44V:
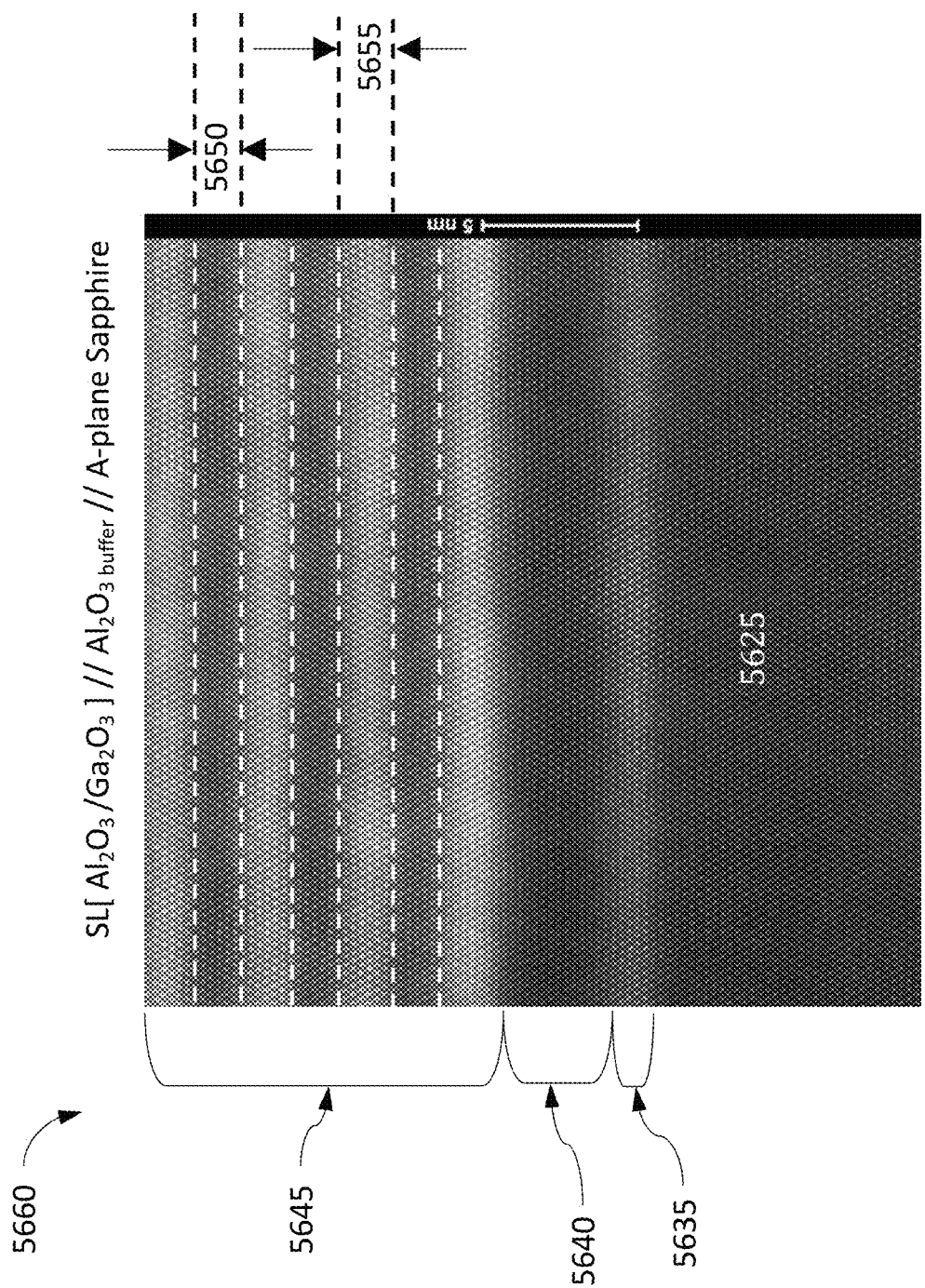
Figure 44W:
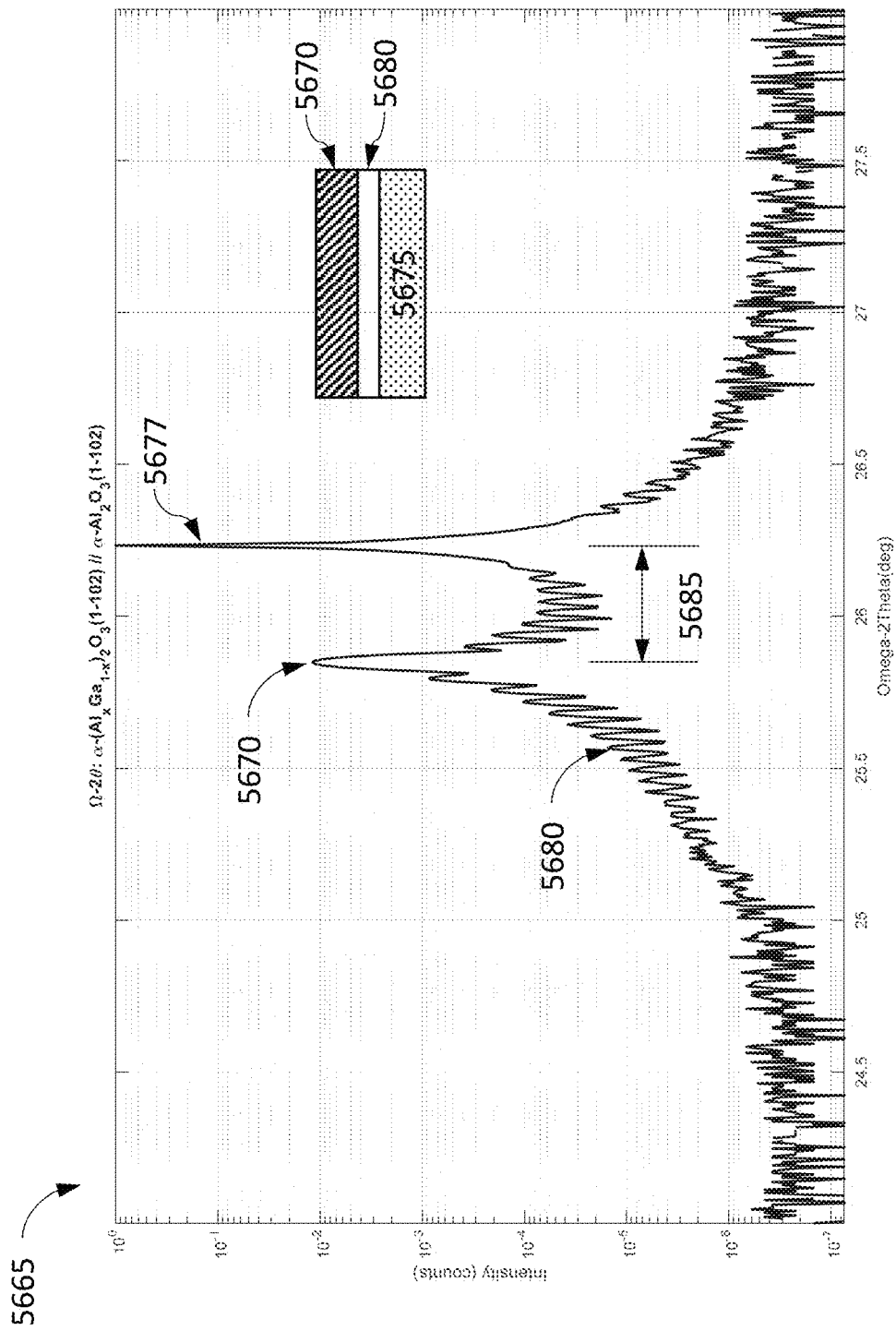
Figure 44X:
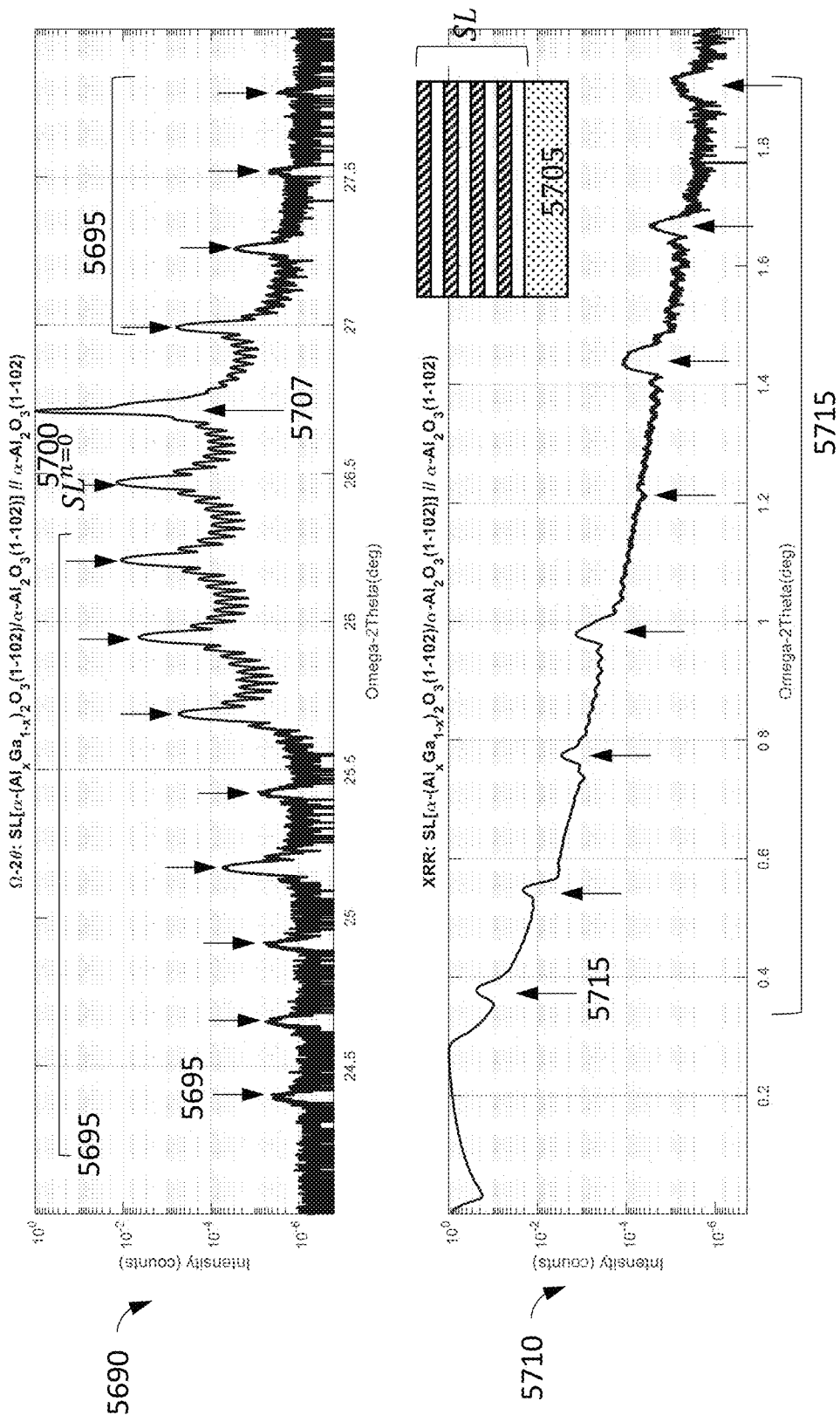
Figure 44Y:
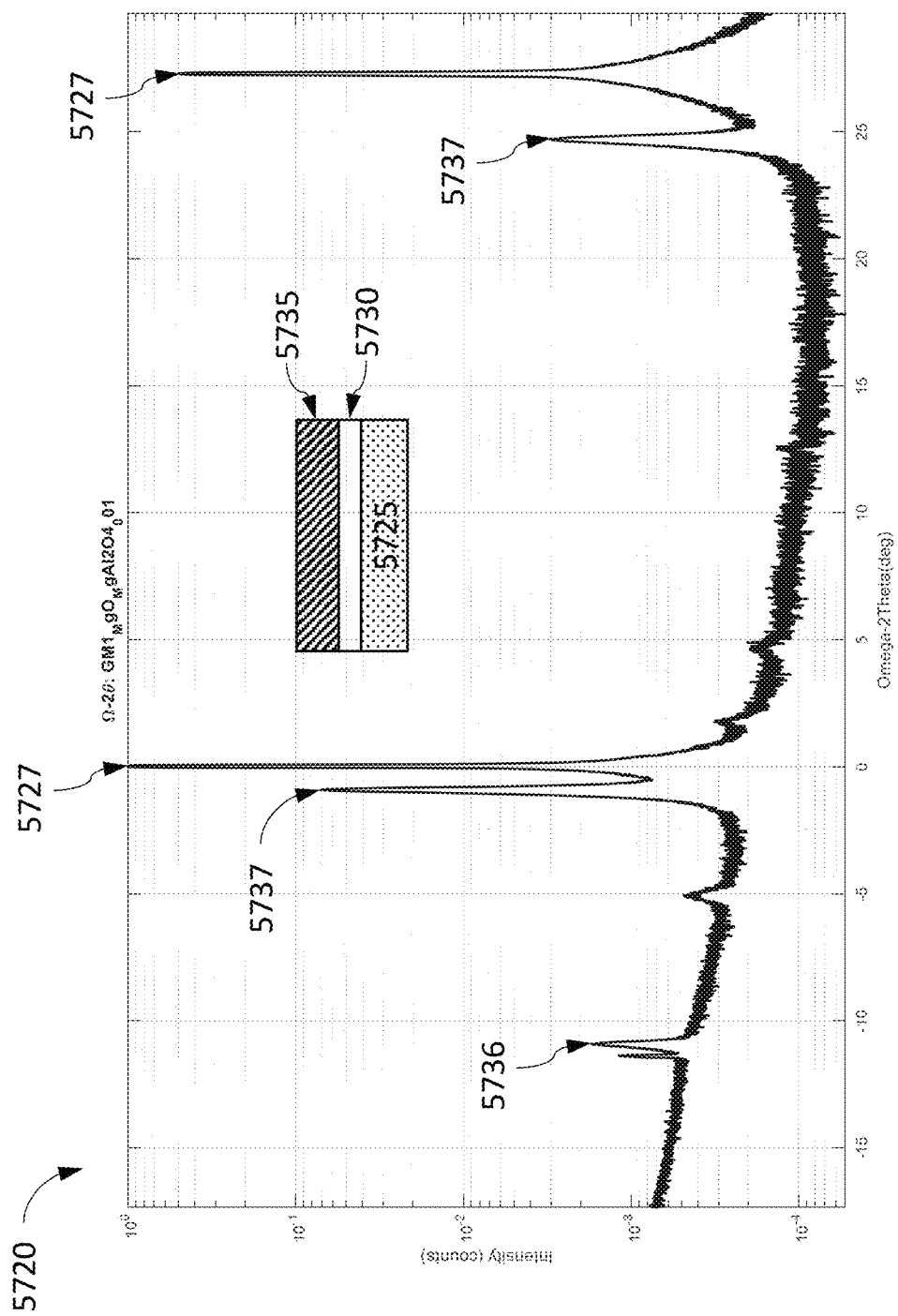
Figure 44Z:
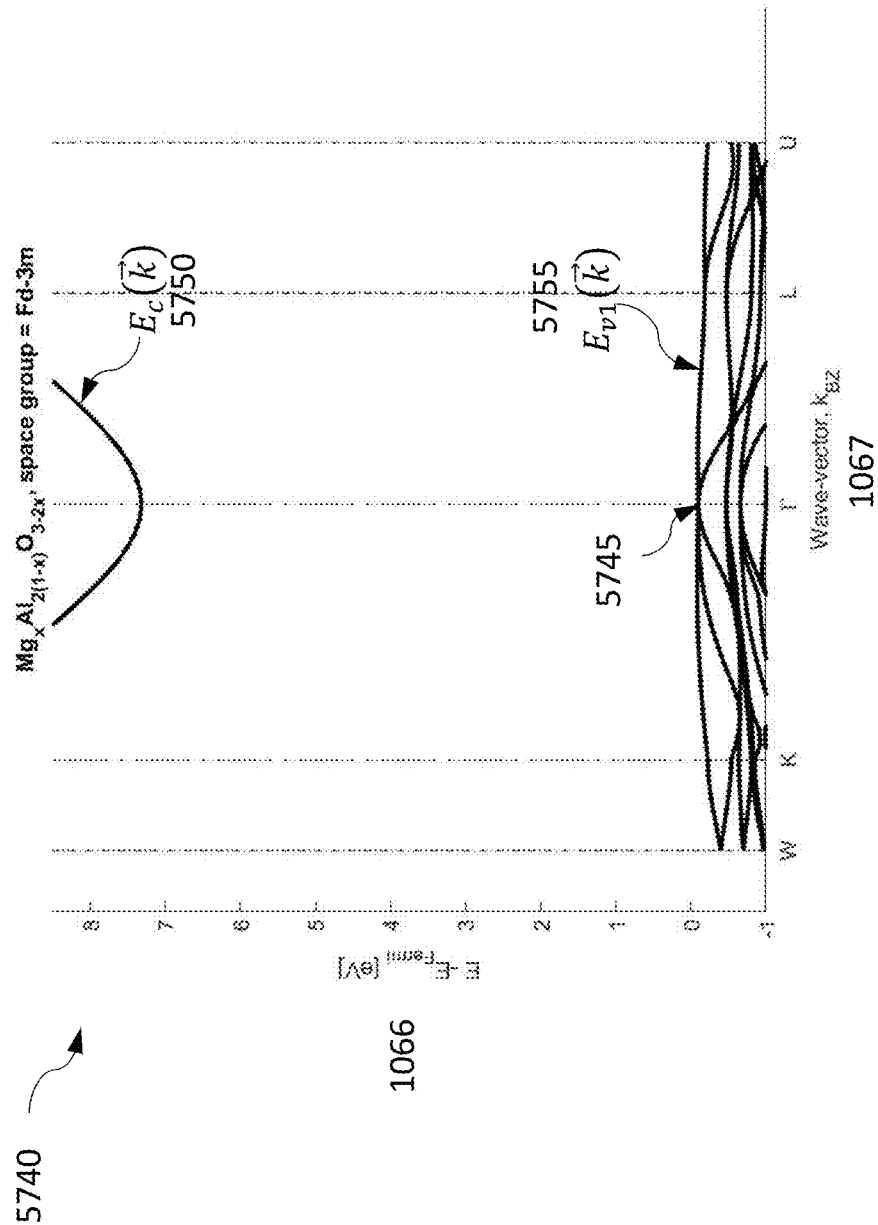
Figure 45:
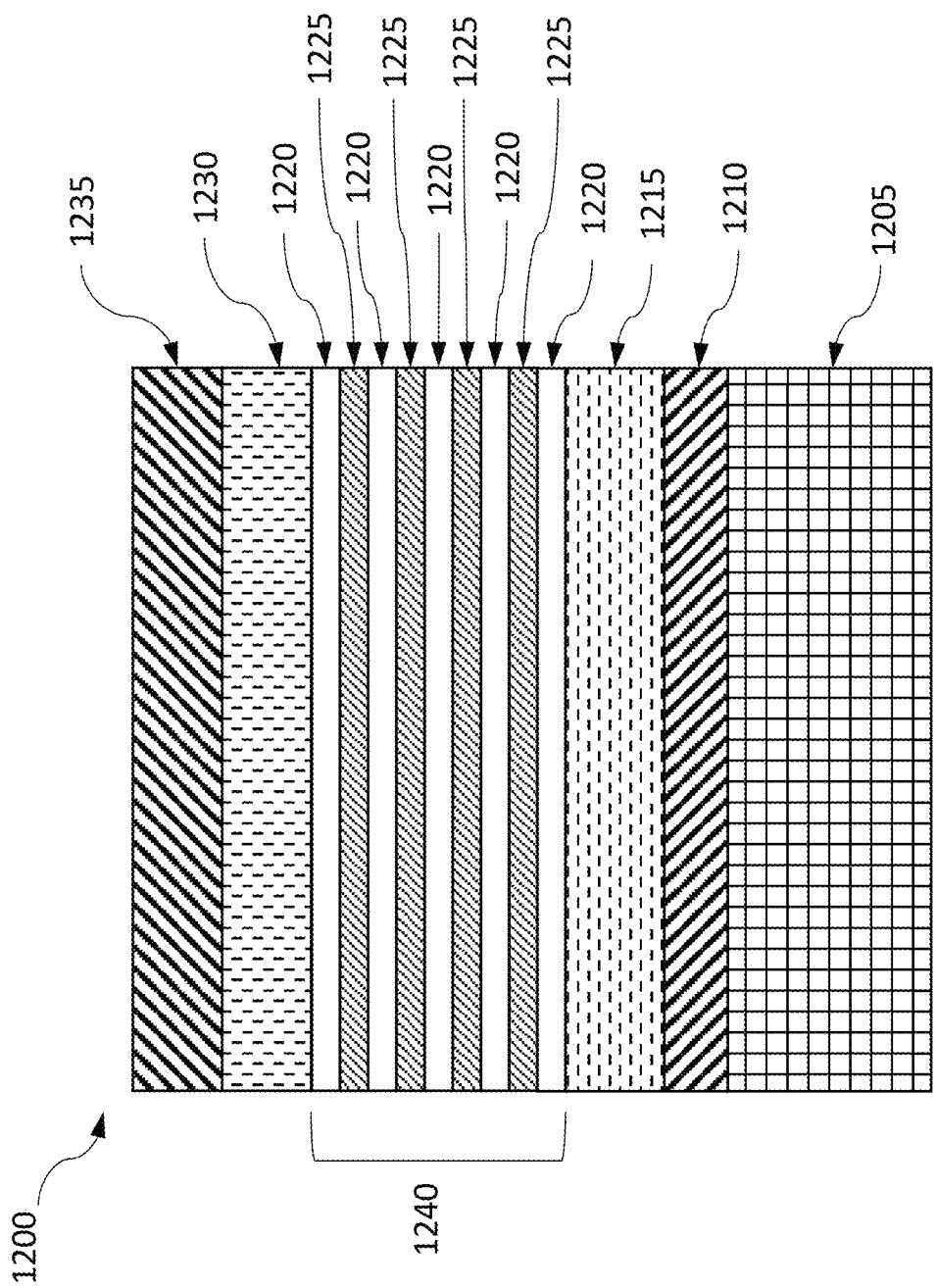
Figure 46:
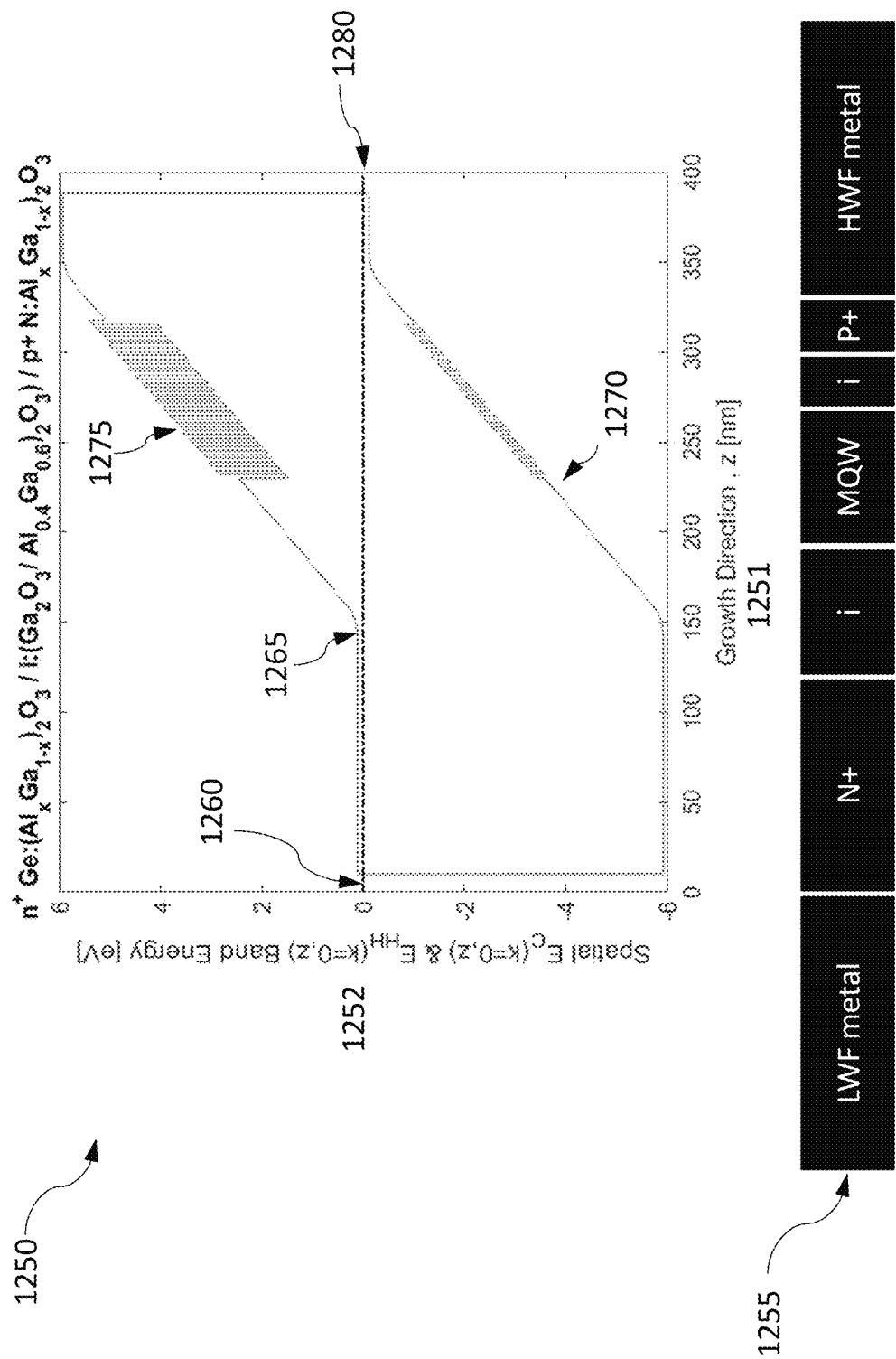
Figure 47:
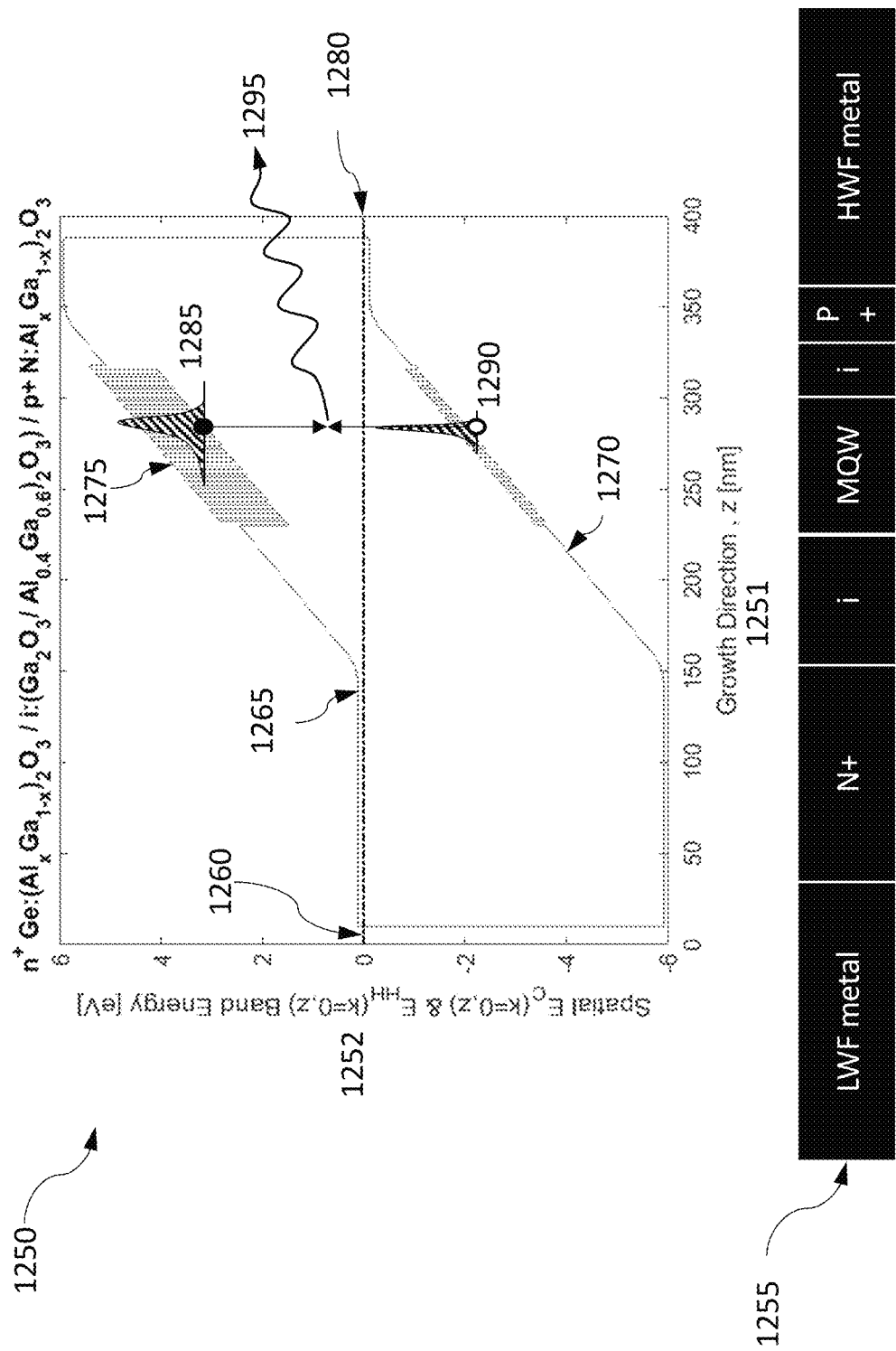
Figure 48:
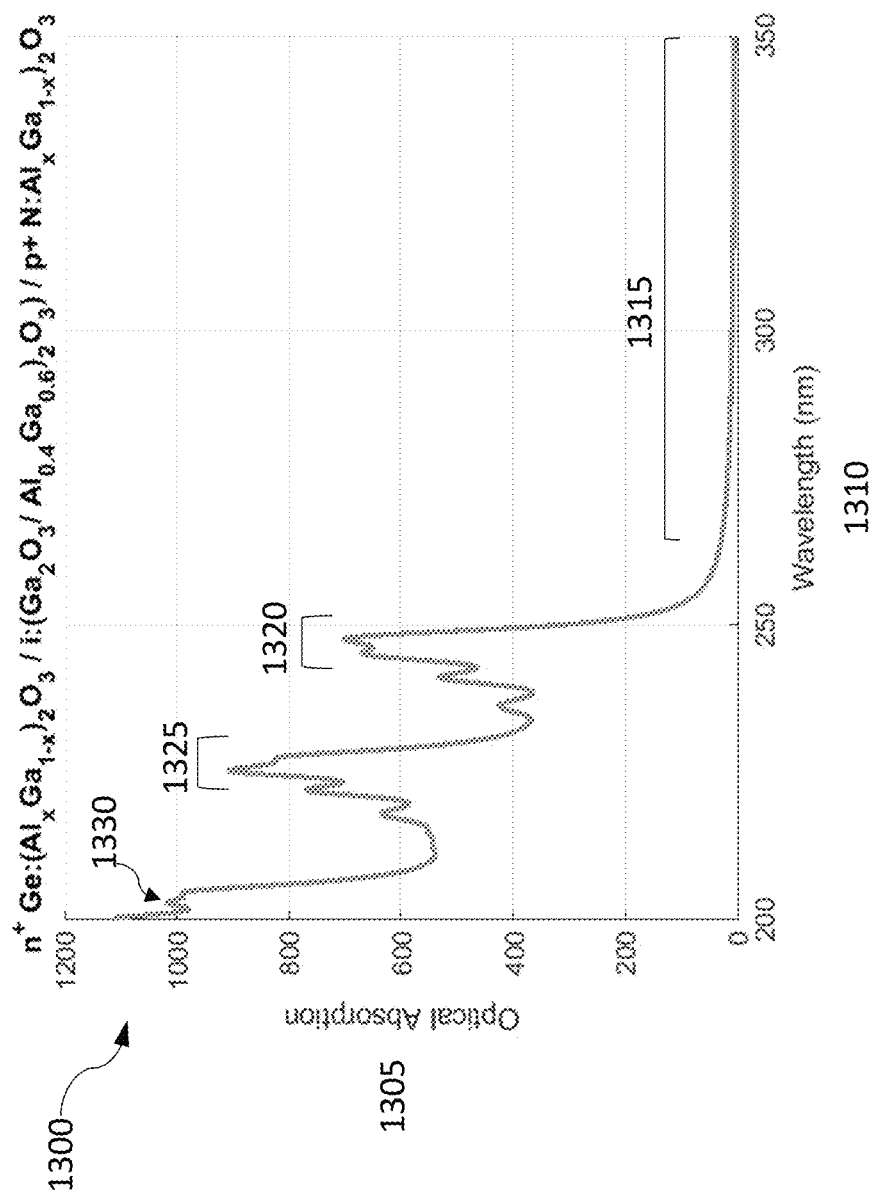
Figure 49:
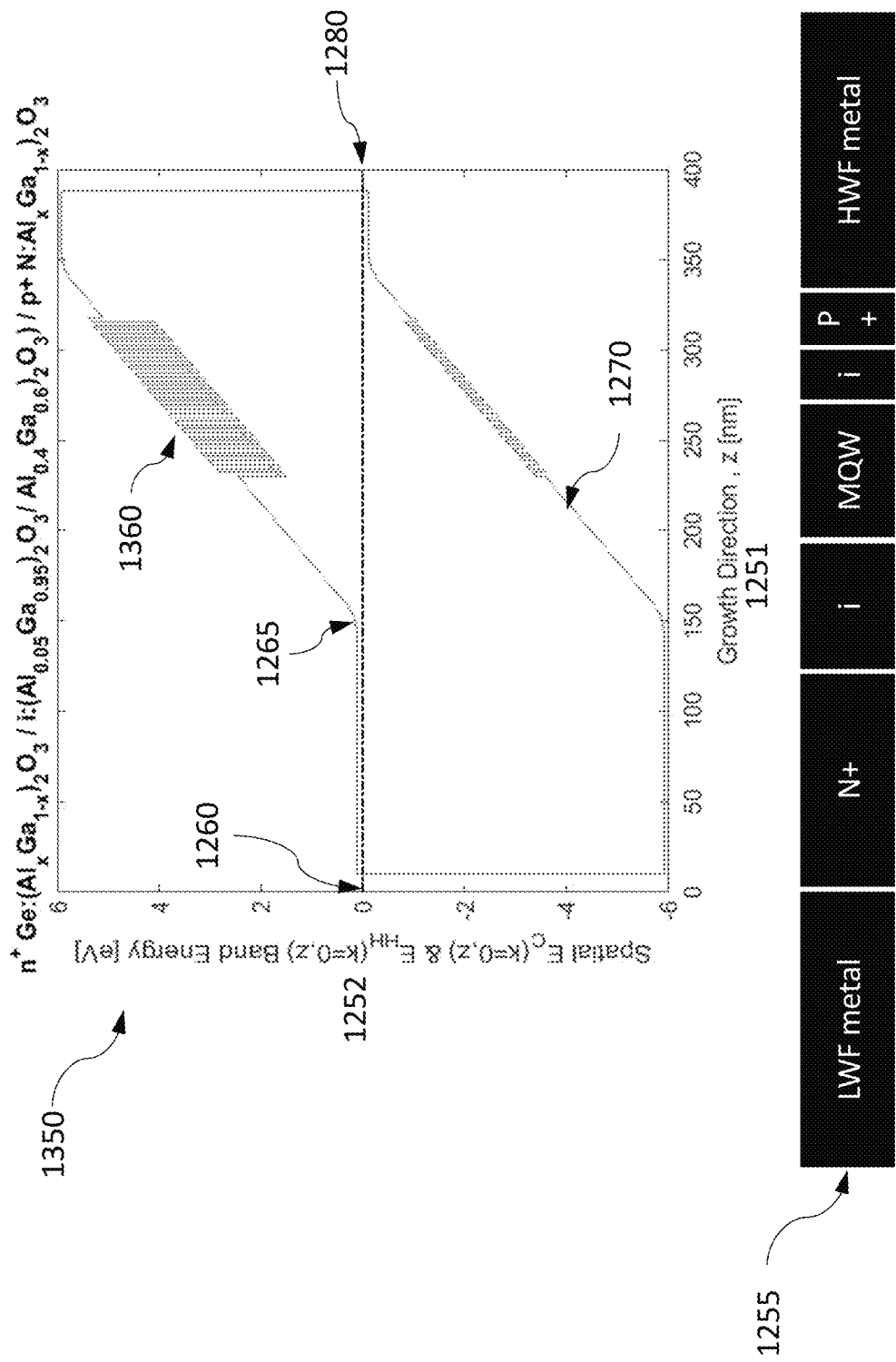
Figure 50:
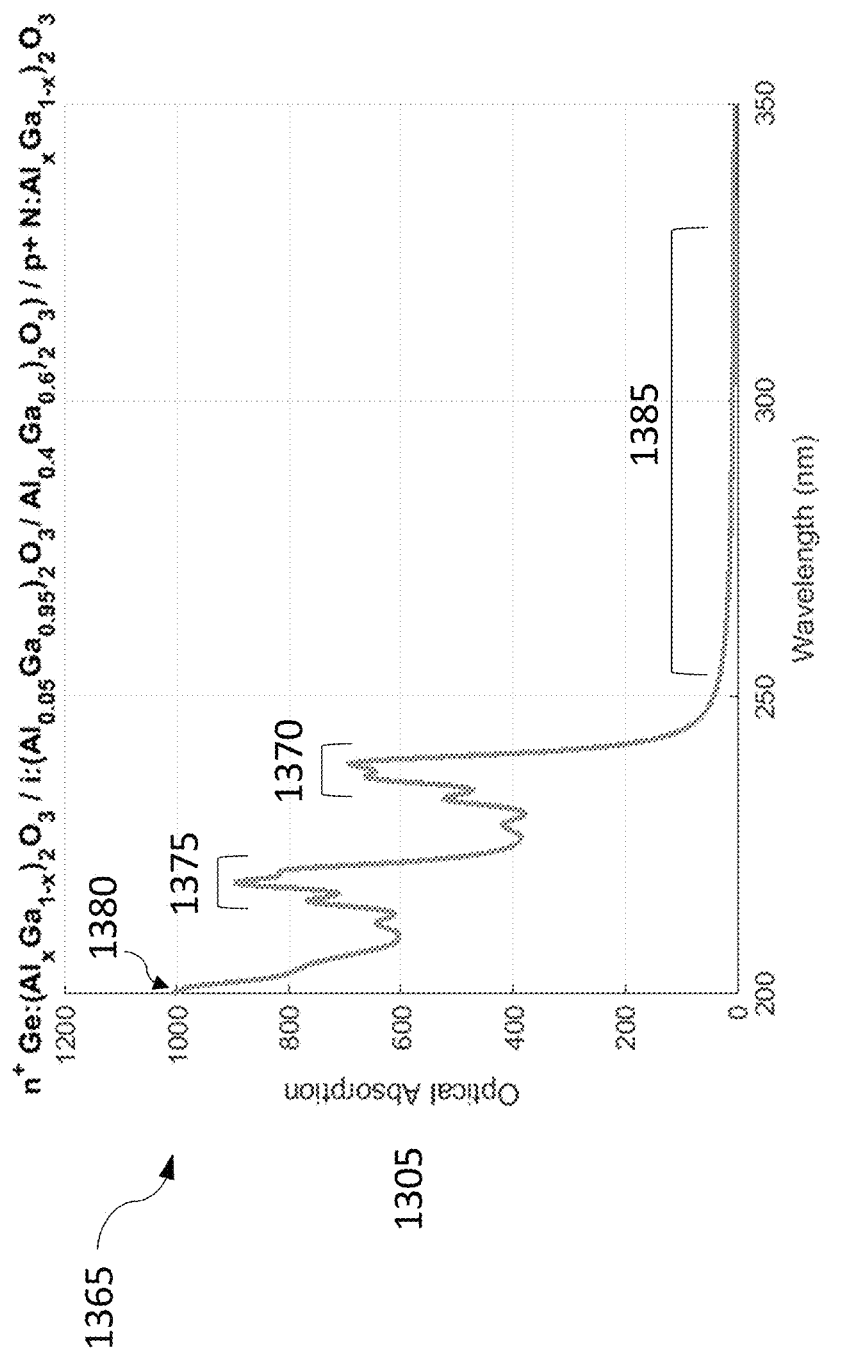
Figure 51:
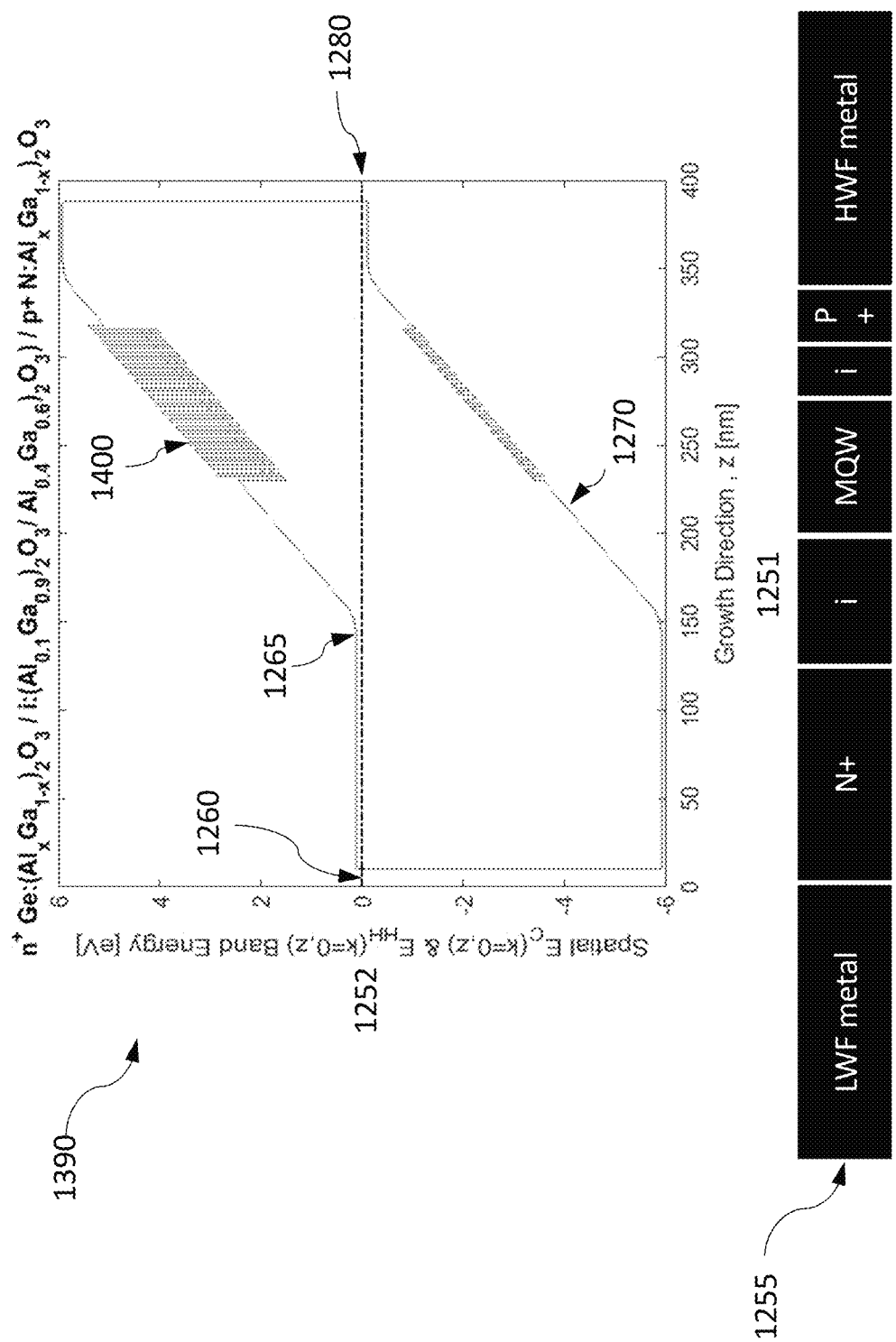
Figure 52:
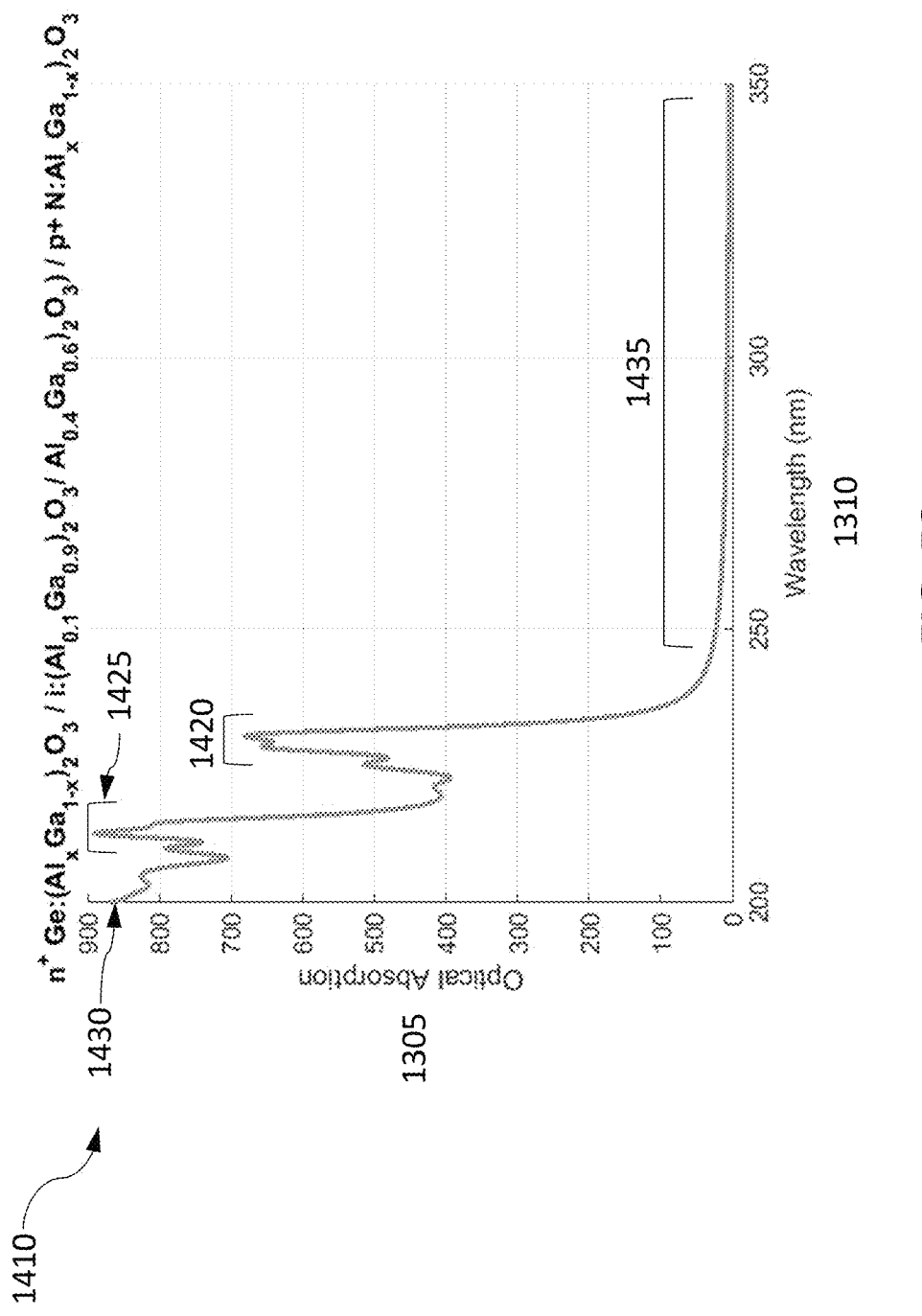
Figure 53:
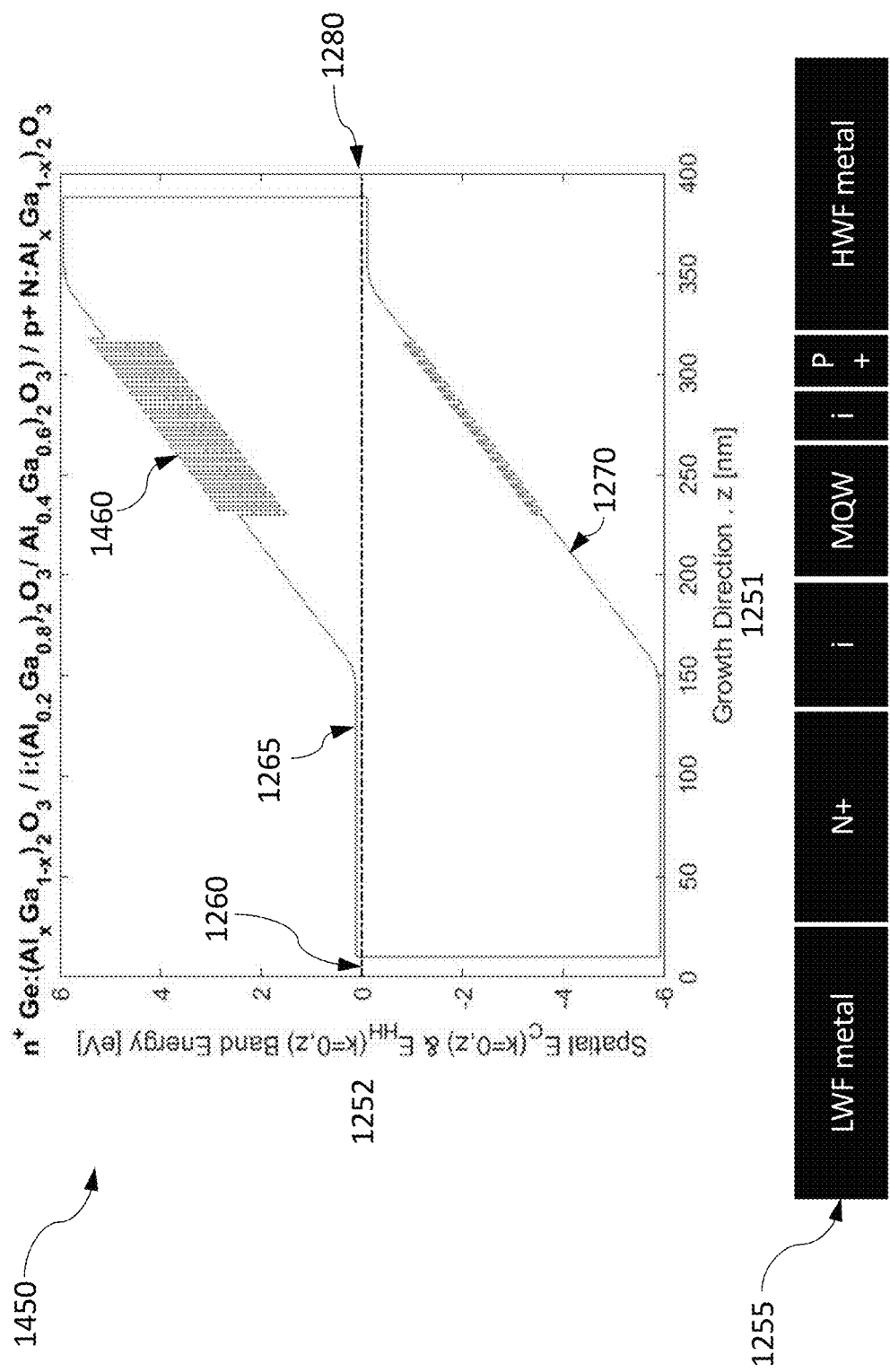
Figure 54:
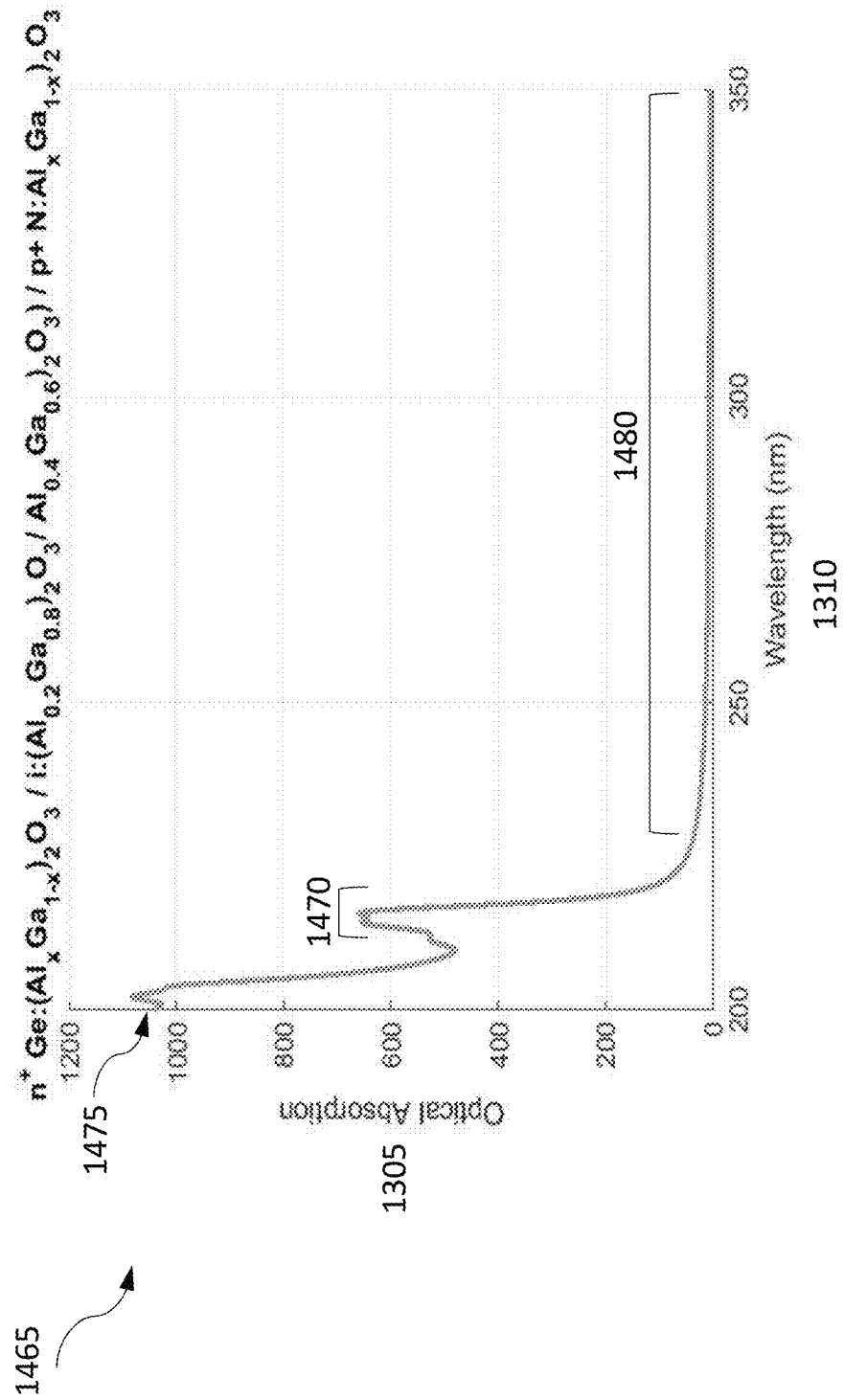
Figure 55:
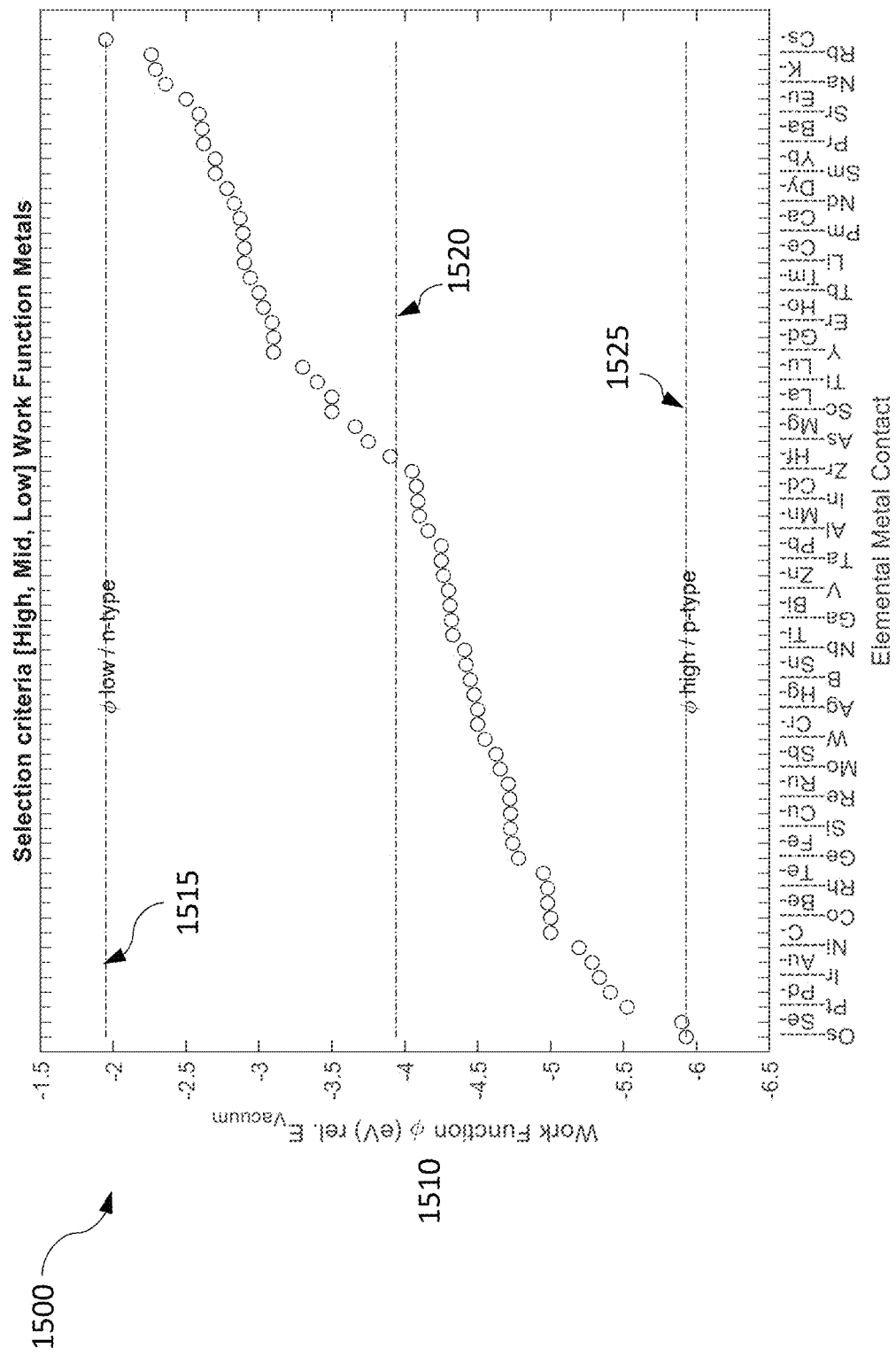
Figure 56:
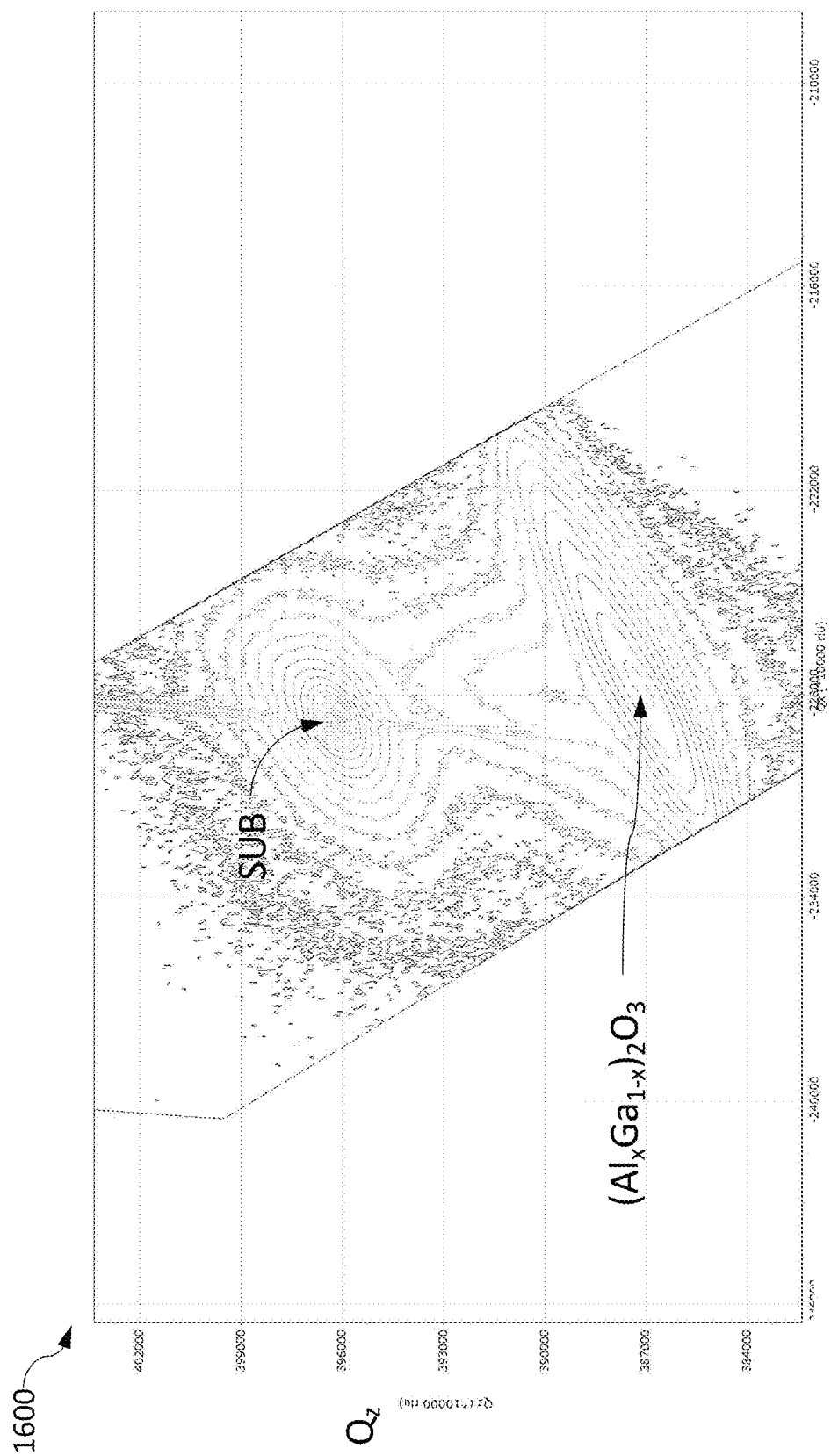
Figure 57:
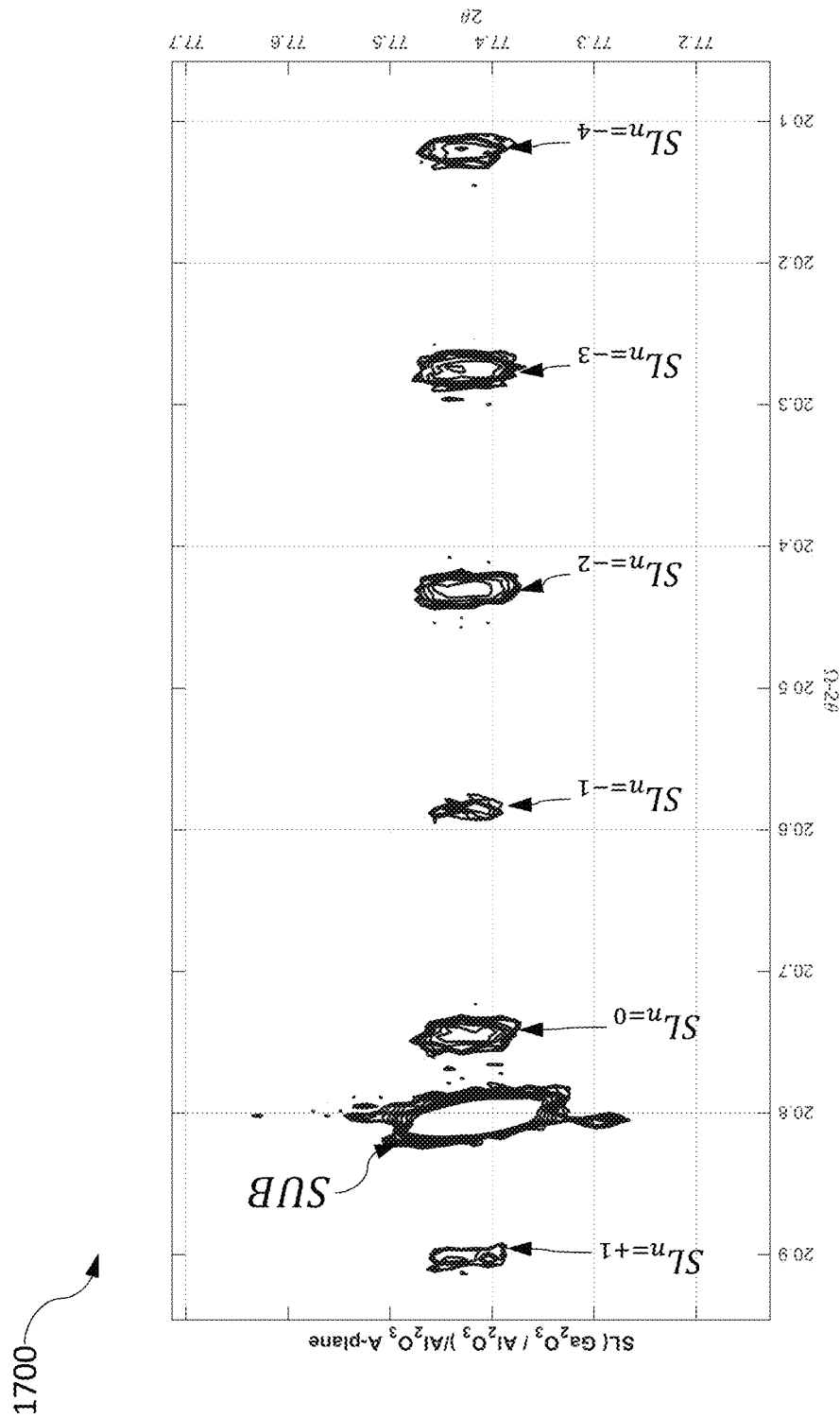
Figures 59A, 59B:
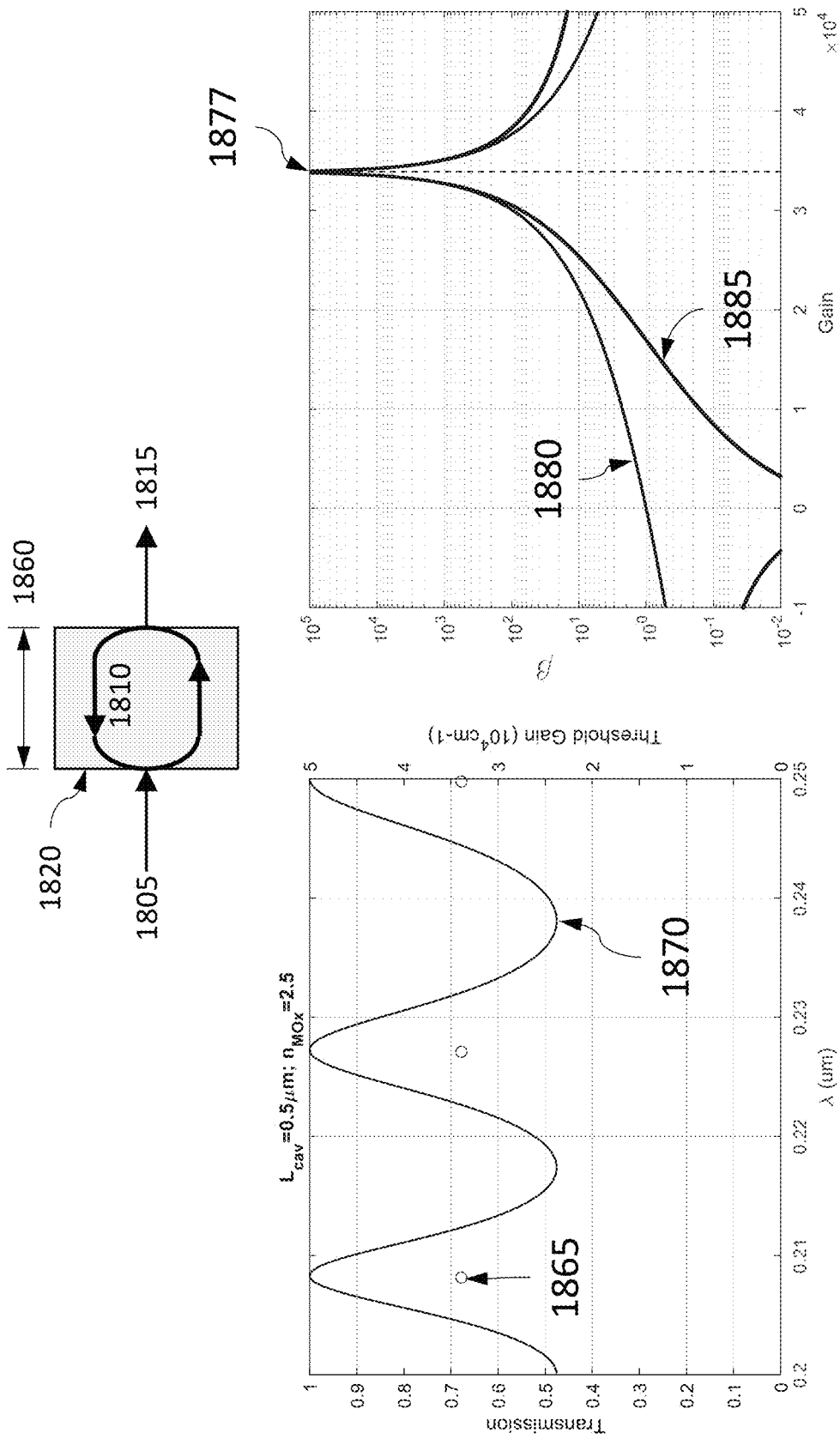
Figure 60:
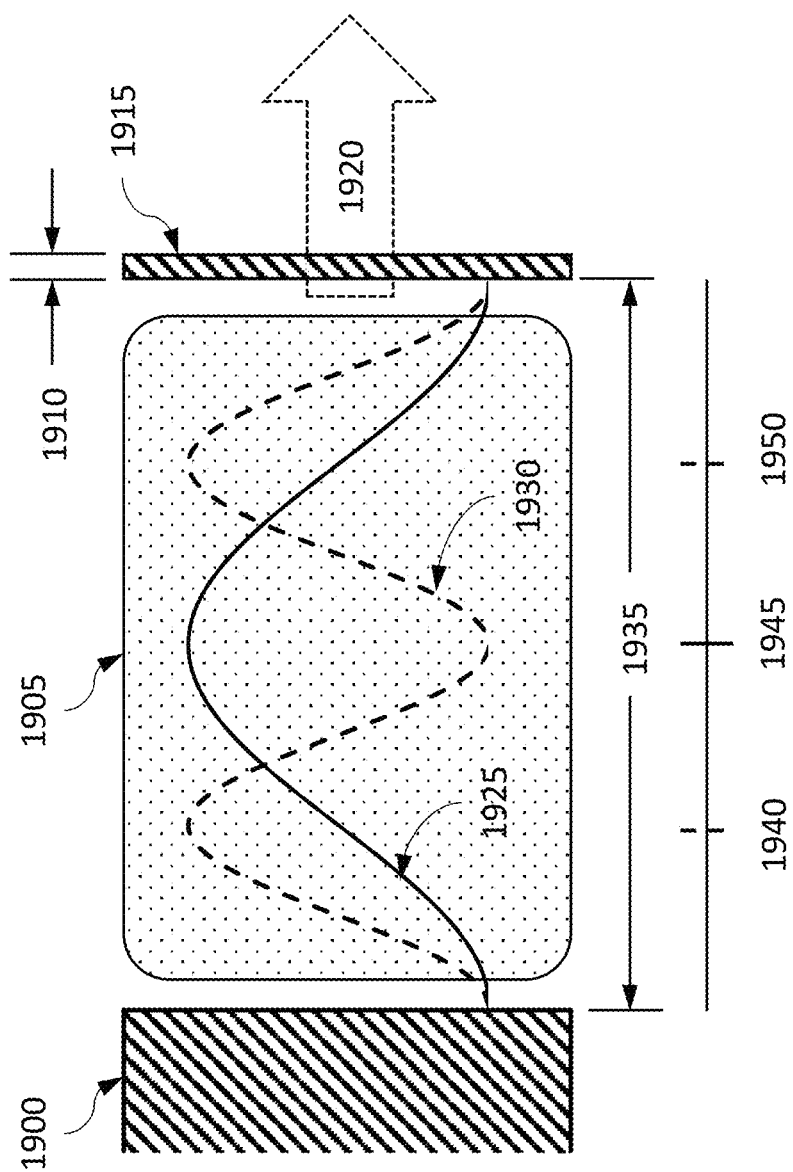
Figure 61:
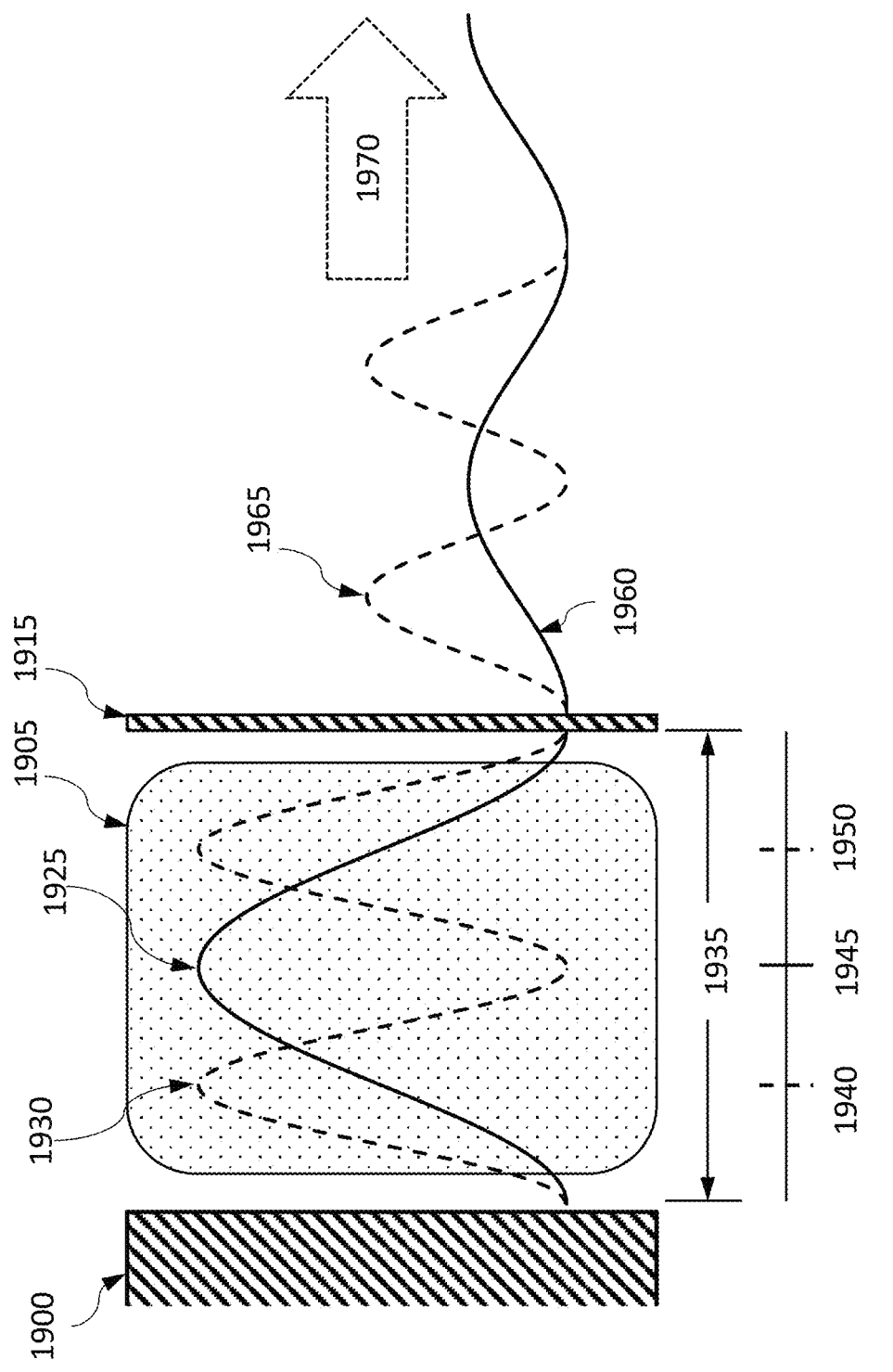
Figure 62:
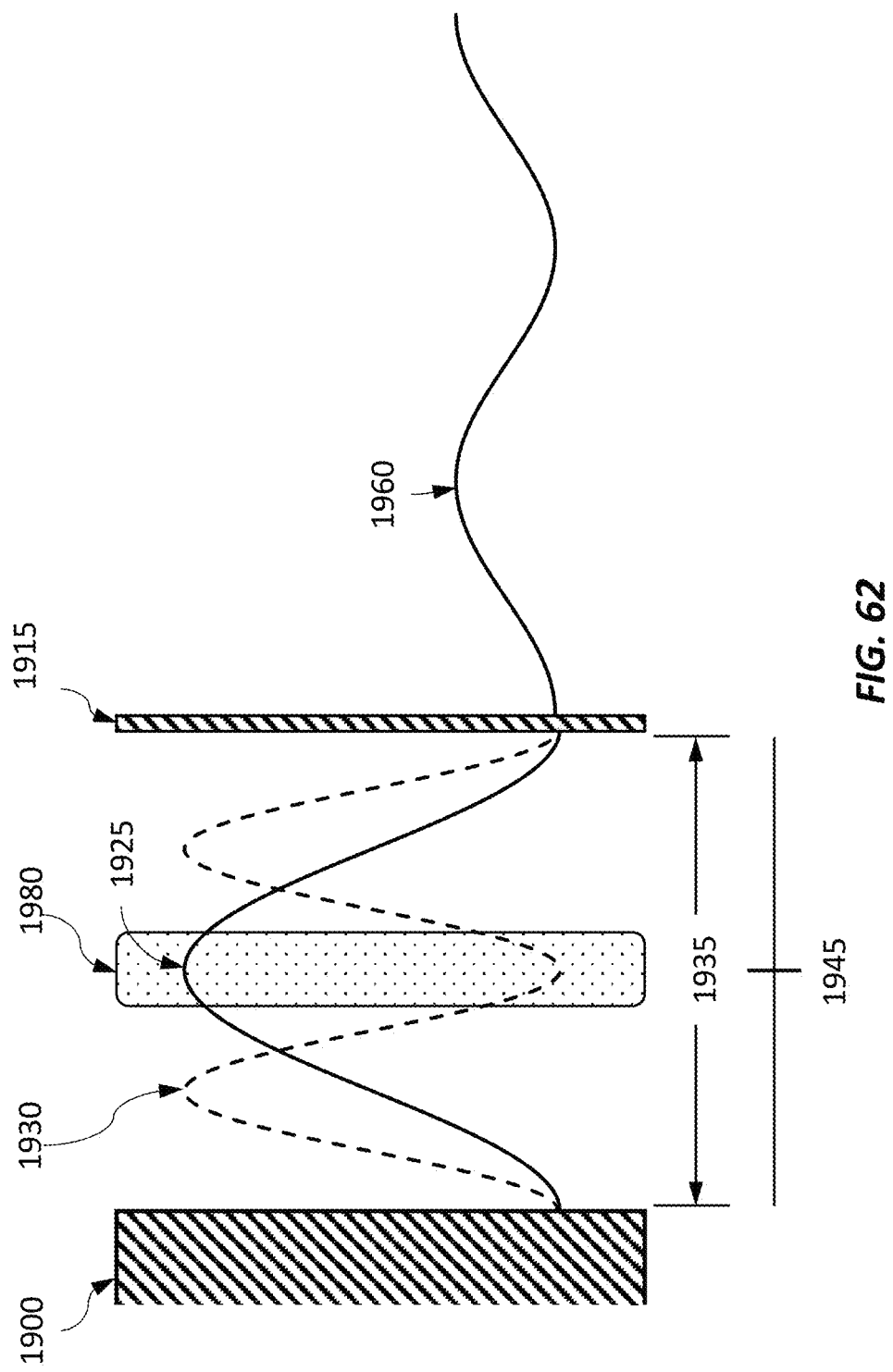
Figure 63:
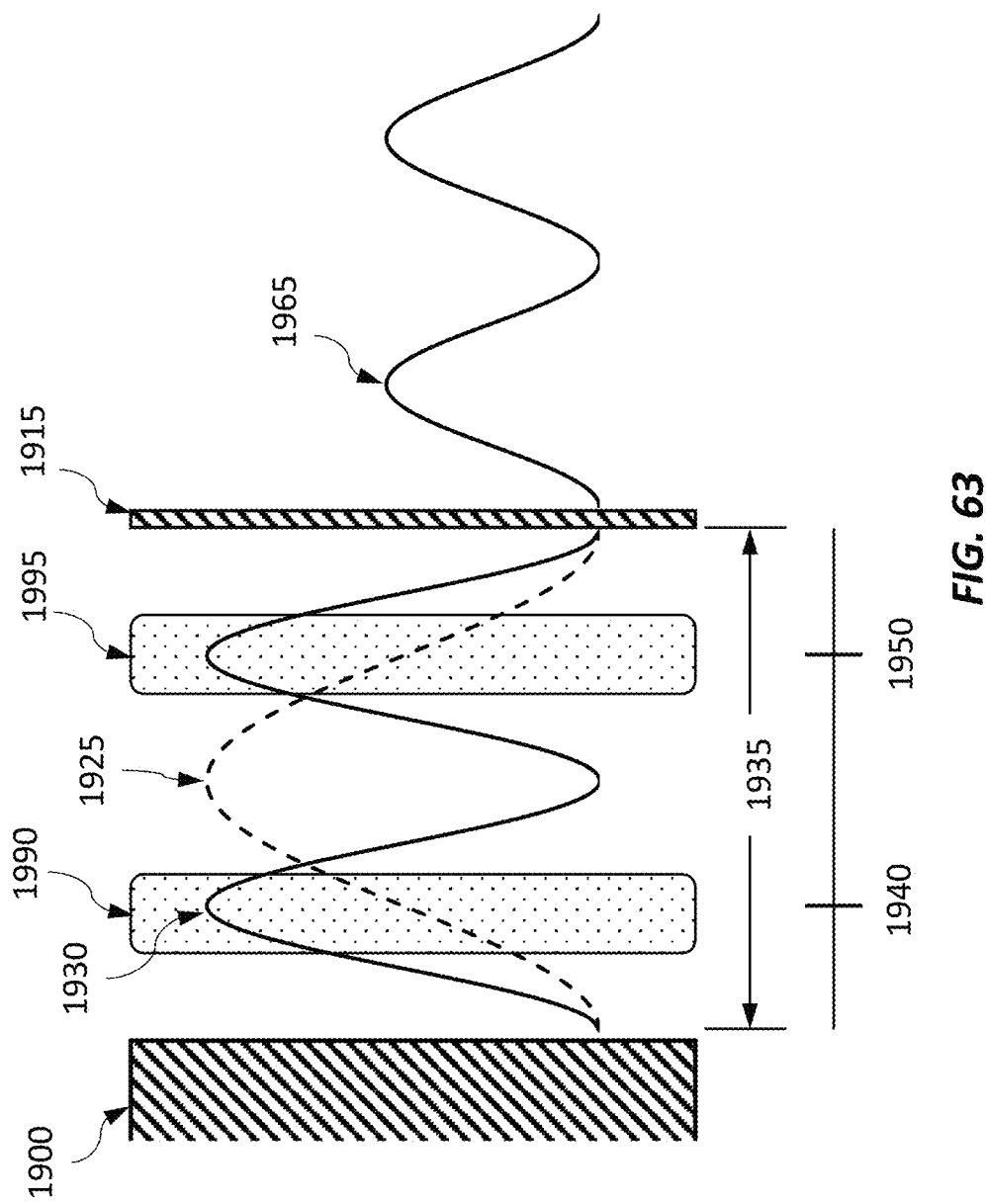
Figures 64A, 64B:
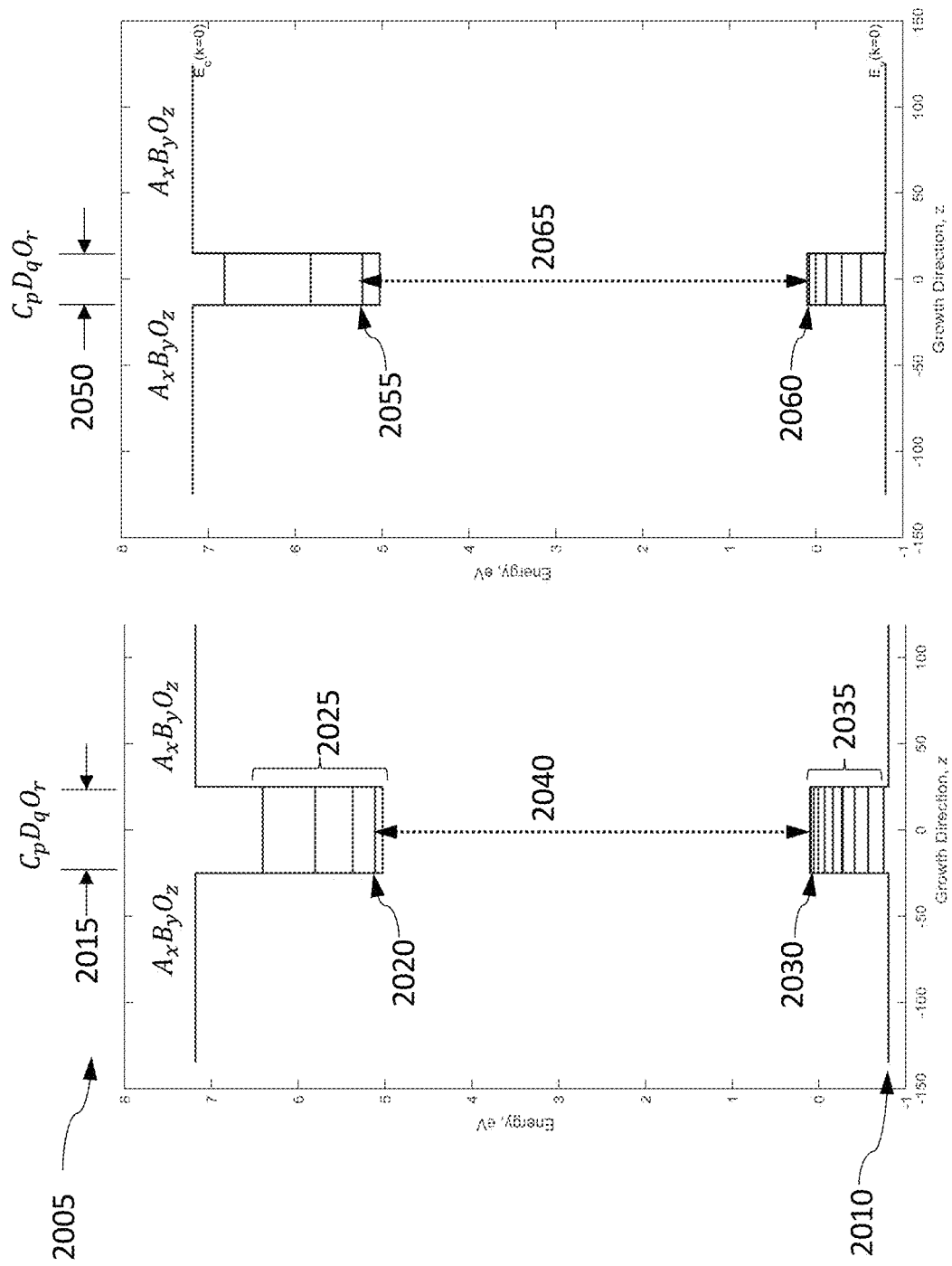
Figures 65A, 65B:
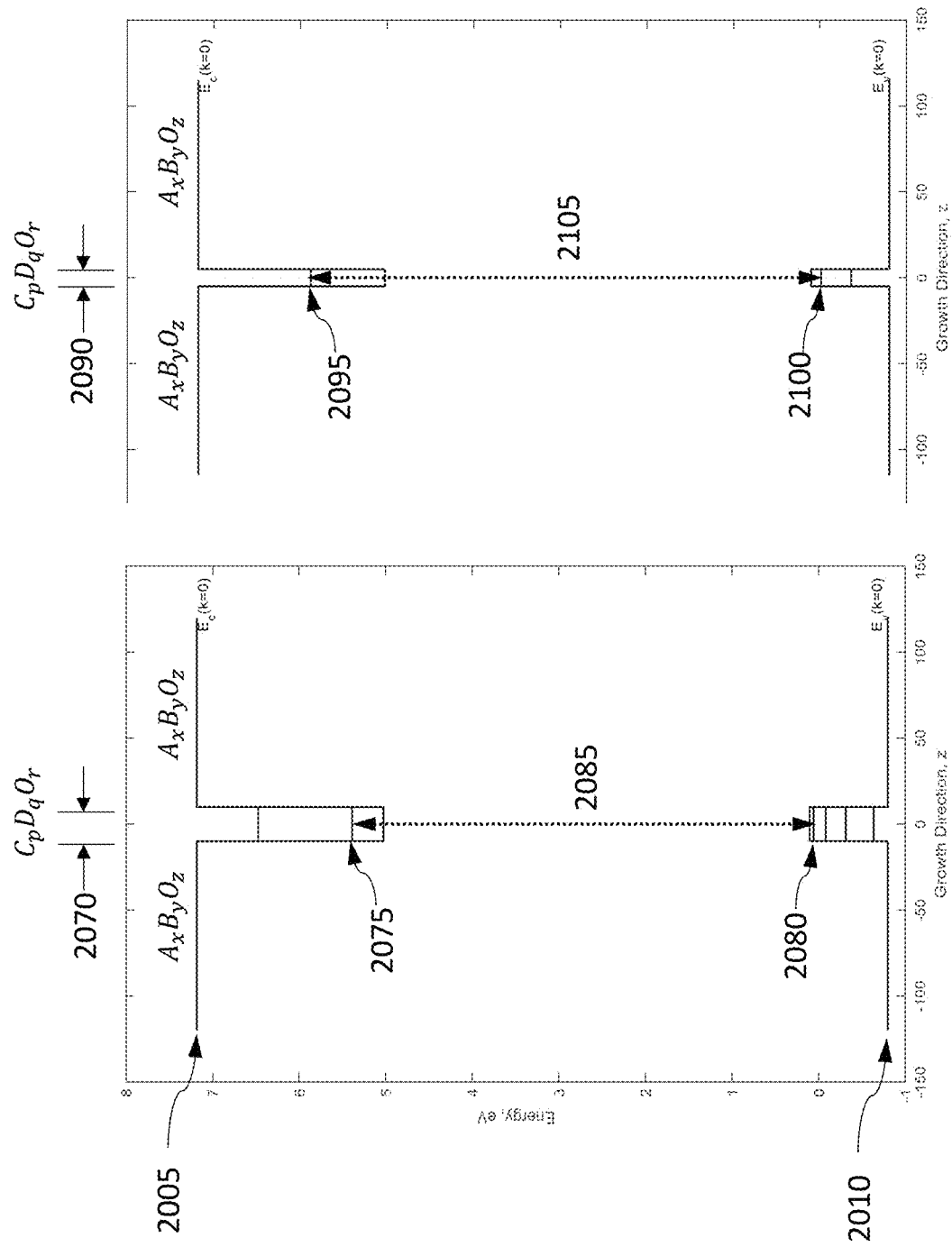
Figures 67A, 67B:
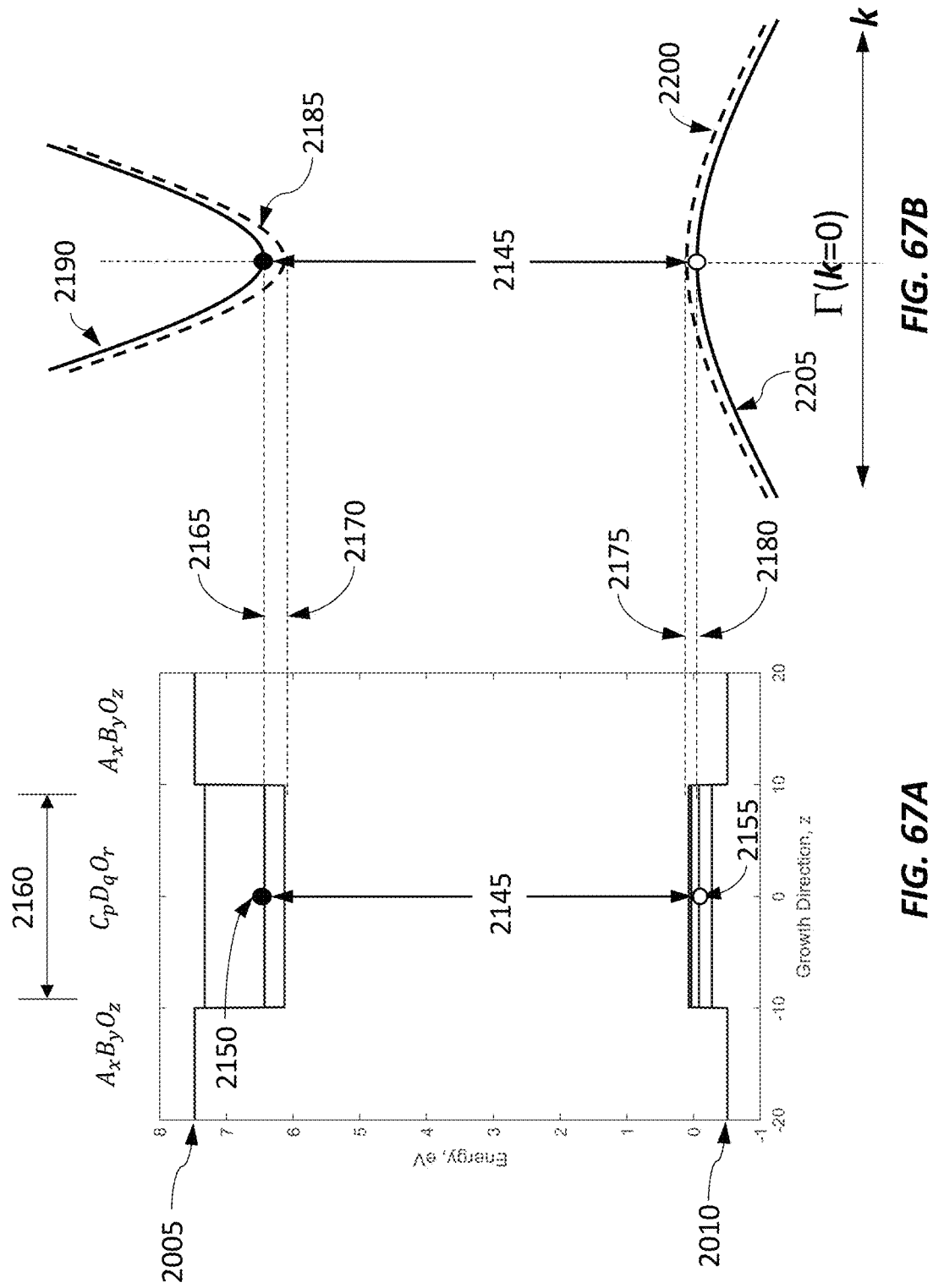
Figure 68B:
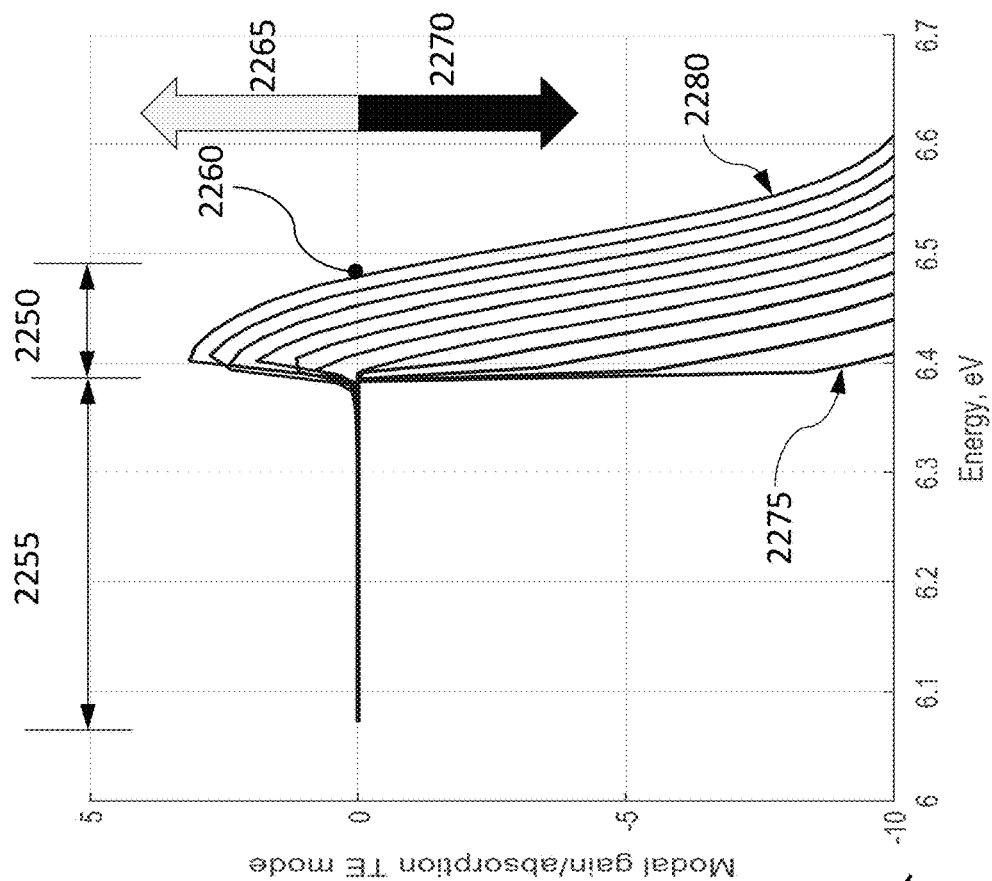
Figure 68A:
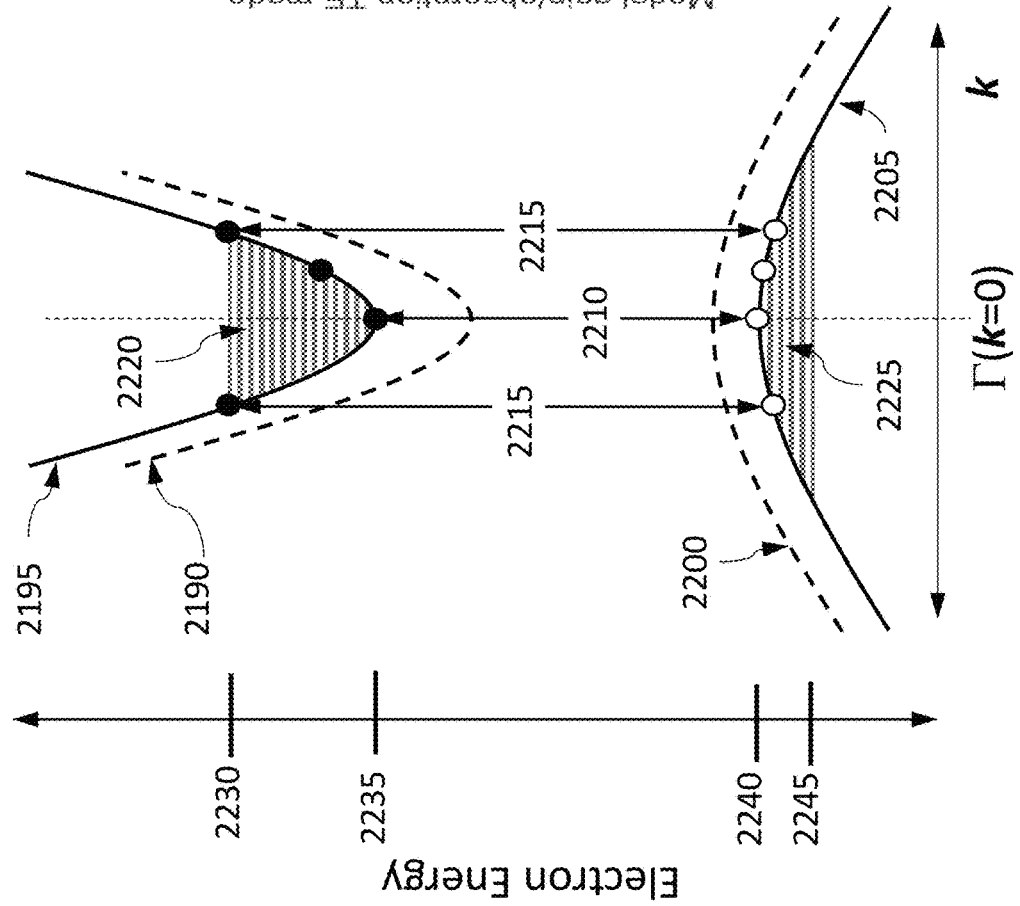
Figure 70B:
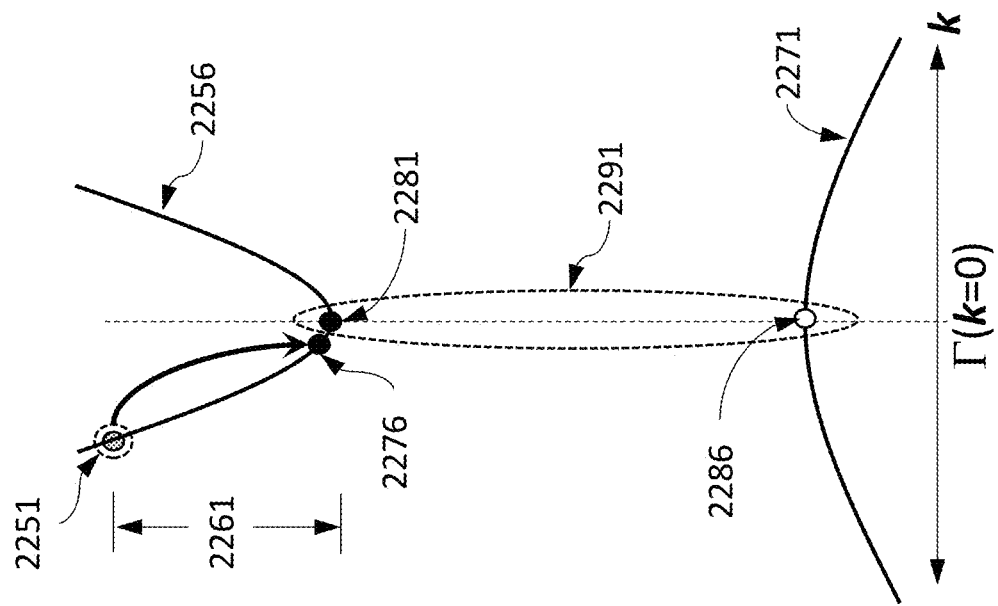
Figure 70A:
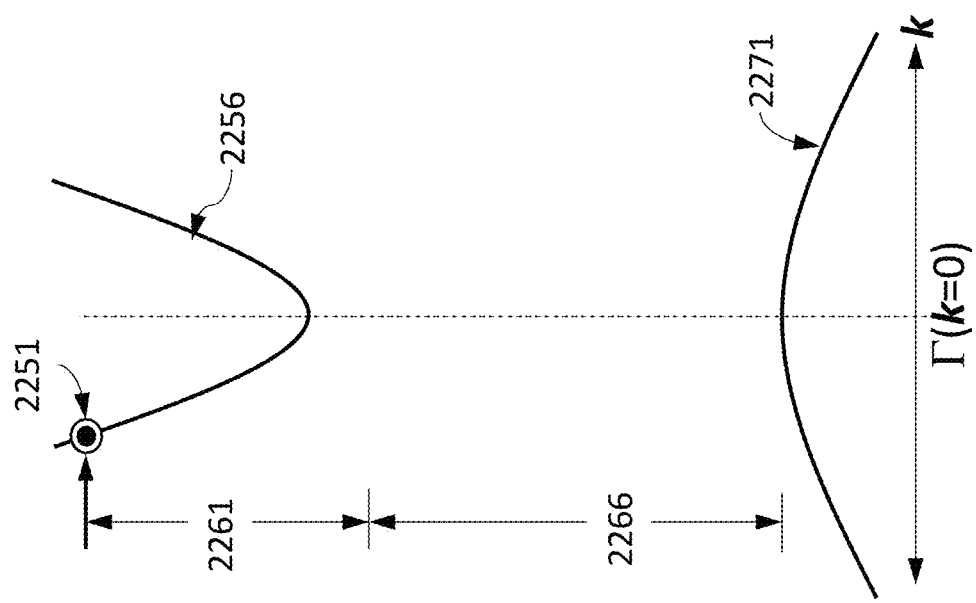
Figure 71B:
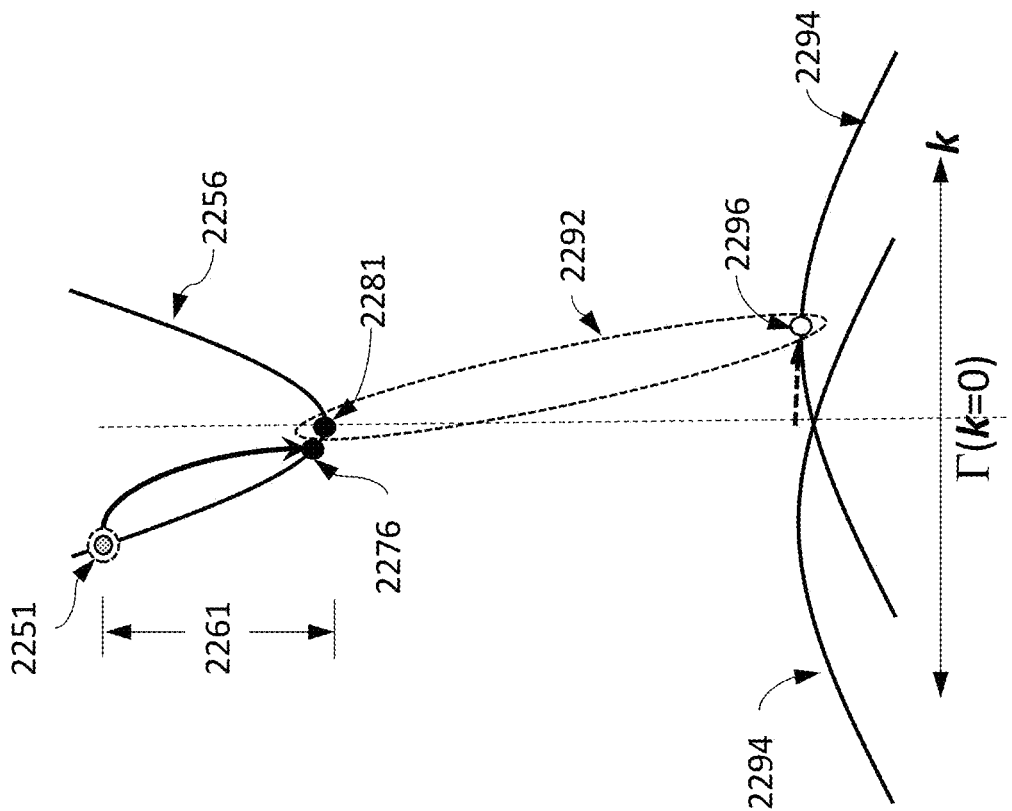
Figure 71A:
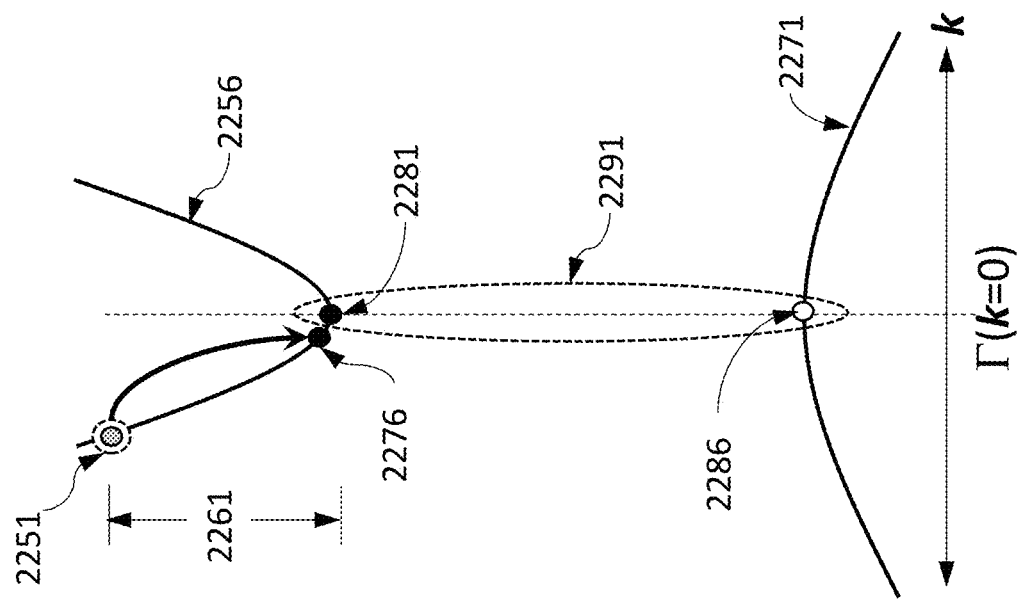
Figure 73:
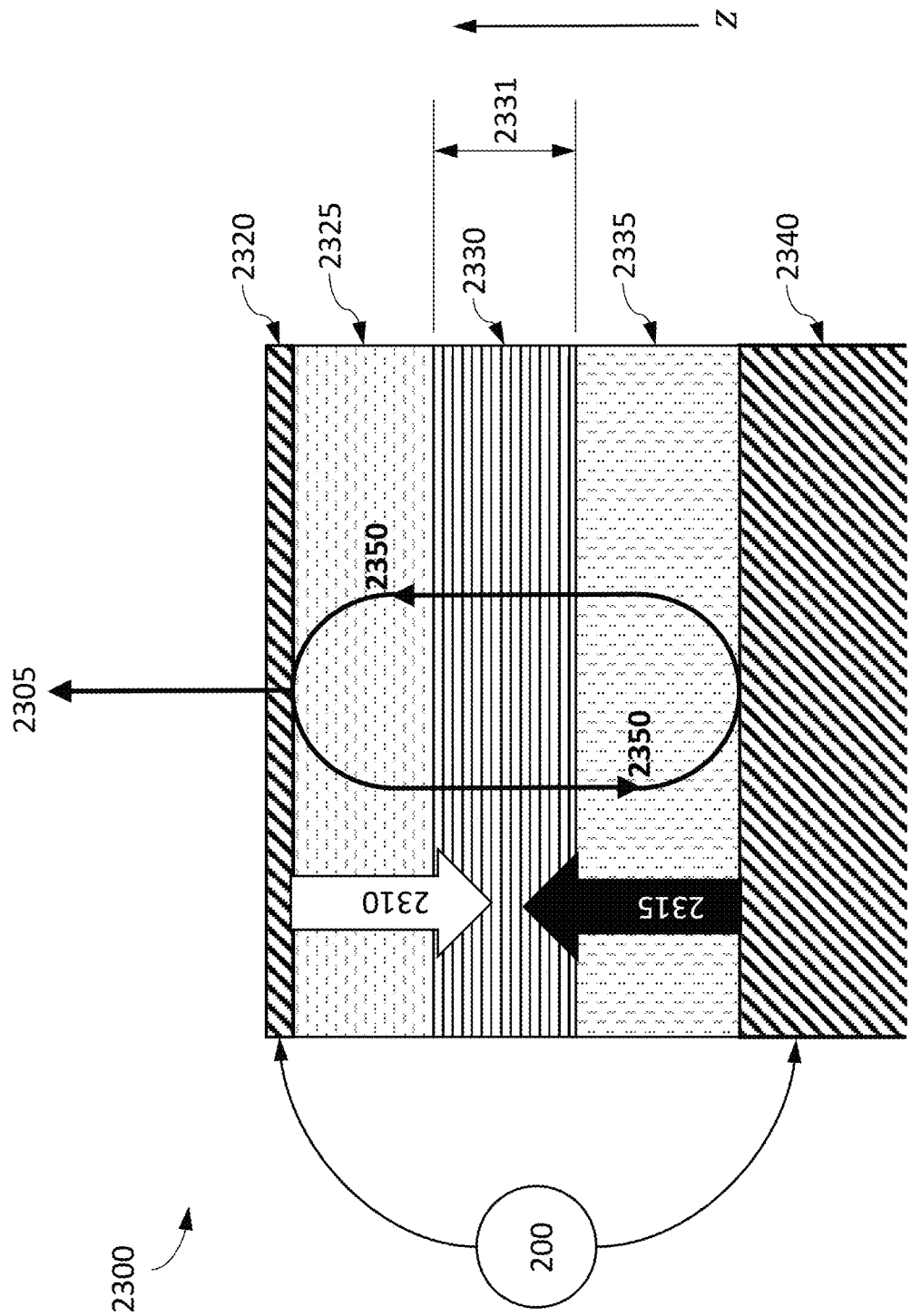
Figure 74:
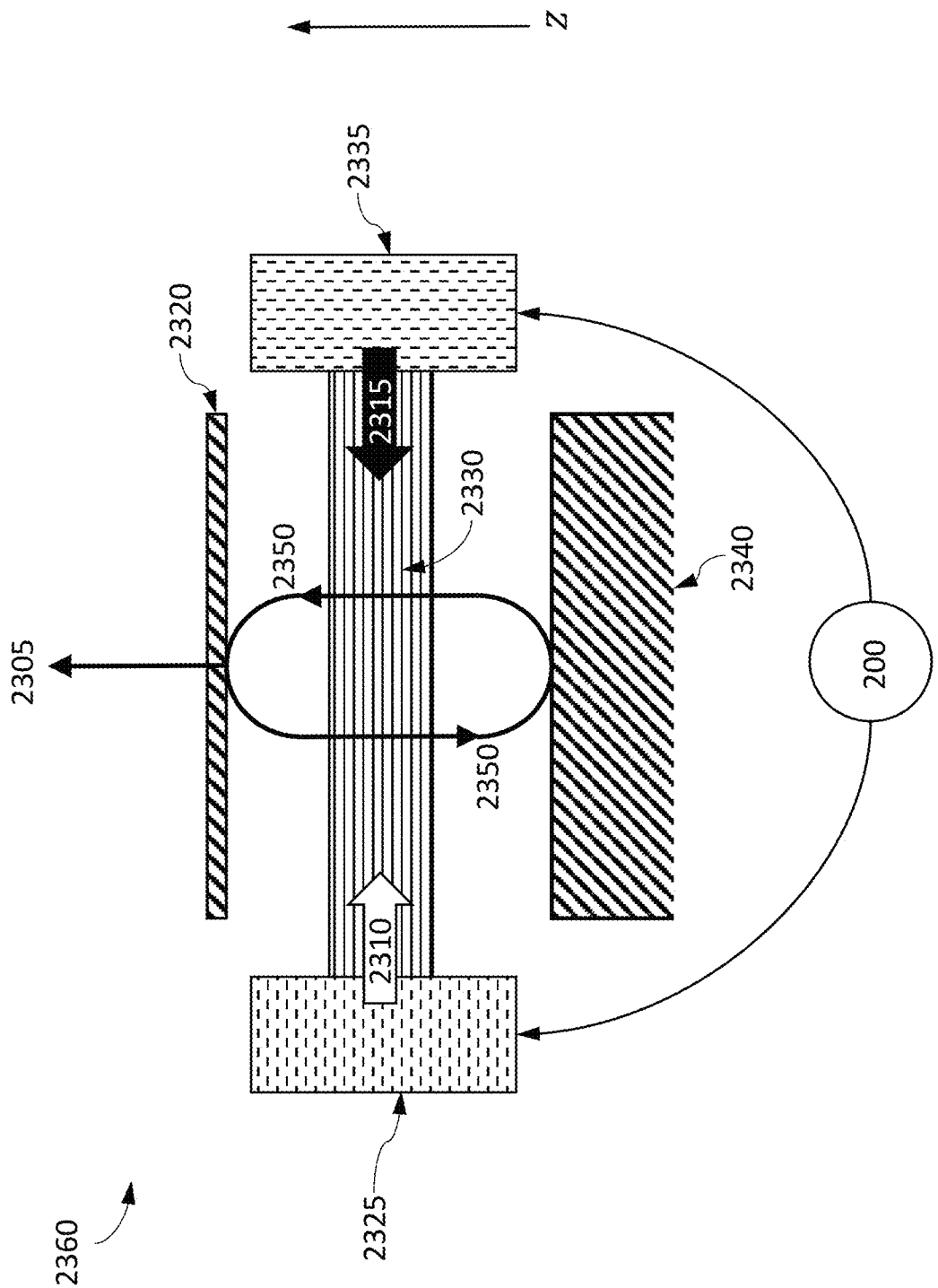
Figure 75:
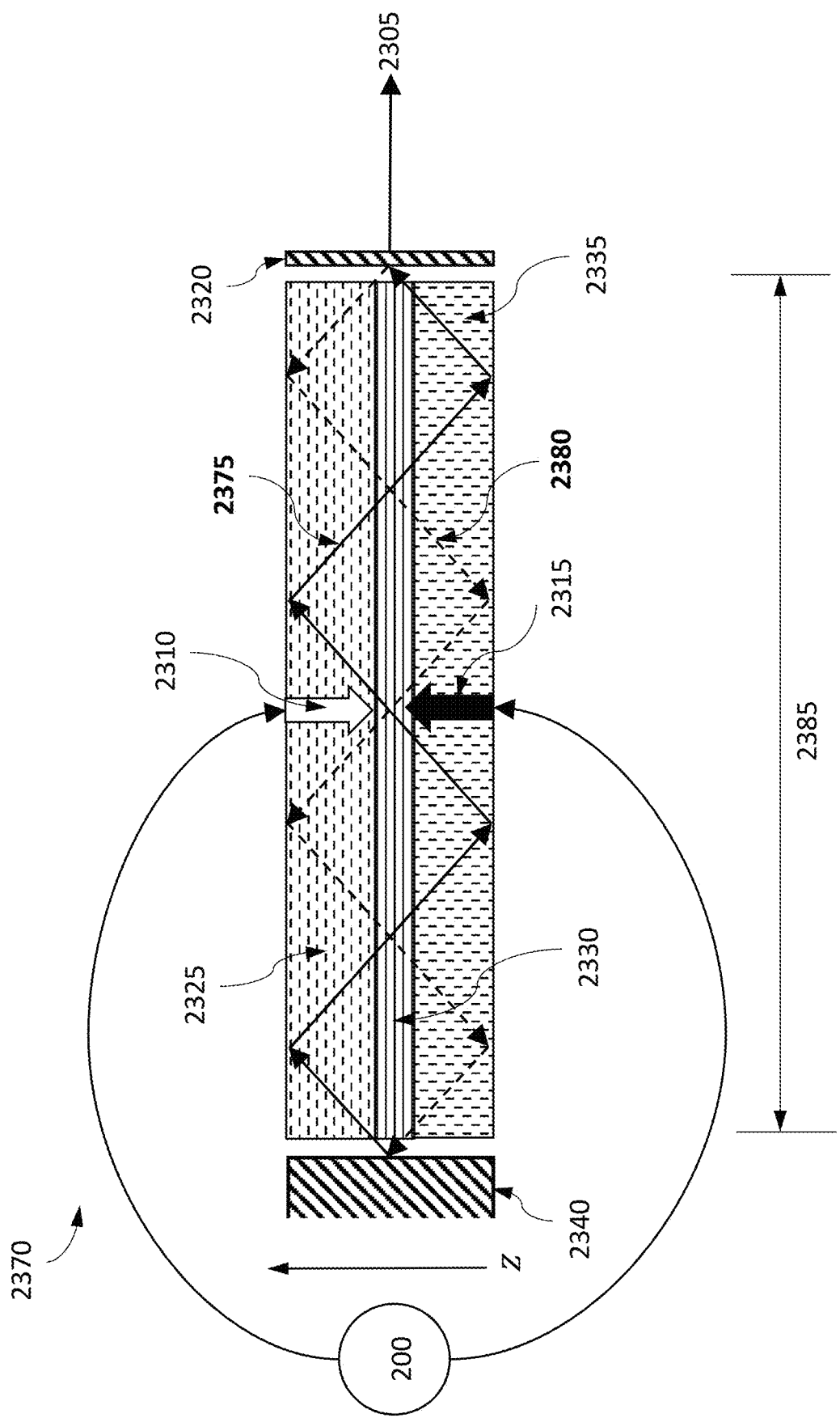

FIG. 27F shows yet another possible four-material binary superlattice comprising plurality of thin epitaxial layers of MgO, NiO and $Ga_2O_3$ repeating with a fixed unit cell period where the digital alloy simulates an equivalent quaternary bulk alloy $(NiO)_x(Ga_2O_3)_y(MgO)_z$ depending on the constituent layer thickness ratio of the superlattice period where the binary metal oxides used for the repeating unit are each selected to vary from between 1 to 10 unit cells in thickness respectively to comprise the unit cell of the SL in accordance with an illustrative embodiment of the present disclosure;

FIG. 28 shows a chart of ternary metal oxide combinations that may be adopted in accordance with various illustrative embodiments of the present disclosure in the forming of optoelectronic devices;

FIG. 29 is an example design flow diagram for tuning and constructing optoelectronic functionality of LED regions in accordance with an illustrative embodiment of the present disclosure;

FIG. 30 shows a heterojunction band lineup for the binary $Al_2O_3$, ternary alloy $(Al,Ga)O_3$ and binary $Ga_2O_3$ semiconducting oxides in accordance with an illustrative embodiment of the present disclosure;

FIG. 31 shows a 3-dimensional crystal unit cell of corundum symmetry crystal structure (alpha-phase) $Al_2O_3$ used to calculate the E-k band structure in accordance with an illustrative embodiment of the present disclosure;

FIGS. 32A and 32B show a calculated energy-momentum configuration of alpha-$Al_2O_3$ in the vicinity of the Brillouin zone center in accordance with an illustrative embodiment of the present disclosure;

FIG. 33 shows a 3-dimensional crystal unit cell of a monoclinic symmetry crystal structure $Al_2O_3$ used to calculate the E-k band structure in accordance with an illustrative embodiment of the present disclosure;

FIGS. 34A and 34B show calculated energy-momentum configurations of theta-$Al_2O_3$ in the vicinity of the Brillouin zone center in accordance with an illustrative embodiment of the present disclosure;

FIG. 35 shows a 3-dimensional crystal unit cell of a corundum symmetry crystal structure (alpha-phase) $Ga_2O_3$ used to calculate the E-k band structure in accordance with an illustrative embodiment of the present disclosure;

FIGS. 36A and 36B show calculated energy-momentum configurations of corundum alpha-$Ga_2O_3$ in the vicinity of the Brillouin zone center in accordance with an illustrative embodiment of the present disclosure;

FIG. 37 shows a 3-dimensional crystal unit cell of a monoclinic symmetry crystal structure (beta-phase) $Ga_2O_3$ used to calculate the E-k band structure in accordance with an illustrative embodiment of the present disclosure;

FIGS. 38A and 38B show calculated energy-momentum configurations of beta-$Ga_2O_3$ in the vicinity of the Brillouin zone center in accordance with an illustrative embodiment of the present disclosure;

FIG. 39 shows a 3-dimensional crystal unit cell of an orthorhombic symmetry crystal structure of bulk ternary alloy of $(Al, Ga)O_3$ used to calculate the E-k band structure in accordance with an illustrative embodiment of the present disclosure;

FIG. 40 shows a calculated energy-momentum configuration of $(Al, Ga)O_3$ in the vicinity of the Brillouin zone center showing a direct bandgap in accordance with an illustrative embodiment of the present disclosure;

FIG. 41 is a process flow diagram for forming an optoelectronic semiconductor device in accordance with an illustrative embodiment of the present disclosure;

FIG. 42 depicts a cross-sectional portion of a $(Al,Ga)O_3$ ternary structure formed by sequentially depositing Al—O—Ga—O— ... —O—Al epilayers along a growth direction in accordance with an illustrative embodiment of the present disclosure;

FIG. 43A shows in TABLE I a selection of substrate crystals for depositing metal oxide structures in accordance with various illustrative embodiments of the present disclosure;

FIG. 43B shows in TABLE II unit cell parameters of a selection of metal oxides in accordance with various illustrative embodiments of the present disclosure, showing lattice constant mismatches between $Al_2O_3$ and $Ga_2O_3$;

FIG. 44A depicts a calculated formation energy of Aluminum-Gallium-Oxide ternary alloy as a function of composition and crystal symmetry in accordance with an illustrative embodiment of the present disclosure;

FIG. 44B shows an experimental high-resolution x-ray diffraction (HRXRD) of two example distinct compositions of high-quality single crystal ternary $(Al_xGa_{1-x})_2O_3$ deposited epitaxially on a bulk (010)-oriented $Ga_2O_3$ substrate in accordance with an illustrative embodiment of the present disclosure;

FIG. 44C shows an experimental HRXRD and x-ray grazing incidence reflection (GIXR) of an example superlattice comprising repeating unit cells of bilayers selected from a $[(Al_xGa_{1-x})_2O_3/Ga_2O_3]$ elastically strained to a β-$Ga_2O_3$(010)-oriented substrate in accordance with an illustrative embodiment of the present disclosure;

FIG. 44D shows an experimental HRXRD and GIXR of two example distinct compositions of high-quality single crystal ternary $(Al_xGa_{1-x})_2O_3$ layers deposited epitaxially on a bulk (001)-oriented $Ga_2O_3$ substrate in accordance with an illustrative embodiment of the present disclosure;

FIG. 44E shows an experimental HRXRD and GIXR of a superlattice comprising repeating unit cells of bilayers selected from a $[(Al_xGa_{1-x})_2O_3/Ga_2O_3]$ elastically strained to a β-$Ga_2O_3$(001)-oriented substrate in accordance with an illustrative embodiment of the present disclosure;

FIG. 44F shows an experimental HRXRD and GIXR of a cubic crystal symmetry binary Nickel Oxide (NiO) epilayer elastically strained to a monoclinic crystal symmetry (3-$Ga_2O_3$(001)-oriented substrate in accordance with an illustrative embodiment of the present disclosure;

FIG. 44G shows an experimental HRXRD and GIXR of a monoclinic crystal symmetry $Ga_2O_3$(100)-oriented epilayer elastically strained to a cubic crystal symmetry MgO (100)-oriented substrate in accordance with an illustrative embodiment of the present disclosure;

FIG. 44H shows an experimental HRXRD and GIXR of a superlattice comprising repeating unit cells of bilayers selected from a $[(Al_xEr_{1-x})_2O_3/Al_2O_3]$ elastically strained to a corundum crystal symmetry α-$Al_2O_3$(001)-oriented substrate in accordance with an illustrative embodiment of the present disclosure;

FIG. 44I shows a strain-free energy-crystal momentum (E-k) dispersion in the vicinity of the Brillouin-zone center for the case of a ternary Aluminum-Erbium-Oxide $(Al_xEr_{1-x})_2O_3$ illustrating the direct bandgap at Γ(k=0) in accordance with an illustrative embodiment of the present disclosure;

FIG. 44J shows an experimental HRXRD and GIXR of a superlattice comprising bilayered unit cells of a monoclinic crystal symmetry $Ga_2O_3$(100)-oriented film coupled to a cubic (spinel) crystal symmetry ternary composition of Magnesium-Gallium-Oxide, $Mg_xGa_{2(1-x)}O_{3-2x}$ where the SL is epitaxially deposited upon a monoclinic $Ga_2O_3$(010)-oriented substrate in accordance with an illustrative embodiment of the present disclosure;

FIG. 44K shows a strain-free energy-crystal momentum (E-k) dispersion in the vicinity of the Brillouin-zone center for the case of ternary Magnesium-Gallium-Oxide $Mg_xGa_{2(1-x)}O_{3-2x}$ illustrating the direct bandgap at Γ(k=0) in accordance with an illustrative embodiment of the present disclosure;

FIG. 44L shows an experimental HRXRD and GIXR of an orthorhombic $Ga_2O_3$ epilayer elastically strained to a cubic crystal symmetry Magnesium-Aluminum-Oxide $MgAl_2O_4$(100)-oriented substrate in accordance with an illustrative embodiment of the present disclosure;

FIG. 44M shows an experimental HRXRD of a ternary Zinc-Gallium-Oxide $ZnGa_2O_4$ epilayer elastically strained to a wurtzite Zinc-Oxide ZnO layer deposited upon a monoclinic crystal symmetry Gallium-Oxide (–201)-oriented substrate in accordance with an illustrative embodiment of the present disclosure;

FIG. 44N shows an energy-crystal momentum (E-k) dispersion in the vicinity of the Brillouin-zone center for the case of ternary cubic Zinc-Gallium-Oxide $Zn_xGa_{2(1-x)}O_{3-2x}$, where x=0.5 illustrating the indirect bandgap at Γ(k=0) in accordance with an illustrative embodiment of the present disclosure;

FIG. 44O shows an epitaxial layer stack deposited along a growth direction for the case of an orthorhombic $Ga_2O_3$ crystal symmetry film using an intermediate layer and a prepared substrate surface in accordance with an illustrative embodiment of the present disclosure;

FIG. 44P shows an experimental HRXRD of two distinctly different crystal symmetry binary $Ga_2O_3$ compositions deposited upon a rhombic Sapphire $\alpha$-$Al_2O_3$(0001)-oriented substrate controlled via growth conditions in accordance with an illustrative embodiment of the present disclosure;

FIG. 44Q shows a strain-free energy-crystal momentum (E-k) dispersion in the vicinity of the Brillouin-zone center for the case of binary orthorhombic Gallium-Oxide illustrating the direct bandgap at $\Gamma$(k=0) in accordance with an illustrative embodiment of the present disclosure;

FIG. 44R shows an experimental HRXRD and GIXR of two example distinct compositions of high-quality single crystal corundum symmetry ternary $(Al_xGa_{1-x})_2O_3$ deposited epitaxially on a bulk (1-100)-oriented corundum crystal symmetry $Al_2O_3$ substrate in accordance with an illustrative embodiment of the present disclosure;

FIG. 44S shows an experimental HRXRD of a monoclinic topmost active $Ga_2O_3$ epilayer deposited upon a ternary Erbium-Gallium-Oxide $(Er_xGa_{1-x})_2O_3$ transition layer deposited upon a single crystal Silicon (111)-oriented substrate in accordance with an illustrative embodiment of the present disclosure;

FIG. 44T shows an experimental HRXRD and GIXR of an example high-quality single crystal corundum symmetry binary $Ga_2O_3$ deposited epitaxially on a bulk (11-20)-oriented corundum crystal symmetry $Al_2O_3$ substrate where the two thicknesses of $Ga_2O_3$ are shown pseudomorphically strained (i.e., elastic deformation of the bulk $Ga_2O_3$ unit cell) to the underlying $Al_2O_3$ substrate in accordance with an illustrative embodiment of the present disclosure;

FIG. 44U shows an experimental HRXRD and GIXR of an example high-quality single crystal corundum symmetry superlattice comprising bilayers of binary pseudomorphic $Ga_2O_3$ and $Al_2O_3$ deposited epitaxially on a bulk (11-20)-oriented corundum crystal symmetry $Al_2O_3$ substrate where the superlattice $[Al_2O_3/Ga_2O_3]$ demonstrates the unique properties of the corundum crystal symmetry in accordance with an illustrative embodiment of the present disclosure;

FIG. 44V shows an experimental transmission electron micrograph (TEM) of a high-quality single crystal superlattice comprising SL $[Al_2O_3/Ga_2O_3]$ deposited upon a corundum $Al_2O_3$ substrate depicting the low dislocation defect density in accordance with an illustrative embodiment of the present disclosure;

FIG. 44W shows an experimental HRXRD of a corundum crystal symmetry topmost active $(Al_xGa_{1-x})_2O_3$ epilayer deposited upon a single corundum $Al_2O_3$(1-102)-oriented substrate in accordance with an illustrative embodiment of the present disclosure;

FIG. 44X shows an experimental HRXRD and GIXR of an example high-quality single crystal corundum symmetry superlattice comprising bilayers of ternary pseudomorphic $(Al_xGa_{1-x})_2O_3$ and $Al_2O_3$ deposited epitaxially on a bulk (1-102)-oriented corundum crystal symmetry $Al_2O_3$ substrate in accordance with an illustrative embodiment of the present disclosure, where the superlattice $[Al_2O_3/(Al_xGa_{1-x})_2O_3]$ demonstrates the unique properties of the corundum crystal symmetry;

FIG. 44Y shows an experimental wide angle HRXRD of a cubic crystal symmetry topmost active Magnesium-Oxide MgO epilayer deposited upon a single crystal cubic (spinel) Magnesium-Aluminum-Oxide $MgAl_2O_4$ (100)-oriented substrate in accordance with an illustrative embodiment of the present disclosure;

FIG. 44Z shows a strain-free energy-crystal momentum (E-k) dispersion in the vicinity of the Brillouin-zone center for the case of ternary Magnesium-Aluminum-Oxide $Mg_xAl_{2(1-x)}O_{3-2x}$, x=0.5 illustrating the direct bandgap at $\Gamma$(k=0) in accordance with an illustrative embodiment of the present disclosure;

FIG. 45 shows schematically a construction of epitaxial regions for a metal oxide UVLED comprising a p-i-n heterojunction diode and multiple quantum wells to tune the optical emission energy in accordance with an illustrative embodiment of the present disclosure;

FIG. 46 is an energy band diagram versus growth direction of the epitaxial metal oxide UVLED structure illustrated in FIG. 45 where the k=0 representation of the band structure is plotted in accordance with an illustrative embodiment of the present disclosure;

FIG. 47 shows a spatial carrier confinement structure of the multiple quantum well (MQW) regions of FIG. 46 having quantized electron and hole wavefunctions which spatially recombine in the MQW region to generate a predetermined emitted photon energy determined by the respective quantized states in the conduction and valence bands where the MQW region has a narrow bandgap material comprising $Ga_2O_3$ in accordance with an illustrative embodiment of the present disclosure;

FIG. 48 shows a calculated optical absorption spectrum for the device structure in FIG. 47 where the lowest energy electron-hole recombination is determined by the quantized energy levels within the MQW giving rise to sharp and discrete absorption/emission energy in accordance with an illustrative embodiment of the present disclosure;

FIG. 49 is an energy band diagram versus growth direction of an epitaxial metal oxide UVLED structure where the MQW region has a narrow bandgap material comprising $(Al_{0.05}Ga_{0.95})_2O_3$ in accordance with an illustrative embodiment of the present disclosure;

FIG. 50 shows a calculated optical absorption spectrum for the device structure in FIG. 49 where the lowest energy electron-hole recombination is determined by the quantized energy levels within the MQW giving rise to sharp and discrete absorption/emission energy in accordance with an illustrative embodiment of the present disclosure;

FIG. 51 is an energy band diagram versus growth direction of an epitaxial metal oxide UVLED structure where the MQW region has a narrow bandgap material comprising $(Al_{0.1}Ga_{0.9})_2O_3$ in accordance with an illustrative embodiment of the present disclosure;

FIG. 52 shows a calculated optical absorption spectrum for the device structure in FIG. 49 where the lowest energy electron-hole recombination is determined by the quantized energy levels within the MQW giving rise to sharp and discrete absorption/emission energy in accordance with an illustrative embodiment of the present disclosure;

FIG. 53 is an energy band diagram versus growth direction of an epitaxial metal oxide UVLED structure where the MQW region has a narrow bandgap material comprising $(Al_{0.2}Ga_{0.8})_2O_3$ in accordance with an illustrative embodiment of the present disclosure;

FIG. 54 shows a calculated optical absorption spectrum for the device structure in FIG. 53 where the lowest energy electron-hole recombination is determined by the quantized energy levels within the MQW giving rise to sharp and discrete absorption/emission energy in accordance with an illustrative embodiment of the present disclosure;

FIG. 55 plots pure metal work-function energy and sorts the metal species from high to low work function for application to p-type and n-type ohmic contacts to metal oxides in accordance with illustrative embodiments of the present disclosure;

FIG. 56 is a reciprocal lattice map 2-axis x-ray diffraction pattern for pseudomorphic ternary $(Al_{0.5}Ga_{0.5})_2O_3$ on an A-plane $Al_2O_3$ substrate in accordance with an illustrative embodiment of the present disclosure;

FIG. 57 is a 2-axis x-ray diffraction pattern of a pseudomorphic 10 period SL $[Al_2O_3/Ga_2O_3]$ on an A-plane $Al_2O_3$ substrate showing in-plane lattice matching throughout the structure in accordance with an illustrative embodiment of the present disclosure;

FIGS. 58A and 58B illustrate optical mode structure and threshold gain for a slab of metal-oxide semiconductor material in accordance with an illustrative embodiment of the present disclosure;

FIGS. 59A and 59B illustrate optical mode structure and threshold gain for a slab of metal-oxide semiconductor material in accordance with another illustrative embodiment of the present disclosure;

FIG. 60 shows an optical cavity formed using an optical gain medium embedded between two optical reflectors in accordance with an illustrative embodiment of the present disclosure;

FIG. 61 shows an optical cavity formed using an optical gain medium embedded between two optical reflectors in accordance with an illustrative embodiment of the present disclosure, illustrating that two optical wavelengths can be supported by the gain medium and cavity length;

FIG. 62 shows an optical cavity formed using an optical gain medium of finite thickness embedded between two optical reflectors and positioned at the peak electric field intensity of a fundamental wavelength mode in accordance with an illustrative embodiment of the present disclosure, showing that only one optical wavelength can be supported by the gain medium and cavity length;

FIG. 63 shows an optical cavity formed using two optical gain media of finite thickness embedded between two optical reflectors in accordance with an illustrative embodiment that is positioned at the peak electric field intensity of a shorter wavelength mode, illustrating that only one optical wavelength can be supported by the gain medium and cavity length;

FIGS. 64A and 64B show single quantum well structures comprising metal-oxide ternary materials with quantized electron and holes states in accordance with an illustrative embodiment of the present disclosure depicting two different quantum well thicknesses;

FIGS. 65A and 65B show single quantum well structures comprising metal-oxide ternary materials with quantized electron and hole states in accordance with an illustrative embodiment of the present disclosure depicting two different quantum well thicknesses;

FIG. 66 shows spontaneous emission spectra from the quantum well structures disclosed in FIGS. 64A, 64B, 65A and 65B;

FIG. 67A and FIG. 67B show a spatial energy band structure of a metal oxide quantum well and the associated energy-crystal momentum band structure in accordance with an illustrative embodiment of the present disclosure;

FIGS. 68A and 68B show a population inversion mechanism for the electrons and holes in a quantum well band structure and the resulting gain spectrum for the quantum well;

FIGS. 69A and 69B show electron and hole energy states for filled conduction and valence bands in the energy-momentum space for the case of a direct and pseudo-direct bandgap metal oxide structure in accordance with an illustrative embodiment of the present disclosure;

FIGS. 70A and 70B show an impact ionization process for metal oxide injected hot electrons resulting in pair production in accordance with an illustrative embodiment of the present disclosure;

FIGS. 71A and 71B show an impact ionization process for metal oxide injected hot electrons resulting in pair production in accordance with another illustrative embodiment of the present disclosure;

FIGS. 72A and 72B show an effect of an electric field applied to metal oxide creating a plurality of impact ionization events in accordance with another illustrative embodiment of the present disclosure;

FIG. 73 shows a vertical type ultraviolet laser structure in accordance with an illustrative embodiment of the present disclosure where the reflectors form part of the cavity and electrical circuit;

FIG. 74 shows a vertical type ultraviolet laser structure in accordance with an illustrative embodiment of the present disclosure where the reflectors forming the optical cavity are decoupled from the electrical circuit; and FIG. 75 shows a waveguide type ultraviolet laser structure in accordance with an illustrative embodiment of the present disclosure where the reflectors forming the optical cavity are decoupled from the electrical circuit and where the optical gain medium embedded within the lateral cavity can have a length optimized for a low threshold gain.

In the following description, like reference characters designate like or corresponding parts throughout the figures.

DETAILED DESCRIPTION

Disclosed herein are embodiments of an optoelectronic semiconductor light emitting device that may be configured to emit light having a wavelength in the range of from about 150 nm to about 280 nm. The devices comprise a metal oxide substrate having at least one epitaxial semiconductor metal oxide layer disposed thereon. The substrate may comprise $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $MgF_2$, $LaAlO_3$, $TiO_2$ or quartz. In certain embodiments, the one or more of the at least one semiconductor layer comprises at least one of $Al_2O_3$ and $Ga_2O_3$.

In a first aspect, the present disclosure provides an optoelectronic semiconductor light emitting device configured to emit light having a wavelength in the range from about 150 nm to about 280 nm, the device comprising a substrate having at least one epitaxial semiconductor layer disposed thereon, wherein each of the one or more epitaxial semiconductor layers comprises a metal oxide.

In another form, the metal oxide of each of the one or more semiconductor layers is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$, $IrO_2$, and any combination of the aforementioned metal oxides.

In another form, at least one of the one or more semiconductor layers is a single crystal.

In another form, the at least one of the one or more semiconductor layers has rhombohedral, hexagonal or monoclinic crystal symmetry.

In another form, at least one of the one or more semiconductor layers is composed of a binary metal oxide, wherein the metal oxide is selected from $Al_2O_3$ and $Ga_2O_3$.

In another form, at least one of the one or more semiconductor layers is composed of a ternary metal-oxide composition, and the ternary metal oxide composition comprises at least one of $Al_2O_3$ and $Ga_2O_3$, and, optionally, a metal oxide selected from MgO, NiO, $LiO_2$, ZnO, $SiO_2$, GeO, $Er_2O_3$, $Gd_2O_3$, PdO, $Bi_2O_3$, and $IrO_2$.

In another form, the at least one of the one or more semiconductor layers is composed of a ternary metal-oxide composition of $(Al_xGa_{1-x})_2O_3$ wherein $0<x<1$.

In another form, the at least one of the one or more semiconductor layers comprises uniaxially deformed unit cells.

In another form, the at least one of the one or more semiconductor layers comprises biaxially deformed unit cells.

In another form, the at least one of the one or more semiconductor layers comprises triaxially deformed unit cells.

In another form, the at least one of the one or more semiconductor layer is composed of a quaternary metal oxide composition, and the quaternary metal oxide composition comprises either: (i) $Ga_2O_3$ and a metal oxide selected from $Al_2O_3$, MgO, NiO, $LiO_2$, ZnO, $SiO_2$, $GeO_2$, $Er_2O_3$, $Gd_2O_3$, PdO, $Bi_2O_3$, and $IrO_2$; or (ii) $Al_2O_3$ and a metal oxide selected from $Ga_2O_3$, MgO, NiO, $LiO_2$, ZnO, $SiO_2$, $GeO_2$, $Er_2O_3$, $Gd_2O_3$, PdO, $Bi_2O_3$, and $IrO_2$.

In another form, the at least one of the one or more semiconductor layers is composed of a quaternary metal oxide composition $(Ni_xMg_{1-x})_yGa_{2(1-y)}O_{3-2y}$, where $0<x<1$ and $0<y<1$.

In another form, the surface of the substrate is configured to enable lattice matching of crystal symmetry of the at least one semiconductor layer.

In another form, the substrate is a single crystal substrate.

In another form, the substrate is selected from $Al_2O_3$, $Ga_2O_3$, MgO, LiF, $MgAl_2O_4$, $MgGa_2O_4$, $LiGaO_2$, $LiAlO_2$, $MgF_2$, $LaAlO_3$, $TiO_2$ and quartz.

In another form, the surface of the substrate has crystal symmetry and in-plane lattice constant matching so as to enable homoepitaxy or heteroepitaxy of the at least one semiconductor layer.

In another form, one or more of the at least one semiconductor layer is of direct bandgap type.

In a second aspect, the present disclosure provides an optoelectronic semiconductor device for generating light of a predetermined wavelength comprising a substrate; and an optical emission region having an optical emission region band structure configured for generating light of the predetermined wavelength and comprising one or more epitaxial metal oxide layers supported by the substrate.

In another form, configuring the optical emission region band structure for generating light of the predetermined wavelength comprises selecting the one or more epitaxial metal oxide layers to have an optical emission region band gap energy capable of generating light of the predetermined wavelength.

In another form, selecting the one or more epitaxial metal oxide layers to have an optical emission region band gap energy capable of generating light of the predetermined wavelength comprises forming the one or more epitaxial metal oxide layers of a binary metal oxide of the form $A_xO_y$, comprising a metal specie (A) combined with oxygen (O) in the relative proportions x and y.

In another form, the binary metal oxide is $Al_2O_3$.

In another form, the binary metal oxide is $Ga_2O_3$.

In another form, the binary metal oxide is selected from the group consisting of MgO, NiO, $LiO_2$, ZnO, $SiO_2$, GeO, $Er_2O_3$, $Gd_2O_3$, PdO, $Bi_2O_3$ and $IrO_2$.

In another form, selecting the one or more epitaxial metal oxide layers to have an optical emission region band gap energy capable of generating light of the predetermined wavelength comprises forming the one or more epitaxial metal oxide layers of a ternary metal oxide.

In another form, the ternary metal oxide is a ternary metal oxide bulk alloy of the form $A_xB_yO_n$ comprising a metal species (A) and (B) combined with oxygen (O) in the relative proportions x, y and n.

In another form, a relative fraction of the metal specie B to the metal specie A ranges from a minority relative fraction to a majority relative fraction.

In another form, the ternary metal oxide is of the form $A_xB_{1-x}O_n$ where $0<x<1.0$.

In another form, the metal specie A is Al and metal specie B is selected from the group consisting of: Zn, Mg, Ga, Ni, Rare Earth, Ir Bi, and Li.

In another form, the metal specie A is Ga and metal specie B is selected from the group consisting of: Zn, Mg, Ni, Al, Rare Earth, Ir, Bi and Li.

In another form, the ternary metal oxide is of the form $(Al_xGa_{1-x})_2O_3$, where $0<x<1$. In other forms, x is about 0.1, or about 0.3, or about 0.5.

In another form, the ternary metal oxide is a ternary metal oxide ordered alloy structure formed by sequential deposition of unit cells formed along a unit cell direction and comprising alternating layers of metal specie A and metal specie B having intermediate 0 layers to form a metal oxide ordered alloy of the form A-O—B—O-A-O—B-etc.

In another form, the metal specie A is Al and the metal specie B is Ga, and the ternary metal oxide ordered alloy is of the form Al—O—Ga—O—Al-etc.

In another form, the ternary metal oxide is of the form of a host binary metal oxide crystal with a crystal modification specie.

In another form, the host binary metal oxide crystal is selected from the group consisting of $Ga_2O_3$, $Al_2O_3$, MgO, NiO, ZnO, $Bi_2O_3$, r-$GeO_2$, $Ir_2O_3$, $RE_2O_3$ and $Li_2O$ and the crystal modification specie is selected from the group consisting of Ga, Al, Mg, Ni, Zn, Bi, Ge, Ir, RE and Li.

In another form, selecting the one or more epitaxial metal oxide layers to have an optical emission region band gap energy capable of generating light of the predetermined wavelength comprises forming the one or more epitaxial metal oxide layers as a superlattice comprising two or more layers of metal oxides forming a unit cell and repeating with a fixed unit cell period along a growth direction.

In another form, the superlattice is a bi-layered superlattice comprising repeating layers comprising two different metal oxides.

In another form, the two different metal oxides comprise a first binary metal oxide and a second binary metal oxide.

In another form, the first binary metal oxide is $Al_2O_3$ and the second binary metal oxide is $Ga_2O_3$.

In another form, the first binary metal oxide is NiO and the second binary metal oxide is $Ga_2O_3$.

In another form, the first binary metal oxide is MgO and the second binary metal oxide is NiO.

In another form, the first binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$ and wherein the second binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$ absent the first selected binary metal oxide.

In another form, the two different metal oxides comprise a binary metal oxide and a ternary metal oxide.

In another form, the binary metal oxide is $Ga_2O_3$ and the ternary metal oxide is $(Al_xGa_{1-x})_2O_3$, where $0<x<1.0$.

In another form, the binary metal oxide is $Ga_2O_3$ and the ternary metal oxide is $Al_xGa_{1-x}O_3$, where $0<x<1.0$.

In another form, the binary metal oxide is $Ga_2O_3$ and the ternary metal oxide is $Mg_xGa_{2(1-x)}O_{3-2x}$, where $0<x<1.0$.

In another form, the binary metal oxide is $Al_2O_3$ and the ternary metal oxide is $(Al_xGa_{1-x})_2O_3$, where $0<x<1.0$.

In another form, the binary metal oxide is $Al_2O_3$ and the ternary metal oxide is $Al_xGa_{1-x}O_3$, where $0<x<1.0$.

In another form, the binary metal oxide is $Al_2O_3$ and the ternary metal oxide is $(Al_xEr_{1-x})_2O_3$.

In another form, the ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $Al_xBi_{1-x})_2O_3$, $Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0<x<1.0$.

In another form, the binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$.

In another form, the two different metal oxides comprise a first ternary metal oxide and a second ternary metal oxide.

In another form, the first ternary metal oxide is $Al_xGa_{1-x}O$ and the second ternary metal oxide is $(Al_xGa_{1-x})_2O_3$ or $Al_yGa_{1-y}O_3$ where $0<x<1$ and $0<y<1$.

In another form, the first ternary metal oxide is $(Al_xGa_{1-x})_2O_3$ and the second ternary metal oxide is $(Al_yGa_{1-y})_2O_3$, where $0<x<1$ and $0<y<1$.

In another form, the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $Al_xBi_{1-x})_2O_3$, $Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xRE_{1-x})O_3$, $(Al_xRE_{1-x})O_3$, $(Al_{2x}Li_{2(1-x)})O_{2x+1}$, and $(Ga_{2x}Li_{2(1-x)})O_{2x+1}$ absent the first selected ternary metal oxide, where $0<x<1.0$.

In another form, the superlattice is a tri-layered superlattice comprising repeating layers of three different metal oxides.

In another form, the three different metal oxides comprise a first binary metal oxide, a second binary metal oxide and a third binary metal oxide.

In another form, the first binary metal oxide is MgO, the second binary metal oxide is NiO and the third binary metal oxide $Ga_2O_3$.

In another form, the first binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$, and wherein the second binary metal oxide is selected from the group $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$ absent the first selected binary metal oxide, and wherein the third binary metal oxide is selected from the group $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$ absent the first and second selected binary metal oxides.

In another form, the three different metal oxides comprise a first binary metal oxide, a second binary metal oxide and a ternary metal oxide.

In another form, the first binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$, and wherein the second binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$ absent the first selected binary metal oxide, and wherein the ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2+x+1}$ and $(Ga_{2x}Li_{2(1-x)})O_{2x+1}$, where $0<x<1$.

In another form, the three different metal oxides comprise a binary metal oxide, a first ternary metal oxide and a second ternary metal oxide.

In another form, the binary metal oxide is selected from the group consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$ and $IrO_2$, and wherein the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, where $0<x<1$.

In another form, the three different metal oxides comprise a first ternary metal oxide, a second ternary metal oxide and a third ternary metal oxide.

In another form, the first ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, and wherein the second ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_x.Bi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first selected ternary metal oxide, and wherein the third ternary metal oxide is selected from the group consisting of $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$ absent the first and second selected ternary metal oxides, where $0<x<1$.

In another form, the superlattice is a quad-layered superlattice comprising repeating layers of at least three different metal oxides.

In another form, the superlattice is a quad-layered superlattice comprising repeating layers of three different metal oxides, and a selected metal oxide layer of the three different metal oxides is repeated in the quad-layered superlattice.

In another form, the three different metal oxides comprise a first binary metal oxide, a second binary metal oxide and a third binary metal oxide.

In another form, the first binary metal oxide is MgO, the second binary metal oxide is NiO and the third binary metal oxide is $Ga_2O_3$ forming a quad-layer superlattice comprising $MgO$—$Ga_2O_3$—$NiO$—$Ga_2O_3$ layers.

In another form, the three different metal oxides are selected from the group of consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$, $IrO_2$, $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0<x<1.0$.

In another form, the superlattice is a quad-layered superlattice comprising repeating layers of four different metal oxides.

In another form, the four different metal oxides are selected from the group of consisting of $Al_2O_3$, $Ga_2O_3$, MgO, NiO, $LiO_2$, ZnO, $SiO_2$, GeO, $Er_2O_3$, $Gd_2O_3$, PdO, $Bi_2O_3$, $IrO_2$, $(Ga_{2x}Ni_{1-x})O_{2x+1}$, $(Al_{2x}Ni_{1-x})O_{2x+1}$, $(Al_{2x}Mg_{1-x})O_{2x+1}$, $(Ga_{2x}Mg_{1-x})O_{2x+1}$, $(Al_{2x}Zn_{1-x})O_{2x+1}$, $(Ga_{2x}Zn_{1-x})O_{2x+1}$, $(Ga_xBi_{1-x})_2O_3$, $(Al_xBi_{1-x})_2O_3$, $(Al_{2x}Ge_{1-x})O_{2+x}$, $(Ga_{2x}Ge_{1-x})O_{2+x}$, $(Al_xIr_{1-x})_2O_3$, $(Ga_xIr_{1-x})_2O_3$, $(Ga_xRE_{1-x})O_3$, $(Al_xRE_{1-x})O_3$, $(Al_{2x}Li_{2(1-x)})O_{2x+1}$ and $(Ga_{2x}Li_{2(1-x)})O_{2x+1}$, where $0<x<1.0$.

In another form, respective individual layers of the two or more metal oxide layers forming the unit cell of the superlattice have a thickness less than or approximately equal to an electron de Broglie wavelength in that respective individual layer.

In another form, configuring the optical emission region band structure for generating light of the predetermined wavelength comprises modifying an initial optical emission region band structure of the one or more epitaxial metal oxide layers on forming the optoelectronic device.

In another form, modifying the initial optical emission region band structure of the one or more epitaxial metal oxide layers on forming the optoelectronic device comprises introducing a predetermined strain to the one or more epitaxial metal oxide layers during epitaxial deposition of the one or more epitaxial metal oxide layers.

In another form, the predetermined strain is introduced to modify the initial optical emission region band structure from an indirect band gap to a direct band gap.

In another form, the predetermined strain is introduced to modify an initial bandgap energy of the initial optical emission region band structure.

In another form, the predetermined strain is introduced to modify an initial valence band structure of the initial optical emission region band structure.

In another form, modifying the initial valence band structure comprises raising or lowering a selected valence band with respect to the Fermi energy level of the optical emission region.

In another form, modifying the initial valence band structure comprises modifying the shape of the valence band structure to change localization characteristics of holes formed in the optical emission region.

In another form, introducing the predetermined strain to the one or more epitaxial metal oxide layers comprises selecting a to be strained metal oxide layer having a composition and crystal symmetry type which, when epitaxially formed on an underlying layer having a underlying layer composition and crystal symmetry type, will introduce the predetermined strain into the to be strained metal oxide layer.

In another form, the predetermined strain is a biaxial strain.

In another form, the underlying layer is a metal oxide having a first crystal symmetry type and the to be strained metal oxide layer also has the first crystal symmetry type but with a different lattice constant to introduce the biaxial strain into the to be strained metal oxide layer.

In another form, the underlying layer of metal oxide is $Ga_2O_3$ and the to be strained metal oxide layer is $Al_2O_3$, and biaxial compression is introduced into the $Al_2O_3$ layer.

In another form, the underlying layer of metal oxide is $Al_2O_3$ and the to be strained layer of metal oxide is $Ga_2O_3$, and biaxial tension is introduced into the $Ga_2O_3$ layer.

In another form, the predetermined strain is a uniaxial strain.

In another form, the underlying layer has a first crystal symmetry type having asymmetric unit cells.

In another form, the to be strained metal oxide layer is monoclinic $Ga_2O_3$, $Al_xGa_{1-x}O$ or $Al_2O_3$, where $x<0<1$.

In another form, the underlying layer and the to be strained layer form layers in a superlattice.

In another form, modifying an initial optical emission region band structure of the one or more epitaxial metal oxide layers on forming the optoelectronic device comprises introducing a predetermined strain to the one or more epitaxial metal oxide layers following epitaxial deposition of the one or more epitaxial metal oxide layers.

In another form, the optoelectronic device comprises a first conductivity type region comprising one or more epitaxial metal oxide layers having a first conductivity type region band structure configured to operate in combination with the optical emission region to generate light of the predetermined wavelength.

In another form, configuring the first conductivity type region band structure to operate in combination with the optical emission region to generate light of the predetermined wavelength comprises selecting a first conductivity type region energy band gap greater than the optical emission region energy band gap.

In another form, configuring the first conductivity type region band structure to operate in combination with the optical emission region to generate light of the predetermined wavelength comprises selecting the first conductivity type region to have an indirect bandgap.

In another form, configuring the first conductivity type region band structure comprises one or more of: selecting an appropriate metal oxide material or materials in line with the principles and techniques considered in the present disclosure in relation to the optical emission region; forming a superlattice in line with the principles and techniques considered in the present disclosure in relation to the optical emission region; and/or modifying the first conductivity type region band structure by applying strain in line with the principles and techniques considered in the present disclosure in relation to the optical emission region.

In another form, the first conductivity type region is a n-type region.

In another form, the optoelectronic device comprises a second conductivity type region comprising one or more epitaxial metal oxide layers having a second conductivity type region band structure configured to operate in combination with the optical emission region and the first conductivity type region to generate light of the predetermined wavelength.

In another form, configuring the second conductivity type region band structure to operate in combination with the optical emission region to generate light of the predetermined wavelength comprises selecting a second conductivity type region energy band gap greater than the optical emission region energy band gap.

In another form, configuring the second conductivity type region band structure to operate in combination with the optical emission region to generate light of the predetermined wavelength comprises selecting the second conductivity type region to have an indirect bandgap.

In another form, configuring the second conductivity type region band structure comprises one or more of: selecting an appropriate metal oxide material or materials in line with the principles and techniques considered in the present disclosure in relation to the optical emission region; forming a superlattice in line with the principles and techniques considered in the present disclosure in relation to the optical emission region; and/or modifying the first conductivity type region band structure by applying strain in line with the principles and techniques considered in the present disclosure in relation to the optical emission region.

In another form, the second conductivity type region is a p-type region.

In another form, the substrate is formed from a metal oxide.

In another form, the metal oxide is selected from the group consisting of $Al_2O_3$, $Ga_2O_3$, MgO, LiF, $MgAl_2O_4$, $MgGa_2O_4$, $LiGaO_2$, $LiAlO_2$, $(Al_xGa_{1-x})_2O_3$, $LaAlO_3$, $TiO_2$ and quartz.

In another form, the substrate is formed from a metal fluoride.

In another form, the metal fluoride is $MgF_2$ or LiF.

In another form, the predetermined wavelength is in the wavelength range of 150 nm to 700 nm.

In another form, the predetermined wavelength is in the wavelength range of 150 nm to 280 nm.

In a third aspect, the present disclosure provides a method for forming an optoelectronic semiconductor device configured to emit light having a wavelength in the range from about 150 nm to about 280 nm, the method comprising: providing a metal oxide substrate having an epitaxial growth surface; oxidizing the epitaxial growth surface to form an activated epitaxial growth surface; and exposing the activated epitaxial growth surface to one or more atomic beams each comprising high purity metal atoms and one or more atomic beams comprising oxygen atoms under conditions to deposit two or more epitaxial metal oxide films.

In another form, the metal oxide substrate comprises an Al or a Ga metal oxide substrate.

In another form, the one or more atomic beams each comprising high purity metal atoms comprise any one or more of the metals selected from the group consisting of Al, Ga, Mg, Ni, Li, Zn, Si, Ge, Er, Gd, Pd, Bi, Ir, and any combination of the aforementioned metals.

In another form, the one or more atomic beams each comprising high purity metal atoms comprise any one or more of the metals selected from the group consisting of Al and Ga, and the epitaxial metal oxide films comprise $(Al_xGa_{1-x})_2O_3$, wherein $0 \leq x \leq 1$.

In another form, the conditions to deposit two or more epitaxial metal oxide films comprise exposing the activated epitaxial growth surface to atomic beams comprising high purity metal atoms and atomic beams comprising oxygen atoms at an oxygen:total metal flux ratio of >1.

In another form, at least one of the two or more epitaxial metal oxide films provides a first conductivity type region comprising one or more epitaxial metal oxide layers, and at least another of the two or more epitaxial metal oxide films provides a second conductivity type region comprising one or more epitaxial metal oxide layers.

In another form, at least one of the two or more epitaxial $(Al_xGa_{1-x})_2O_3$ films provides a first conductivity type region comprising one or more epitaxial $(Al_xGa_{1-x})_2O_3$ layers, and at least another of the two or more epitaxial $(Al_xGa_{1-x})_2O_3$ films provides a second conductivity type region comprising one or more epitaxial $(Al_xGa_{1-x})_2O_3$ layers.

In another form, the substrate is treated prior to the oxidizing step by high temperature (>800° C.) desorption in an ultrahigh vacuum chamber (less than $5 \times 10^{-10}$ Torr) to form an atomically flat epitaxial growth surface.

In another form, the method further comprises monitoring the surface in real-time to assess atomic surface quality.

In another form, the surface is monitored in real-time by reflection high energy electron diffraction (RHEED).

In another form, oxidizing the epitaxial growth surface comprises exposing the epitaxial growth surface to an oxygen source under conditions to oxidize the epitaxial growth surface.

In another form, the oxygen source is selected from one or more of the group consisting of an oxygen plasma, ozone and nitrous oxide.

In another form, the oxygen source is radiofrequency inductively coupled plasma (RF-ICP).

In another form, the method further comprises monitoring the surface in real-time to assess surface oxygen density.

In another form, the surface is monitored in real-time by RHEED.

In another form, the atomic beams comprising high purity Al atoms and/or high purity Ga atoms are each provided by effusion cells comprising inert ceramic crucibles radiatively heated by a filament and controlled by feedback sensing to monitor the metal melt temperature within the crucible.

In another form, high purity elemental metals of 6N to 7N or higher purity are used.

In another form, the method further comprises measuring the beam flux of each Al and/or Ga and oxygen atomic beam to determine the relative flux ratio prior to exposing the activated epitaxial growth surface to the atomic beams at the determined relative flux ratio.

In another form, the method further comprises rotating the substrate as the activated epitaxial growth surface is exposed to the atomic beams so as to accumulate a uniform amount of atomic beam intersecting the substrate surface for a given amount of deposition time.

In another form, the method further comprises heating the substrate as the activated epitaxial growth surface is exposed to the atomic beams.

In another form, the substrate is heated radiatively from behind using a blackbody emissivity matched to the below bandgap absorption of the metal oxide substrate.

In another form, the activated epitaxial growth surface is exposed to the atomic beams in a vacuum of from about $1 \times 10^{-6}$ Torr to about $1 \times 10^{-5}$ Torr.

In another form, Al and Ga atomic beam fluxes at the substrate surface are from about $1 \times 10^{-8}$ Torr to about $1 \times 10^{-6}$ Torr.

In another form, oxygen atomic beam fluxes at the substrate surface are from about $1 \times 10^{-7}$ Torr to about $1 \times 10^{-5}$ Torr.

In another form, the Al or Ga metal oxide substrate is A-plane sapphire.

In another form, the Al or Ga metal oxide substrate is monoclinic $Ga_2O_3$.

In another form, the two or more epitaxial $(Al_xGa_{1-x})_2O_3$ films comprise corundum type $AlGaO_3$.

In another form, $x \leq 0.5$ for each of the two or more epitaxial $(Al_xGa_{1-x})_2O_3$ films.

In a fourth aspect, the present disclosure provides a method for forming a multilayer semiconducting device comprising: forming a first layer having a first crystal symmetry type and a first composition; and depositing in a non-equilibrium environment a metal oxide layer having a second crystal symmetry type and a second composition onto the first layer, wherein depositing the second layer onto the first layer comprises initially matching the second crystal symmetry type to the first crystal symmetry type.

In another form, initially matching the second crystal symmetry type to the first crystal symmetry type comprises matching a first lattice configuration of the first crystal symmetry type with a second lattice configuration of the second crystal symmetry at a horizontal planar growing interface.

In another form, matching the first and second crystal symmetry types comprise substantially matching respective end plane lattice constants of the first and second lattice configurations.

In another form, the first layer is corundum $Al_2O_3$ (sapphire) and the metal oxide layer is corundum $Ga_2O_3$.

In another form, the first layer is monoclinic $Al_2O_3$ and the metal oxide layer is monoclinic $Ga_2O_3$.

In another form, the first layer is R-plane corundum $Al_2O_3$ (sapphire) prepared under O-rich growth conditions and the metal oxide layer is corundum $AlGaO_3$ selectively grown at low temperatures (<550° C.).

In another form, the first layer is M-plane corundum $Al_2O_3$ (sapphire) and the metal oxide layer is corundum $AlGaO_3$.

In another form, the first layer is A-plane corundum $Al_2O_3$ (sapphire) and the metal oxide layer is corundum $AlGaO_3$.

In another form, the first layer is corundum $Ga_2O_3$ and the metal oxide layer is. corundum $Al_2O_3$ (sapphire).

In another form, the first layer is monoclinic $Ga_2O_3$ and the metal oxide layer is. monoclinic $Al_2O_3$ (sapphire).

In another form, the first layer is (−201)-oriented monoclinic $Ga_2O_3$ and the metal oxide layer is. (−201)-oriented monoclinic $AlGaO_3$.

In another form, the first layer is (010)-oriented monoclinic $Ga_2O_3$ and the metal oxide layer is. (010)-oriented monoclinic $AlGaO_3$.

In another form, the first layer is (001)-oriented monoclinic $Ga_2O_3$ and the metal oxide layer is. (001)-oriented monoclinic $AlGaO_3$.

In another form, the first and second crystal symmetry types are different, and matching the first and second lattice configuration comprises reorienting the metal oxide layer to substantially matching the in-plane atomic arrangement at the horizontal planar growing interface.

In another form, the first layer is C-plane corundum $Al_2O_3$ (sapphire) and wherein the metal oxide layer is any one of monoclinic, triclinic or hexagonal $AlGaO_3$.

In another form, the C-plane corundum $Al_2O_3$ (sapphire) is prepared under O-rich growth conditions to selectively grow hexagonal $AlGaO_3$ at lower growth temperatures (<650° C.).

In another form, the C-plane corundum $Al_2O_3$ (sapphire) is prepared under O-rich growth conditions to selectively grow monoclinic $AlGaO_3$ at higher growth temperatures (>650° C.) with Al % limited to approximately 45-50%.

In another form, the R-plane corundum $Al_2O_3$ (sapphire) is prepared under O-rich growth conditions to selectively grow monoclinic $AlGaO_3$ at higher growth temperatures (>700° C.) with Al %<50%.

In another form, the first layer is A-plane corundum $Al_2O_3$ (sapphire) and wherein the metal oxide layer is (110)-oriented monoclinic $Ga_2O_3$.

In another form, the first layer is (110)-oriented monoclinic $Ga_2O_3$ and wherein the metal oxide layer is corundum $AlGaO_3$.

In another form, the first layer is (010)-oriented monoclinic $Ga_2O_3$ and the metal oxide layer is. (111)-oriented cubic $MgGa_2O_4$.

In another form, the first layer is (100)-oriented cubic MgO and wherein the metal oxide layer is (100)-oriented monoclinic $AlGaO_3$.

In another form, the first layer is (100)-oriented cubic NiO and the metal oxide layer is (100)-oriented monoclinic $AlGaO_3$.

In another form, initially matching the second crystal symmetry type to the first crystal symmetry type comprises depositing, in a non-equilibrium environment, a buffer layer between the first layer and the metal oxide layer wherein a buffer layer crystal symmetry type is the same as the first crystal symmetry type to provide atomically flat layers for seeding the metal oxide layer having the second crystal symmetry type.

In another form, the buffer layer comprises an O-terminated template for seeding the metal oxide layer.

In another form, the buffer layer comprises a metal terminated template for seeding the metal oxide layer.

In another form, the first and second crystal symmetry types are selected from the group consisting of cubic, hexagonal, orthorhombic, trigonal, rhombic and monoclinic.

In another form, the first crystal symmetry type and first composition of the first layer and the second crystal symmetry type and second composition of the second layer are selected to introduce a predetermined strain into the second layer.

In another form, the first layer is a metal oxide layer.

In another form, the first and second layers form a unit cell that is repeated with a fixed unit cell period to form a superlattice.

In another form, the first and second layers are configured to have substantially equal but opposite strain to facilitate forming of the superlattice without defects.

In another form, the method comprises depositing, in a non-equilibrium environment, an additional metal oxide layer having a third crystal symmetry type and a third composition onto the metal oxide layer.

In another form, the third crystal type is selected from the group consisting of cubic, hexagonal, orthorhombic, trigonal, rhombic and monoclinic.

In another form, the multilayer semiconductor device is an optoelectronic semiconductor device for generating light of a predetermined wavelength.

In another form, the predetermined wavelength is in the wavelength range of 150 nm to 700 nm.

In another form, the predetermined wavelength is in the wavelength range of 150 nm to 280 nm.

In a fifth aspect, the present disclosure provides a method for forming an optoelectronic semiconductor device for generating light of a predetermined wavelength, the method comprising: introducing a substrate; depositing in a non-equilibrium environment a first conductivity type region comprising one or more epitaxial layers of metal oxide; depositing in a non-equilibrium environment an optical emission region comprising one or more epitaxial layers of metal oxide and comprising an optical emission region band structure configured for generating light of the predetermined wavelength; and depositing in a non-equilibrium environment a second conductivity type region comprising one or more epitaxial layers of metal oxide In another form, the predetermined wavelength is in the wavelength range of about 150 nm to about 700 nm. In another form, the predetermined wavelength is in the wavelength range of about 150 nm to about 425 nm. In one example, bismuth oxide can be used to produce wavelengths up to approximately 425 nm.

In another form, the predetermined wavelength is in the wavelength range of about 150 nm to about 280 nm.

In yet another form, the optical emission efficacy is controlled by the selection of the crystal symmetry type of the optically emissive region. The optical selection rule for electric-dipole emission is governed by the symmetry properties of the conduction band and valence band states as well as the crystal symmetry type. An optically emissive region having crystal structure possessing point group symmetry can have a property of either a center-of-inversion symmetry or non-inversion symmetry. Advantageous selection of crystal symmetry to promote electric-dipole or magnetic-dipole optical transitions are claimed herein for application to the optically emissive region. Conversely, advantageous selection of crystal symmetry to inhibit electric-dipole or magnetic-dipole optical transitions are also possible for promoting optically non-absorptive regions of the device.

Figure 1:
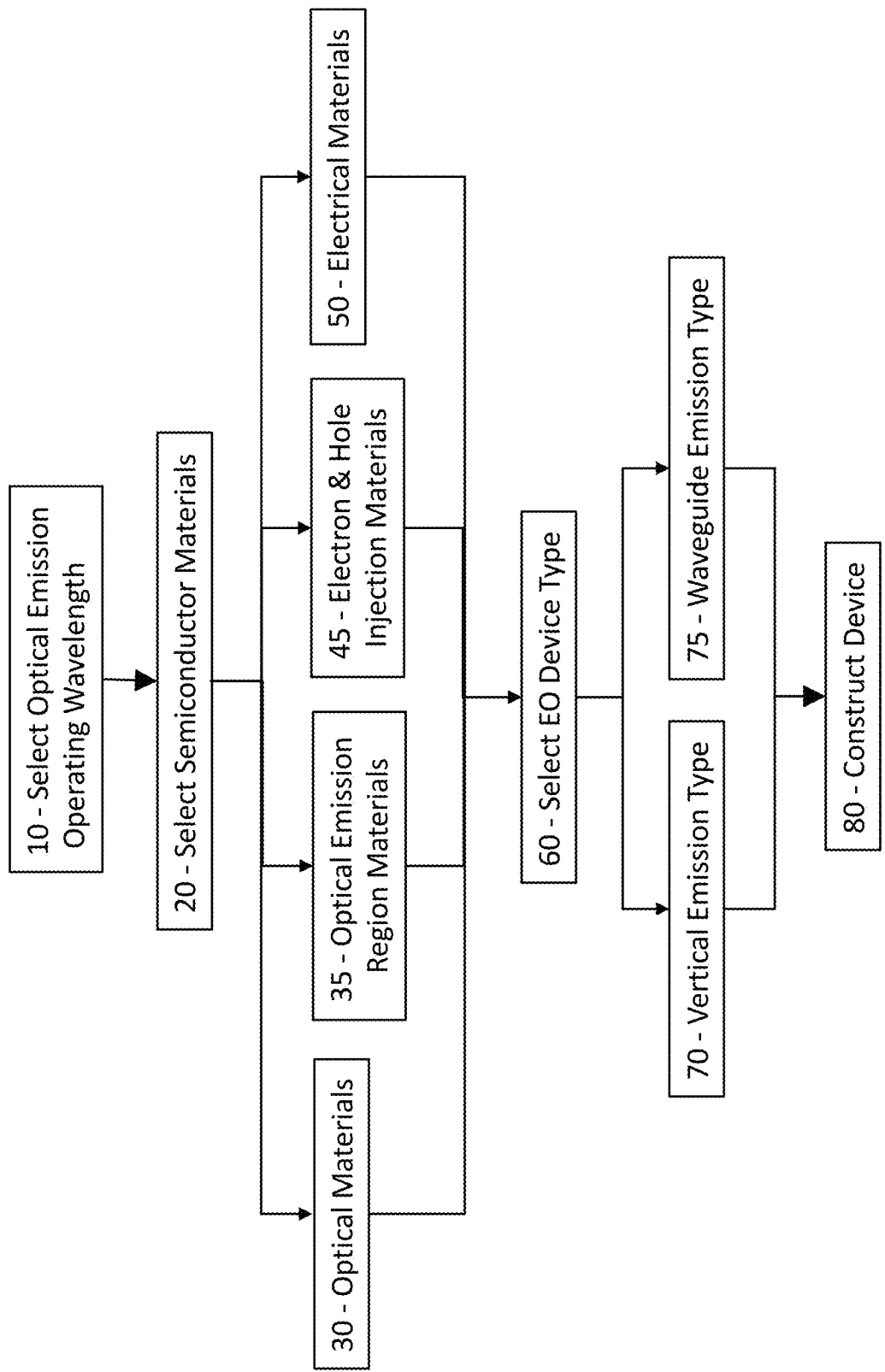
FIG. 1 is process flow diagram for constructing a metal oxide semiconductor-based LED in accordance with an illustrative embodiment of the present disclosure.

By way of overview, FIG. 1 is a process flow diagram for constructing an optoelectronic semiconductor optoelectronic device in accordance with an illustrative embodiment. In one example, the optoelectronic semiconductor device is a UVLED and in a further example, the UVLED is configured to generate a predetermined wavelength in the wavelength region of about 150 nm to about 280 nm. In this example, the construction process comprises selecting initially (i) the operating wavelength desired (e.g., a UVC wavelength or lower wavelength) in step 10 and (ii) the optical configuration of the devices in step 60 (e.g., a vertically emissive device 70 where the light output vector or direction is substantially perpendicular to the plane of the epi-layers, or a waveguide device 75 where the light output vector is substantially parallel to the plane of the epi-layers). The optical emission characteristics of the device is implemented in part by selection of semiconductor materials 20 and optical materials 30.

Taking the example of a UVLED, the optoelectronic semiconductor device constructed in accordance with the process illustrated in FIG. 1 will comprise an optical emission region based on the selected optical emission region material 35 wherein a photon is created by the advantageous spatial recombination of an electron in the conduction band and a hole in the valence band. In one example, the optical emission region comprises one or more metal oxide layers.

The optical emission region may be a direct bandgap type band structure configuration. This can be an intrinsic property of the materials(s) selected or can be tuned using one or more of the techniques of the present disclosure. The optical recombination or optical emission region may be clad by electron and hole reservoirs comprising n-type and p-type conductivity regions. The n-type and p-type conductivity regions are selected from electron and hole injection materials 45 that may have larger bandgaps relative to the optical emission region material 35, or can comprise an indirect bandgap structure that limits the optical absorption at the operating wavelength. In one example, the n-type and p-type conductivity regions are formed of one or more metal oxide layers.

Impurity doping of $Ga_2O_3$ and low Al % $AlGaO_3$ is possible for both n-type and p-type materials. N-type doping is particularly favorable for $Ga_2O_3$ and $AlGaO_3$, whereas p-type doping is more challenging but possible. Impurities suitable for n-type doping are Si, Ge, Sn and rare-earths (e.g., Erbium (Er) and Gadolinium (Gd)). The use of Ge-fluxes for co-deposition doping control is particularly suitable. For p-type co-doping using group-III metals, Ga-sites can be substituted via Magnesium ($Mg^{2+}$), Zinc ($Zn^{2+}$) and atomic-Nitrogen ($N^{3-}$ substitution for 0-sites). Further improvements can also be obtained using Iridium (Ir), Bismuth (Bi), Nickel (Ni) and Palladium (Pd).

Digital alloys using NiO, $Bi_2O_3$, $Ir_2O_3$ and PdO may also be used in some embodiments to advantageously aid p-type formation in $Ga_2O_3$-based materials. While p-type doping for $AlGaO_3$ is possible, alternative doping strategies are also possible using cubic crystal symmetry metal oxides (e.g. Li-doped NiO or Ni vacancy $NiO_{x>1}$) and wurtzite p-type Mg:GaN.

Yet a further opportunity is the ability to form highly polar forms of hexagonal crystal symmetry and epsilon-phase $Ga_2O_3$ directly integrated to $AlGaO_3$ thereby inducing polarization doping in accordance with the principles and techniques described and referred to in U.S. Pat. No. 9,691,938. The optical materials 30 necessary for the confinement of light in the device as differential changes in refractive index also requires selection. For far or vacuum ultraviolet, the selection of optically transparent materials ranges from MgO to metal-fluorides, such as $MgF_2$, LiF and the like. It has been found in accordance with the present disclosure that single crystal LiF and MgO substrates are advantageous for the realization of UVLEDs.

The electrical materials 50 forming the contacts to the electron and hole injector regions are selected from low- and high-work function metals, respectively. In one example, the metal ohmic contacts are formed in-situ directly on the final metal oxide surface, as a result reducing any mid-level traps/defects created at the semiconducting oxide-metal interface. The device is then constructed in step 80.

FIGS. 2A and 2B show schematically a vertical emission device 110 and waveguide emissive device 140 in accordance with illustrative embodiments. Device 110 has a substrate 105 and emission structure 135. Similarly, device 140 has a substrate 155 and emission structure 145. Light 125 and 130 from device 110 and light 150 from device 140, generated from the light generation region 120, propagates through the device from region 120 and is confined by a light escape cone defined by the difference in refractive indices at the semiconductor-air interface. As metal oxide semiconductors have extremely large bandgap energy, they have a substantially lower refractive index compared to III-N materials. Therefore, the use of metal oxide materials provides an improved light escape cone and therefore higher optical output coupling efficiency compared to conventional emission devices. Waveguide devices having single mode and multimode operation are also possible.

Broad area stripe waveguides can also be constructed further utilizing elemental metals Al- or Mg-metal to directly form ultraviolet plasmon guiding at the semiconductor-metal interface. This is an efficient method for forming waveguide structures. The E-k band structure for Al, Mg and Ni will be discussed below. Once the desired materials selections are available the process for constructing the semiconductor optoelectronic device may occur at step 80 (see FIG. 1).

Figure 3A:
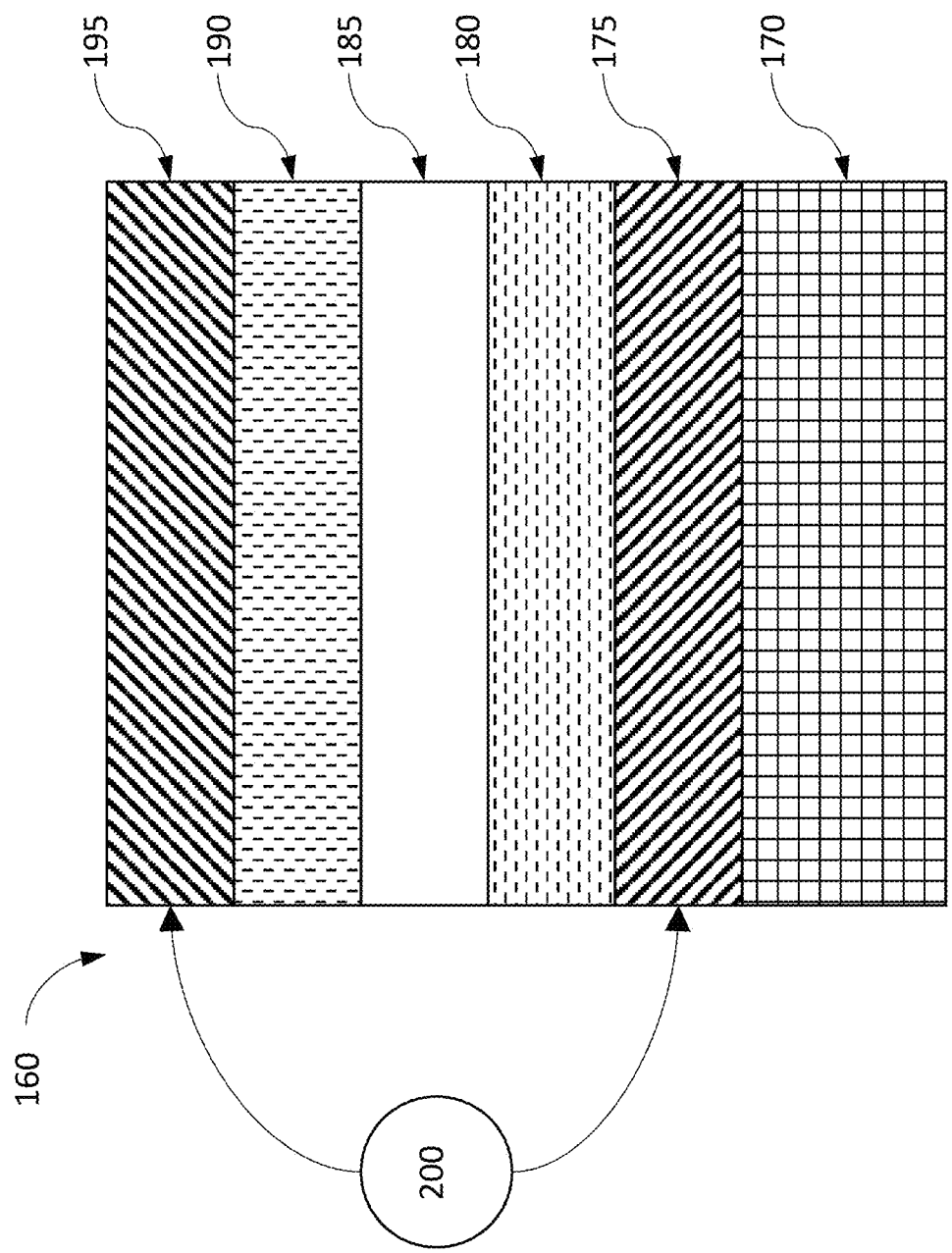
FIGS. 3A-3E are schematic diagrams of different LED device configurations in accordance with illustrative embodiments of the present disclosure comprising a plurality of regions.

FIG. 3A depicts functional regions of the epitaxial structure of an optoelectronic semiconductor device 160 for generating light of a predetermined wavelength according to an illustrative embodiment.

Figure 3B:
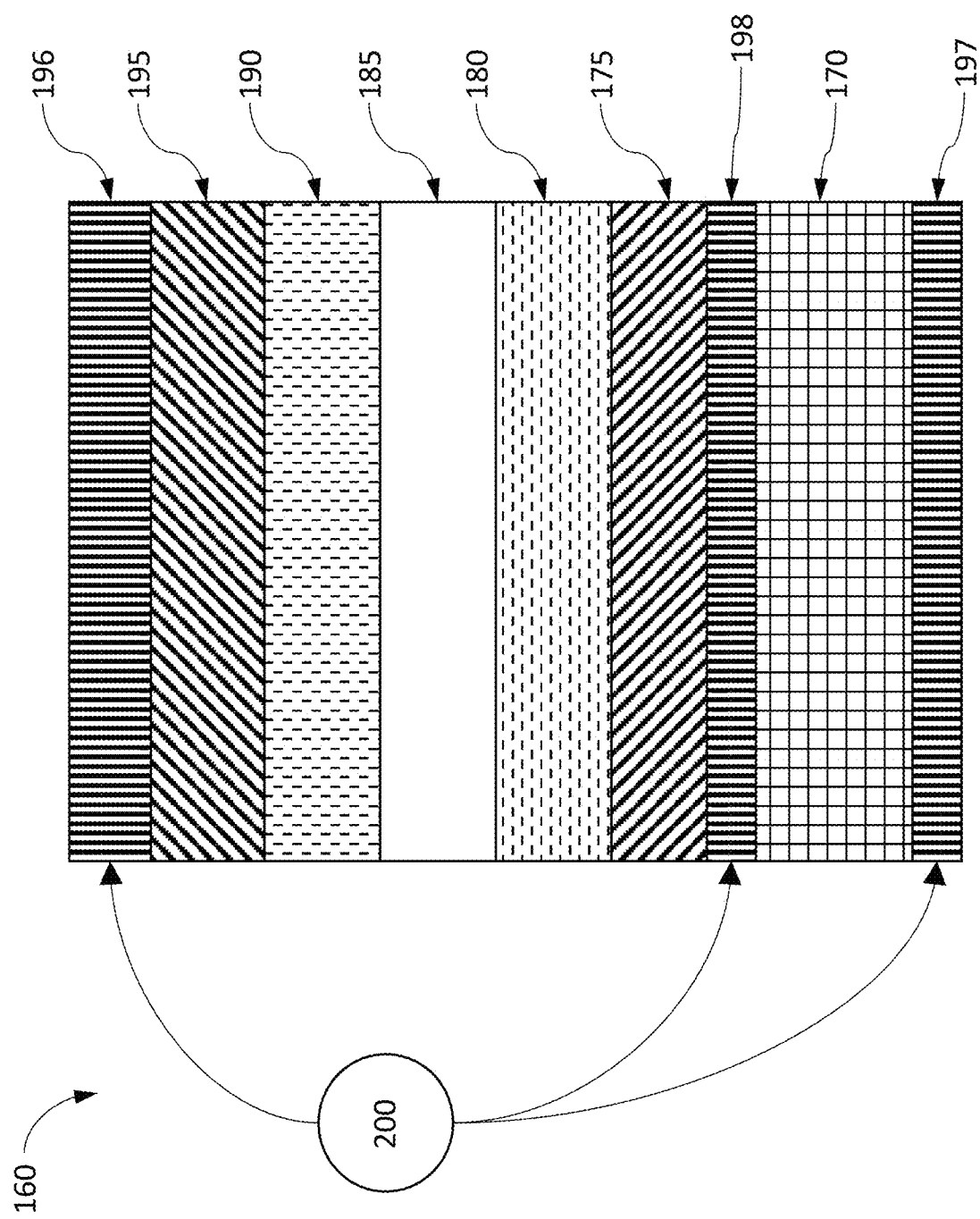

A substrate 170 is provided with advantageous crystal symmetry and in-plane lattice constant matching at the surface to enable homoepitaxy or heteroepitaxy of a first conductivity type region 175 with a subsequent non-absorbing spacer region 180, an optical emission region 185, an optional second spacer region 190 and a second conductivity type region 195. In one example, the in-plane lattice constant and the lattice geometry/arrangement are matched to modify (i.e., reduce) lattice defects. Electrical excitation is provided by a source 200 that is connected to the electron and hole injection regions of the first and second conductivity type regions 175 and 195. Ohmic metal contacts and low-bandgap or semi-metallic zero-bandgap oxide semiconductors are shown in FIG. 3B as regions 196, 197, 198 in another illustrative embodiment.

First and second conductivity type regions 175 and 195 are formed in one example using metal oxides having wide bandgap and are electrically contacted using ohmic contact regions 197, 198 and 196 as described herein. In the case of an insulating type substrate 170 the electrical contact configuration is via ohmic contact region 198 and first conductivity type region 175 for one electrical conductivity type (viz., electron or holes) and the other using ohmic contact region 196 and second conductivity type region 195. Ohmic contact region 198 may optionally be made to an exposed portion of first conductivity type region 175. As the insulating substrate 170 may further be transparent or opaque to the operating wavelength, for the case of a transparent substrate the lower ohmic contact region 197 may be utilized as an optical reflector as part of an optical resonator in another embodiment.

For the case of a vertical conduction device, the substrate 170 is electrically conducting and maybe either be transparent or opaque to the operating wavelength. Electrical or ohmic contact regions 197 and 198 are disposed to advantageously enable both electrical connection and optical propagation within the device.

Figure 3C:
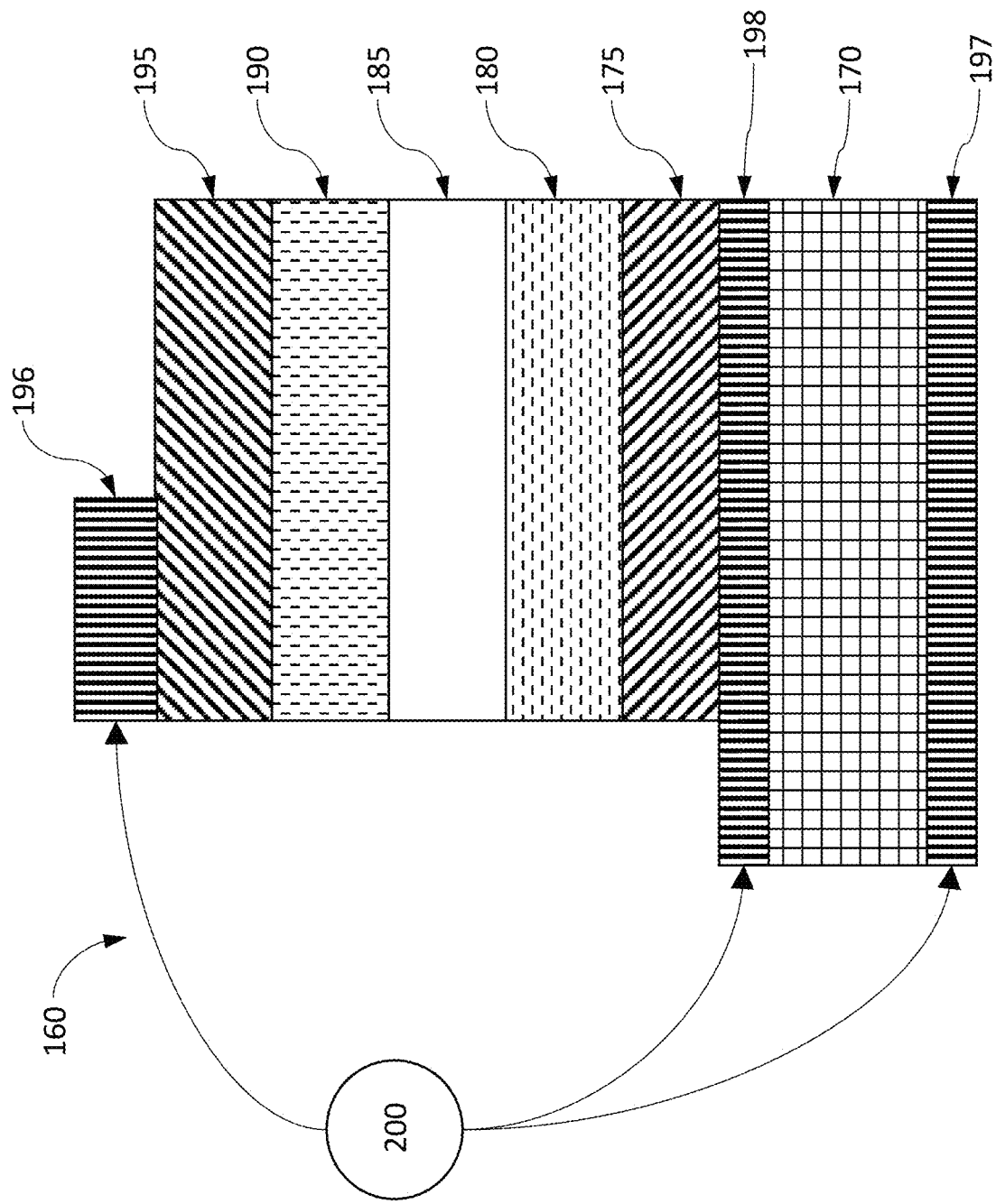

FIG. 3C illustrates schematically further possible electrical arrangements for the electrical contact regions 196 and 198 showing a mesa etched portion to expose lower conductivity type regions 175 and 198. The ohmic contact region 196 may further be patterned to expose a portion of the device for light extraction.

Figure 3D:
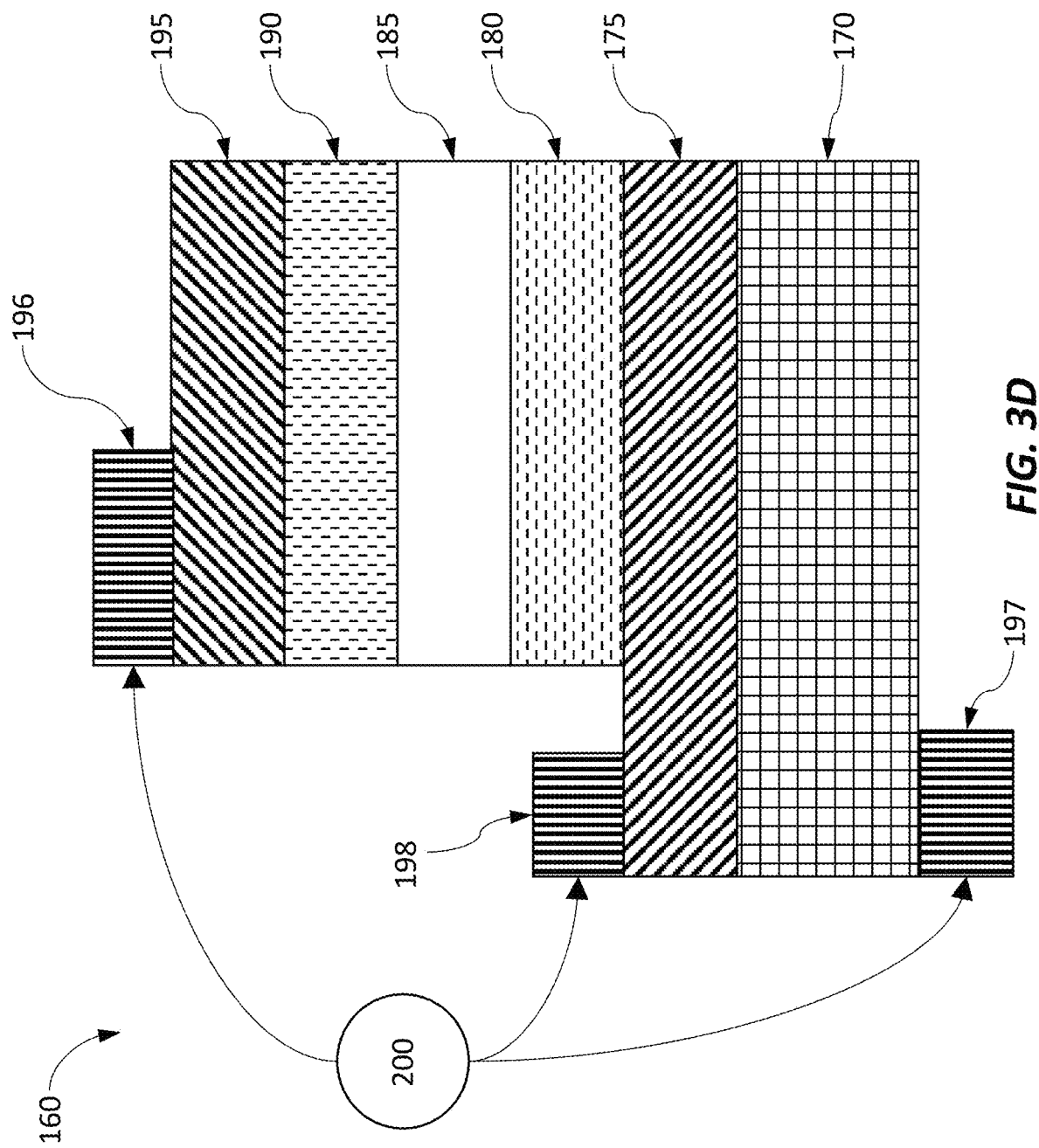

FIG. 3D shows yet a further electrical configuration wherein the insulating substrate 170 is used such that the first conductivity type region 175 is exposed and an electrical contact formed on a partially exposed portion of first conductivity type region 175. For the case of an electrically conductive and transparent substrate contact, ohmic contact region 198 is not required and a spatially disposed electrical contact region 197 is used.

Figure 3E:
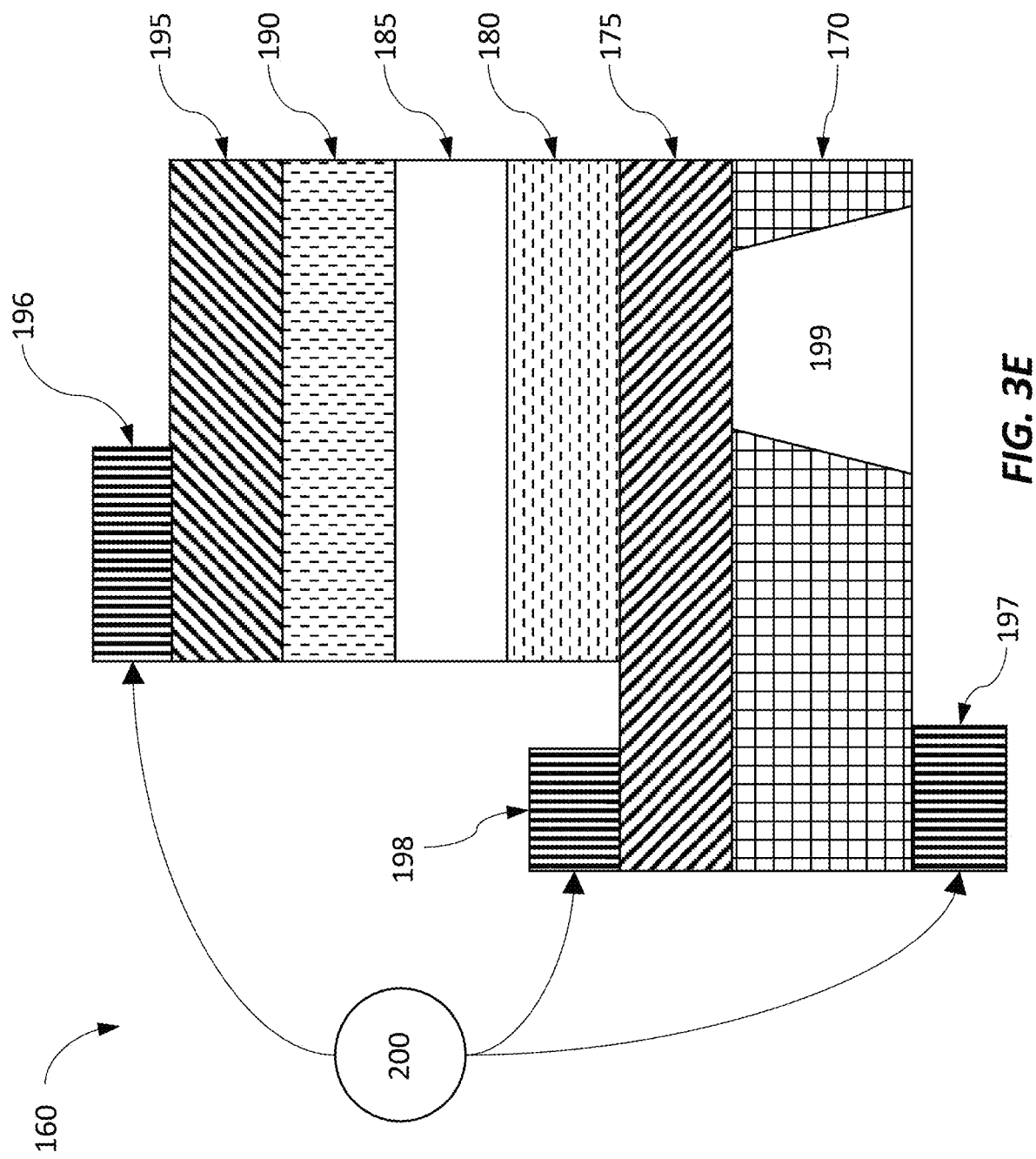

FIG. 3E yet further shows a possible arrangement of an optical aperture 199 etched partially or fully into an optically opaque substrate 170 for the optical coupling of light generated from optical emission region 185. The optical aperture may be utilized with the previous embodiments of FIGS. 3A-3D as well.

Figure 4:
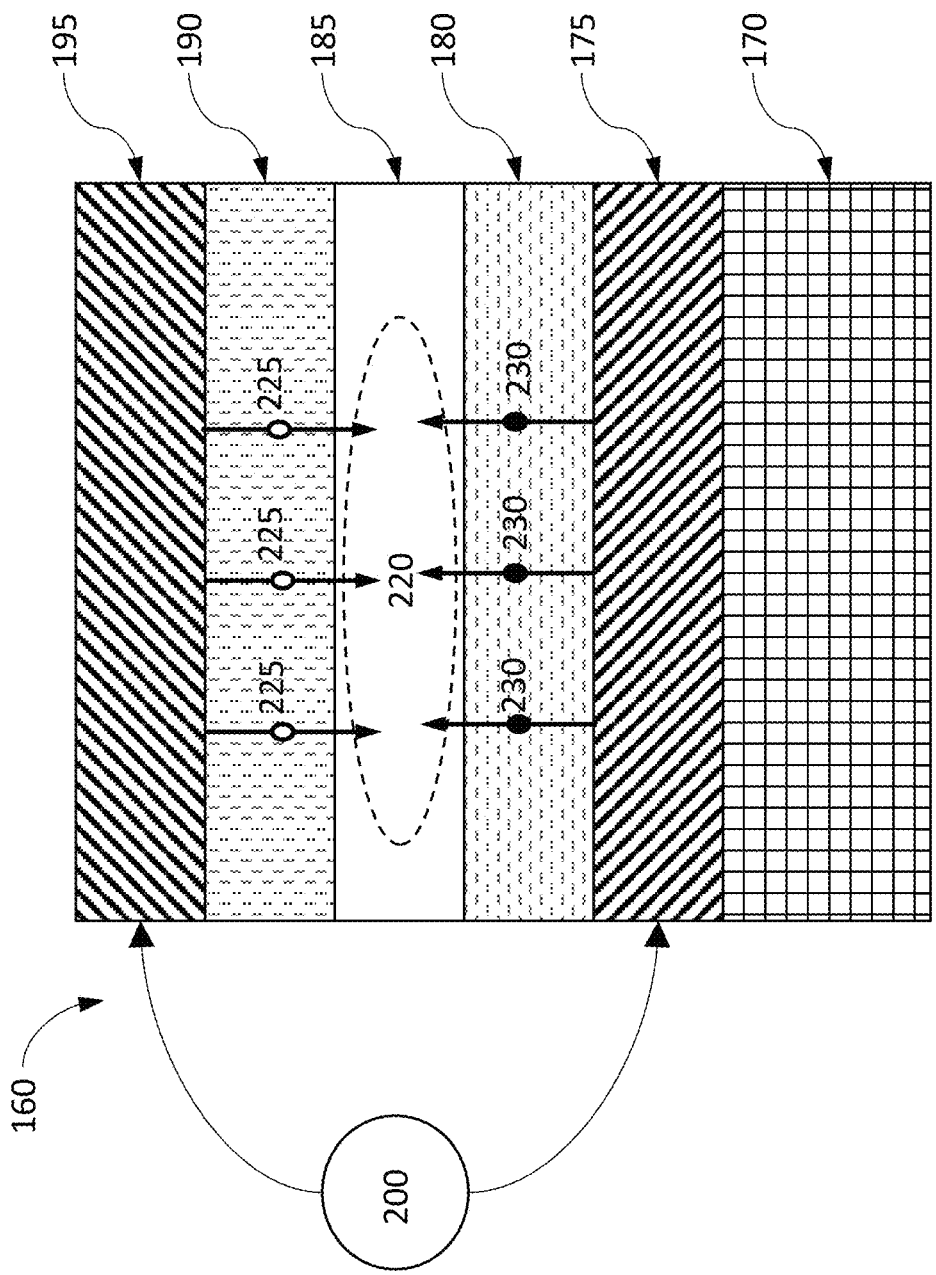
FIG. 4 depicts schematically the injection of oppositely charged carriers from physically separated regions into a recombination region in accordance with an illustrative embodiment of the present disclosure.

FIG. 4 shows schematically operation of optoelectronic semiconductor device 160 wherein an example configuration comprises an electron injection region 180 and a hole injection region 190 with electrical bias 200 to transport and direct mobile electrons 230 and holes 225 into the recombination region 220. The resulting electron and hole recombination forms a spatial optical emission region 185.

Extremely large energy bandgap ($E_G$) metal oxide semiconductors ($E_G > 4$ eV) may exhibit low mobility hole-type carriers and may even be highly localized spatially—as a result limiting the spatial extent for hole injection. The region in the vicinity of the hole injection region 190 and recombination region 220 may then become advantageous for recombination process. Furthermore, the hole injection region 190 itself may be the preferred region for injecting electrons such that recombination region 220 is located within a portion of hole injection region 190.

Figure 5:
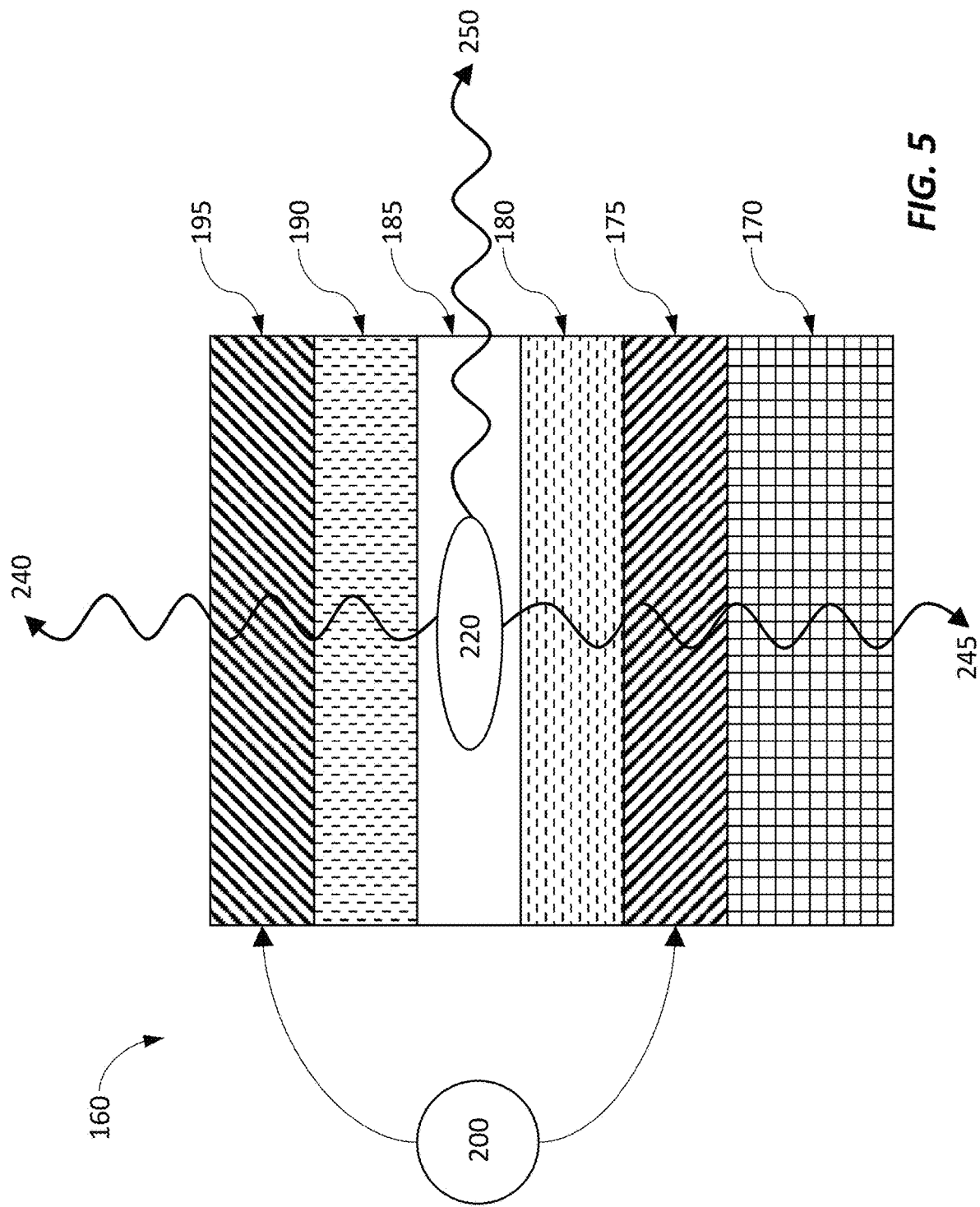
FIG. 5 shows the optical emission directions possible from the emission region of an LED in accordance with an illustrative embodiment of the present disclosure.

Referring now to FIG. 5, light or optical emission is generated within the device 160 by selective spatial recombination of electrons and holes to create high energy photons 240, 245 and 250 of a predetermined wavelength dictated by the configuration of the band structure of the metal oxide layer or layers forming the optical emission region 185 as will be described below. The electrons and holes are both instantaneously annihilated to create a photon that is a property of the band structure of the metal oxide selected.

The light generated within optical emission region 185 can propagate within the device according to the crystal symmetry of the metal oxide host regions. The crystal symmetry group of the host metal oxide semiconductor has definite energy and crystal momentum dispersion known as the E-k configuration that characterizes the band structure of various regions including the optical emission region 185. The non-trivial E-k dispersions are fundamentally dictated by the underlying physical atomic arrangements of definite crystal symmetry of the host medium. In general, the possible optical polarizations, optical energy emitted and optical emission oscillator strengths are directly related to the valence band dispersion of the host crystal. In accordance with the present disclosure, embodiments advantageously configure the band structure including the valence band dispersion of selected metal oxide semiconductors for application to optoelectronic semiconductor devices, such as for, in one example, UVLEDs.

Light 240 and 245 generated vertically requires optical selection rules of the underlying band structure to be fulfilled. Similarly, there are optical selection rules for generation of lateral light 250. These optical selection rules can be achieved by advantageous arrangement of the crystal symmetry types and physical spatial orientation of the crystal for each of the regions within the UVLED. Advantageous orientation of the constituent metal oxide crystals as a function of the growth direction is beneficial for optimal operation of the UVLEDs of the present disclosure. Furthermore, selection of the optical properties 30 in the process flow diagram illustrated in FIG. 1 such as the refractive index forming the waveguide type device is indicated for optical confinement and low loss.

Figure 6:
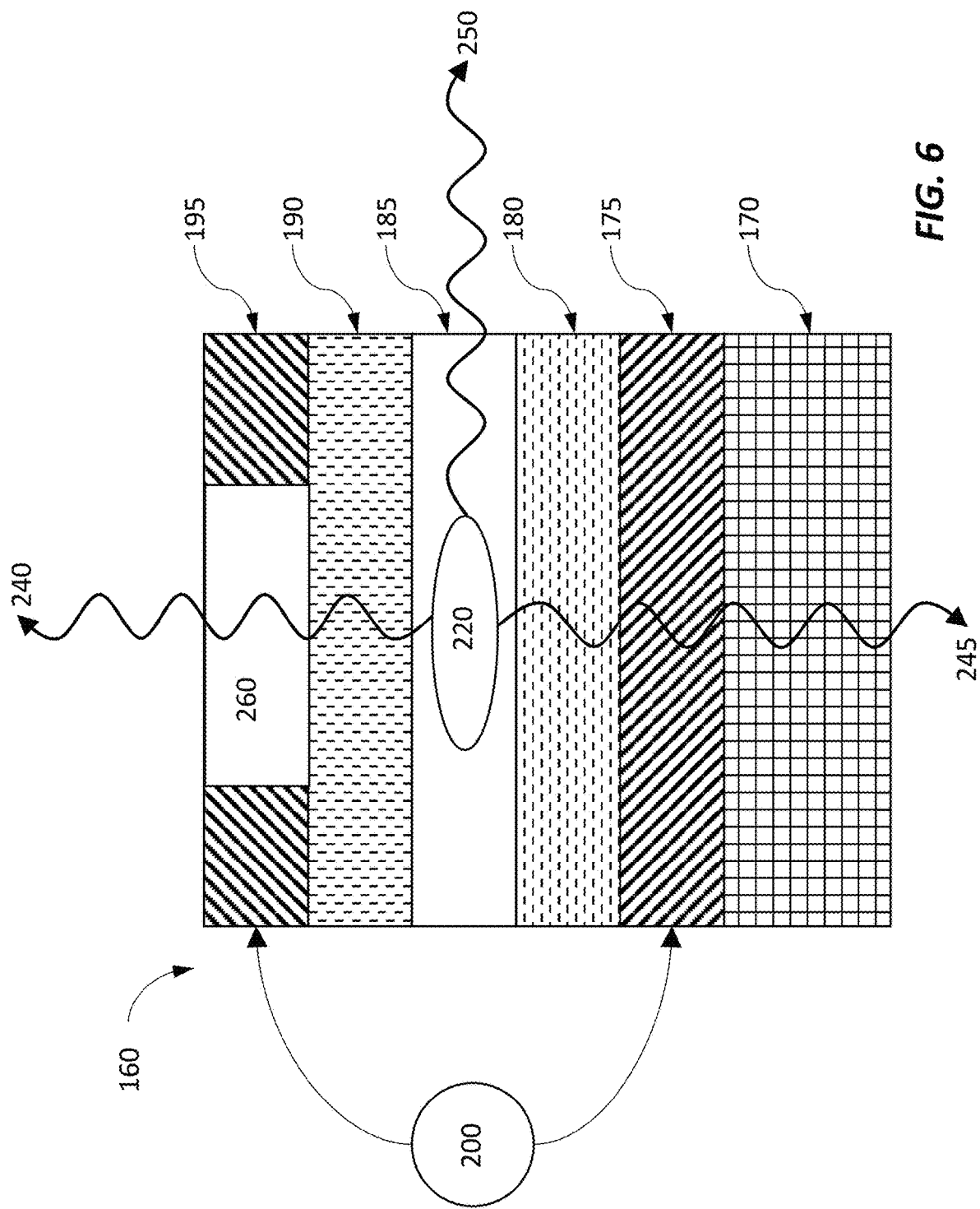
FIG. 6 depicts an aperture through an opaque region to enable light emission from an LED in accordance with an illustrative embodiment of the present disclosure.

FIG. 6 further shows for completeness, another embodiment comprising an optical aperture 260 disposed within optoelectronic semiconductor device 160 to enable the use of materials 195 which are opaque to the operating wavelength to provide optical out coupling from optical emission region 185.

Figure 7:
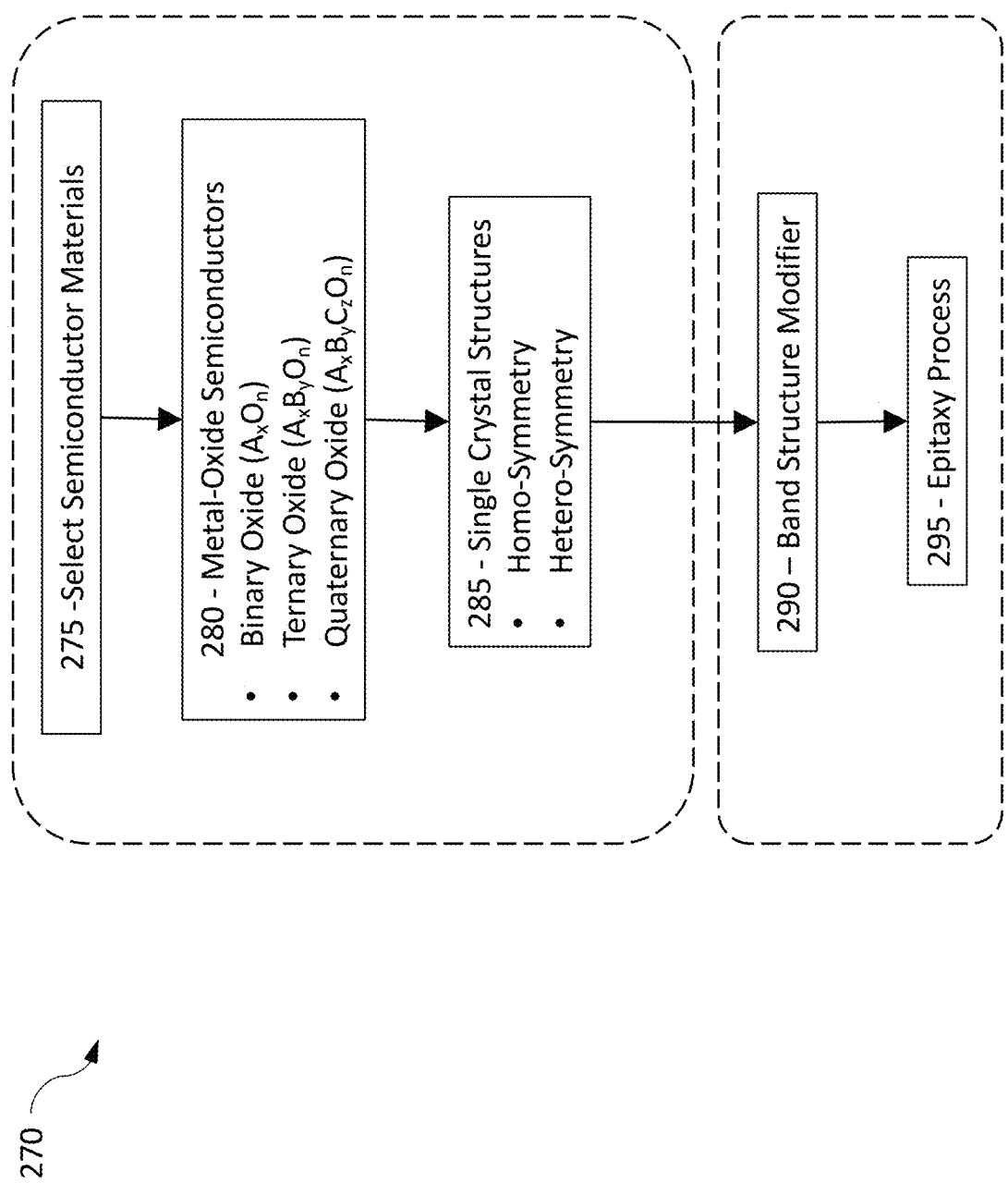
FIG. 7 shows example selection criteria to construct a metal oxide semiconductor structure in accordance with an illustrative embodiment of the present disclosure.

FIG. 7 shows by way of overview, selection criteria 270 for one or more metal oxide crystal compositions in accordance with illustrative embodiments. First, semiconductor materials 275 are selected. The semiconductor materials 275 may include metal-oxide semiconductors 280, which may be one or more of binary oxides, ternary oxides or quaternary oxides. The recombination region 220 forming the optical emission region 185 of optoelectronic semiconductor device 160 (for example see FIG. 5) is selected to exhibit efficient electron-hole recombination whereas the conductivity type regions are selected for their ability to provide sources of electrons and holes. Metal oxide semiconductors can also be created selectively from a plurality of possible crystal symmetry types even with the same species of constituent metals. Binary metal oxides of the form $A_xO_y$ comprising one metal species may be used, wherein the metal specie (A) is combined with oxygen (O) in the relative proportions x and y. Even with the same relative proportions x and y, a plurality of crystal structure configurations are possible having vastly different crystal symmetry groups.

As will be described below, compositions $Ga_2O_3$ and $Al_2O_3$ exhibit several advantageous and distinct crystal symmetries (e.g., monoclinic, rhombohedral, triclinic and hexagonal) but require careful attention to the utility of incorporating them and constructing a UVLED. Other advantageous metal oxide compositions, such as MgO and NiO, exhibit less variation in practically attainable crystal structures, namely cubic crystals.

Addition of advantageous second dissimilar metal species (B) can also augment a host binary metal oxide crystal structure to create a ternary metal oxide of the form $A_xB_yO_n$. Ternary metal oxides range from dilute addition of B-species up to a majority relative fraction. As described below, ternary metal oxides may be adopted for the advantageous formation of direct bandgap optically emissive structures in various embodiments. Yet further materials can be engineered comprising three dissimilar cation-atom species coupled to oxygen forming a quaternary composition $A_xB_yC_zO_n$.

In general, while a larger number (>4) of dissimilar metal atoms can theoretically be incorporated to form complex oxide materials—they are seldom capable of producing high crystallographic quality with exceptionally distinct crystal symmetry structures. Such complex oxides are in general polycrystalline or amorphous and therefore lack optimal utility for the applications to an optoelectronic device. As will be apparent, the present disclosure seeks in various examples substantially single crystal and low defect density configurations in order to exploit the band structure to form UVLED epitaxial formed devices. Some embodiments also include achieving desirable E-k configurations by the addition of another dissimilar metal specie.

Selection of desired bandgap structures for each of the UVLED regions of optoelectronic semiconductor device 160 may also involve integration of dissimilar crystal symmetry types. For example, a monoclinic crystal symmetry host region and a cubic crystal symmetry host region comprising a portion of the UVLED may be utilized. The epitaxial formation relationships then involve attention toward the formation of low defect layer formation. The type of layer formation steps are then classed 285 as homo-symmetry and hetero-symmetry formation. To achieve the goal of providing the materials forming the epilayer structure, band structure modifiers 290 can be utilized such as biaxial strain, uniaxial strain and digital alloys such as superlattice formation.

The epitaxy process 295 is then defined by the types and sequence of material composition required for deposition. The present disclosure describes new processes and compositions for achieving this goal.

Figure 8:
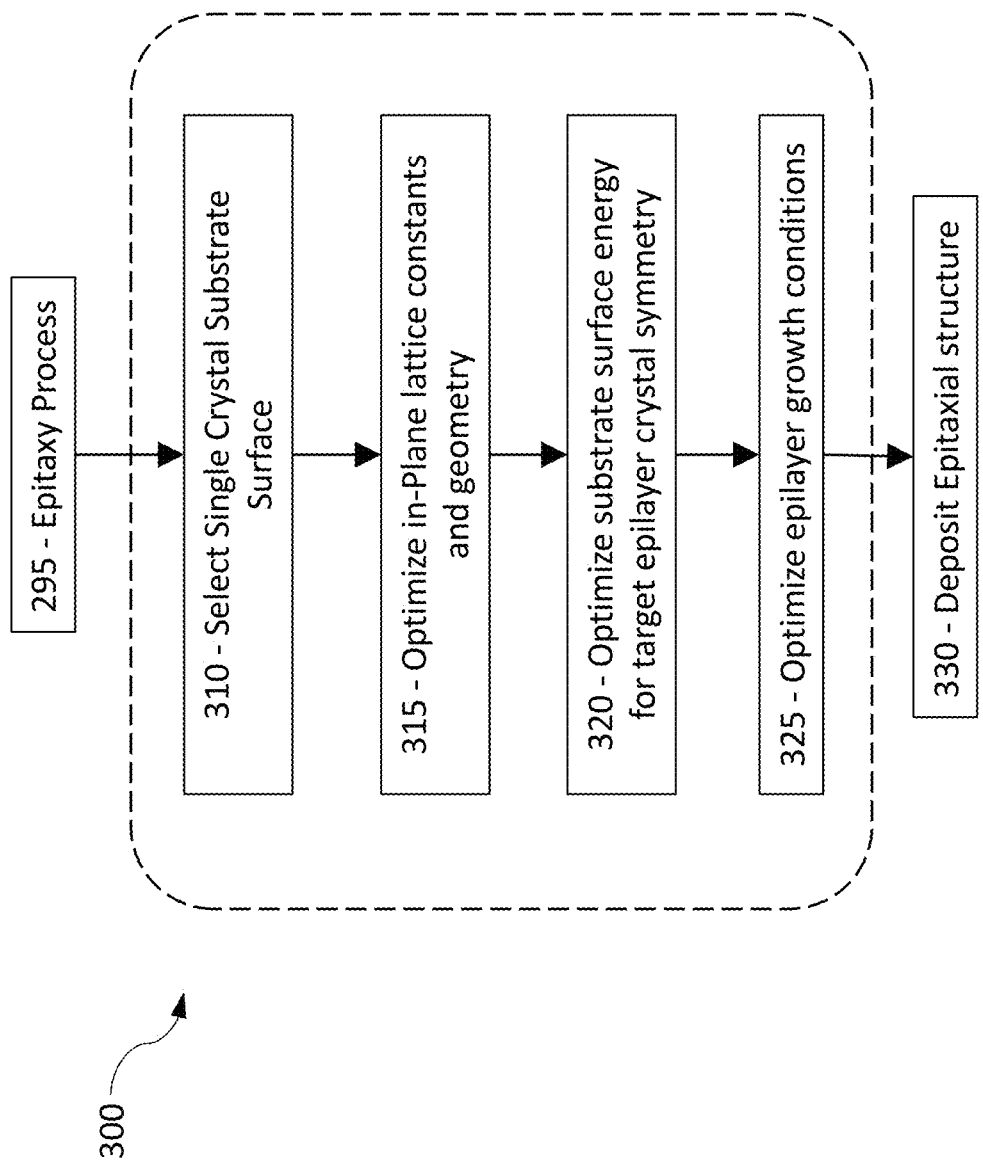
FIG. 8 is an example process flow diagram for selecting and depositing epitaxially a metal oxide structure in accordance with an illustrative embodiment of the present disclosure.

FIG. 8 shows the epitaxy process 300 formation steps. At step 310, a film formation substrate for supporting the optical emission region is selected with desirable properties of crystal symmetry type, and optical and electrical characteristics. In one example, the substrate is selected to be optically transparent to the operating wavelength and a crystal symmetry compatible with the epitaxial crystal symmetry types required. Even though equivalent crystal symmetry of both the substrate and epitaxial film(s) can be used there is also an optimization 315 for matching the in-plane atomic arrangements, such as in-plane lattice constants or advantageous co-incidence of in-plane geometry of respective crystal planes from dissimilar crystal symmetry types.

The substrate surface has a definite 2-dimensional crystal arrangement of terminated surface atoms. In vacuum, on a prepared surface this discontinuity of definite crystal structure results in a minimization of surface energy of the dangling bonds of the terminated atoms. For example, in one embodiment a metal oxide surface can be prepared as an oxygen terminated surface or in another embodiment as a metal-terminated surface. Metal oxide semiconductors can have complex crystal symmetry, and pure specie termination may require careful attention. For example, both $Ga_2O_3$ and $Al_2O_3$ can be 0-terminated by high temperature anneal in vacuum followed by sustained exposure to atomic or molecular oxygen at high temperature.

The crystal surface orientation 320 of the substrate can also be selected to achieve selective film formation crystal symmetry type of the epitaxial metal oxide. For example, A-plane sapphire can be used to advantageously select (110)-oriented alpha-phase formation high quality epitaxial $Ga_2O_3$, $AlGaO_3$ and $Al_2O_3$; whereas for C-plane sapphire hexagonal and monoclinic $Ga_2O_3$ and $AlGaO_3$ films are generated. $Ga_2O_3$ oriented surfaces are also used selectively for film formation selection of $AlGaO_3$ crystal symmetry.

The growth conditions 325 are then optimized for the relative proportions of elemental metal and activated oxygen required to achieve the desired material properties. The growth temperature also plays an important role in determining the crystal structure symmetry types possible. The judicious selection of the substrate surface energy via appropriate crystal surface orientation also dictates the temperature process window for the epitaxial process during which the epitaxial structure 330 is deposited.

Figure 9:
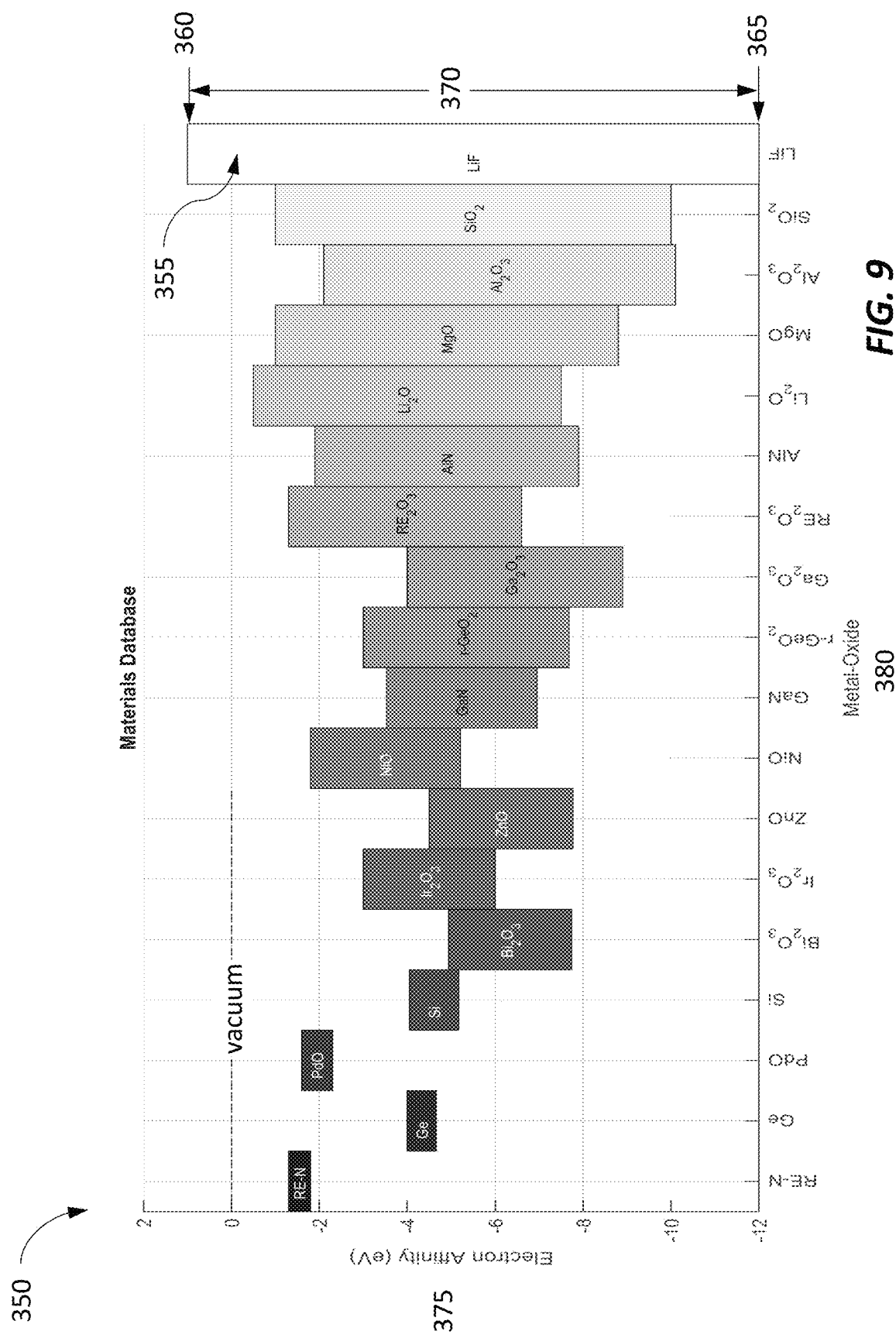
FIG. 9 is a summary of technologically relevant semiconductor bandgaps as a function of electron affinity, showing relative band lineups.

A materials selection database 350 for the application toward UVLED based optoelectronic devices is disclosed in FIG. 9. Metal oxide materials 380 are plotted as a function of their electron affinity energy 375 relative to vacuum. Ordered from left to right, the semiconductor materials have increasing optical bandgap and accordingly have greater utility for shorter wavelength operation UVLEDs. Using lithium fluoride (LiF) as an example in this graph, LiF has a bandgap 370 (represented as the box for each material) which is the energy difference in electron volts between conduction band minimum 360 and valence band maximum 365. The absolute energy positions represented by conduction band minimum 360 and valence band maximum 365 are plotted with respect to the vacuum energy. While narrow bandgap material such as rare-earth nitride (RE-N), germanium (Ge), palladium-oxide (PdO) and silicon (Si) do not offer suitable host properties for the optical emission region, they can be used advantageously for electrical contact formation. The use of intrinsic electron affinity of given materials can be used to form ohmic contacts and metal-insulator-semiconductor junctions as required.

Desirable materials combinations for use as a substrate are bismuth-oxide ($Bi_2O_3$), nickel-oxide (NiO), germanium-oxide ($GeO_{x-2}$), gallium-oxide ($Ga_2O_3$), lithium-oxide ($Li_2O$), magnesium-oxide (MgO), aluminum-oxide ($Al_2O_3$), single crystal quartz $SiO_2$, and ultimately lithium-fluoride 355 (LiF). In particular, $Al_2O_3$ (sapphire), $Ga_2O_3$, MgO and LiF are available as large high-quality single crystal substrates and may be used as substrates for UVLED type optoelectronic devices in some embodiments. Additional embodiments for substrates for UVLED applications also include single crystal cubic symmetry magnesium aluminate ($MgAl_2O_4$) and magnesium gallate ($MgGa_2O_4$). In some embodiments, the ternary form of $AlGaO_3$ may be deployed as a bulk substrate in monoclinic (high Ga %) and corundum (high Al %) crystal symmetry types using large area formation methods such as Czochralski (CZ) and edge-fed growth (EFG).

Considering host metal oxide semiconductors of $Ga_2O_3$ and $Al_2O_3$, in some embodiments alloying and/or doping via elements selected from database 350 are advantageous for film formation properties.

Therefore elements selected from Silicon (Si), Germanium (Ge), Er (Erbium), Gd (Gadolinium), Pd (Palladium), Bi (Bismuth), Ir (Iridium), Zn (Zinc), Ni (Nickel), Li (Lithium), Magnesium (Mg) are desirable crystal modification specie to form ternary crystal structures or dilute additions to the $Al_2O_3$, $AlGaO_3$ or $Ga_2O_3$ host crystals (see semiconductors 280 of FIG. 7).

Further embodiments include selection of the group of crystal modifiers selected from the group of Bi, Ir, Ni, Mg, Li.

For application to the host crystals $Al_2O_3$, $AlGaO_3$ or $Ga_2O_3$ multivalence states possible using Bi and Ir can be added to enable p-type impurity doping. The addition of Ni and Mg cations can also enable p-type impurity substitutional doping at Ga or Al crystal sites. In one embodiment, Lithium may be used as a crystal modifier capable of increasing the bandgap and modifying the crystal symmetry possible, ultimately toward orthorhombic crystal symmetry lithium gallate ($LiGaO_2$) and tetragonal crystal symmetry aluminum-gallate ($LiAlO_2$). For n-type doping Si and Ge may be used as impurity dopants, with Ge offering improved growth processes for film formation.

While other materials are also possible, the database 350 provides advantageous properties for application to UVLED.

Figure 10:
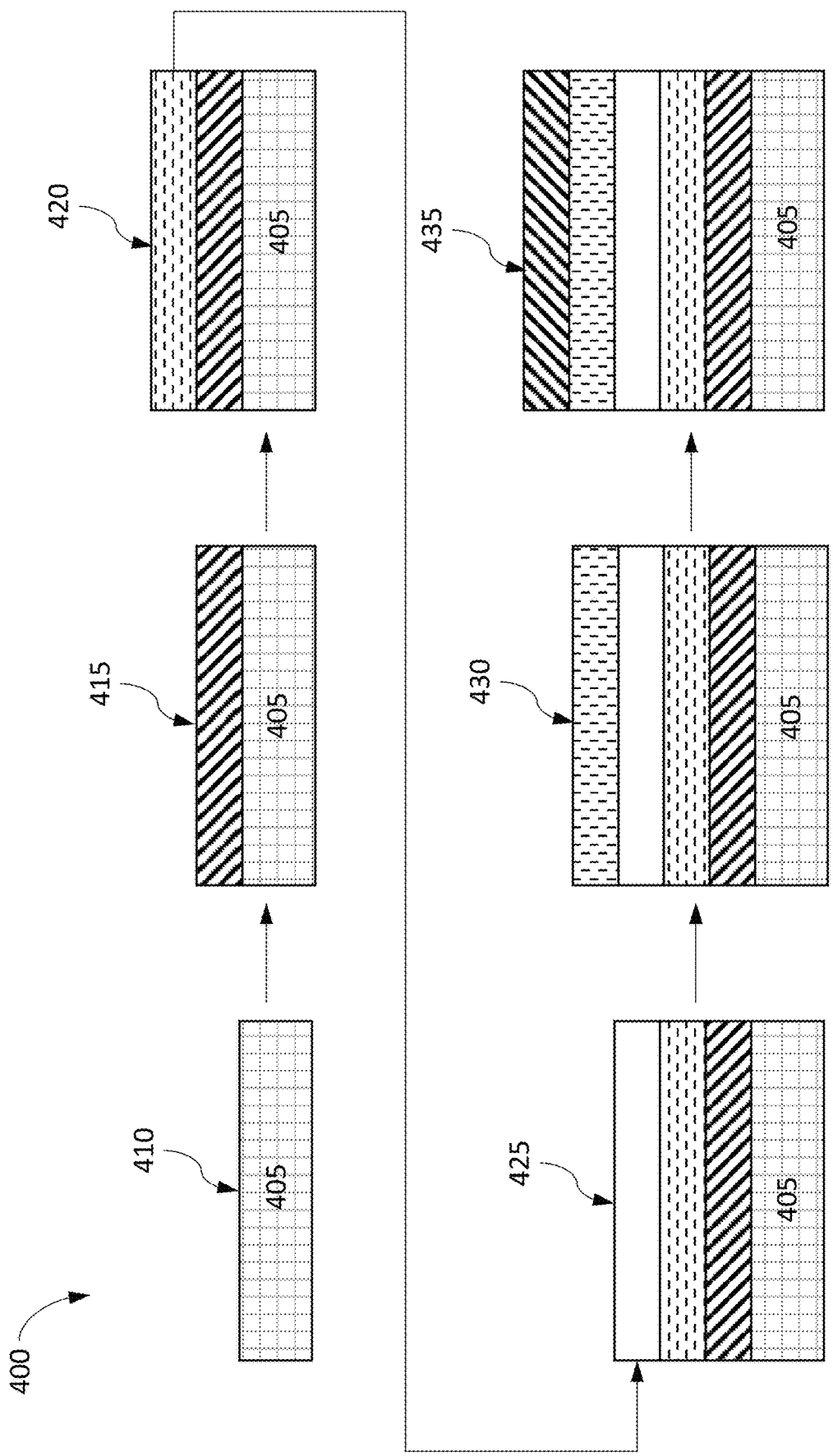
FIG. 10 is an example schematic process flow for depositing a plurality of layers for forming a plurality of regions comprising an LED in accordance with an illustrative embodiment of the present disclosure.

FIG. 10 depicts a sequential epitaxial layer formation process flow 400 utilized to epitaxially integrate the material regions as defined in optoelectronic semiconductor device 160 according to an illustrative embodiment.

A substrate 405 is prepared with surface 410 configured to accept a first conductivity type crystal structure layer(s) 415 which may comprise a plurality of epitaxial layers. Next first spacer region composition layer(s) 420 which may comprise a plurality of epitaxial layers is formed on layer 415. An optical emission region 425 is then formed on layer 420, in which region 425 may comprise a plurality of epitaxial layers. A second spacer region 430 which may comprise a plurality of epitaxial layers is then deposited on region 425. A second conductivity type cap region 435 which may comprise a plurality of epitaxial layers then completes a majority of the UVLED epitaxial structure. Other layers may be added to complete the optoelectronic semiconductor device, such as ohmic metal layers and passive optical layers, such as for optical confinement or antireflection.

Figure 11:
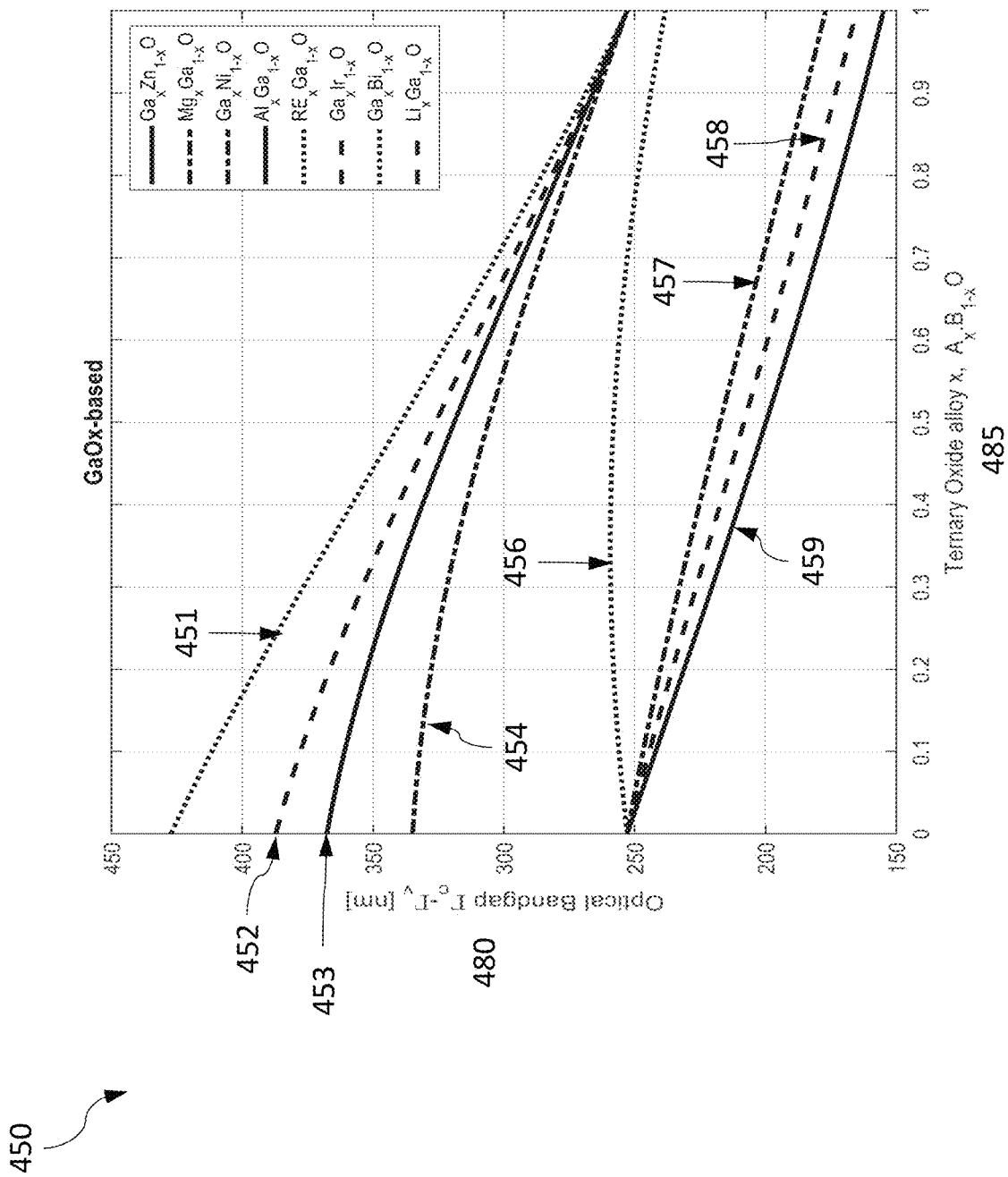
FIG. 11 is a ternary alloy optical bandgap tuning curve for metal oxide semiconductor ternary compositions based on Gallium-Oxide in accordance with illustrative embodiments of the present disclosure.

Referring to FIG. 11, a possible selection of ternary metal oxide semiconductors 450 is shown for the cases of Gallium-Oxide-based (GaOx-based) compositions 485. Optical bandgap 480 for various values of x in ternary oxide alloys $A_xB_{1-x}O$ are graphed. As previously stated, metal oxides may exhibit several stable forms of crystal symmetry structure which is further complicated by the addition of another specie to form a ternary. However, the example general trend can be found by selectively incorporating or alloying Aluminum, group-II cations {Mg, Ni, Zn}, Iridium, Erbium and Gadolinium atoms, as well as Lithium atoms advantageously with Ga-Oxide. Ni and Ir typically form deep d-bands but for high Ga % can form useful optical structures. Ir is capable of multiple valence states, where in some embodiments the $Ir_2O_3$ form is utilized.

Alloying one of X={Ir, Ni, Zn, Bi} into $Ga_xX_{1-x}O$ decreases the available optical bandgap (refer to curves labelled 451, 452, 453, 454). Conversely, alloying one of Y={Al, Mg, Li, RE} increases the available bandgap of the ternary $Ga_xY_{1-x}O$ (refer to curves 456, 457, 458, 459).

FIG. 11 can therefore be understood with application toward forming the optically emissive and conductivity type regions in accordance with the present disclosure.

Figure 12:
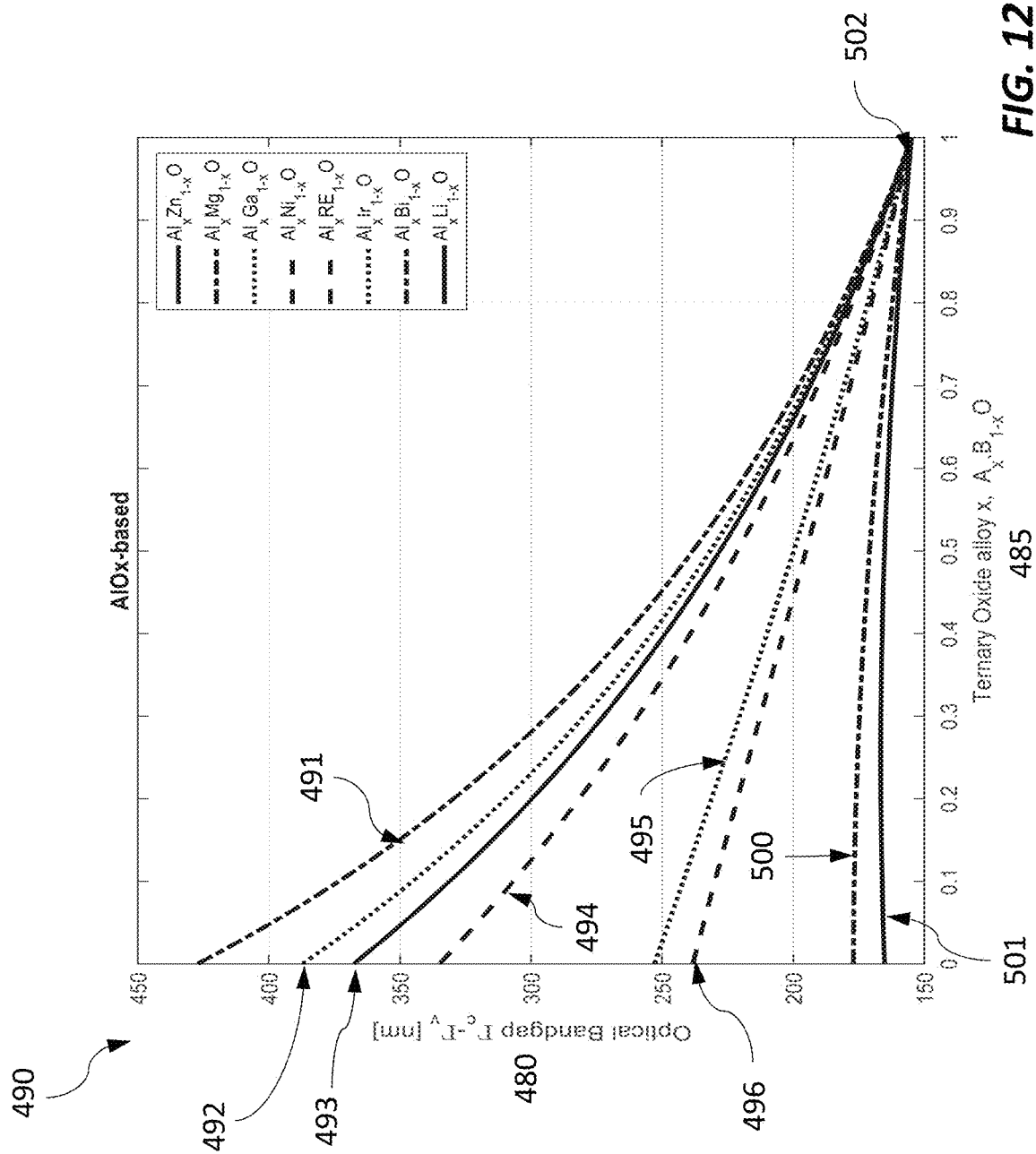
FIG. 12 is a ternary alloy optical bandgap tuning curve for metal oxide semiconductor ternary compositions based on Aluminum-Oxide in accordance with illustrative embodiments of the present disclosure.

Similarly, FIG. 12 discloses a possible selection of ternary metal oxide semiconductors 490 for the cases of Aluminum-Oxide-based (AlOx-based) compositions 485 in relation to optical bandgap 480. Scrutinizing the curves, it can be seen that alloying one of X={Ir, Ni, Zn, Mg, Bi, Ga, RE, Li} into $Al_xX_{1-x}O$ decreases the available optical bandgap. The group of Y={Ni, Mg, Zn} form spinel crystal structures but all decreases the available bandgap of the ternary $Al_xY_{1-x}O$ (refer to curves 491, 492, 493, 494, 495, 496, 500, 501). FIG. 12 also shows the energy gap 502 of the alpha-phase aluminum oxide ($Al_2O_3$) having rhombohedral crystal symmetry.

FIG. 12 can therefore be understood with application to forming the optically emissive and conductivity type regions in accordance with the present disclosure. Shown in FIG. 28 is a chart 2800 of potential ternary oxide combinations for (0≤x≤1) that may be adopted in accordance with the present disclosure. Chart 2800 shows the crystal growth modifier down the left-hand column and the host crystal across the top of the chart.

Figure 13B:
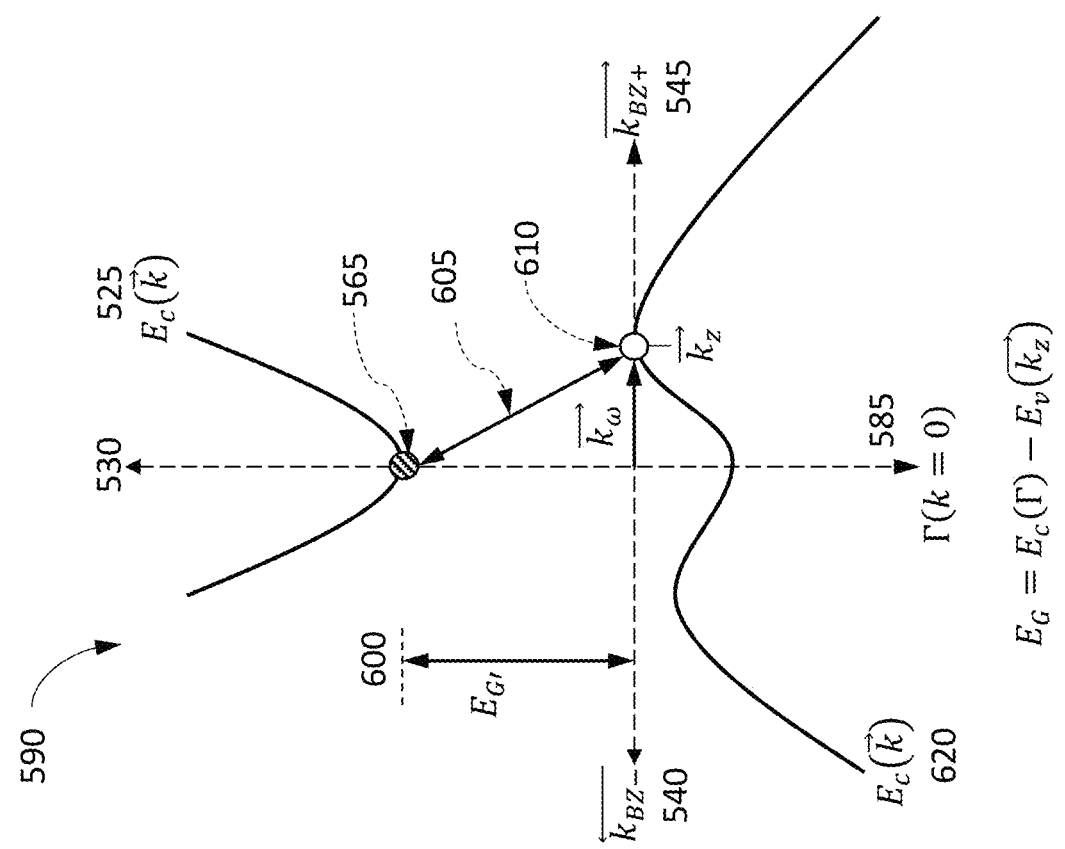
FIGS. 13A and 13B are electron energy-vs.-crystal momentum representations of metal oxide based optoelectronic semiconductors showing a direct bandgap (FIG. 13A) and indirect bandgap (FIG. 13B) in accordance with illustrative embodiments of the present disclosure.
Figure 13A:
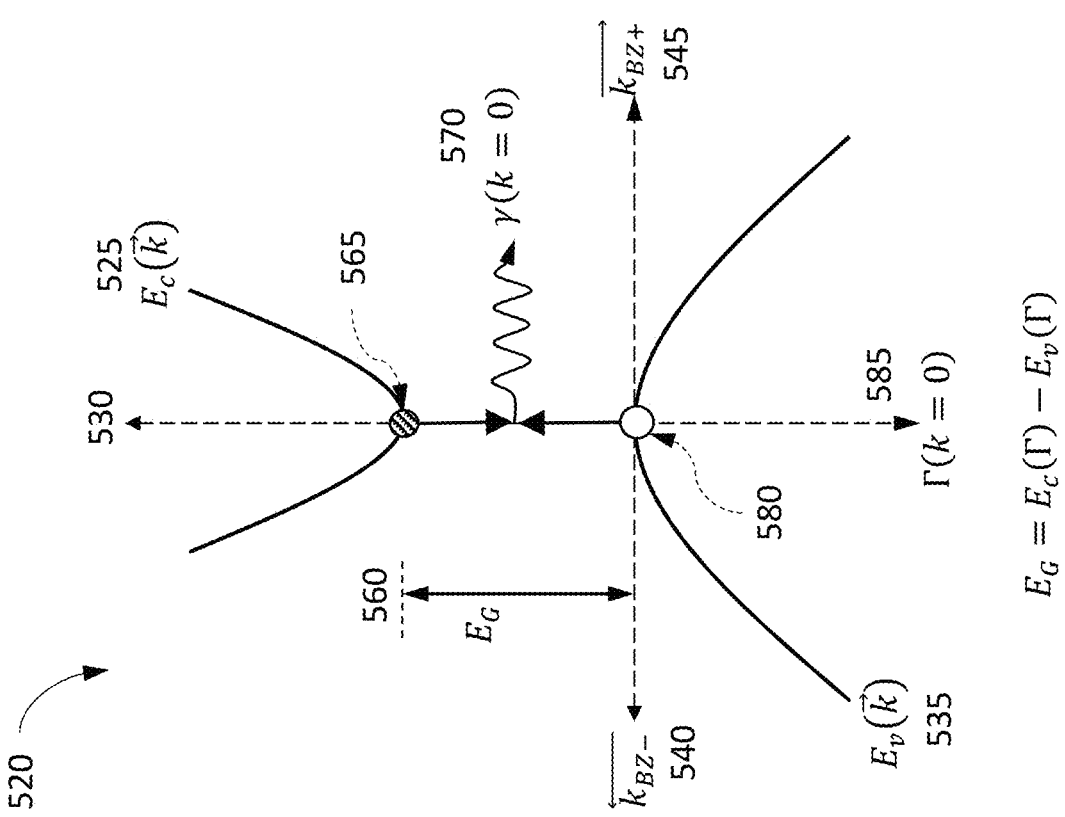

FIGS. 13A and 13B are electron energy-vs-crystal momentum representations of possible metal oxide based semiconductors showing a direct bandgap (FIG. 13A) and indirect bandgap (FIG. 13B) and are illustrative of concepts related to the formation of optoelectronic devices in accordance with the present disclosure. It is known by workers in the field of quantum mechanics and crystal structure design that symmetry directly dictates the electronic configuration or band structure of a single crystal structure.

In general, for application to optically emissive crystal structures, there exists two classes of electronic band structure as shown in FIGS. 13A and 13B. The fundamental process utilized in optoelectronic devices of the present disclosure is the recombination of physical (massive) electron and hole particle-like charge carriers which are manifestations of the allowed energy and crystal momentum. The recombination process can occur conserving crystal momentum of the incident carriers from their initial state to the final state.

To achieve a final state, wherein the electron and hole annihilate to form a massless photon (i.e., momentum $k_\gamma$ of final state massless photon $k_\gamma=0$), requires a special E-k band structure which is shown in FIG. 13A. A metal oxide semiconductor structure having pure crystal symmetry can be calculated using various computational techniques. One such method is the Density Function Theory wherein first principles can be used to construct an atomic structure comprising distinction pseudopotentials attached to each constituent atom comprising the structure. Iterative computational schemes for ab initio total-energy calculations using a plane-wave basis can be used to calculate the band structure due to the crystal symmetry and spatial geometry.

FIG. 13A represents the reciprocal space energy-versus-crystal momentum or band structure 520 for a crystal structure. The lowest lying conduction band 525 having energy dispersion $E_c(\vec{k})$ with respect to crystal momentum vector $k=\vec{k}=(k_x,k_y,k_z)$ describes the allowed configuration space for electrons. The highest lying valence band 535 having energy dispersion $E_v(\vec{k})$ also describes the allowed energy states for holes (positively charged crystal particles).

The dispersions 525 and 535 are plotted with respect to the electron energy (increasing direction 530, decreasing direction 585) in units of electron volts and the crystal momentum in units of reciprocal space (positive KBZ 545 and negative KBZ 540 representing distinct crystal wavevectors from the Brillouin zone center). The band structure 520 is shown at the highest symmetry point of the crystal labelled as the Γ-point representing the band structure at k=0. The bandgap is defined by the energy difference between the minima and maxima of 525 and 535, respectively. An electron propagating through the crystal will minimize energy and relax to the conduction band minimum 565, similarly a hole will relax to the lowest energy state 580.

If 565 and 580 are simultaneously located at k=0 then a direct recombination process can occur wherein the electron and hole annihilate and create a new massless photon 570 with energy approximately equal to the bandgap energy 560. That is, electron and holes at k=0 can recombine and conserve crystal moment to create a massless particle termed a 'direct' bandgap material. As will be disclosed, this situation is rare in practice with only a small subset of all crystal symmetry type semiconductors exhibiting this advantageous configuration.

Referring now to crystal structure 590 of FIG. 13B, where the primary bands 525 and 620 of the band structure do not have their respective minima 565 and maxima 610 at k=0, this is termed an 'indirect' configuration. The minimum bandgap energy 600 is still defined as the energy difference between the conduction band minimum and the valence band maximum which do occur at the same wavevector, and is known as the indirect bandgap energy 600. Optical emission processes are clearly not favorable as crystal momentum cannot be conserved for the recombination event and requires secondary particles to conserve crystal momentum, such as crystal vibrational quanta phonons. In metal oxides, the longitudinal optical phonon energy scales with bandgap and are in comparison very large to those found in for example, GaAs, Si and the like.

It is therefore challenging to use indirect E-k configurations for the purpose of optically emissive regions. The present disclosure describes methods to manipulate an otherwise indirect bandgap of a specific crystal symmetry structure and transform or modify the zone-center k=0 character of the band structure into direct bandgap dispersion suitable for optical emission. These methods are now disclosed for application to the manufacture of optoelectronic devices and in particular to the fabrication of UVLEDs.

Even if there exists a direct bandgap configuration, the design selection is then confronted by specific crystal symmetry of given metal oxide having electric dipole selection rules governed by the symmetry character group assigned to each of the energy bands. For the case of $Ga_2O_3$ and $Al_2O_3$ the optical absorption is governed between the lowest conduction band and the three topmost valence bands.

FIGS. 13C-13E show the optical emission and absorption transition at k=0 with respect to a $Ga_2O_3$ monoclinic crystal symmetry. FIGS. 13C-13E each show three valence bands $E_{vi}(k)$ 621, 622 and 623. In FIG. 13C, the optically allowed electric dipole transition are shown for an electron 566 and a hole 624 being allowed for optical polarization vectors within the a-axis and c-axis of the monoclinic unit cell. With respect to the reciprocal space E-k this corresponds to wave vector 627 in the F-Y branches. Similarly, electric-dipole transition between electron 566 and hole 625 in FIG. 13D are allowed for polarizations along the c-axis 628 of the crystal unit cell. Furthermore, higher energy transitions between electron 566 and hole 626 in FIG. 13E are allowed for optical polarization fields along the b-axis 629 of the unit cell corresponding to the E-k (Γ-X) branch.

Clearly, the magnitude of the energy transitions 630, 631 and 632 in FIGS. 13C, 13D and 13E respectively are increasing with only the lowest energy transition favorable for optical light emission. If, however, the Fermi energy level ($E_F$) is configured such that the lowest lying valence band 621 is above $E_F$ and 622 below $E_F$, then optical emission can occur at energy 631. These selection rules are particularly useful when designing waveguide devices which are optical polarization dependent for specific TE, TM and TEM modes of operation.

Figure 14B:
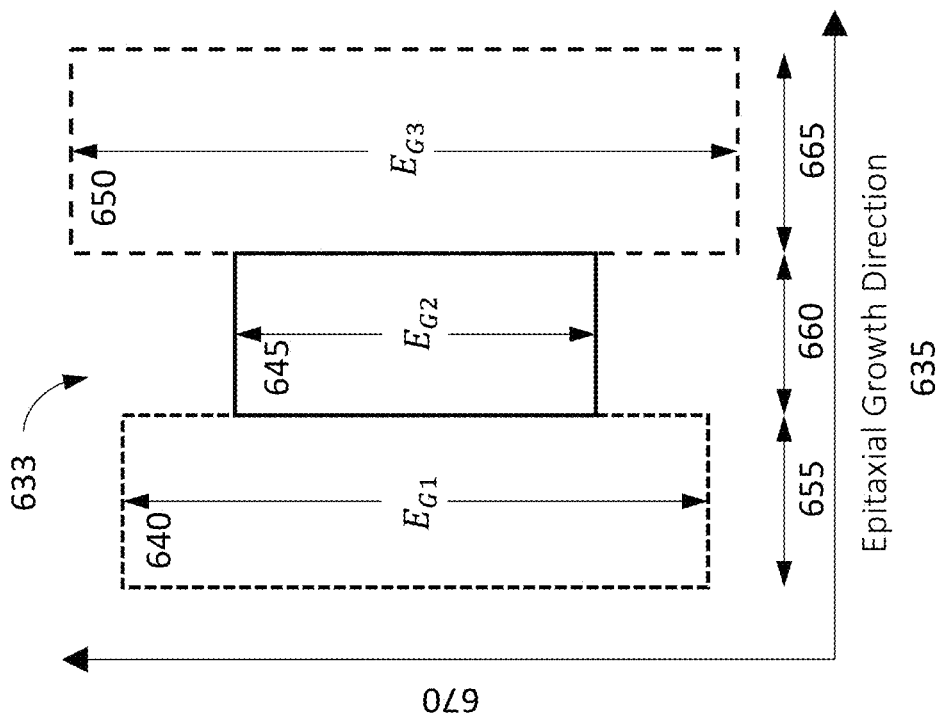
FIGS. 14A and 14B depict sequential deposition of a plurality of heterogenous metal oxide semiconductor layers having dissimilar crystal symmetry types to embed an optical emission region in accordance with an illustrative embodiment of the present disclosure.
Figure 14A:
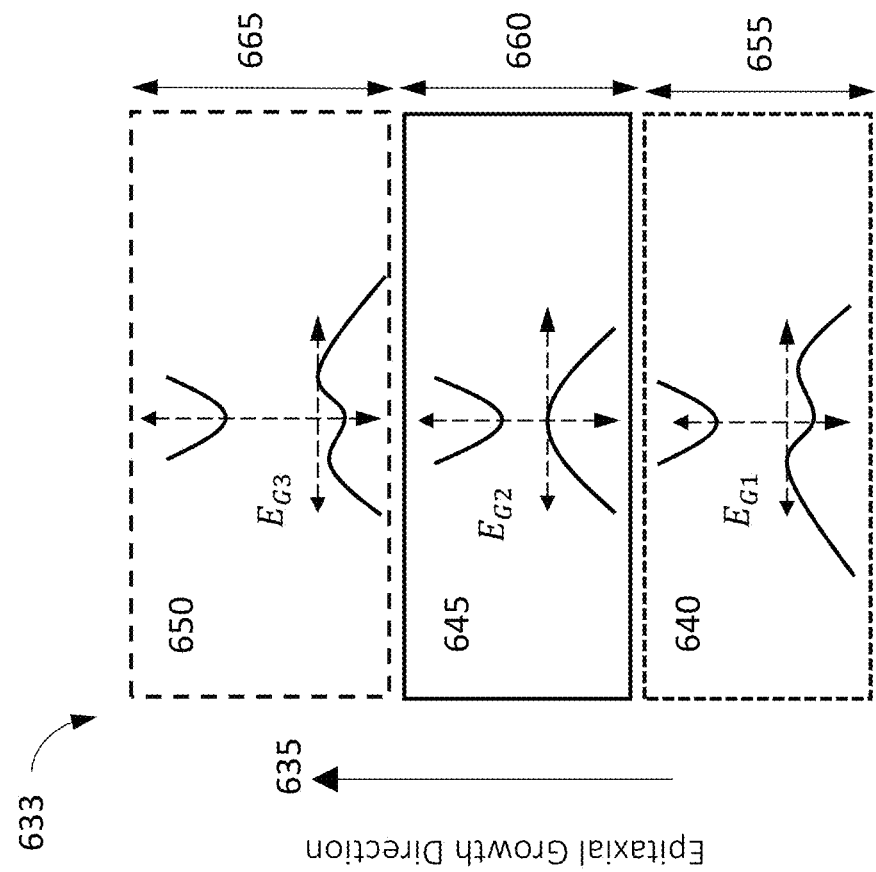

By reference to the explanations above relating to band structure, referring now to FIGS. 14A-14B these diagrams show how these complex elements may be incorporated in the device structure 160. Each functional region of the UVLED has a specific E-k dispersion having both indirect and direct type materials which can also be due to dramatically different crystal symmetry types. This then allows the optically emissive region to be embedded advantageously within the device.

FIGS. 14A and 14B show the representations of complex E-k materials by single blocks 633 defined by the layer thickness 655, 660 and 665 and the fundamental bandgap energy 640, 645 and 650, respectively. The relative alignments of the conduction and valence band edges are shown in blocks 633. FIG. 14B represents the electron energy 670 versus a spatial growth direction 635 for three distinct materials having bandgap energies 640, 645 and 650. For example, a first region deposited along a growth direction 635 using an indirect type crystal but otherwise having a final surface lattice constant geometry capable of providing mechanical elastic deformation of the subsequent crystal 645 is possible. For example, this can occur for the growth of $AlGaO_3$ directly on $Ga_2O_3$.

Epitaxial Fabrication Methods

Figure 15:
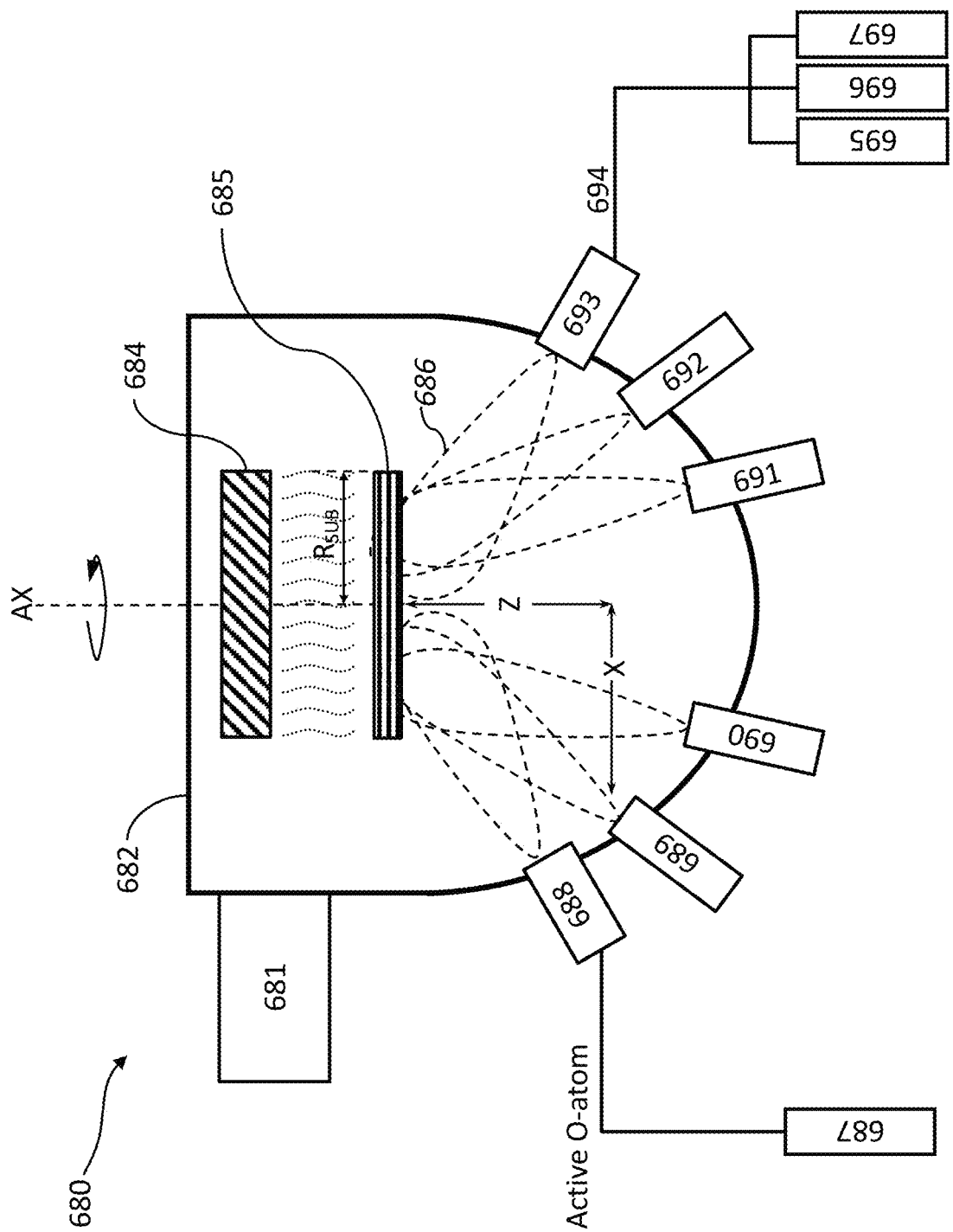
FIG. 15 is a schematic representation of an atomic deposition tool for the creation of multi-layered metal oxide semiconductor films comprising a plurality of material compositions in accordance with illustrative embodiments of the present disclosure.

Non-equilibrium growth techniques are known in the prior art and are called Atomic and Molecular Beam Epitaxy, Chemical Vapor Epitaxy or Physical Vapor Epitaxy. Atomic and Molecular Beam Epitaxy utilizes atomic beams of constituents directed toward a growth surface spatially separate as shown FIG. 15. While molecular beams are also used it is the combination of molecular and atomic beams which may be used in accordance with the present disclosure.

One guiding principle is the use of pure constituent sources that can be multiplexed at a growth surface through favorable condensation and kinematically favored growth conditions to physically build a crystal atomic layer by layer. While the growth crystal can be substantially self-assembled, the control of the present methods can also intervene at the atomic level and deposit single specie atomic thick epilayers. Unlike equilibrium growth techniques which rely on the thermodynamic chemical potentials for bulk crystal formation, the present techniques can deposit extraordinarily thin atomic layers at growth parameters far from the equilibrium growth temperature for a bulk crystal.

In one example, $Al_2O_3$ films are formed at film formation temperature in the range of 300-800° C., whereas the conventional bulk equilibrium growth of $Al_2O_3$(Sapphire) is produced well in excess of 1500° C. requiring a molten reservoir containing Al and O liquid which can be configured to position a solid seed crystal in close proximity to the molten surface. Careful positioning of a seed crystal orientation is placed in contact to the melt which forms a recrystallized portion in the vicinity of the melt. Pulling the seed and partially solidified recrystallized portion away from the melt forms a continuous crystal boule.

Such equilibrium growth methods for metal oxides limit the possible combinations of metals and the complexity of discontinuous regions possible for heteroepitaxial formation of complex structures. The non-equilibrium growth techniques in accordance with the present disclosure can operate at growth parameters well away from the melting point of the target metal oxide and can even modulate the atomic specie present in a single atomic layer of a unit cell of crystal along a preselected growth direction. Such non-equilibrium growth methods are not bound by equilibrium phase diagrams. In one example, the present methods utilize evaporated source materials comprising the beams impinging upon the growth surface to be ultrapure and substantially charge neutral. Charged ions are in some cases created but these should be minimized as best possible.

For the growth of metal oxides the constituent source beams can be altered in a known way for their relative ratio. For example, oxygen-rich and metal-rich growth conditions can be attained by control of the relative beam flux measured at the growth surface. While nearly all metal oxides grow optimally for oxygen-rich growth conditions, analogous to arsenic-rich growth of gallium arsenide GaAs, some materials are different. For example, GaN and MN require metal rich growth conditions with extremely narrow growth window, which are one of the most limiting reasons for high volume production.

While metal oxides favor oxygen-rich growth with wide growth windows—there are opportunities to intervene and create intentional metal-deficient growth conditions. For example, both $Ga_2O_3$ and NiO favor cation vacancies for the production of active hole conductivity type. A physical cation vacancy can produce an electronic carrier type hole and thus favor p-type conduction.

Referring now to FIG. 41, and by way of overview, there is shown a process flow diagram of a method 4100 for forming an optoelectronic semiconductor device according to the present disclosure. In one example the optoelectronic semiconductor device is configured to emit light in the wavelength of about 150 nm to about 280 nm.

At step 4110 a metal oxide substrate is provided having an epitaxial growth surface. At step 4120, the epitaxial growth surface is oxidized to form an activated epitaxial growth surface. At step 4130, the activated epitaxial growth surface is exposed to one or more atomic beams each comprising high purity metal atoms and one or more atomic beams comprising oxygen atoms under conditions to deposit two or more epitaxial metal oxide films or layers.

Referring again to FIG. 15 there is shown an epitaxial deposition system 680 for providing Atomic and Molecular Beam Epitaxy in accordance with, in one example, method 4100 referred to in FIG. 41.

In one example, a substrate 685 rotates about an axis AX and is heated radiatively by a heater 684 with emissivity designed to match the absorption of a metal oxide substrate. The high vacuum chamber 682 has a plurality of elemental sources 688, 689, 690, 691, 692 capable of producing atomic or molecular species as beams of a pure constituent of atoms. Also shown are plasma source or gas source 693, and gas feed 694 which is a connection to gas source 693.

For example, sources 689-692 may comprise effusion type sources of liquid Ga and Al and Ge or precursor based gases. The active oxygen sources 687 and 693 may be provided via plasma excited molecular oxygen (forming atomic-O and $O_2$*), ozone ($O_3$), nitrous oxide ($N_2O$) and the like. In some embodiments, plasma activated oxygen is used as a controllable source of atomic oxygen. A plurality of gases can be injected via sources 695, 696, 697 to provide a mixture of different species for growth. For example, atomic and excited molecular nitrogen enable n-type, p-type and semi-insulating conductivity type films to be created in GaOxide-based materials. The vacuum pump 681 maintains vacuum, and mechanical shutters intersecting the atomic beams 686 modulate the respective beam fluxes providing line of sight to the substrate deposition surface.

This method of deposition is found to have particular utility for enabling flexibility toward incorporating elemental species into Ga-Oxide based and Al-Oxide based materials.

Figure 16:
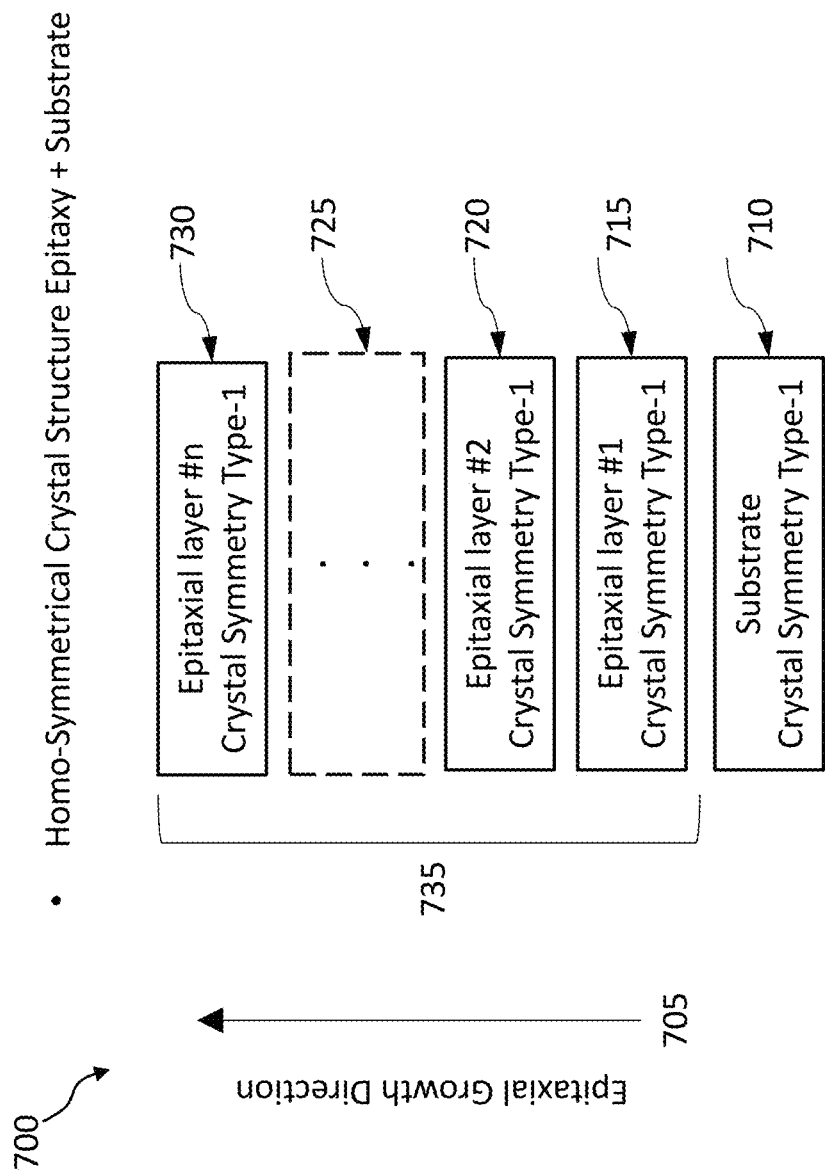
FIG. 16 is a representation of sequential deposition of layers and regions having similar crystal symmetry types matching the substrate in accordance with an illustrative embodiment of the present disclosure.

FIG. 16 shows an embodiment of an epitaxial process 700 for constructing UVLEDs as a function of the growth direction 705. Homo-symmetry type layers 735 can be formed using a native substrate 710. The substrate 710 and crystal structure epitaxy layers 735 are homo-symmetrical, being labeled here as Type-1. For example, a corundum type sapphire substrate can be used to deposit corundum crystal symmetry type layers 715, 720, 725, 730. Yet another example is the use of a monoclinic substrate crystal symmetry to form monoclinic type crystal symmetry layers 715-730. This is readily possible using native substrates for growth of the target materials disclosed herein (e.g., see Table I of FIG. 43A). Of particular interest is the growth of epitaxial layer formations such as corundum $AlGaO_3$ having a plurality of compositions of layers 715-730. Alternatively, a monoclinic $Ga_2O_3$ substrate 710 can be used to form a plurality of monoclinic $AlGaO_3$ compositions of layers 715-730.

Figure 17:
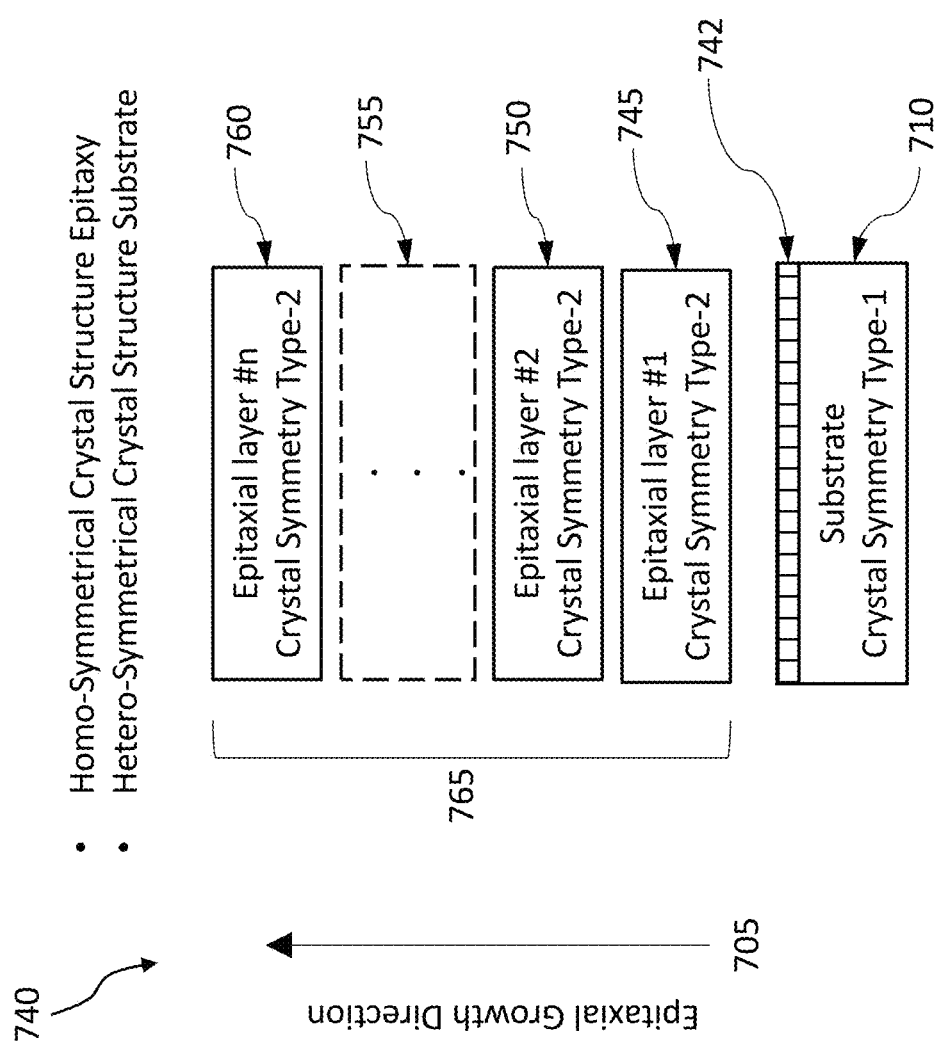
FIG. 17 depicts sequential deposition of regions having a different crystal symmetry to an underlying first surface of a substrate where a surface modification to the substrate is shown in accordance with an illustrative embodiment of the present disclosure.

Referring now to FIG. 17, a further epitaxial process 740 is illustrated that uses a substrate 710 with crystal symmetry that is inherently dissimilar to the target epitaxial metal oxide epilayer crystal types of layers 745, 750, 755, 760. That is, the substrate 710 is of crystal symmetry Type-1 which is hetero-symmetrical to the crystal structure epitaxy 765 that is made of layers 745, 750, 755, 760 that are all Type-2.

For example, C-plane corundum sapphire can be used as a substrate to deposit at least one of a monoclinic, triclinic or hexagonal $AlGaO_3$ structure. Another example is the use of (110)-oriented monoclinic $Ga_2O_3$ substrate to epitaxially deposit corundum $AlGaO_3$ structure. Yet a further example is the use of a MgO (100) oriented cubic symmetry substrate to epitaxially deposit (100)-oriented monoclinic $AlGaO_3$ films.

Process 740 can also be used to create corundum $Ga_2O_3$ modified surface 742 by selectively diffusing Ga-atoms into the surface structure provided by the $Al_2O_3$ substrate. This can be done by elevating the growth temperature of the substrate 710 and exposing the $Al_2O_3$ surface to an excess of Ga while also providing an O-atom mixture. For Ga-rich conditions and elevated temperatures Ga-adatoms attach selectively to O-sites and form a volatile sub-oxide $Ga_2O$, and further excess Ga diffuses Ga-adatoms into the $Al_2O_3$ surface. Under suitable conditions a corundum $Ga_2O_3$ surface structure results enabling lattice matching of Ga-rich $AlGaO_3$ corundum constructions or thicker layers can result in monoclinic $AlGaO_3$ crystal symmetry.

Figure 18:
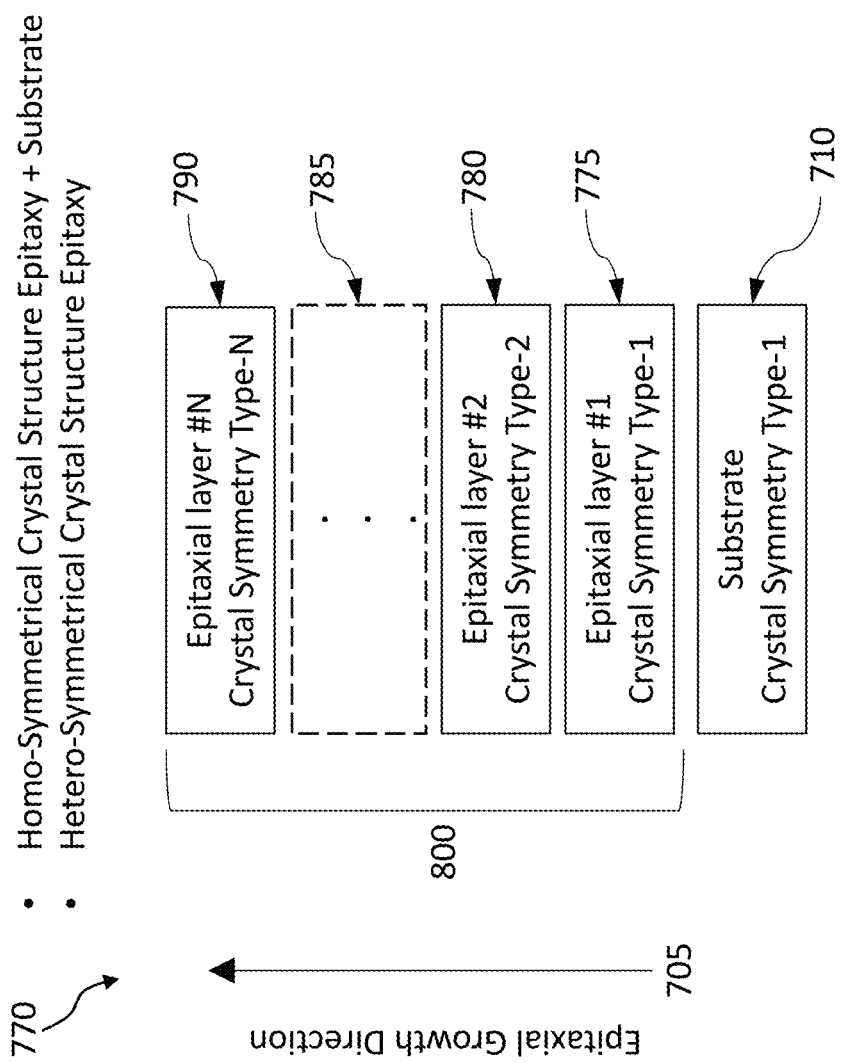
FIG. 18 depicts a buffer layer deposited with the same crystal symmetry as an underlying substrate to enable subsequent hetero-symmetry deposition of oxide materials in accordance with an illustrative embodiment of the present disclosure.

FIG. 18 describes yet another embodiment of a process 770 wherein a buffer layer 775 is deposited on the substrate 710, the buffer layer 775 having the same crystal symmetry type as substrate 710 (Type-1), thereby enabling atomically flat layers to seed alternate crystal symmetry types of layers 780, 785, 790 (Type 2, 3 ... N). For example, a monoclinic buffer 775 is deposited upon a monoclinic bulk $Ga_2O_3$ substrate 710. Then cubic MgO and NiO layers 780-790 are formed. In this figure, the hetero-symmetrical crystal structure epitaxy with the homo-symmetrical buffer layer is labeled as structure 800.

Figure 19:
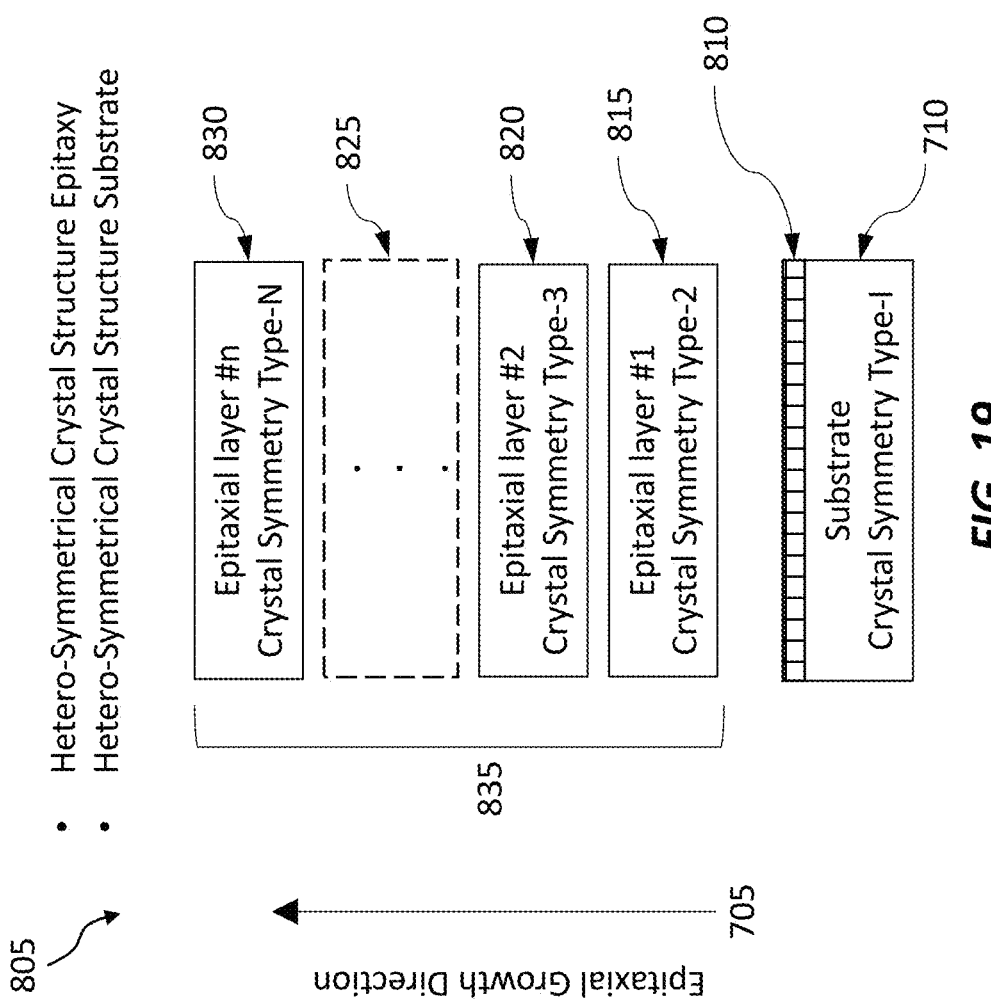
FIG. 19 depicts a structure comprising a plurality of hetero-symmetrical regions sequentially deposited as a function of the growth direction in accordance with an illustrative embodiment of the present disclosure.

FIG. 19 depicts yet a further embodiment of a process 805 showing sequential variation along a growth direction 705 of a plurality of crystal symmetry types. For example, a corundum $Al_2O_3$ substrate 710 (Type-1) creates an O-terminated template 810 which then seeds a corundum $AlGaO_3$ layer 815 of Type-2 crystal symmetry. A hexagonal $AlGaO_3$ layer 820 of Type-3 crystal symmetry can then be formed followed by cubic crystal symmetry type (Type-N) such as a MgO or NiO layer 830. The layers 815, 820, 825 and 830 are collectively labeled in this figure as hetero-symmetrical crystal structure epitaxy 835. Such crystal growth matching is possible using vastly different crystal symmetry type layers if in-plane lattice co-incidence geometry can occur. While rare, this is found to be possible in the present disclosure with (100)-oriented cubic ($0 \leq x \leq 1$) and monoclinic $AlGaO_3$ compositions. This procedure can then be repeated along a growth direction.

Figure 20A:
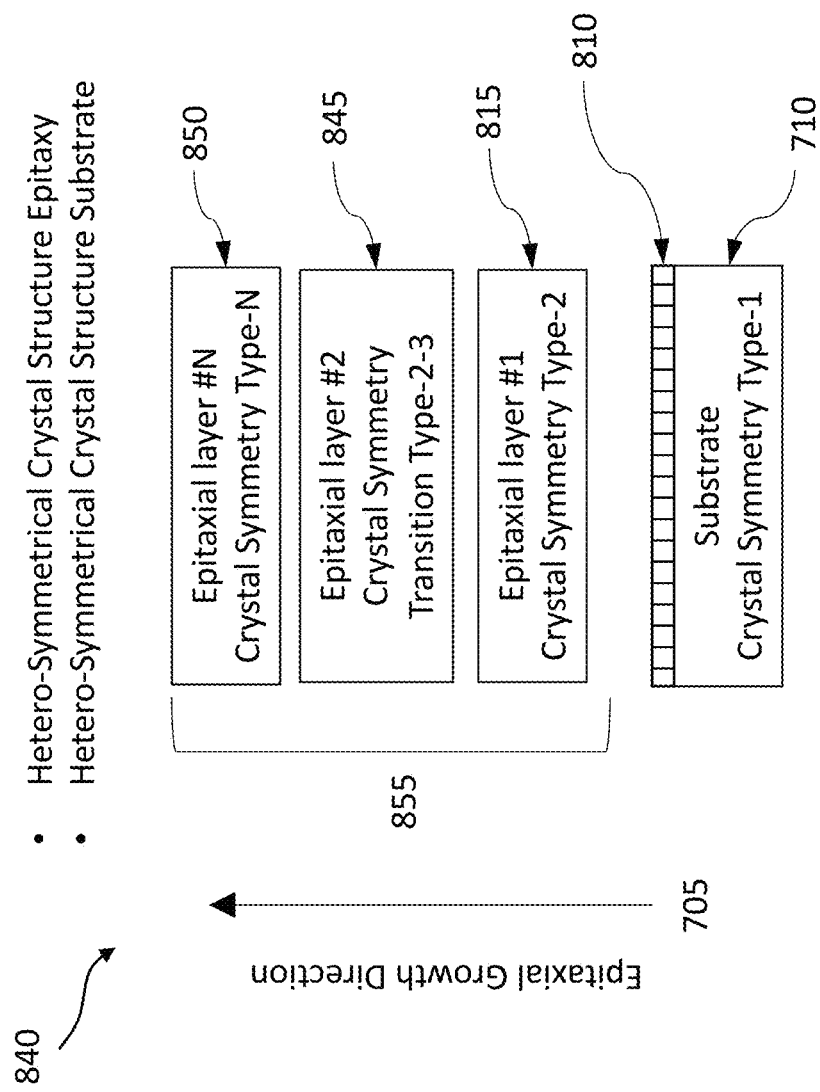
FIG. 20A shows a crystal symmetry transition region linking two deposited crystal symmetry types in accordance with an illustrative embodiment of the present disclosure.

Yet another embodiment is shown in FIG. 20A where the substrate 710 of Type-1 crystal symmetry has a prepared surface (template 810) seeding a first crystal symmetry type 815 (Type-2) which then can be engineered to transition to another symmetry type 845 (Transition Type 2-3) over a given layer thickness. An optional layer 850 can then be grown with yet another crystal symmetry type (Type-N). For example, C-plane sapphire substrate 710 forms a corundum $Ga_2O_3$ layer 815 which then relaxes to a hexagonal $Ga_2O_3$ crystal symmetry type or a monoclinic crystal symmetry type. Further growth of layer 850 then can be used to form a high quality relaxed layer of high crystal structure quality. The layers 815, 845 and 850 are collectively labeled in this figure as hetero-symmetrical crystal structure epitaxy 855.

Figure 20B:
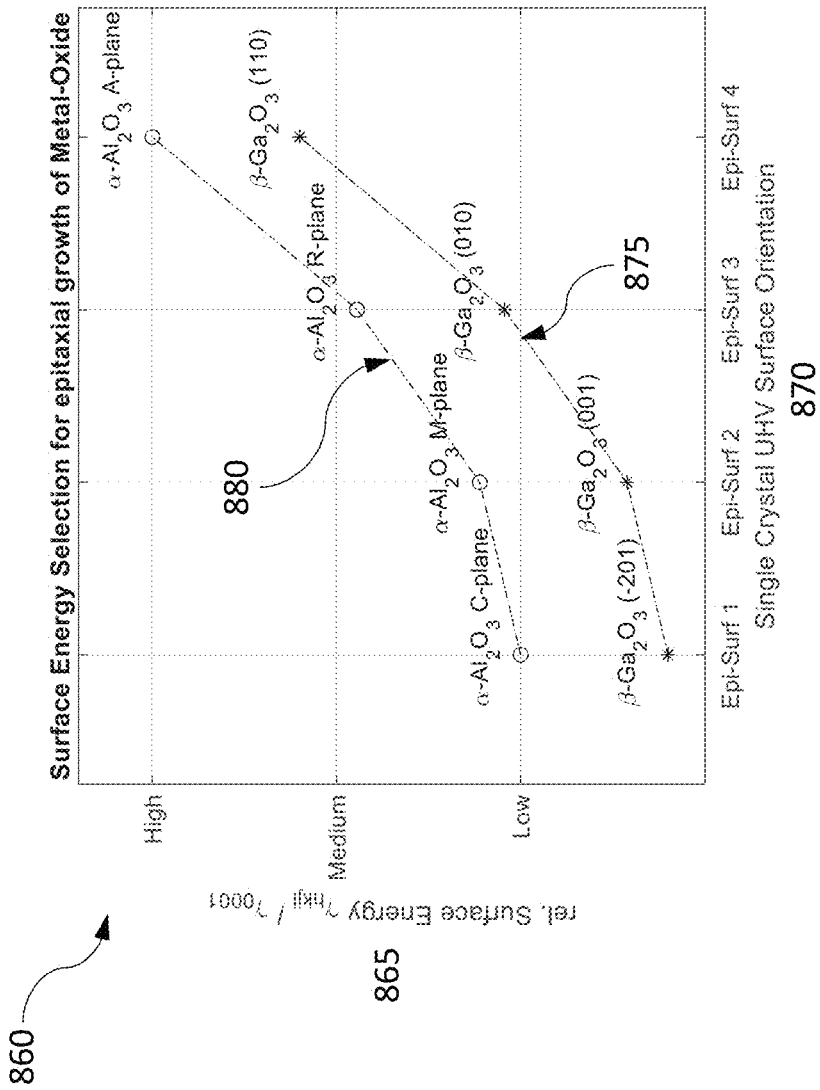
FIG. 20B shows the variation in a particular crystal surface energy as a function of crystal surface orientation for the cases of corundum-Sapphire and monoclinic Gallia single crystal oxide materials in accordance with an illustrative embodiment of the present disclosure.

Referring now to FIG. 20B, there is shown a chart 860 of the variation in a particular crystal surface energy 865 as a function of crystal surface orientation 870 for the cases of corundum-Sapphire 880 and monoclinic Gallia single crystal oxide materials 875. It has been found in accordance with the present disclosure that the crystal surface energy for technologically relevant corundum $Al_2O_3$ 880 and monoclinic substrates can be used to selectively form $AlGaO_3$ crystal symmetry types.

For example, Sapphire C-plane can be prepared under O-rich growth conditions to selectively grow hexagonal $AlGaO_3$ at lower growth temperature (<650° C.) and monoclinic $AlGaO_3$ at higher temperatures (>650° C.). Monoclinic $AlGaO_3$ is limited to Al % of approximately 45-50% owing to the monoclinic crystal symmetry having approximately 50% tetrahedrally coordinated bonds (TCB) and 50% octahedrally coordinated bonds (OCB). While Ga can accommodate both TCB and OCB, Al seeks in preference the OCB sites. R-plane sapphire can accommodate corundum $AlGaO_3$ compositions with Al % ranging 0-100% grown at low temperatures of less than about 550° C. under O-rich conditions and monoclinic $AlGaO_3$ with Al<50% at elevated temperatures >700° C.

M-plane sapphire surprisingly provides yet an even more stable surface which can grow exclusively corundum $AlGaO_3$ composition for Al %=0-100%, providing atomically flat surfaces.

Even more surprising is the discovery of A-plane sapphire surfaces presented for $AlGaO_3$ which are capable of extremely low defect density corundum $AlGaO_3$ compositions and superlattices (see discussion below). This result is fundamentally due to the fact that corundum $Ga_2O_3$ and corundum $Al_2O_3$ both share exclusive crystal symmetry structure formed by OCBs. This translates into very stable growth conditions with a growth temperature window ranging from room temperature to 800° C. This clearly shows attention toward crystal symmetry designs that can create new structural forms applicable to LEDs such as UVLEDs.

Similarly, native monoclinic $Ga_2O_3$ substrates with (−201)-oriented surfaces can only accommodate monoclinic $AlGaO_3$ compositions. The Al % for (−201)-oriented films is significantly lower owing to the TCB presented by the growing crystal surface. This does not favor large Al fractions but can be used to form extremely shallow MQWs of $AlGaO_3/Ga_2O_3$.

Surprisingly the (010)- and (001)-oriented surface of monoclinic $Ga_2O_3$ can accommodate monoclinic $AlGaO_3$ structures of exceedingly high crystal quality. The main limitation for $AlGaO_3$ Al % is the accumulation of biaxial strain. Careful strain management in accordance with the present disclosure using $AlGaO_3/Ga_2O_3$ superlattices also finds a limiting Al %<40%, with higher quality films achieved using (001)-oriented $Ga_2O_3$ substrate. Yet a further example of (010)-oriented monoclinic $Ga_2O_3$ substrates is the extremely high quality lattice matching of $MgGa_2O_4$ (111)-oriented films having cubic crystal symmetry structures.

Similarly, $MgAl_2O_4$ crystal symmetry is compatible with corundum $AlGaO_3$ compositions. It is also found experimentally in accordance with the present disclosure that (100)-oriented $Ga_2O_3$ provides an almost perfect coincidence lattice match for cubic MgO(100) and NiO(100) films. Even more surprising is the utility of (110)-oriented monoclinic $Ga_2O_3$ substrates for the epitaxial growth of corundum $AlGaO_3$.

These unique properties provide for the selective utility of $Al_2O_3$ and $Ga_2O_3$ crystal symmetry type substrates, as an example, with the selective use of crystal surface orientations to offer many advantages for the fabrication of LEDs and in particular UVLED.

In some embodiments, conventional bulk crystal growth techniques may be adopted to form corundum $AlGaO_3$ composition bulk substrates having corundum and monoclinic crystal symmetry types. These ternary $AlGaO_3$ substrates can also prove valuable for application to UVLED devices.

Band Structure Modifiers

Optimizing the $AlGaO_3$ band structure can be achieved by careful attention to the structural deformations of a given crystal symmetry type. For application to a solid-state, and in particular a semiconductor-based electro-optically driven ultraviolet emissive device, the valence band structure (VBS) is of major importance. It is typically the VBS E-k dispersion which determines the efficacy for the creation of optical radiation by direct recombination of electrons and holes. Therefore, attention is now directed toward valence band tuning options for achieving in one example UVLED operation.

Configuring of the Band Structure by Bi-Axial Strain

In some embodiments, selective epitaxial deposition of AlGaO$_3$ crystal structures can be formed under the elastic structural deformation by the use of composition control or by using a surface crystal geometric arrangement that can epitaxially register the AlGaO$_3$ film while still maintaining an elastic deformation of the AlGaO$_3$ unit cell.

Figures 21A, 21B, 21C:
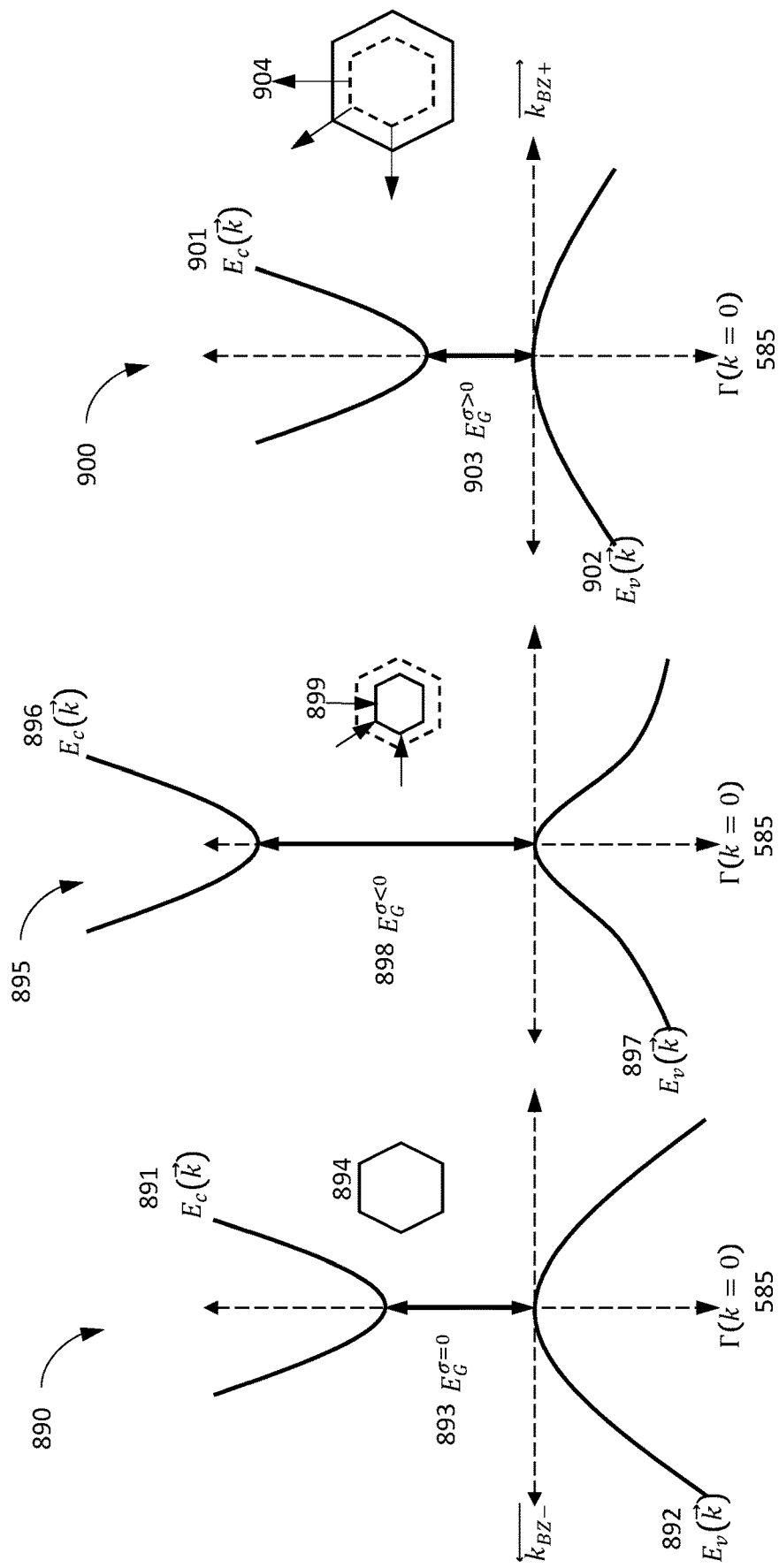
FIGS. 21A-21C depict schematically the change in electronic energy configuration or band structure of a metal oxide semiconductor under the influence of bi-axial strain applied to the crystal unit cell in accordance with an illustrative embodiment of the present disclosure.

For example, FIGS. 21A-21C depict the change in E-k band structure in the vicinity of the Brillouin zone-center (k=0) which favors e-h recombination for generating bandgap energy photons under the influence of bi-axial strain applied to the crystal unit cell. The band structures for both corundum and monoclinic Al$_2$O$_3$ are direct. Depositing Al$_2$O$_3$, Ga$_2$O$_3$ or AlGaO$_3$ thin films onto a suitable surface which can elastically strain the in-plane lattice constant of the film may be achieved and engineered in accordance with the present disclosure.

The lattice constant mismatches between Al$_2$O$_3$ and Ga$_2$O$_3$ are shown in Table II of FIG. 43B. The ternary alloys can be roughly interpolated between the end point binaries for the same crystal symmetry type. In general, an Al$_2$O$_3$ film deposited on a Ga$_2$O$_3$ substrate conserving crystal orientations will create the Al$_2$O$_3$ film in biaxial tension, whereas a Ga$_2$O$_3$ film deposited on an Al$_2$O$_3$ substrate having the same crystal orientation will be in a state of compression.

The monoclinic and corundum crystals have non-trivial geometric structures with relatively complex strain tensors compared to conventional cubic, zinc-blende or even wurtzite crystals. The general trend observed on E-k dispersion in vicinity of the BZ centre is shown in FIGS. 21A-21B. For example, diagram 890 of FIG. 21A describes a c-plane corundum crystal unit cell 894 having a strain free (σ=0) E-k dispersion, with conduction band 891 and valence band 892 separated by a bandgap 893. Biaxial compression of the unit cell 899 in diagram 895 of FIG. 21B changes the dispersion by hydrostatically lifting the conduction band, e.g., see conduction band 896 and warping the E-k curvature of the valence band 897. The compressively strained (σ<0) bandgap 898 is generally increased $E_G^{\sigma<0} > E_G^{\sigma=0}$.

Conversely, as shown in diagram 900 of FIG. 21C, biaxial tension applied to the unit cell 904 has the effect of reducing the bandgap 903 $E_G^{\sigma>0} < E_G^{\sigma=0}$, lowering the conduction band 901 and flattening the valence band curvature 902. As the valence band curvature is directly related to the hole effective mass, a larger curvature decreases the effective hole mass, whereas smaller curvature (i.e., flatter E-k bands) increase the hole effective mass (note: a totally flat valence band dispersion potentially creates immobile holes). Therefore, it is possible to improve the Ga$_2$O$_3$ valence band dispersion by judicious choice of biaxial strain via the epitaxy on a suitable crystal surface symmetry and in-plane lattice structure.

Configuring of the Band Structure by Uni-Axial Strain

Figures 22A, 22B:
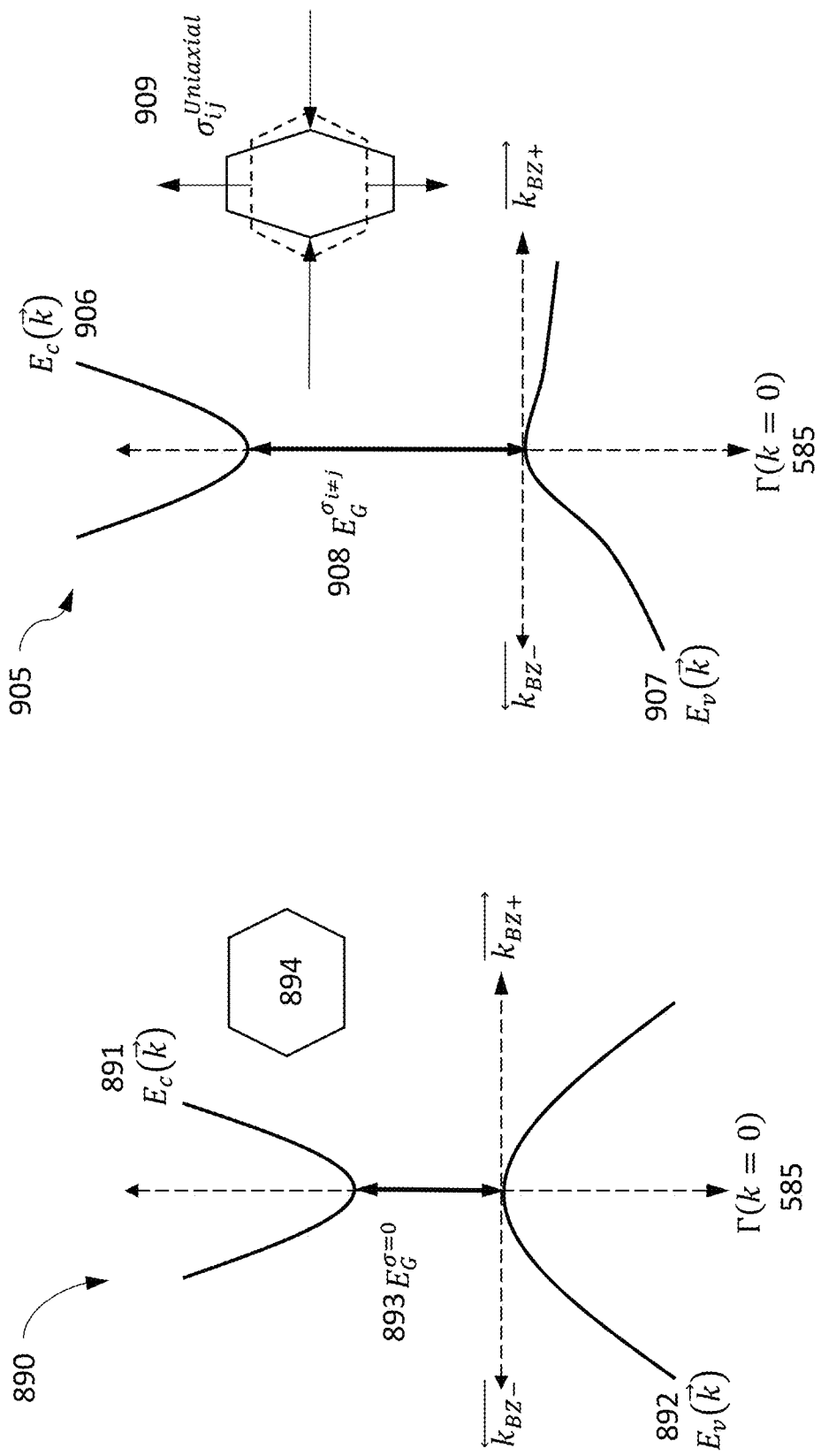
FIGS. 22A and 22B depict schematically the change in band structure of a metal oxide semiconductor under the influence of uniaxial strain applied to the crystal unit cell in accordance with an illustrative embodiment of the present disclosure.

Of particular interest is the possibility of using uniaxial strain to advantageously modify the valence band structure as shown in FIGS. 22A and 22B, where reference numbers in FIG. 22A correspond to those of FIG. 21A. For example, in-plane uniaxial deformation of the unit cell 894 along substantially one crystal direction as shown in unit cell 909 will asymmetrically deform the valence band 907 as shown in diagram 905, which also shows conduction band 906 and bandgap 908.

For the case of monoclinic and corundum crystal symmetry films, similar behavior will occur and can be shown via the growth of elastically strained superlattice structures comprising Al$_2$O$_3$/Ga$_2$O$_3$, Al$_x$Ga$_{1-x}$O$_3$/Ga$_2$O$_3$ and Al$_x$Ga$_{1-x}$O$_3$/Al$_2$O$_3$ on Al$_2$O$_3$ and Ga$_2$O$_3$, substrates. Such structures have been grown in relation to the present disclosure, and the critical layer thickness (CLT) was found to depend on the surface orientation of the substrate and be in the range of 1-2 nm to about 50 nm for binary Ga$_2$O$_3$ on Sapphire. For monoclinic Al$_x$Ga$_{1-x}$O$_{3x}$, x<10% the CLT can exceed 100 nm on Ga$_2$O$_3$.

Uniaxial strain can be implemented by growth on crystal symmetry surface with surface geometries having asymmetric surface unit cells. This is achieved in both corundum and monoclinic crystals under various surface orientations as described in FIG. 20B, although other surface orientation and crystals are also possible, for example, MgO(100), MgAl$_2$O$_4$(100), 4H—SiC(0001), ZnO(111), Er$_2$O$_3$(222) and AlN(0002) among others.

FIG. 22B shows the advantageous deformation of the valence band structure for the case of a direct bandgap. For the case of an indirect bandgap E-k dispersion, such as, thin monolayered monoclinic Ga$_2$O$_3$, the valence band dispersion can be tuned from an indirect to a direct band gap as shown in FIGS. 23A or 23B transitioning to FIG. 23C. Consider the strain-free band structure 915 of FIG. 23B having conduction band 916, valence band 917, bandgap 918 and valence band maximum 919. Similarly, compressive structure 910 of FIG. 23A shows conduction band 911, valence band 912, bandgap 913 and valence band maximum 914. Tensile structure 920 of FIG. 23C shows conduction band 921, valence band 922, bandgap 923 and valence band maximum 924. Detailed calculations and experimental angle resolved photoelectron spectroscopy (ARPES) can show that compressive and tensile strain applied to thin films of Ga$_2$O$_3$ can warp the valence band as shown in structures 910 and 920 for the cases of compressive (valence band 912) and tensile (valence band 922) uniaxial strain applied along the b-axis or c-axis of the monoclinic Ga$_2$O$_3$ unit cell.

As shown by these figures, strain plays an important role which typically will require management for complex epitaxy structure. Failure to manage the strain accumulation is likely to result in relief of the elastic energy within the unit cell by the creation of dislocations and crystallographic defects which reduce the efficiency of the UVLED.

Configuration of the Band Structure by Application of Post Growth Stress

While the above techniques involve the introduction of stresses in the form of uni-axial or bi-axial strain during forming of the layers, in other embodiments external stress may be applied following formation or growing of the layers or layers of metal oxide to configure the band structure as required. Illustrative techniques that may be adopted to introduce these stresses are disclosed in U.S. Pat. No. 9,412,911.

Configuration of the Band Structure by Selection of Compositional Alloy

Figures 24A, 24B:
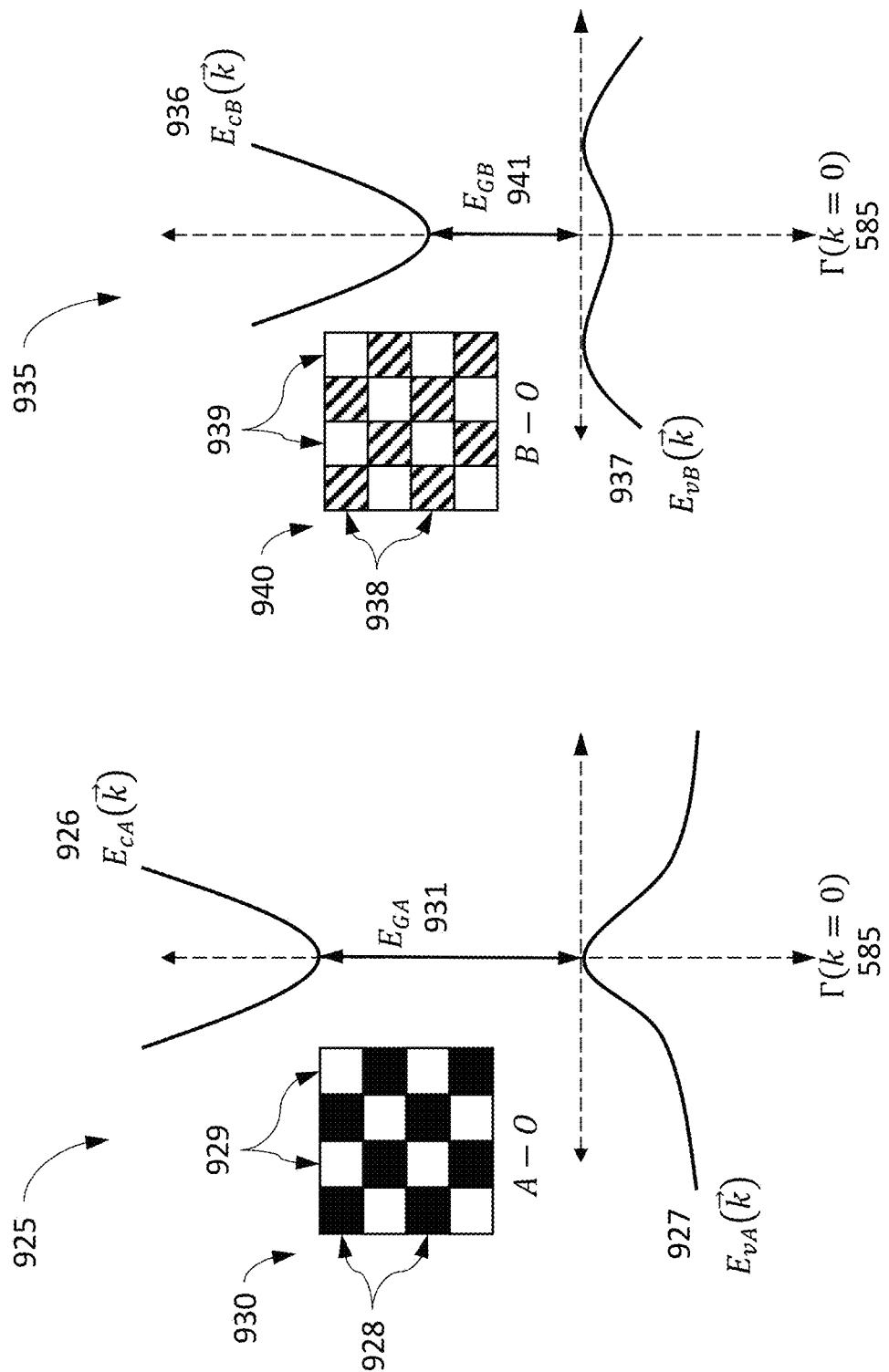
FIGS. 24A and 24B depict the E-k electronic configuration of two dissimilar binary metal oxides in accordance with an illustrative embodiment of the present disclosure.

Yet another mechanism which is utilized in the present disclosure and applied to optically emissive metal oxide based UVLEDs is the use of compositional alloying to form ternary crystal structures with a desirable direct bandgap. In general, two distinct binary oxide material compositions are shown in FIGS. 24A and 24B. Band structure 925 comprises metal oxide A-O with crystal structure material 930 built from metal atoms 928 and oxygen atoms 929 having conduction band 926, valence band dispersion 927 and direct bandgap 931. Another binary metal oxide B—O has a crystal structure material 940 built from a different metal cation 938 of type B and oxygen atoms 939 and has an indirect band structure 935 with conduction band 936, bandgap 941 and valence band dispersion 937. In this example, the common anion is oxygen, and both A-O and B—O have the same underlying crystal symmetry type.

In the case where a ternary alloy may be formed by mixing cation sites with metal atoms A and B within an otherwise similar oxygen matrix to form $(A-O)_x(B-O)_{1-x}$ this will result in an $A_xB_{1-x}O$ composition with the same underlying crystal symmetry. On this basis, it is then possible to form a ternary metal oxide with valence band mixing effect as shown in FIG. 25B (Note: FIGS. 25A and 25C reproduce FIGS. 24A and 24B). The direct valence band dispersion 927 of A-O crystal structure material 930 alloyed with B—O crystal structure material 940 having indirect valence band dispersion 937 can produce a ternary material 948 that exhibits improved valence band dispersion 947, and having conduction band 946 and bandgap 949. That is, atomic species A of material 930 incorporated into B-sites of material 940 can augment the valence band dispersion. Atomistic Density Functional Theory calculations can be used to simulate this concept which will fully account for the pseudopotentials of the constituent atoms, strain energy and crystal symmetry.

Accordingly, alloying corundum $Al_2O_3$ and $Ga_2O_3$ can result in a direct bandgap for the band structure of the ternary metal oxide alloy and can also improve the valence band curvature of monoclinic crystal symmetry compositions.

Configuration of the Band Structure by Selection of Digital Alloy Fabrication

While ternary alloy compositions such as $AlGaO_3$ are desirable, an equivalent method for creating a ternary alloy is by the use of digital alloy formation employing superlattices (SLs) built from periodic repetitions of at least two dissimilar materials. If the each of the layers comprising the repeating unit cell of the SL are less than or equal to the electron de Broglie wavelength (typically about 0.1 to 10's of nm) then the superlattice periodicity forms a 'mini-Brillouin zone' within the crystal band structure as shown in FIG. 27A. In effect, a new periodicity is superimposed over the inherent crystal structure by the formation of the predetermined SL structure. The SL periodicity is typically in the one-dimension of the epitaxial film formation growth direction.

In the graph 950 of FIG. 26, consider the valence band states 953 native to material 955, and valence band states 954 from material 956. The E-k dispersion shows an energy gap 957 along the energy axis 951 for region 958, and a first Brillouin zone edge 959 relative to k=0. Region 958 is a forbidden energy gap ($\Delta E$) between the energy band states 953 and 954, which are the bulk-like energy bands of materials 955 and 956. If material A and B form a superlattice 968 as shown in FIG. 27B and the SL period $L_{SL}$ is selected to be a multiple (e.g., $L_{SL}=2a_{AB}$) of the average lattice constant $a_{AB}$ of A and B, then new states 961, 962, 963 and 964 are generated as shown in FIG. 27A. The superlattice energy potential therefore creates a SL band gap 967 at k=0. This effectively folds the energy band 953 from the first bulk Brillouin zone edge 959 to k=0. That is, when making a superlattice using the two materials 955 and 956 into ultrathin layers (thicknesses 970 and 971, respectively) forming a periodic repeating unit 969, the original bulk-like valence band states 953 and 954 are folded into new energy band states 961, 962 and 963 and 964. Stated another way, the superlattice potential creates a new energy dispersion structure comprising band states 961, 962, 963 and 964. As the superlattice period imposes a new spatial potential, the Brillouin zone is contracted to wavevector 975.

This type of SL structure in FIG. 27B can be created using bi-layered pairs comprising in different examples: $Al_xGa_{1-x}O/Ga_2O_3$, $Al_xGa_{1-x}O_3/Al_2O_3$, $Al_2O_3/Ga_2O_3$ and $Al_xGa_{1-x}O/Al_yGa_{1-y}O_3$.

The general use of SLs to configure an optoelectronic device is disclosed in U.S. Pat. No. 10,475,956.

FIG. 27C shows the SL structure for the case of a digital binary metal oxide comprising $Al_2O_3$ layers 983 and $Ga_2O_3$ layers 984. The structure is shown in terms of electron energy 981 as a function of epitaxial growth direction 982. The period of the SL forming the repeating unit cell 980 is repeated in integer or half-integer repetitions. For example, the number of repetitions can vary from 3 or more periods and even up to 100 or 1000 or more. The average Al % content of the equivalent digital alloy $Al_xGa_{1-x}O$ is calculated as $x_{Al}^{SL}=L_{Al_2O_3}/L_{Al_2O_3}+L_{Ga_2O_3}$, where $L_{Al_2O_3}$ is the layer thickness of $Al_2O_3$ and $L_{Ga_2O_3}$=thickness of $Ga_2O_3$ layer.

Yet further examples of SL structures possible are shown in FIGS. 27D-27F.

The digital alloy concept can be expanded to other dissimilar crystal symmetry types, for example cubic NiO 987 and monoclinic $Ga_2O_3$ 986 as shown in FIG. 27D where the digital alloy 985 simulates an equivalent ternary $(NiO)_x (Ga_2O_3)_{1-x}$ bulk alloy.

Yet a further example is shown in digital alloy 990 of FIG. 27E using cubic MgO layers 991 and cubic NiO layers 992 comprising the SL. In this example, MgO and NiO have a very close lattice match, unlike $Al_2O_3$ and $Ga_2O_3$ which are high lattice mismatched.

A four layer period SL996 is shown in the digital alloy 995 of FIG. 27F where cubic MgO and NiO with oriented growth along (100) can coincidence lattice match for (100)-oriented monoclinic $Ga_2O_3$. Such a SL would have an effective quaternary composition of $Ga_xNi_yMg_zO_n$.

Al—Ga-Oxide Band Structures

The UVLED component regions can be selected using binary or ternary $Al_xGa_{1-x}O_3$ compositions either bulk-like or via digital alloy formation. Advantageous valence band tuning using bi-axial or uniaxial strain is also possible as described above. An example process flow 1000 is shown in FIG. 29 describing the possible selection criteria for selecting at least one of the crystal modification methods to form the bandgap regions of the UVLED.

At step 1005, the configuration of the band structure is selected including, but not limited to, band structure characteristics such as whether the band gap is direct or indirect, band gap energy, Efermi, carrier mobility, and doping and polarization. At step 1010, it is determined whether a binary oxide may be suitable and further whether that band structure of the binary oxide may be modified (i.e., tuned) at step 1015 to meet requirements. If the binary oxide material meets the requirements then this material is selected for the relevant layer at step 1045 in the optoelectronic device. If a binary oxide is not suitable, then it is determined whether a ternary oxide may be suitable at step 1025 and further whether the band structure of the ternary oxide may be modified at step 1030 to meet requirements. If the ternary oxide meets requirements then this material is selected for the relevant layer at step 1045.

If a ternary oxide is not suitable, then it is determined whether a digital alloy may be suitable at step 1035 and further whether the band structure of the digital alloy may be modified at step 1040 to meet requirements. If the digital alloy meets requirements then this material is selected for the relevant layer at step 1045. Following determination of the layers by this method, then the optoelectronic device stack is fabricated at step 1048.

An embodiment of an energy band lineup for $Al_2O_3$ and $Ga_2O_3$ with respect to the ternary alloy $Al_xGa_{1-x}O_3$ is shown in diagram 1050 of FIG. 30 and varies in conduction and valence band offsets for corundum and monoclinic crystal symmetry. In diagram 1050 the y-axis is electron energy 1051 and the x-axis is different material types 1053 ($Al_2O_3$ 1054, $(Ga_1Al_1)O_3$ 1055 and $Ga_2O_3$ 1056). Corundum and monoclinic heterojunctions both appear to have type-I and type-II offsets whereas FIG. 30 simply plots the band alignment using existing values for the electron affinity of each material.

The theoretical electronic band structures of corundum and monoclinic bulk crystal forms of $Al_2O_3$ and $Ga_2O_3$ are known in the prior art. The application of strain to thin epitaxial films is however unexplored and is a subject of the present disclosure. By way of reference to the bulk band structures of $Ga_2O_3$ 1056 and $Al_2O_3$ 1054, embodiments of the present disclosure utilize how strain engineering can be applied advantageously for the application to UVLEDs. Incorporation of the monoclinic and trigonal strain tensor into a k.p-like Hamiltonian is necessary for understanding how the valence band is affected. Prior-art k.p crystal models as applied to zinc-blende and wurtzite crystal symmetry systems lack maturity for simulation of both the monoclinic and trigonal systems. Current efforts are being directed to perform a calculation of in the quadratic approximation to a valence band Hamiltonian at the center of the Brillioun zone of materials where this center possess the symmetry of the point group $C2_h$.

Single Crystal Aluminum-Oxide

The two main crystal forms of monoclinic (C2/m) and corundum (R3c) crystal symmetry is discussed herein for both $Al_2O_3$ and $Ga_2O_3$; however, other crystal symmetry types are also possible such as triclinic and hexagonal forms. The other crystal symmetry forms can also be applied in accordance with the principles set out in the present disclosure.

(a) Corundum Symmetry $Al_2O_3$

The crystal structure of trigonal $Al_2O_3$ (corundum) 1060 is shown in FIG. 31. The larger spheres represent Al-atoms 1064 and the smaller spheres are oxygen 1063. The unit cell 1062 has crystal axes 1061. Along the c-axis there are layers of Al atoms and O atoms. This crystal structure has a computed band structure 1065 as shown in FIGS. 32A-32B. The electron energy 1066 is plotted as a function of the crystal wave vectors 1067 within the Brillouin zone. The high symmetry points within the Brillouin zone are labelled as shown in the vicinity of the zone center k=0 which is applicable to understand the optical emission properties of the material.

The direct bandgap has valence band maximum 1068 and conduction band minimum 1069 at k=0. A detailed picture of the valence band in FIG. 32B shows a complex dispersion for the two uppermost valence bands. The topmost valence band determines the optical emission character if electrons and holes are indeed capable of being injected simultaneously into the $Al_2O_3$ band structure.

(b) Monoclinic Symmetry $Al_2O_3$

The crystal structure 1070 of monoclinic $Al_2O_3$ is shown in FIG. 33. The larger spheres represent Al-atoms 1064 and the smaller spheres are oxygen 1063. The unit cell 1072 has crystal axes 1071. This crystal structure has a computed band structure 1075 as shown in FIGS. 34A-34B, where FIG. 34B is a detailed picture of the valence band. FIG. 34A also shows conduction band 1076. The high symmetry points within the Brillouin zone are labelled as shown in the vicinity of the zone center k=0 which is applicable for understanding the optical emission properties of the material.

The monoclinic crystal structure 1070 is relatively more complex than the trigonal crystal symmetry and has lower density and smaller bandgap than the corundum Sapphire 1060 form illustrated in FIG. 31.

The monoclinic $Al_2O_3$ form also has a direct bandgap with clear split-off highest valence band 1077 which has lower curvature with respect to the E-k dispersion along the G-X and G-N wave vectors. The monoclinic bandgap is 1.4 eV smaller than the corundum form. The second highest valence band 1078 is symmetry split from the upper most valence band.

Single Crystal Gallium-Oxide (a) Corundum Symmetry $Ga_2O_3$

The crystal structure of trigonal $Ga_2O_3$ (corundum) 1080 is shown in FIG. 35. The larger spheres represent Ga-atoms 1084 and the smaller spheres are oxygen 1083. The unit cell 1082 has crystal axes 1081. The corundum (trigonal crystal symmetry type) is also known as the alpha-phase. The crystal structure is identical to Sapphire 1060 of FIG. 31 with lattice constants defining the unit cell 1082 shown in Table II of FIG. 43B. The $Ga_2O_3$ unit cell 1082 is larger than $Al_2O_3$. The corundum crystal has octahedrally bonded Ga-atoms.

The calculated band structure 1085 for corundum $Ga_2O_3$ is shown in FIGS. 36A and 36B which is pseudo-direct having only a very small energy difference between the valence band maximum and the zone center k=0. Conduction band 1086 is also shown in FIG. 36A.

Biaxial and uniaxial strain when applied to corundum $Ga_2O_3$ using the methods described above may then be used to modify the band structure and valence band into a direct bandgap. Indeed it is possible to use tensile strain applied along the b- and/or c-axes crystal to shift the valence band maximum to the zone center. It is estimated that 5% tensile strain can be accommodated within a thin $Ga_2O_3$ layer comprising an $Al_2O_3/Ga_2O_3$ SL.

(b) Monoclinic Symmetry $Ga_2O_3$

The crystal structure of monoclinic $Ga_2O_3$ (corundum) 1090 is shown in FIG. 37. The larger spheres represent Ga-atoms 1084 and the smaller spheres are oxygen 1083. The unit cell 1092 has crystal axes 1091. This crystal structure has a computed band structure 1095 as shown in FIGS. 38A-38B. The high symmetry points within the Brillouin zone are labelled as shown in the vicinity of the zone center k=0 which is applicable for understanding the optical emission properties of the material. Conduction band 1096 is also shown in FIG. 38A.

Monoclinic $Ga_2O_3$ has an uppermost valence 1097 with a relatively flat E-k dispersion. Close inspection reveals a few eV (less than the thermal energy $k_BT \sim 25$ meV) variation in the actual maximum position of the valence band. The relatively small valence dispersion provides insight to the fact that monoclinic $Ga_2O_3$ will have relatively large hole effective masses and will therefore be relatively localized with potentially low mobility. Thus, strain can be used advantageously to improve the band structure and in particular the valence band dispersion.

Ternary Aluminum-Gallium-Oxide

Yet another example of the unique properties of the $AlGaO_3$ materials system is demonstrated by the crystal structures 1100 as shown in FIG. 39, having crystal axes 1101 and unit cell 1102. The ternary alloy comprises a 50% Al composition.

$(Al_xGa_{1-x})_2O_3$, where x=0.5 and can be deformed into substantially different crystal symmetry form having rhombic structure. The Ga atoms 1084 and Al atoms 1064 are disposed within the crystal as shown with oxygen atoms 1083. Of particular interest is the layered structure of Al and Ga atom planes. This type of structure can also be built using atomic layer techniques to form an ordered alloy as described throughout this disclosure.

The calculated band structure of 1105 is shown in FIG. 40. The conduction band minimum 1106 and valence band maximum 1107 exhibits a direct bandgap.

Ordered Ternary AlGaO$_3$ Alloy

Using atomic layer epitaxy methods further enables new types of crystal symmetry structures to be formed. For example, some embodiments include ultrathin epilayers comprising alternate sequences along a growth direction of the form of [Al—O—Ga—O—Al—...]. Structure 1110 of FIG. 42 shows one possible extreme case of creating ordered ternary alloys using alternate sequences 1115 and 1120. It has been demonstrated in relation to the present disclosure that growth conditions can be created where self-ordering of Al and Ga can occur. This condition can occur even under co-incident Al and Ga fluxes simultaneously applied to the growing surface resulting in a self-assembled ordered alloy. Alternatively, a predetermined modulation of the Al and Ga fluxes arriving at the epilayer surface can also create an ordered alloys structure.

The ability to configure the band structure for optoelectronic devices, and in particular UVLEDS, by selecting from bulk-like metal oxides, ternary compositions or further still digital alloys are all contemplated to be within the scope of the present disclosure.

Yet another example is the use of biaxial and uniaxial strain to modify the band structure, with one example being the use of the $(Al_xGa_{1-x})_2O_3$ material system employing strained layer epitaxy on $Al_2O_3$ or $Ga_2O_3$ substrates.

Substrate Selection for AlGaO-Based UVLEDs

The selection of a native metal oxide substrate is one advantage of the present disclosure applied to the epitaxy of the $(Al_xGa_{1-x})_2O_3$ material systems using strained layer epitaxy on $Al_2O_3$ or $Ga_2O_3$ substrates.

Example substrates are listed in Table I in FIG. 43A. In some embodiments, intermediate AlGaO$_3$ bulk substrates may also be utilized and are advantageous for application to UVLEDs.

A beneficial utility for monoclinic Ga$_2$O$_3$ bulk substrates is the ability to form monoclinic $(Al_xGa_{1-x})_2O_3$ structures having high Ga % (e.g., approximately 30-40%), limited by strain accumulation. This enables vertical devices due to the ability of having an electrically conductive substrate. Conversely, the use of corundum Al$_2$O$_3$ substrates enable corundum epitaxial films $(Al_xGa_{1-x})_2O_3$ with $0 \leq x \leq 1$.

Other substrates such as MgO(100), MgAl$_2$O$_4$ and MgGa$_2$O$_4$ are also favorable for the epitaxial growth of metal oxide UVLED structures.

Selection and Action of Crystal Growth Modifiers

Examples of metal oxide structures are now discussed for optoelectronic applications and in particular to the fabrication of UVLEDs. The structures disclosed in FIGS. 44A-44Z, which shall be described subsequently, are not limiting as the possible crystal structure modifiers may be selected from either elemental cation and anion constituents into a given metal oxide M-O (where M=Al, Ga), such as binary Ga$_2$O$_3$, ternary $(Al_xGa_{1-x})_2O_3$ and binary Al$_2$O$_3$.

It is found both theoretically and experimentally in accordance with the present disclosure that the cation specie crystal modifiers into M-O defined above may be selected from at least one of the following:

Germanium (Ge)

Ge is beneficially supplied as pure elemental species to incorporate via co-deposition of M-O species during non-equilibrium crystal formation process. In some embodiments, elemental pure ballistic beams of atomic Ga and Ge are co-deposited along with an active Oxygen beam impinging upon the growth surface. For example, Ge has a valence of +4 and can be introduced in dilute atomic ratio by substitution onto metal cation M-sites of the M-O host crystal to form stoichiometric composition of the form $(Ge^{+4}O_2)_m(Ga_2O_3)_n = (Ge^{+4}O_2)_{m/(m+n)}(Ga_2O_3)_{n/(m+n)} = (Ge^{+4}O_2)_x(Ga_2O_3)_{1-x} = Ge_xGa_{2(1-x)}O_{3-x}$ wherein for dilute Ge compositions $x < 0.1$.

In accordance with the present disclosure, it was found that for Ge $x<0.1$, a dilute ratio of Ge provides sufficient electronic modification to the intrinsic M-O for manipulating the Fermi-energy (EF), thereby increasing the available electron free carrier concentration and altering the crystal lattice structure to impart advantageous strain during epitaxial growth. For dilute compositions the host M-O physical unit cell is substantially unperturbed. Further increase in Ge concentration results in modification of the host Ga$_2$O$_3$ crystal structure through lattice dilation or even resulting in a new material composition.

For example, for Ge $x \leq \frac{1}{3}$ a monoclinic crystal structure of the host Ga$_2$O$_3$ unit cell can be maintained. For example, x=0.25 forming monoclinic $Ge_{0.25}Ga_{1.50}O_{2.75} = Ge_1Ga_6O_{11}$ is possible. Advantageously, monoclinic $Ge_xGa_{2(1-x)}O_3$, ($x=\frac{1}{3}$) crystal exhibits an excellent direct bandgap in excess of 5 eV. The lattice deformation by introducing Ge increases the monoclinic unit cell preferentially along the b-axis and c-axis while retaining the a-axis lattice constant in comparison to strain-free monoclinic Ga$_2$O$_3$.

The lattice constants for monoclinic Ga$_2$O$_3$ are (a=3.08 A, b=5.88 A, c=6.41 A) and for monoclinic Ge$_1$Ga$_6$O$_{11}$ (a=3.04 A, b=6.38 A, c=7.97 A). Therefore, introducing Ge creates biaxial expansion of the free-standing unit cell along the b- and c-axes. Therefore, if $Ge_xGa_{2(1-x)}O_{3-x}$ is epitaxially deposited upon a bulk-like monoclinic Ga$_2$O$_3$ surface oriented along the b- and c-axis (that is, deposited along the a-axis), then a thin film of $Ge_xGa_{2(1-x)}O_3$, can be elastically deformed to induce biaxial compression, and therefore warp the valence band E-k dispersion advantageously, as discussed herein.

Beyond $x > \frac{1}{3}$ the higher Ge % transforms the crystal structure to cubic, for example, GeGa$_2$O$_5$.

In some embodiments, incorporation of Ge into Al$_2$O$_3$ and $(Al_xGa_{1-x})_2O_3$ are also possible.

For example, a direct bandgap $Ge_xAl_{2(1-x)}O_3$, ternary can also be epitaxially formed by co-deposition of elemental Al and Ge and active Oxygen so as to form a thin film of monoclinic crystal symmetry. In accordance with the present disclosure it was found that the monoclinic structure is stabilized for Ge % x~0.6 creating a free-standing lattice that has a large relative expansion along the a-axis and along the c-axis, while moderate decrease along the b-axis when compared to monoclinic Al$_2$O$_3$.

The lattice constants for monoclinic Ge$_2$Al$_2$O$_7$ are (a=5.34 A, b=5.34 A, c=9.81 A) and for monoclinic Al$_2$O$_3$ (a=2.94 A, b=5.671 A, c=6.14 A). Therefore, $Ge_xAl_{2(1-x)}O_3$ deposited along a growth direction oriented along the b-axis and deposited further on a monoclinic $Al_2O_3$ surface, for sufficiently thin films to maintain elastic deformation, will undergo biaxial tension.

Silicon (Si)

Elemental Si may also be supplied as a pure elemental species to incorporate via co-deposition of M-O species during non-equilibrium crystal formation process. In some embodiments, elemental pure ballistic beams of atomic Ga and Si are co-deposited along with an active Oxygen beam impinging upon the growth surface. For example, Si has a valence of +4 and can be introduced in dilute atomic ratio by substitution onto metal cation M-sites of the M-O host crystal to form stoichiometric composition of the form $(Si'O_2)_m(Ga_2O_3)_n = (Si^{+4}O_2)_{m/(m+n)}(Ga_2O_3)_{n/(m+n)} = (Si^{+4}O_2)_x(Ga_2O_3)_{1-x} = Si_xGa_{2(1-x)}O_{3-x}$ wherein for dilute Si compositions x<0.1.

In accordance with the present disclosure, it was found that for Si x<0.1, a dilute ratio of Si provides sufficient electronic modification to the intrinsic M-O for manipulating the Fermi-energy ($E_F$), thereby increasing the available electron free carrier concentration and altering the crystal lattice structure to impart advantageous strain during epitaxial growth. For dilute compositions the host M-O physical unit cell is substantially unperturbed. Further increase in Si concentration results in modification of the host $Ga_2O_3$ crystal structure through lattice dilation or even resulting in a new material composition.

For example, for Si x≤⅓ a monoclinic crystal structure of the host $Ga_2O_3$ unit cell can be maintained. For example, for the case of Si % x=0.25, forming monoclinic $Si_{0.25}Ga_{1.50}O_{2.75} = Si_1Ga_6O_{11}$ is possible. The lattice deformation by introducing Si increases the monoclinic unit cell preferentially along the b-axis and c-axis while retaining the a-axis lattice constant in comparison to strain-free monoclinic $Ga_2O_3$. The lattice constants for monoclinic $Si_1Ga_6O_{11}$ are (a=6.40 A, b=6.40 A, c=9.40 A) compared to monoclinic $Ga_2O_3$ (a=3.08 A, b=5.88 A, c=6.41 A).

Therefore, introducing Si creates biaxial expansion of the free-standing unit cell along all the a-, b- and c-axes. Therefore, if $Si_xGa_{2(1-x)}O_3$, is epitaxially deposited upon a bulk-like monoclinic $Ga_2O_3$ surface oriented along the b- and c-axis (that is, deposited along the a-axis), then a thin film of $Si_xGa_{2(1-x)}O_3$, can be elastically deformed to induce asymmetric biaxial compression, and therefore warp the valence band E-k dispersion advantageously, as discussed herein.

Beyond x>⅓ the higher Si % transforms the crystal structure to cubic, for example, $SiGa_2O_5$.

In some embodiments, incorporation of Si into $Al_2O_3$ and $(Al_xGa_{1-x})_2O_3$ are also possible. For example, orthorhombic $(Si^{+4}O_2)_x(Al_2O_3)_{1-x} = Si_xAl_{2(1-x)}O_3$, is possible by direct co-deposition of elemental Si and Al with an active Oxygen flux onto a deposition surface. If the deposition surface is selected from the available trigonal alpha-$Al_2O_3$ surfaces (e.g., A-, R-, M-plane) then it is possible to form orthorhombic crystal symmetry $Al_2SiO_5$ (i.e., x=0.5) which reports a large direct bandgap at the Brillouin-zone center. The lattice constants for orthorhombic are (a=5.61 A, b=7.88 A, c=7.80 A) and trigonal (R3c) $Al_2O_3$ (a=4.75 A, b=4.75 A, c=12.982 A).

Deposition of oriented $Al_2SiO_5$ films on $Al_2O_3$ can therefore result in large biaxial compression for elastically strained films. Exceeding the elastic energy limit creates deleterious crystalline misfit dislocations and is generally to be avoided. To achieve elastically deformed film on $Al_2O_3$, in particular, films of thickness less than about 10 nm are preferred.

Magnesium (Mg)

Some embodiments include the incorporation of Mg elemental species with $Ga_2O_3$ and $Al_2O_3$ host crystals, where Mg is selected as a preferred group-II metal specie. Furthermore, incorporation of Mg into $(Al_xGa_{1-x})_2O_3$ up to and including the formation of a quaternary $Mg_x(Al,Ga)_yO_z$ may also be utilized. Particular useful compositions of $Mg_xGa_{2(1-x)}O_{3-2x}$, wherein x<0.1, enable the electronic structure of the $Ga_2O_3$ and $Al_xGa_{1-x})_2O_3$ host to be made p-type conductivity type by substituting $Ga^{3+}$ cation sites by $Mg^{2+}$ cations. For $Al_yGa_{1-y})_2O_3$ y=0.3 the bandgap is about 6.0 eV, and Mg can be incorporated up to about y~0.05 to 0.1 enabling the conductivity type of the host to be varied from intrinsic weak excess electron n-type to excess hole p-type.

Ternary compounds of the type $Mg_xGa_{2(1-x)}O_{3-2x}$ and $Mg_xAl_{2(1-x)}O_{3-2x}$ and $(Ni_xMg_{1-x})O$ are also example embodiments of active region materials for optically emissive UVLEDs.

In some embodiments, both stoichiometric compositions of $Mg_xGa_{2(1-x)}O_{3-2x}$ and $Mg_xAl_{2(1-x)}O_{3-2x}$ wherein x=0.5 producing cubic crystal symmetry structure exhibit advantageous direct bandgap E-k dispersion are suitable for optically emissive region.

Furthermore, in accordance with the present disclosure it was found that the $Mg_xGa_{2(1-x)}O_{3-2x}$ and $Mg_xAl_{2(1-x)}O_{3-2x}$ compositions are epitaxially compatible with cubic MgO and monoclinic, corundum and hexagonal crystal symmetry forms of $Ga_2O_3$.

Using non-equilibrium growth techniques enables a large miscibility range of Mg within both $Ga_2O_3$ and $Al_2O_3$ hosts spanning MgO to the respective M-O binary. This is in contradistinction with equilibrium growth techniques such as CZ wherein phase separation occurs due to the volatile Mg specie.

For example, the lattice constants of cubic and monoclinic forms of $Mg_xGa_{2(1-x)}O_{3-2x}$ for x~0.5 are (a=b=c=8.46 A) and (a=10.25 A, b=5.98, c=14.50 A), respectively. In accordance with the present disclosure, it was found that the cubic $Mg_xGa_{2(1-x)}O_{3-2x}$ form can orient as a thin film having (100)- and (111)-oriented films on monoclinic $Ga_2O_3(100)$ and $Ga_2O_3$ (001) substrates. Also, $Mg_xGa_{2(1-x)}O_{3-2x}$ thin epitaxial films can be deposited upon MgO substrates. Furthermore, $Mg_xGa_{2(1-x)}O_{3-2x}$ 0≤x≤1 films can be deposited directly onto $MgAl_2O_4(100)$ spinel crystal symmetry substrates.

In further embodiments, both $Mg_xAl_{2(1-x)}O_{3-2x}$ and $Mg_xGa_{2(1-x)}O_{3-2x}$ high quality (i.e., low defect density) epitaxial films can be deposited directly onto Lithium Fluoride (LiF) substrates.

Zinc (Zn)

Some embodiments include incorporation of Zn elemental species into $Ga_2O_3$ and $Al_2O_3$ host crystals, where Zn is another preferred group-II metal specie. Furthermore, incorporation of Zn into $(Al_xGa_{1-x})_2O_3$ up to and including the formation of a quaternary $Zn_x(Al,Ga)_yO_z$ may also be utilized.

Yet further quaternary compositions advantageous for tuning the direct bandgap structure are the compounds of the most general form:

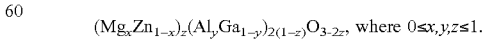

$(Mg_xZn_{1-x})_z(Al_yGa_{1-y})_{2(1-z)}O_{3-2z}$, where 0≤x,y,z≤1.

In accordance with the present disclosure, it was found that the cubic crystal symmetry composition forms of z~0.5 can be used advantageously for a given fixed y composition between Al and Ga. By varying the Mg to Zn ratio x, the direct bandgap can be tuned from about 4 eV≤$E_G$(x)<7 eV. This can be achieved by disposing advantageously separately controllable fluxes of pure elemental beams of Al, Ga, Mg and Zn and providing an activated Oxygen flux for the anions species. In general, an excess of atomic oxygen is desired with respect to the total impinging metal flux. Control of the Al:Ga flux ratio and Mg:Zn ratio arriving at the growth surface can then be used to preselect the composition desired for bandgap tuning the UVLED regions.

Surprisingly, while Zinc-Oxide (ZnO) is generally a wurtzite hexagonal crystal symmetry structure, when introduced into $(Mg_xZn_{1-x})_z(Al_yGa_{1-y})_{2(1-z)}O_{3-2z}$, cubic and spinel crystal symmetry forms are readily possible using non-equilibrium growth methods described herein. The bandgap character at the Brillouin-zone center can be tuned by alloy composition (x, y, z) ranging from indirect to direct character. This is advantageous for application to substantially non-absorbing electrical injection regions and optical emissive regions, respectively. Furthermore, bandgap modulation is possible for bandgap engineered structures, such as superlattices and quantum wells described herein.

Nickel (Ni)

The incorporation of Ni elemental species into $Ga_2O_3$ and $Al_2O_3$ host crystals is yet another preferred group-II metal specie. Furthermore, incorporation of Ni into $(Al_xGa_{1-x})_2O_3$ up to and including the formation of a quaternary $Ni_x(Al, Ga)_yO_z$ may be utilized.

Yet further quaternary compositions advantageous for tuning the direct bandgap structure are the compounds of the most general form:

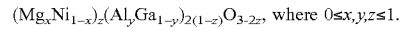
$(Mg_xNi_{1-x})_z(Al_yGa_{1-y})_{2(1-z)}O_{3-2z}$, where $0 \le x, y, z \le 1$.

In accordance with the present disclosure, it was discovered that the cubic crystal symmetry composition forms of z~0.5 can be used advantageously for a given fixed y composition between Al and Ga. By varying the Mg to Ni ratio x, the direct bandgap can be tuned from about 4.9 eV$\le E_G(x) < 7$ eV. This can be achieved by disposing advantageously separately controllable fluxes of pure elemental beams of Al, Ga<Mg and Ni and providing an activated oxygen flux for the anion species. Control of the Al:Ga flux ratio and Mg:Ni ratio arriving at the growth surface can then be used to preselect the composition desired for bandgap tuning the UVLED regions.

Of enormous utility herein is the specific band structure and intrinsic conductivity type of cubic NiO. Nickel-Oxide (NiO) exhibits a native p-type conductivity type due to the Ni d-orbital electrons. The general cubic crystal symmetry form $(Mg_xNi_{1-x})_z(Al_yGa_{1-y})_{2(1-z)}O_{3-2z}$ are possible using non-equilibrium growth methods described herein.

Both $Ni_zGa_{2(1-z)}O_{3-2z}$ and $Ni_zAl_{2(1-z)}O_{3-2z}$ are advantageous for application to UVLED formation. Dilute composition of z<0.1 was found in accordance with the present disclosure to be advantageous for p-type conductivity creation, and for z~0.5 the ternary cubic crystal symmetry compounds also exhibit direct bandgap at the Brillouin-zone center.

Lanthanides

There exists a large selection of the Lanthanide-metal atomic species available which can be incorporated into the binary $Ga_2O_3$, ternary $(Al_xGa_{1-x})_2O_3$ and binary $Al_2O_3$. The Lanthanide group metals range from the 15 elements starting with Lanthanum (Z=57) to Lutetium (Z=71). In some embodiments, Gadolinium Gd(Z=64) and Erbium Er(Z=68) are utilized for their distinct 4f-shell configuration and ability to form advantageous ternary compounds with $Ga_2O_3$, $GaAlO_3$ and $Al_2O_3$. Again, dilute impurity incorporation of exclusively one specie selected from RE={Gd or Er} incorporated into cation sites of $(RE_xGa_{1-x})_2O_3$, $(RE_x$-$Ga_yAl_{1-x-y})_2O_3$ and $(RE_xAl_{1-x})_2O_3$ where $0 \le x, y, z \le 1$ enable tuning of the Fermi energy to form n-type conductivity type material exhibiting corundum, hexagonal and monoclinic crystal symmetry. The inner 4f-shell orbitals of Gd provide opportunity for the electronic bonding to circumvent parasitic optical 4f-to-4f energy level absorption for wavelengths below 250 nm.

Surprisingly, it was found both theoretically and experimentally in accordance with the present disclosure that ternary compounds of $(Er_xGa_{1-x})_2O_3$, and $(Er_xAl_{1-x})_2O_3$ for the case of x~0.5 exhibit cubic crystal symmetry structures with direct bandgaps. It is known to have a bixbyite crystal symmetry for binary Erbium-Oxide $Er_2O_3$ which can be formed epitaxially as single crystal films on Si(111) substrates. However, the lattice constant available by bixbyite $Er_2O_3$ is not readily applicable for seeding epitaxial films of $Ga_2O_3$, $GaAlO_3$ and $Al_2O_3$. In accordance with the present disclosure, it was discovered that graded composition incorporation along a growth direction of Er increasing from 0 to 0.5 is necessary for creating the necessary final surface commensurate for epitaxy of monoclinic $Ga_2O_3$. Cubic crystal symmetry forms of $(Er_xGa_{1-x})_2O_3$, $0 \le x \le 0.5$ may be utilized, such as compositions exhibiting direct bandgap.

Of particular interest is the orthorhombic ternary composition of $(Er_xAl_{1-x})_2O_3$ with x~0.5 having lattice constants (a=5.18 A, b=5.38 A, c=7.41) and exhibiting a well-defined direct energy bandgap of $E_G(k=0)$ of approximately 6.5 to 7 eV. Such a structure can be deposited on monoclinic $Ga_2O_3$ and corundum $Al_2O_3$ substrates or epilayers. As mentioned, the inner $Er^{3+}$ 4f-4f transitions are not presented in the E-k band structure and are therefore classed as non-parasitic absorption for the application of UVLEDs.

Bismuth (Bi)

Bismuth is a known specie which acts as a surfactant for GaN non-equilibrium epitaxy of thin Gallium-Nitride GaN films. Surfactants lower the surface energy for an epitaxial film formation but in general are not incorporated within the growing film. Incorporation of Bi even in Gallium Arsenide is low. Bismuth is a volatile specie having high vapor pressure at low growth temperatures and would appear to be a poor adatom for incorporation into a growing epitaxial film. Surprisingly however, the incorporation of Bi into $Ga_2O_3$, $(Ga, Al)O_3$ and $Al_2O_3$ at dilute levels x<0.1 is extremely efficient using the non-equilibrium growth methods described in the present disclosure. For example, elemental sources of Bi, Ga and Al can be co-deposited with an overpressure ratio of activated Oxygen (namely, atomic Oxygen, Ozone and Nitrous Oxide). It was found in accordance with the present disclosure that Bi incorporation in the monoclinic and corundum crystal symmetry $Ga_2O_3$ and $(Ga_xAl_{1-x})_2O_3$ for x<0.5 exhibits a conductivity type character that creates an activated hole carrier concentration suitable as a p-type conductivity region for UVLED function.

Yet higher Bi atomic incorporation x>0.1 enables band structure tuning of $(Bi_xGa_{1-x})_2O_3$ and $(Bi_xAl_{1-x})_2O_3$ ternary compositions and indeed all the way to stoichiometric binary Bismuth Oxide $Bi_2O_3$. Monoclinic $Bi_2O_3$ forms lattice constants of (a=12.55 A, b=5.28 and c=5.67 A) which is commensurate with strained layer film growth directly on monoclinic $Ga_2O_3$.

Furthermore, orthorhombic and trigonal forms may be utilized in some embodiments, exhibiting native p-type conductivity character and indirect bandgap.

Particular interest is toward the orthorhombic crystal symmetry composition of $(Bi_xAl_{1-x})_2O_3$ where for the case of $x=\frac{1}{3}$ exhibits an E-k dispersion that is direct and having $E_G$=4.78-4.8 eV.

Palladium (Pd)

The addition of Pd to $Ga_2O_3$, (Ga, Al)$O_3$ and $Al_2O_3$ may be utilized in some embodiments to create metallic behavior and is applicable for the formation of ohmic contacts. In some embodiments, Palladium Oxide PdO can be used as an in-situ deposited semi-metallic ohmic contact for n-type wide bandgap metal oxide owing to the intrinsically low work function of the compound (refer to FIG. 9).

Iridium (Ir)

Iridium is a preferred Platinum-group metal for incorporation into $Ga_2O_3$, (Ga, Al)$O_3$ and $Al_2O_3$ It was found in accordance with the present disclosure that Ir may bond in a large variety of valence states. In general, the rutile crystal symmetry form of $IrO_2$ composition is known and exhibits a semi-metallic character. Surprisingly, the triply charged $Ir^{3+}$ valence state is possible using non-equilibrium growth methods and is a preferred state for application to incorporation with $Ga_2O_3$ and in particular corundum crystal symmetry. Iridium has one of the highest melting points and lowest vapor pressures when heated. The present disclosure utilizes electron-beam evaporation to form an elemental pure beam of Ir specie impinging upon a growth surface. If activated oxygen is supplied in coincidence and a corundum $Ga_2O_3$ surface presented for epitaxy, corundum crystal symmetry form of $Ir_2O_3$ composition can be realized. Furthermore, by co-depositing with pure elemental beams of Ir and Ga with activated oxygen, compounds of $(Ir_xGa_{1-x})_2O_3$ for $0 \le x \le 1.0$ can be formed. Furthermore, by co-depositing with pure elemental beams of Ir and Al with activated oxygen, ternary compounds of $(Ir_xAl_{1-x})_2O_3$ for $0 \le x \le 1.0$ can be formed. The addition of Ir to a host metal oxide comprising at least one of $Ga_2O_3$, (Ga, Al)$O_3$ and $Al_2O_3$ can reduce the effective bandgap. Furthermore, for Ir fractions of $x > 0.25$ the bandgap is exclusively indirect in nature.

Lithium (Li)

Lithium is a unique atomic specie especially when incorporated with oxygen. Pure Lithium metal readily oxidizes, and Lithium Oxide ($Li_2O$) is readily formed using non-equilibrium growth methods of pure elemental Li beam and activated oxygen directed toward a growth surface of definite surface crystal symmetry. Cubic crystal symmetry $Li_2O$ exhibits a large indirect bandgap $E_g$~6.9 eV with lattice constants (a=b=c=4.54 A). Lithium is a mobile atom if present in a defective crystal structure, and it is this property which is exploited in Li-ion battery technology. The present disclosure, in contradistinction, seeks to rigidly incorporate Li-atoms within a host crystal matrix comprising at least one of $Ga_2O_3$, (Ga, Al)$O_3$ and $Al_2O_3$. Again, dilute Li concentrations can be incorporated onto substitutional metal sites of $Ga_2O_3$, (Ga, Al)$O_3$ and $Al_2O_3$. For example, for a valence state of Li$^{+}$ these compositions may be utilized:

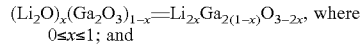

$(Li_2O)_x(Ga_2O_3)_{1-x}=Li_{2x}Ga_{2(1-x)}O_{3-2x}$, where $0 \le x \le 1$; and

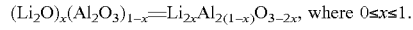

$(Li_2O)_x(Al_2O_3)_{1-x}=Li_{2x}Al_{2(1-x)}O_{3-2x}$, where $0 \le x \le 1$.

Stoichiometric forms of $Li_{2x}Ga_{2(1-x)}O_{3-2x}$ for x=0.5 provide for $LiGaO_2$, and $Li_{2x}Al_{2(1-x)}O_{3-2x}$ for x=0.5 provide for $LiAlO_2$.

Both $LiGaO_2$ and $LiAlO_2$ crystalize in preferred orthorhombic and trigonal forms having direct and indirect bandgap energies, respectively, with $E_G(LiGaO_2)$=5.2 eV and $E_G(LiALO_2)$ 8 eV.

Of particular interest is the relatively small valence band curvature in both suggesting a smaller hole effective mass compared to $Ga_2O_3$.

The lattice constants of $LiGaO_2$ (a=5.09 A, b=5.47, c=6.46 A) and $LiAlO_2$ are (a=b=2.83 A, c=14.39 A). As bulk Li(Al, Ga)$O_2$ substrates may be utilized, orthorhombic and trigonal quaternary compositions such as $Li(Al_xGa_{1-x})O_2$ may also be utilized thereby enabling UVLED operation for the optical emissive region.

Li impurity incorporation within even cubic NiO can enable improved p-type conduction and can serve as a possible electrical injector region for holes applied to the UVLED.

Yet a further composition in some embodiments is ternary comprising Lithium-Nickel-Oxide $Li_xNi_yO_z$. Theoretical calculations provide insight toward the possible higher valence states of $Ni^{2+}$ and $Li^{2+}$. An electronic composition comprising $Li_2^{(+4)}Ni^{+2}O_3^{(-6)} = Li_2NiO_3$ may be utilized to create via non-equilibrium growth techniques forming a monoclinic crystal symmetry. It was found in accordance with the present disclosure that $Li_2NiO_3$ forms an indirect bandgap of $E_G$~5 eV. Yet another composition is the trigonal crystal symmetry (R3m) where $Li^{+1}$ and $Ni^{+1}$ valence states form the composition $Li_2NiO_2$ having a direct bandgap between s-like and p-like states of $E_G$=8 eV, however the strong d-like states from Ni create crystal momentum independent mid bandgap energy states continuous across all the Brillouin zones.

Nitrogen and Fluorine Anion Substitution

Furthermore, it has been found in accordance with the present disclosure that selected anion crystal modifiers to the disclosed metal oxide compositions may be selected from at least one of a nitrogen (N) and fluorine (F) specie. Similar to p-type activated hole concentration creation in binary $Ga_2O_3$ and ternary $(Ga_xAl_{1-x})_2O_3$ by substitutional incorporation of a group-III metal cation site by a group-II metal specie, it is further possible to substitute an oxygen anion site during epitaxial growth by an activated Nitrogen atom (e.g., neutral atomic nitrogen species in some embodiments). In accordance with the present disclosure, dilute nitrogen incorporation within a $Ga_2O_3$ host was surprisingly been found to stabilize monoclinic $Ga_2O_3$ compositions during epitaxy. Prolonged exposure of $Ga_2O_3$ during growth to a combination of elemental Ga and neutral atomic fluxes of simultaneous oxygen and nitrogen was found to form competing GaN-like precipitates.

It was also found in accordance with the present disclosure that periodically modulating the $Ga_2O_3$ growth by interrupting the Ga and O fluxes periodically and preferentially exposing the terminated surface exclusively with activated atomic neutral nitrogen enables a portion of the surface to incorporate N on otherwise available O-sites within the $Ga_2O_3$ growth. Spacing these N-layer growth interruptions by a distance greater than 5 or more unit cells of $Ga_2O_3$ along the growth direction enables high density impurity incorporation aiding the achievement of p-type conductivity character in $Ga_2O_3$.

This process may be utilized for both corundum and trigonal forms of $Ga_2O_3$.

In some embodiments, a combination approach of group-II metal cation substation and Nitrogen anion substation may be utilized for controlling the p-type conductivity concentration in $Ga_2O_3$.

Fluorine impurity incorporation into $Ga_2O_3$ is also possible, however elemental fluorine sources are challenging. The present disclosure uniquely utilizes the sublimation of Lithium-Fluoride LiF bulk crystal within a Knudsen cell to provide a compositional constituent of both Li and F which is co-deposited during elemental Ga and Al beams under an activated oxygen environment supplying the growth surface. Such a technique enables the incorporation of Li and F atoms within an epitaxially formed $Ga_2O_3$ or $LiGaO_2$ host.

Examples of crystal symmetry structures formed using example compositions are now described and referred to in FIGS. 44A-44Z. The compositions shown are not intended to be limiting as discussed in the previous section using the crystal modifiers.

An example of crystal symmetry groups 5000 that are possible for the ternary composition of $(Al_xGa_{1-x})_2O_3$ is shown in FIG. 44A. The calculated equilibrium crystal formation probability 5005 is a measure of the probability the structure will form for a given crystal symmetry type. The space group nomenclature 5010 used in FIG. 44A is understood by those skilled in the art.

The non-equilibrium growth methods described herein can potentially select crystal symmetry types that are otherwise not accessible using equilibrium growth methods (such as CZ). The general crystal classes of cubic 5015, tetragonal, trigonal (rhombohedral/hexagonal) 5020, monoclinic 5025, and triclinic 5030 are shown in the inset of FIG. 44A.

For example, it was found in accordance with the present disclosure that monoclinic, trigonal and orthorhombic crystal symmetry types can be made energetically favorable by providing the kinematic growth conditions favoring exclusively a particular space group to be epitaxially formed. For example, as set out in TABLE I shown in FIG. 43A, the surface energy of a substrate can be selected by judicious preselection of the surface orientation presented for epitaxy.

FIG. 44B shows an example high-resolution x-ray Bragg diffraction (HRXRD) curves of a high quality, coherently strained, elastically deformed unit cell (i.e., the epilayer is termed pseudomorphic with respect to the underlying substrate) strained ternary $(Al_xGa_{1-x})_2O_3$ epilayer 5080 formed on a monoclinic $Ga_2O_3$(010)-oriented surface 5045. The graph shows intensity 5035 as a function of $\Omega-2\theta$ 5040. Two compositions $(Al_xGa_{1-x})_2O_3$ x=0.15 (5050) and x=0.25 (5065) are shown. The substrate is initially prepared by high temperature (>800° C.) desorption in an ultrahigh vacuum chamber (less than $5\times10^{-10}$ Torr) of surface impurities.

The surface is monitored in real-time by reflection high energy electron diffraction (RHEED) to assess atomic surface quality. Once a bright and streaky RHEED pattern indicative of an atomically flat surface of predetermined surface reconstruction of the discontinuous surface atom dangling bond is apparent, the activated Oxygen source comprising an radiofrequency inductively coupled plasma (RF-ICP) is ignited to produce a stream of substantially neutral atomic-Oxygen (O*) species and excited molecular neutral oxygen ($O_2$*) directed toward the heated surface of the substrate.

The RHEED is monitored to show an oxygen-terminated surface. The source of elemental and pure Ga and Al atoms are provided by effusion cells comprising inert ceramic crucibles radiatively heated by a filament and controlled by feedback sensing of a thermocouple advantageously positioned relative to the crucible to monitor the metal melt temperature within the crucible. High purity elemental metals are used, such as 6N to 7N or higher purity.

Each source beam flux is measured by a dedicated nude ion gauge that can be spatially positioned in the vicinity of the center of the substrate to sample the beam flux at the substrate surface. The beam flux is measured for each elemental specie so the relative flux ratio can be predetermined. During beam flux measurements a mechanical shutter is positioned between the substrate and the beam flux measurement. Mechanical shutters also intersect the atomic beams emanating from each crucible containing each elemental specie selected to comprise epitaxial film.

During deposition the substrate is rotated so as to accumulate a uniform amount of atomic beam intersecting the substrate surface for a given amount of deposition time. The substrate is heated radiatively from behind by an electrically heated filament, in preference for oxide growth is the advantageous use of a Silicon-Carbide (SiC) heater. A SiC heater has the unique advantage over refractory metal filament heaters in that a broad near-to-mid infrared emissivity is possible.

Not well known to workers in the field of epitaxial film growth, is that most metal oxides have the attribute of relatively large optical absorption for near to far infrared wavelengths. The deposition chamber is preferentially actively and continuously pumped to achieve and maintain vacuum in vicinity of 1e-6 to 1e-5 Torr during growth of epitaxial films. Operating in this vacuum range, the evaporating metals particles from the surface of each effusion crucible acquire a velocity that is essentially non-interacting and ballistic.

Advantageously positioning the effusion cell beam formed by the Clausing factor of the crucible aperture and UHV large mean free path, the collisionless ballistic transport of the effusion specie toward the substrate surface is ensured. The atomic beam flux from effusion type heated sources is determined by the Arrhenius behavior of the particular elemental specie placed in the crucible. In some embodiments, Al and Ga fluxes in the range of $1\times10^{-6}$ Torr are measured at the substrate surface. The oxygen plasma is controlled by the RF power coupled to the plasma and the flow rate of the feedstock gas.

RF plasma discharges typically operate from 10 milliTorr to 1 Torr. These RF plasma pressures are not compatible with atomic layer deposition process reported herein. To achieve activated oxygen beam fluxes in the range of $1\times10^{-7}$ Torr to $1\times10^{-5}$ Torr, a sealed fused quartz bulb with laser drilled apertures of the order of 100 microns in diameter are disposed across a circular end-face of the sealed cylindrical bulb. The said bulb is coupled to a helical wound copper tube and water-cooled RF antenna driven by an impedance matching network and a high power 100 W-1 kW RF oscillator operating at, for example, 2 MHz to 13.6 MHz or even 20 MHz.

The plasma is monitored using optical emission from the plasma discharge which provides accurate telemetry of actual species generated within the bulb. The size and number of the apertures on the bulb end face are the interface of the plasma to the UHV chamber and can be predetermined to achieve compatible beam fluxes so as to maintain ballistic transport conditions for long mean free path in excess of the source to substrate distance. Other in-situ diagnostics enabling accurate control and repeatability of film composition and uniformity include the use of ultraviolet polarized optical reflectometry and ellipsometry as well as a residual gas analyzer to monitor the desorption of species from the substrate surface.

Other forms of activated oxygen include the use of oxidizers such as Ozone (03) and nitrous oxide ($N_2O$). While all forms work relatively well, namely RF-plasma, $O_3$ and $N_2O$, RF plasma may be used in certain embodiments owing to the simplicity of point of use activation. RF-plasma, however, does potentially create very energetic charged ion species which can affect the material background conductivity type. This is mitigated by removing the apertures directly in the vicinity of the center of the plasma end plate coupled to the UHV chamber. The RF induced oscillating magnetic field at the center of the solenoid of the cylindrical discharge tube will be maximal along the center axis. Therefore, removing the apertures providing line of sight from the plasma interior toward the growth surface removes the charged ions specie ballistically delivered to the epilayer.

Having briefly described the growth method, refer again to FIG. 44B. The monoclinic $Ga_2O_3$(010)-oriented substrate 5045 is cleaned in-situ via high temperature in UHV conditions, such as at 800° C. for 30 mins. The cleaned surface is then terminated with activated oxygen adatoms forming a surface reconstruction comprising oxygen atoms.

An optional homoepitaxial $Ga_2O_3$ buffer layer 5075 is deposited and monitored for crystallographic surface improvement by in-situ RHEED. In general, $Ga_2O_3$ growth conditions using elemental Ga and activated oxygen requires a flux ratio of $\phi(Ga): \phi(O^*)<1$, that is atomic oxygen rich conditions.

For flux ratios of $\Phi(Ga):\Phi(O^*)>1$ an excess Ga atoms on the growth surface is capable of attaching to surface bonded oxygen that can potentially form a volatile $Ga_2O_{(g)}$ suboxide species—which then desorbs from the surface and can remove material from the surface and even etch the surface of $Ga_2O_3$. It was found in accordance with the present disclosure that for high Al content $AlGaO_3$ this etching process is reduced if not eliminated for Al %>50%. The etching process can be used to clean a virgin $Ga_2O_3$ substrate for example to aid in the removal of chemical mechanical polish (CMP) damage.

To initiate growth of $AlGaO_3$ the activated oxygen source is optionally initially exposed to the surface followed by opening both shutters for each of the Ga and Al effusion cells. It was found experimentally in accordance with the present disclosure that the sticking coefficient for Al is near unity whereas the sticking coefficient on the growth surface is kinetically dependent on the Arrhenius behavior of the desorbing Ga adatoms which depend on the growth temperature.

The relative x=Al % of the epitaxial $(Al_xGa_{1-x})_2O_3$ film is related to $x=\Phi(Al)/[\Phi(Ga)+\Phi(Al)]$. Clear high quality RHEED surface reconstruction streaks are evident during deposition of $(Al_xGa_{1-x})_2O_3$. The thickness can be monitored by in-situ ultraviolet laser reflectometry and the pseudomorphic strain state monitored by RHEED. As the free-standing in-plane lattice constant of monoclinic crystal symmetry $(Al_xGa_{1-x})_2O_3$ is smaller than the underlying $Ga_2O_3$ lattice, the $(Al_xGa_{1-x})_2O_3$ is grown under tensile strain during elastic deformation.

The thickness 5085 of epilayer 5080 at which the elastic energy can be matched or reduced by inclusion of misfit dislocation within the growth plane is called the critical layer thickness (CLT), beyond this point the film can begin to grow as a partially or fully relaxed bulk-like film. The curves 5050 and 5065 are for the case of coherently strained $(Al_xGa_{1-x})_2O_3$ films with thickness below the CLT. For the case of x=0.15 the CLT is >400 nm and for x=0.25 CLT 100 nm. The thickness oscillations 5070 are also known as Pendellosung interference fringes and are indicative of highly coherent and atomically flat epitaxial film.

In experiments performed in relation to the present disclosure, growth of pure monoclinic $Al_2O_3$ epitaxial films directly on monoclinic $Ga_2O_3$(010) surface achieved CLT<1 nm. It was further found experimentally that Al %>50% achieved low growth rate owing to the unique monoclinic bonding configuration of cations partitioned approximately as 50% tetrahedral bonding sites and 50% octahedral bonding sites. It was found that Al adatoms prefer to incorporate at octahedral bonding sites during crystal growth and have bonding affinity for tetrahedral sites.

Superlattices (SLs) are created and directly applicable to UVLED operation utilizing the quantum size effect tuning mechanism for quantization of allowed energy levels within a narrower bandgap material sandwiched between two potential energy barriers. Furthermore, SLs are example vehicles for creating pseudo ternary alloys as discussed herein, further enabling strain management of the layers.

For example, monoclinic $(Al_xGa_{1-x})_2O_3$ ternary alloy experiences an asymmetric in-plane biaxial tensile strain when epitaxial deposited upon monoclinic $Ga_2O_3$. This tensile strain can be managed by ensuring the thickness of ternary is kept below the CLT within each layer comprising the SL. Furthermore, the strain can be balanced by tuning the thickness of both $Ga_2O_3$ and ternary layer to manage the built-in strain energy of the bilayer pair.

Yet a further embodiment of the present disclosure is the creation of a ternary alloy as bulk-like or SL grown sufficiently thick so as to exceed the CLT and form an essentially free-standing material that is strain-free. This virtually strain-free relaxed ternary layer possesses an effective in-plane lattice constant $a_{SL}$ which is parameterized by the effective Al % composition. If then a first relaxed ternary layer is formed, followed by yet another second SL deposited directly upon the relaxed layer then the bilayer pair forming the second SL can be tuned such that the layers comprising the bilayer are in equal and opposite strain states of tensile and compressive strain with respect to the first in-plane lattice constant.

FIG. 44C show an example SL 5115 formed directly on a $Ga_2O_3$ (010)-oriented substrate 5100.

The bilayer pairs comprising the SL 5115 are both monoclinic crystal symmetry $Ga_2O_3$ and ternary $(Al_xGa_{1-x})_2O_3$ (x=0.15) with SL period $\Delta_{SL}$=18 nm. The HRXRD 5090 shows the symmetric Bragg diffraction, and the GIXR 5105 shows the grazing incidence reflectivity of the SL. Ten periods are shown with extremely high crystal quality indicative of the $(Al_xGa_{1-x})_2O_3$ having thickness <CLT.

The plurality of narrow SL diffraction peaks 5095 and 5110 is indicative of coherently strained films registered with in-plane lattice constant matching the monoclinic $Ga_2O_3$ (010)-oriented bulk substrate 5100. The monoclinic crystal structure (refer to FIG. 37) having growth surface exposed of (010) exhibits a complex array of Ga and O atoms. In some embodiments, the starting substrate surface is prepared by O-terminations as described previously. The average Al % alloy content of the SL represents a pseudo-bulk-like ternary alloy which can be thought of as an order atomic plane ternary alloy.

The SL comprising bilayers of $[(Al_{xB}Ga_{1-xB})_2O_3/Ga_2O_3]$ has an equivalent Al % defined as:

$$x_{Al}^{SL} = \frac{L_B \cdot x_B}{\Delta_{SL}},$$

where $L_B$ is the thickness of the wider bandgap $(Al_{xB}Ga_{1-xB})_2O_3$ layer. This can be directly determined by reference to the angular separation and position of the zeroth-order diffraction peak $SL^{n=0}$ of the SL with respect to the substrate peak 5102. Reciprocal lattice maps show that the in-plane lattice constant is pseudomorphic with the underlying substrate and provides excellent application for the UVLED.

The tensile strain as shown in FIGS. 23A-23C can be used advantageously towards the formation of the optical emission region.

FIG. 44D shows yet further flexibility toward depositing ternary monoclinic 5130 alloy $(Al_xGa_{1-x})_2O_3$ directly upon yet another crystal orientation of monoclinic $Ga_2O_3(001)$ substrate 5120.

Again, the best results are obtained by careful attention to high quality CMP surface preparation of the cleaved substrate surface. The growth recipe in some embodiments utilizes in-situ activated oxygen polish at high temperatures (e.g., 700-800° C.) using a radiatively heated substrate via a high power and oxygen resistant radiatively coupled heater. The SiC heater possesses the unique property of having high near-to-far infrared emissivity. The SiC heater emissivity closely matches the intrinsic $Ga_2O_3$ absorption features and thus couples well to the radiative blackbody emission spectrum presented by the SiC heater. Region 5125 represents the O-termination process and the homoepitaxial growth of a high quality $Ga_2O_3$ buffer layer. The SL is then deposited showing two separate growths with different ternary alloy compositions.

Shown in FIG. 44D are coherently strained epilayers of $(Al_xGa_{1-x})_2O_3$ having thickness <CLT and achieving x~15% (5135) and x~30% (5140), relative to the (002) substrate peak 5122. Again, the high quality films are indicated by the presence of thickness interference fringes.

Discovering further that SL structures are also possible on the (001) oriented monoclinic $Ga_2O_3$ substrate 5155, the results are shown in FIG. 44E.

Clearly, HRXRD 5145 and GIXR 5158 demonstrate a high quality coherently deposited SL. Peak 5156 is the substrate peak. The SL diffraction peaks 5150 and 5160 enable direct measurement of the SL period, and the SL[⁰] peak enables the effective Al % of SL to be determined. For this case a ten period SL[$(Al_{0.18}Ga_{0.92})_2O_3/Ga_2O_3$] having period $\Delta_{SL}$=8.6 nm is shown.

Demonstrating an example application of the versatility of the metal oxide film deposition method disclosed herein, refer to FIG. 44F. Two dissimilar crystal symmetry type structures are epitaxially formed along a growth direction as defined by FIG. 18. A substrate 5170 (peak 5172) comprising monoclinic $Ga_2O_3(001)$-oriented surface is presented for homoepitaxy of a monoclinic $Ga_2O_3$ 5175. Next a cubic crystal symmetry NiO epilayer 5180 is deposited. The HRXRD 5165 and GIXR 5190 show the topmost NiO film peak 5185 of thickness 50 nm has excellent atomic flatness and thickness fringes 5195.

In one example, mixing-and-matching crystal symmetry types can be favorable to a given material composition that is advantageous for a given function comprising the UVLED (refer FIG. 1) thereby increasing the flexibility for optimizing the UVLED design. $Ni_xO$ (0.5<x≤1 representing metal vacancy structures are possible), $Li_xNi_yO_n$, $Mg_xNi_{1-x}O$ and $Li_xMg_yNi_zO_n$ are compositions that may be utilized favorably for integration with $AlGaO_3$ materials comprising the UVLED.

As NiO and MgO share very close cubic crystal symmetry and lattice constants, they are advantageous for bandgap tuning application from about 3.8 to 7.8 eV. The d-states of Ni influence the optical and conductivity type of the MgNiO alloy and can be tailored for application to UVLED type devices. A similar behavior is found for the selective incorporation of Ir into corundum crystal symmetry ternary alloy $(Ir_xGa_{1-x})_2O_3$ which exhibits advantageous energy position within the E-k dispersion due to the Iridium d-state orbitals for creation of p-type conductivity.

Yet a further example of the metal oxide structures is shown in FIG. 44G. A cubic crystal symmetry MgO (100)-oriented surface of a substrate 5205 (corresponding to peak 5206) is presented for direct epitaxy of $Ga_2O_3$. It was found in accordance with the present disclosure that the surface of MgO can be selectively modified to create a cubic crystal symmetry form of $Ga_2O_3$ epilayer 5210 (peaks 5212 for gamma $Ga_2O_3$) that acts as an intermediate transition layer for subsequent epitaxy of monoclinic $Ga_2O_3(100)$ 5215 (peaks 5214 and 5217). Such a structure is represented by the growth process shown in FIG. 20A.

First a prepared clean MgO (100) surface is presented for MgO homoepitaxy. The magnesium source is a valved effusion source comprising 7N purity Mg with a beam flux of ~1×10$^{-10}$ Torr in the presence of active-oxygen supplied with ϕ(Mg): ϕ(O*)<1 and substrate surface growth temperature from 500-650° C.

The RHEED is monitored to show improved and high quality surface reconstruction of MgO surface of the epitaxial film. After about 10-50 nm of MgO homoepitaxy the Mg source is closed and the substrate elevated to a growth temperature of about 700° C. while under a protective flux of O*. Then the Ga source is exposed to the growth surface and the RHEED is observed to instantaneous change surface reconstruction toward a cubic crystal symmetry $Ga_2O_3$ epilayer 5210. After about 10-30 nm of cubic $Ga_2O_3$ (known also as the gamma-phase) it is observed via direct observation of RHEED the characteristic monoclinic surface reconstruction of $Ga_2O_3(100)$ appears and remains as the most stable crystal structure. A $Ga_2O_3$ (100)-oriented film of 100 nm is deposited, with HRXRD 5200 and GIXR 5220 showing peak 5214 for beta-$Ga_2O_3$(200) and peak 5217 for beta-$Ga_2O_3$(400). Such fortuitous crystal symmetry alignments are rare but highly advantageous for the application toward UVLED.

Yet another example of a complex ternary metal oxide structure applied for UVLED is disclosed in FIG. 44H. The HRXRD 5225 and GIXR 5245 show experimental realization of a superlattice comprising a lanthanide-aluminum-oxide ternary integrated with corundum $Al_2O_3$ epilayers.

The SL comprises corundum crystal symmetry $(Al_xEr_{1-x})_2O_3$ ternary composition with the lanthanide selected from Erbium grown pseudomorphically with corundum $Al_2O_3$. Erbium is presented to the non-equilibrium growth via a sublimating 5N purity Erbium source using an effusion cell. The flux ratio of ϕ(Er):ϕ(Al)~0.15 was used with the oxygen-rich condition of [ϕ(Er)+ϕ(Al)]:ϕ(O*)<1 at a growth temperature of about 500° C.

Of particular note is the ability for Er to crack molecular oxygen at the epilayer surface and therefore the total oxygen overpressure is larger than the atomic oxygen flux. An A-plane Sapphire (11-20) substrate 5235 is prepared and heated to about 800° C. and exposed to an activated Oxygen polish. It was found in this example that the activated oxygen polish of the bare substrate surface dramatically improves the subsequent epilayer quality. Next a homoepitaxial corundum $Al_2O_3$ layer is formed and monitored by RHEED showing excellent crystal quality and atomically flat layer-by-layer deposition. Then a ten period SL is deposited and shown as the satellite peaks 5230 and 5240 in the HRXRD 5225 and GIXR 5245 scans. Clearly evident are the Pendellosung fringes indicating excellent coherent growth.

The effective alloy composition of the $(Er_{xSL}Al_{1-xSL})_2O_3$ of the SL can be deduced by position of the zeroth order SL peak $SL^{n=0}$ relative to the (110) substrate peak 5235. It is found xSl~0.15 is possible and that the $(Al_xEr_{1-x})_2O_3$ layer forming the SL period has corundum crystal symmetry. This discovery is particularly important for application to UVLED wherein FIG. 44I discloses the E-K band structure 5250 of corundum $(Al_xEr_{1-x})_2O_3$ is indeed a direct bandgap material having $E_G \geq 6$ eV. The electron energy 1066 is plotted as a function of the crystal wave vectors 1067. The conduction band minimum 5265 and valence band 5260 is maximum at the Brillouin-zone center 5255 (k=0).

Next in FIG. 44J is demonstrated yet a further ternary magnesium-gallium-oxide cubic crystal symmetry $Mg_xGa_{2(1-x)}O_{3-2x}$ material composition integrable with $Ga_2O_3$. Shown is the HRXRD 5270 and GIXR 5290 experimental realization of a superlattice comprising a 10 period $SL[Mg_xGa_{2(1-x)}O_{3-2x}/Ga_2O_3]$ deposited upon a monoclinic $Ga_2O_3(010)$ oriented substrate 5275 (corresponding to peak 5277). The SL ternary alloy composition is selected from x=0.5 with thickness of 8 nm and $Ga_2O_3$ of 8 nm. The SL period is $\Delta_{SL}$=16 nm with average Mg % of $x_{Mg}^{SL}$=x, $L_{MgGaO}/\Delta_{SL}$. The diffraction satellite peaks 5280 and 5295 report slight diffusion of Mg across the SL interfaces which can be alleviated by growing at a lower temperature. The band structure of $Mg_xGa_{2(1-x)}O_{3-2x}$, x=0.5 is particularly useful for application toward UVLED. FIG. 44K reports the calculated energy band structure 5300 is direct in character (refer to band extrema 5315 and 5310 and k=05305) with bandgap of $E_G$~5.5 eV.

The ability for the monoclinic $Ga_2O_3$ crystal symmetry to integrate with cubic $MgAl_2O_4$ crystal symmetry substrates is presented in FIG. 44L. A high quality single crystal substrate 5320 (peak 5322) comprising $MgAl_2O_4$ spinel is cleaved and polished to expose the (100)-oriented crystal surface. The substrate is prepared and polished using active oxygen at elevated temperature (~700° C.) under UHV conditions (<1e-9 Torr). Keeping the substrate at growth temperature of 700° C. the $MgGa_2O_4$ film 5330 is initiated showing excellent registration to the substrate. After about 10-20 nm the Mg is shuttered and only $Ga_2O_3$ is deposited as the topmost film 5325. The GIXR film flatness is excellent showing thickness fringes 5340 indicating a >150 nm film. The HRXRD shows transition material $MgGa_2O_4$ corresponding to peaks 5332 and $Ga_2O_3$(100)-oriented epilayer of peaks 5327 indicative of monoclinic crystal symmetry. In some embodiments, hexagonal $Ga_2O_3$ can also be deposited epitaxially.

The monoclinic $Ga_2O_3$ (−201)-oriented crystal plane features unique attributes of a hexagonal oxygen surface matrix with in-plane lattice spacing acceptable for registering wurtzite-type hexagonal crystal symmetry materials. For example, as shown in diagram 5345 of FIG. 44M wurtzite ZnO 5360 (peak 5367) is deposited on an oxygen terminated $Ga_2O_3$(−201)-oriented surface of a substrate $Zn_xGa_{2(1-x)}O_{3-2x}$ 5350 (peak 5352). The Zn is supplied by sublimation of 7N purity Zn contained within an effusion cell. The growth temperature is selected from 450-650° C. for ZnO and exhibits extremely bright and sharp narrow RHEED streaks indicative high crystal quality. Peak 5362 represents $(Al_xGa_{1-x})_2O_3$. Peak 5355 represents a transition layer.

Next a ternary zinc-gallium-oxide epilayer $Zn_xGa_{2(1-x)}O_{3-2x}$ 5365 is deposited by co-deposition of Ga and Zn and active oxygen at 500° C. The flux ratio of $[\phi(Zn)+\phi(Ga)]$:$\phi(O^*)$<1 and the metal beam flux ratio $\phi(Zn):\phi(Ga)$ is chosen to achieve x~0.5. Zn desorbs at much lower surface temperatures than Ga and is controlled in part by absorption limited process depending on surface temperature dictated by the Arrhenius behavior of Zn adatoms.

Zn is a group metal and substitutes advantageously on available Ga-sites of the host crystal. In some embodiments, Zn can be used to alter the conductivity type of the host for dilute x<0.1 concentrations of incorporated Zn. The peak 5355 labelled $Zn_xGa_{2(1-x)}O_{3-2x}$ shows the transition layer formed on the substrate showing low Ga % formation of $Zn_xGa_{2(1-x)}O_{3-2x}$. This suggests strongly a high miscibility of Ga and Zn in the ternary offering non-equilibrium growth of full range of alloys $0 \leq x \leq 1$. For the case of x=0.5 in $Zn_xGa_{2(1-x)}O_{3-2x}$ offers the cubic crystal symmetry form an E-k band structure as shown in diagram 5370 of FIG. 44N.

The indirect bandgap shown by band extrema 5375 and 5380 can be shaped using SL band engineering as shown in FIG. 27. The valence band dispersion 5385 showing maxima at k≠0 can be used to create a SL period that can advantageously map the maxima back to an equivalent energy at zone center thereby creating a pseudo-direct bandgap structure. Such a method is claimed in its entirety for application to the formation of optoelectronic devices such as UVLEDs as referred to in the present disclosure.

As explained in the present disclosure, there is a large design space available for crystal modifiers to the $Ga_2O_3$ and $Al_2O_3$ host crystals that can be exploited for application to UVLEDs.

Yet a further example is now disclosed where the growth conditions can be tuned to preselect a unique crystal symmetry type of $Ga_2O_3$, namely monoclinic (beta-phase) or hexagonal (epsilon or kappa phase).

FIG. 44O shows a specific application of the more general method disclosed in FIG. 19.

A prepared and clean surface of corundum crystal symmetry type of sapphire C-plane substrate 5400 is presented for epitaxy.

The substrate surface is polished via active oxygen at elevated temperature >750° C. and such as ~800-850° C. This creates an oxygen terminated surface 5405. While maintaining the high growth temperature, a Ga and active oxygen flux is directed toward the epi-surface and the surface reconstruction of bare $Al_2O_3$ is modified to either a corundum $Ga_2O_3$ thin template layer 5396 or a low Al % corundum $(Al_xGa_{1-x})_2O_3$ x<0.5 is formed by an additional co-deposited Al flux. After about 10 nm of the template layer 5396 the Al flux is closed and $Ga_2O_3$ is deposited. Maintaining a high growth temperature and a low Al % template $0 \leq x < 0.1$ favors exclusive film formation of monoclinic crystal structure epilayer 5397.

If after the initial template layer 5396 formation the growth temperature is reduced to about 650-750° C. then the $Ga_2O_3$ favors exclusively the growth of a new type of crystal symmetry structure having hexagonal symmetry. The hexagonal phase of $Ga_2O_3$ is also favored by x>0.1 template layer. The unique properties of the hexagonal crystal symmetry $Ga_2O_3$ 5420 composition is discussed later. The experimental evidence for the disclosed process of growing the epitaxial structure 5395 is provided in FIG. 44P, showing the HRXRD 5421 for two distinct growth process outcomes of phase pure monoclinic $Ga_2O_3$ and hexagonal crystal symmetry $Ga_2O_3$. The HRXRD scan shows the C-plane $Al_2O_3$ (0001)-oriented substrate Bragg diffraction peaks of corundum $Al_2O_3$(0006) 5465 and $Al_2O_3$(0012) 5470. For the case of monoclinic $Ga_2O_3$ topmost epitaxial film, the diffraction peaks indicated by 5445, 5450, 5455, and 5460 represent sharp single crystal monoclinic $Ga_2O_3$(−201), $Ga_2O_3$(−204), $Ga_2O_3$(−306) and $Ga_2O_3$(−408).

The orthorhombic crystal symmetry can further exhibit an advantageous property of possessing a non-inversion symmetry. This is particularly advantageous for allowing electric dipole transition between the conduction and valence band edges of the band structure at zone-center. For example, wurtzite ZnO and GaN both exhibit crystal symmetry having non-inversion symmetry. Likewise, orthorhombic (namely the space group 33 Pna21 crystal symmetry) has a non-inversion symmetry which enables electric dipole optical transitions.

Conversely, for the growth process of hexagonal $Ga_2O_3$, the peaks 5425, 5430, 5435 and 5440 represent sharp single crystal hexagonal crystal symmetry $Ga_2O_3(002)$, $Ga_2O_3(004)$, $Ga_2O_3(006)$, and $Ga_2O_3(008)$.

The importance of achieving hexagonal crystal symmetry $Ga_2O_3$ and also hexagonal $(Al_xGa_{1-x})_2O_3$ is shown in FIG. 44Q.

The energy band structure 5475 shows the conduction band 5480 and valence band 5490 extrema are both located at the Brillouin-zone center 5485 and is therefore advantageous for application to UVLED.

Single crystal sapphire is one of the most mature crystalline oxide substrates. Yet another form of Sapphire is the corundum M-plane surface which can be used advantageously to form $Ga_2O_3$ and $AlGaO_3$ and other metal oxides discussed herein.

For example, it has been found experimentally in accordance with the present disclosure that the surface energy of Sapphire exhibited by specific crystal planes presented for epitaxy can be used to preselect the type of crystal symmetry of $Ga_2O_3$ that is epitaxially formed thereon.

Consider now FIG. 44R disclosing the utility of an M-plane corundum $Al_2O_3$ substrate 5500. The M-plane is the (1-100) oriented surface and can be prepared as discussed previously and atomically polished in-situ at elevated growth temperature of 800° C. while exposed to an activated oxygen flux. The oxygen terminated surface is then cooled to 500-700° C., such as 500° C. in one embodiment, and a $Ga_2O_3$ film is epitaxially deposited. It was found that in excess of 100-150 nm of corundum crystal symmetry $Ga_2O_3$ can be deposited on M-plane sapphire and about 400-500 nm of corundum $(Al_xGa_{1-x})_2O_3$ for x~0.3-0.45. Of particular interest, corundum $(Al_{03}Ga_{0.7})_2O_3$ exhibits a direct bandgap and is equivalent to the energy gap of wurtzite AlN.

The HRXRD 5495 and GIXR 5540 curves show two separate growths on M-plane sapphire 5500. High quality single crystal corundum $Ga_2O_3$ 5510 and $(Al_{03}Ga_{0.7})_2O_3$ 5505 are clearly shown with respect to the corundum $Al_2O_3$ substrate peak 5502. Therefore, M-plane oriented $AlGaO_3$ films are possible on M-plane Sapphire. The GIXR thickness oscillation 5535 is indicative of atomically flat interfaces 5520 and films 5530. Curve 5155 shows that there are no other crystal phases of $Ga_2O_3$ other than the corundum phase (rhombohedral crystal symmetry).

For completeness, it has also been found in accordance with the present disclosure that various metal oxides can also be used to exploit even the most technologically mature semiconductor substrate, namely Silicon. For example, while bulk $Ga_2O_3$ substrates are desirable for their crystallographic and electronic properties, they are still more expensive to produce than single crystal substrates and furthermore cannot scale as easily as Si to large wafer diameter substrates, for example up to 450 mm diameter for Si.

Therefore, embodiments include developing functional electronic $Ga_2O_3$ films directly on Silicon. To this end a process has been developed specifically for this application.

Referring now to FIG. 44S, there are shown the results of one experimentally developed process for depositing monoclinic $Ga_2O_3$ films on large area Silicon substrates.

A single crystal high quality monoclinic $Ga_2O_3$ epilayer 5565 is formed on a cubic transition layer 5570 comprising ternary $(Ga_{1-x}Er_x)_2O_3$. The transition layer is deposited using a compositional grading which can be abrupt or continuous. The transition layer can also be a digital layer comprising a SL of layers of $[(Ga_{1-x}Er_x)_2O_3/(Ga_{1-y}Er_y)_2O_3]$ wherein x and y are selected from $0 \le x, y \le 1$. The transition layer is deposited optionally on a binary bixbyite crystal symmetry $Er_2O_3(111)$-oriented template layer 5560 deposited on a Si(111)-oriented substrate 5555. Initially the Si(111) is heated in UHV to 900° C. or more but less than 1300° C. to desorb the native $SiO_2$ oxide and remove impurities.

A clear temperature dependent surface reconstruction change is observed and can be used to in-situ calibrate the surface growth temperature which occurs at 830° C. and is only observable for a pristine Si surface devoid of surface $SiO_2$. Then the temperature of the Si substrate is reduced to 500-700° C. to deposit the $(Ga_{1-y}Er_y)_2O_3$ film(s) and then increased slightly to favor epitaxial growth of monoclinic $Ga_2O_3(-201)$-oriented active layer film. If $Er_2O_3$ binary is used, then activated oxygen is not necessary and pure molecular oxygen can be used to co-deposit with pure Er beam flux. As soon as Ga is introduced the activated oxygen flux is necessary. Other transition layers are also possible and can be selected from a number of ternary oxides described herein. The HRXRD 5550 shows the cubic $(Ga_{1-y}Er_y)_2O_3$ peak 5572 along with the bixbyite $Er_2O_3$ (111) and (222) peaks 5562. The monoclinic $Ga_2O_3$ (-201), (-201), (-402) peaks are also observed as peaks 5567, and the Si(111) substrate as peaks 5557.

One application of the present disclosure is the use of cubic crystal symmetry metal oxides for the use of transition layers between Si(001)-oriented substrate surfaces to form $Ga_2O_3(001)$ and $(Al,Ga)_2O_3(001)$-oriented active layer films. This is particularly advantageous for high volume manufacture.

Interest herein is directed toward exploiting transparent substrates that can accommodate a wide variety of metal oxide compositions and crystal symmetry types. In particular, again it is reiterated that the $Al_2O_3$, $(Al_xGa_{1-x})_2O_3$ and $Ga_2O_3$ materials are of great interest and the opportunity for accessing the entire miscibility range of Al % x in $(Al_xGa_{1-x})_2O_3$ and Ga % y in $(Al_{1-y}Ga_y)_2O_3$ can be addressed by corundum crystal symmetry type compositions.

Reference shall now be made to the examples in FIGS. 44T-44X.

FIG. 44T discloses high quality single crystal epitaxy of corundum $Ga_2O_3(110)$-oriented film on $Al_2O_3(11-20)$-oriented substrate (i.e., A-plane Sapphire). The surface energy of the A-plane $Al_2O_3$ surface can be used to grow exceptionally high quality corundum $Ga_2O_3$ and ternary films of corundum $(Al_xGa_{1-x})_2O_3$ where $0 \le x \le 1$ for the entire alloy range. $Ga_2O_3$ can be growth up to a CLT of about 45-80 nm and the CLT increases dramatically with the introduction of Al to form the ternary $(Al_xGa_{1-x})_2O_3$.

Homoepitaxial growth of corundum $Al_2O_3$ is possible at a surprisingly wide growth window range. Corundum $AlGaO_3$ can be grown from room temperature up to about 750° C. All growths, however, require an activated oxygen (viz., atomic oxygen) flux to be well in excess of the total metal flux, that is, oxygen rich growth conditions. Corundum crystal symmetry $Ga_2O_3$ films are shown in the HRXRD 5575 and GIXR 5605 scan of two separate growths for different thickness films on A-plane $Al_2O_3$ substrates. The substrate 5590 surface (corresponding to peak 5592) is oriented in the (11-20) plane and O-polished at elevated temperature at about 800° C.

The activated oxygen polish is maintained while the growth temperature is reduced to an optimal range of 450-600° C., such as 500° C. Then an $Al_2O_3$ buffer 5595 is optionally deposited for 10-100 nm and then the ternary $(Al_xGa_{1-x})_2O_3$ epilayer 5600 is formed by co-depositing with suitably arranged Al and Ga fluxes to achieve the desired Al %. Oxygen-rich conditions are mandatory. Curves 5580 and 5585 show example x=0 $Ga_2O_3$ films 5600 of 20 and 65 nm respectively.

The Pendellosung interference fringes in both the HRXRD and GIXR demonstrate excellent coherent growth, and transmission electron microscopy (TEM) confirm off-axis XRD measurements that defect densities below $10^7$ $cm^{-3}$ are possible.

Corundum $Ga_2O_3$ films on A-plane $Al_2O_3$ in excess of about 65 nm show relaxation as evidenced in reciprocal lattice mapping (RSM) but however maintain excellent crystal quality for film >CLT.

Yet other methods for further improvement in the CLT of binary $Ga_2O_3$ films on A-plane $Al_2O_3$ are also possible. For example, during the high temperature O-polish step of a virgin $Al_2O_3$ substrate surface, the substrate temperature can be maintained at about 750-800° C. At this growth temperature the Ga flux can be presented along with the activated oxygen and a high temperature phenomenon can occur. It was found in accordance with the present disclosure that Ga effectively diffuses into the topmost surface of the $Al_2O_3$ substrate forming an extremely high quality corundum $(Al_xGa_{1-x})_2O_3$ template layer with $0 \le x \le 1$. The growth can either be interrupted or continued while the substrate temperature is reduced to about 500° C. The template layer then acts as an in-plane lattice matching layer that is closer to $Ga_2O_3$ and thus a thicker CLT is found for the epitaxial film.

Having established the unique properties of A-plane surfaces and with reference to the surface energy trend disclosed in FIG. 20B, bandgap modulated superlattice structures are also shown to be possible.

FIG. 44U shows unique attributes of binary $Ga_2O_3$ and binary $Al_2O_3$ epilayers used to form a SL structure on an A-plane $Al_2O_3$ substrate 5625 (corresponding to peak 5627). The excellent SL HRXRD 5610 and GIXR 5630 data show a plurality of high quality SL Bragg diffraction satellite peaks 5615 and 5620 having period $\Delta_{SL}$=9.5 nm. Not only are the full width at half maximum (FWHM) of each satellite peak 5615 very small, there are also clearly observed the inter-peak oscillations of the Pendellosung fringes. For N=10 periods of SL, there exist N–2 Pendellosung oscillations as shown in both the HRDRD and GIXR. The zeroth order SL peak $SL^{n=0}$ is indicative of the average alloy Al % of the digital alloy formed by the SL and is $x_{Al}^{SL}$=0.85. This level of crystalline perfection is rarely observed in many other non-oxide commercially relevant material systems and is noted to be comparable to extremely mature GaAs/AlAs group-III-Arsenide material systems deposited on GaAs substrates. Such low defect density SL structures are necessary for high performance UVLED operation.

Image 5660 in FIG. 44V demonstrates the crystal quality observed for an example $[Al_2O_3/Ga_2O_3]$ SL 5645 deposited on A-plane sapphire 5625. Clearly evident is the contrast in Ga and Al specie showing the abrupt interfaces between the nanometer scale films 5650 and 5655 comprising the SL period.

Closer inspection of image 5660 shows the region labelled 5635 which is due to the high temperature Ga intermixing process described above. The $Al_2O_3$ buffer layer 5640 imparts a small strain to the SL stack. Careful attention is paid to maintaining the $Ga_2O_3$ film thickness to well below the CLT to create high quality SL. However, strain accumulation can result and other structures such as growing the SL structure on a relaxed buffer composition midway between the composition endpoints of the materials comprising the SL is possible in some embodiments.

This enables strain symmetrization to be engineered wherein the layer pairs forming the period of the superlattice can have equal and opposite in-plane strain. Each layer is deposited below the CLT and experiences biaxial elastic strain (thereby inhibiting dislocation formation at the interfaces). Therefore some embodiments include engineering a SL disposed on a relaxed buffer layer that enables the SL to accumulate zero strain and thus can be grown effectively strain-free with theoretically infinite thickness.

Yet a further application of corundum film growth can be demonstrated on yet another advantageous $Al_2O_3$ crystal surface, namely the R-plane (1-102).

FIG. 44W shows the ability to epitaxially deposit thick ternary corundum $(Al_xGa_{1-x})_2O_3$ films on R-plane corundum $Al_2O_3$. The HRXRD 5665 shows an R-plane $Al_2O_3$ substrate 5675 that is prepared using a high temperature O-polish and co-deposition of Al and Ga while reducing the growth temperature from 750 to 500° C. forming region 5680. Region 5680 is an optional surface layer modification to the sapphire substrate surface, such as an oxygen-terminated surface. The excellent high quality ternary epilayer 5670 (corresponding to XRD peak 5672) demonstrates sharp Pendellosung fringes 5680 and provides an alloy composition of x=0.64 with respect to the substrate peak 5677. The film thickness for this case is about 115 nm. Also shown in FIG. 44W is the angular separation of symmetric Bragg peaks 5685 of the pseudomorphic corundum $Ga_2O_3$ epilayer.

Again, high utility is placed on creating bandgap epilayer films that may be configured or engineered to construct the required functional regions for the UVLED. In this manner, strain and composition are tools that may be employed for manipulating known functional properties of the materials for application to UVLEDs in accordance with the present disclosure.

FIG. 44X shows an example of a high quality superlattice structure possible for R-plane $Al_2O_3$(1-102) oriented substrates.

The HRXRD 5690 and GIXR 5710 are shown for an example SL epitaxially formed on R-plane $Al_2O_3$(1-102) substrate 5705 (corresponding to peak 5707).

The SL comprises a 10 period [ternary/binary] bilayer pair of $[(Al_xGa_{1-x})_2O_3/Al_2O_3]$ where x=0.50. The SL period $\Delta_{SL}$=20 nm. The plurality of SL Bragg diffraction peaks 5695 and reflectivity peaks 5715 indicate coherently grown pseudomorphic structure. The zeroth order SL diffraction peak $SL^{n=0}$ 5700 indicates an effective digital alloy $x_{SL}$ of the SL as comprising $(Al_{xSL}Ga_{1-xSL})_2O_3$ where $x_{SL}$=0.2.

Such highly coherent and largely dissimilar bandgap materials used to create epitaxial SL with abrupt discontinuities at the interfaces may be employed for the formation of quantum confined structures as disclosed herein for application to optoelectronic devices such as UVLEDs.

The conduction and valence band energy discontinuity available at the $Al_2O_3/Ga_2O_3$ heterointerface for corundum crystal symmetry (R3c) is:

$$\Delta E_{R3c}^C = E_{Al_2O_3}^C - E_{Ga_2O_3}^C = 3.20 \text{ eV}$$

$$\Delta E_{R3c}^V = E_{Al_2O_3}^V - E_{Ga_2O_3}^V = 0.12 \text{ eV}$$

Also, for the monoclinic crystal symmetry (C2m) heterointerface the band offsets are:

$$\Delta E_{C2m}^{C}=E_{Al_2O_3}^{C}-E_{Ga_2O_3}^{C}=2.68 \text{ eV}$$

$$\Delta E_{C2m}^{V}=E_{Al_2O_3}^{V}-E_{Ga_2O_3}^{V}=0.34 \text{ eV}$$

Some embodiments also include creating a potential energy discontinuity by creation of $Ga_2O_3$ layers having an abrupt change in crystal symmetry.

For example, it is disclosed herein that corundum crystal symmetry $Ga_2O_3$ can be directly epitaxially deposited on monoclinic $Ga_2O_3$ (110)-oriented surfaces. Such a heterointerface produces band offsets given by:

$$\Delta E_{Ga_2O_3}^{C}=\Delta E_{R3c}^{C}-\Delta E_{C2m}^{C}\sim 0.50 \text{ eV}$$

$$\Delta E_{Ga_2O_3}^{V}=\Delta E_{R3c}^{V}-\Delta E_{C2m}^{V}\sim 0.10 \text{ eV}$$

These band offsets are sufficient to create quantum confined structures as will be described below.

As yet another example of embodiments of complex metal oxide heterostructures, refer to FIG. 44Y wherein a cubic MgO epilayer 5730 is formed directly on a spinel $MgAl_2O_4$(100) oriented substrate 5725. The HRXRD 5720 shows the cubic $MgAl_2O_4$(h 00), h=4, 8 substrate Bragg diffraction peaks 5727 and the epitaxial cubic MgO peaks 5737 corresponding to the MgO epilayer 5730. The lattice constant of MgO is almost exactly twice the lattice constant of $MgAl_2O_4$ and thus creates unique epitaxial coincidence for in-plane lattice registration at the heterointerface.

Clearly a high quality MgO(100)-oriented epilayer is formed as evidenced by the narrow FWHM. Next a monoclinic layer of $Ga_2O_3$ 5735 is formed on the MgO layer 5730. The $Ga_2O_3$(100) oriented film is evidenced by the 5736 Bragg diffraction peak.

The interest in cubic $MgAl_2O_4$ and $Mg_xAl_{2(1-x)}O_{3-2x}$ ternary structures is due to the direct and large bandgap possible.

Graph 5740 of FIG. 44Z shows the energy band structure for $Mg_xAl_{2(1-x)}O_{3-2x}$ x~0.5 showing a direct bandgap 5745 formed between the conduction band 5750 and valence band 5755 extrema.

Some embodiments also include growing directly $Ga_2O_3$ on Lanthanum-Aluminum-Oxide $LaAlO_3$(001) substrates.

The example structures disclosed in FIGS. 44A-44Z are for the purpose of demonstrating one of the possible configurations applicable for use in at least a portion of a UVLED structure. The wide variety of compatible mixed symmetry type heterostructures is a further attribute of the present disclosure. As would be appreciated, other configurations and structures are also possible and consistent with the present disclosure.

The aforementioned unique properties of the $AlGaO_3$ material system can be applied to formation of a UVLED. FIG. 45 shows an example light emitting device structure 1200 in accordance with the present disclosure. Light emitting device 1200 is designed to operate such that optically generated light can be out-coupled vertically through the device. Device 1200 comprises a substrate 1205, a first conductivity n-type doped $AlGaO_3$ region 1210, followed by a not-intentionally doped (NID) intrinsic $AlGaO_3$ spacer region 1215, followed by a multiple quantum well (MQW) or superlattice 1240 formed using periodic repetitions of $(Al_xGa_{1-x})_2O_3/(Al_yGa_{1-y})_2O_3$ wherein the barrier layer comprises the larger bandgap composition 1220 and the well layer comprises the narrower bandgap composition 1225.

The total thickness of the MQW or SL 1240 is selected to achieve the desired emission intensity. The layer thicknesses comprising the unit cell of the MQW or SL 1240 are configured to produce a predetermined operating wavelength based on the quantum confinement effect. Next an optional $AlGaO_3$ spacer layer 1230 separates the MQW/SL from the p-type $AlGaO_3$ layer 1235.

Spatial energy band profiles using the k=0 representation are disclosed in FIGS. 46, 47, 49, 51 and 53 which are graphs of spatial band energy 1252 as a function of growth direction 1251. The n-type and p-type conductivity regions 1210 and 1235 are selected from monoclinic or corundum compositions of $(Al_xGa_{1-x})_2O_3$, where x=0.3, followed by a NID 1215 of the same composition x=0.3. The MQW or SL 1240 is tuned by keeping the thickness of both the well and barrier layers the same in each design 1250 (FIGS. 46, 47), 1350 (FIG. 49), 1390 (FIGS. 51) and 1450 (FIG. 53).

The composition of the well is varied from x=0.0, 0.05, 0.10 and 0.20, and the barrier is fixed to y=0.4 for the bi-layer pairs $(Al_xGa_{1-x})_2O_3/(Al_yGa_{1-y})_2O_3$. These MQW regions are located at 1275, 1360, 1400 and 1460. The thickness of the well layer is selected from at least $0.5xa_w$ to $10xa_w$ the unit cell ($a_w$ lattice constant) of the host composition. For the present case, one unit cell is chosen. The periodic unit cell thickness can be relatively large as the corundum and monoclinic unit cells are relatively large. However, sub-unit-cell assemblies may be utilized in some embodiments. MQW region 1275 in FIG. 47 is configured for intrinsic or non-intentionally doped layer combination comprising $Ga_2O_3/(Al_{0.4}Ga_{0.6})_2O_3$. MQW region 1360 in FIG. 49 is configured for intrinsic or non-intentionally doped layer combination comprising $(Al_{0.05}Ga_{0.95})_2O_3/(Al_{0.4}Ga_{0.6})_2O_3$. MQW region 1400 in FIG. 51 is configured for intrinsic or non-intentionally doped layer combination comprising $(Al_{0.1}Ga_{0.9})_2O_3/(A_{0.4}Ga_{0.6})_2O_3$. MQW region 1460 in FIG. 53 is configured for intrinsic or non-intentionally doped layer combination comprising $(A_{0.2}Ga_{0.8})_2O_3/(Al_{0.4}Ga_{0.6})_2O_3$.

Also shown are ohmic contact metals 1260 and 1280. The conduction band edge $E_C(z)$ 1265 and the valence band edges $E_V(z)$ 1270 and the MQW region 1400 shows the modulation in bandgap energy with respect to the spatially modulated composition. This is yet another particular advantage of atomic layer epitaxy deposition techniques which make such structures possible.

FIG. 47 shows schematically the confined electron 1285 and hole 1290 wavefunctions within the MQW region 1275. The electric-dipole transition due to spatial recombination of electron 1285 and hole 1290 creates photon 1295.

The emission spectrum can be calculated and is shown in FIG. 48, plotted in graph 1300 as the emission wavelength 1310 and the oscillator absorption strength 1305 due to the wavefunction overlap integrals for the spatially dependent quantized electron and holes states (also indicative of the emission strength). A plurality of peaks 1320, 1325 and 1330 are generated due to recombination of quantized energy states with the MQW. In particular, the lowest energy electron-hole recombination peak 1320 is the most probable and occurs at ~245 nm. Region 1315 shows that below the energy gap of the MQW there is no absorption or optical emission. The first onset of optical activity in moving toward shorter wavelengths is the n=1 exciton peak 1320 determined by the MQW configuration.

The MQW configurations 1275, 1360, 1400 and 1460 result in light emission energy peaks 1320 (FIG. 48), 1370 (FIG. 50), 1420 (FIG. 52) and 1470 (FIG. 54) having peak operating wavelengths of 245 nm, 237 nm, 230 nm and 215 nm, respectively. Graph 1365 of FIG. 50 also shows peaks 1375 and 1380 along with region 1385. Graph 1410 of FIG.

52 also shows peaks 1425 and 1430 along with region 1435. Graph 1465 of FIG. 54 also shows peak 1475 along with region 1480. Regions 1385, 1435 and 1480 show that there is no optical absorption or emission for photon energy/wavelengths below the energy gap of the MQW.

Yet a further feature of extremely wide bandgap metal oxide semiconductors is the configuration of ohmic contacts to n-type and p-type regions. The example diode structures 1255 comprise high work-function metal 1280 and low work-function metal 1260 (ohmic contact metals). This is because of the relative electron affinity of the metal-oxides with respect to vacuum (refer to FIG. 9).

FIGS. 48, 50, 52 and 54 show the optical absorption spectrum for the MQW regions contained within the diode structures 1255. The MQW comprises two layers of a narrower bandgap material and a wider bandgap material. The thickness of the layers, and in particular the narrow bandgap layer, are selected such that they are small enough to exhibit quantization effects along the growth direction within the conduction and valence potentials wells that are formed. The absorption spectrum represents the creation of an electron and hole in the quantized state of the MQW upon resonant absorption of an incident photon.

The reversible process of photon creation is where the electron and hole are spatially localized in their respective quantum energy levels of the MQW and recombine by virtue of the direct bandgap. The recombination producing a photon equals approximately to the layer acting as the potential well having a direct energy gap in addition to the energy separation of the quantized levels within the potentials wells relative to the conduction and valence band edges. The emission/absorption spectra therefore show the lowest lying energy resonance peak indicative of the UVLED primary emission wavelength and is engineered to be the desired operating wavelength of the device.

FIG. 55 shows a plot 1500 of the known pure metal work-function energy 1510 and sorts the metal species (elemental metal contact 1505) from high 1525 to low 1515 work function for application to p-type and n-type ohmic contacts and provides selection criteria for the metal contacts for each of the conductivity type regions required by the UVLED. Line 1520 represents the mid-point work function energy with respect to the high 1525 and low 1515 limits depicted in FIG. 55.

In some embodiments, Os, Pt, Ir, and Ni are used for the p-type regions, and low work-function metals selected from rare-earths, Li and Cs can be used. Other selections are also possible.

Intermediary contact materials such as semi-metallic palladium oxide PdO, degenerately doped Si or Ge and rare-earth nitrides can be used. In some embodiments, ohmic contacts are formed in-situ to the deposition process for at least a portion of the contact materials to preserve the [metal contact/metal oxide] interface quality. In fact, single crystal metal deposition is possible for some metal oxide configurations.

X-ray diffraction (XRD) is one of the most powerful tools available to crystal growth analysis to directly ascertain crystallographic quality and crystal symmetry type. FIGS. 56 and 57 show the two-dimensional XRD data of example materials of ternary AlGaO$_3$ and a binary Al$_2$O$_3$/Ga$_2$O$_3$ superlattice. Both structures are deposited pseudomorphically on corundum crystal symmetry substrates having an A-plane oriented surface.

Referring now to FIG. 56, there is shown a reciprocal lattice map 2-axis x-ray diffraction pattern 1600 for a 201 nm thick epitaxial ternary (Al$_{0.5}$Ga$_{0.5}$)$_2$O$_3$ on an A-plane Al$_2$O$_3$ substrate. Clearly, the in-plane and perpendicular mismatch of the ternary film is well matched to the underlying substrate. The in-plane mismatch parallel to the plane of growth is 4088 ppm, and the perpendicular lattice mismatch of the film is 23440 ppm. The relatively vertical displacement of the ternary layer peak (Al$_x$Ga$_{1-x}$)$_2$O$_3$ with respect to the substrate (SUB) shows excellent film growth compatibility and is directly advantageous for UVLED application.

Referring now to FIG. 57, there is shown a 2-axis x-ray diffraction pattern 1700 of a 10 period SL[Al$_2$O$_3$/Ga$_2$O$_3$] on an A-plane Al$_2$O$_3$ substrate showing excellent strained Ga$_2$O$_3$ layers (no spread in 2theta angle)=>elastically strained SL. The SL period=18.5 nm and an effective SL digital Al % ternary alloy, x_Al~18%.

In further illustrative embodiments, an optoelectronic semiconductor device in accordance with the present disclosure may be implemented as an ultraviolet laser device (UVLAS) based upon metal oxide semiconducting materials.

The metal oxide compositions having bandgap energy commensurate with operation in the UVC (150-280 nm) and far/vacuum UV wavelengths (120-200 nm) have the general distinguishing feature of having intrinsically small optical refractive index far from the fundamental band edge absorption. For operation as optoelectronic devices with energy states in the immediate vicinity of the conduction and valence band edges the effective refractive index is governed by the Krammers-Kronig relations.

FIGS. 58A-58B show a section of a metal-oxide semiconductor material 1820 having optical length 1850 along a one-dimensional optical axis in accordance with an illustrative embodiment of the present disclosure. An incident light vector 1805 enters the material 1820 from air having refractive index n$_{MOx}$. The light within the material 1820 is transmitted and reflected (beams 1810) at the refractive index discontinuities at each surface with a transmitted optical beam 1815.

The material slab of length 1850 can support a number of optical longitudinal modes 1825 as shown in FIG. 58A. The transmission 1815 as a function of the optical wavelength incident upon the slab shows a Fabry-Perot mode structure having modes 1825. For a photon trapped within the optical cavity defined by the one-dimensional slab it is possible in accordance with the present disclosure to determine the roundtrip losses of the slab and the required minimum optical gain required to overcome these losses and enable a net gain.

The threshold gain is calculated in FIG. 58B showing the transmission factor 13 as a function of optical gain within the slab for the forward 1830 and reverse 1835 propagating light beams 1810. For this simple Fabry-Perot case the low refractive index n$_{MOx}$=2.5 of slab length L$_{eav}$=1 micrometer requires a threshold gain 1845 calculated by the full-width-half max point of the peak gain at 1840.

Some embodiments implement semiconductor cavities contained with a vertical-type structure 110 (e.g., see FIG. 2A) with sub-micron length scales. This is because of the desire to localize the electron and hole recombination into a narrow region. Confining the physical thickness of the slab, where the carrier recombination occurs and light emission is generated, aids in reducing the threshold current density required to achieve lasing. It is therefore instructive to understand the required threshold gain by reducing the gain slab length.

FIGS. 59A-59B show the same optical material as FIGS. 58A-58B, but for the case of L$_{eav}$=500 nm. The smaller cavity length 1860 compared to length 1850 results in fewer allowed optical modes 1870. The required threshold gain required to overcome cavity losses is increased to 1865 compared to the gain 1845 of FIG. 58A, referring to the peaks 1877 calculated for forward and reverse propagating modes 1880 and 1885, respectively, shown in FIG. 59B.

The increase in required threshold gain for a slab of metal oxide material can be reduced dramatically by increasing the slab length of the optical gain medium in this case the metal-oxide semiconducting region responsible for the optical emission process.

Referring again to FIGS. 2A and 2B, instead of using vertical type 110 emission devices (i.e., FIG. 2A), some embodiments utilize planar waveguide structures where the optical mode overlaps an optical gain layer along the plane parallel length. That is, even though the gain material is still a thin slab the optical propagation vector is substantially parallel to the plane of the gain slab.

This is shown schematically for structure 140 FIG. 2B and structure 2360 in FIG. 74. Waveguide structures having optical gain region layer thicknesses well below 500 nm are possible and can even be as thin as 1 nanometer supporting a quantum well (refer to FIGS. 64 to 68). The longitudinal length of the waveguide can then be of the order of several microns to even a few millimeters or even a centimeter. This is an advantage of the waveguide structure. An added requirement is the ability to confine and guide optical modes along the major axis length of the waveguide, which can be achieved by use of suitable refractive index discontinuities. Optical modes prefer to be guided in a higher refractive index medium compared to the surrounding non-absorptive cladding regions. This can be achieved using metal-oxide compositions as set out in the present disclosure which can be preselected to exhibit advantageous E-k band structure.

A UVLAS requires, in the most fundamental configuration, at least one optical gain medium and an optical cavity for recycling generated photons. The optical cavity must also present a high reflector (HR) with low loss and an output coupling reflector (OC) that can transmit a portion of the optical energy generated with in the gain medium. The HR and OC reflectors are in general plane parallel or enable focusing of the energy within the cavity into the gain medium.

FIG. 60 shows schematically an embodiment of an optical cavity having HR 1900, gain medium 1905 substantially filling the cavity of length 1935, and an OC 1915 having physical thickness 1910. The standing waves 1925 and 1930 show two distinct optical wavelength optical fields that are matched to the cavity length. The outcoupled light 1920 is due to the OC leaking a portion of the trapped energy within the cavity gain medium 1905. In one example, Aluminum metal of low thickness <15 nm is utilized in the far or vacuum UV wavelength regions and the transmission can be tuned accurately by the Al-film thickness 1910. The lowest energy standing wave 1925 has a node (peak intensity of the optical field) at the center node 1945 of the cavity. The 1$^{st}$ harmonic (standing wave 1930) exhibits to nodes 1940 and 1950, as shown.

FIG. 61 shows output wavelengths 1960 and 1965 from the cavity with energy flow 1970. The cavity length 1935 is the same as in FIG. 60. FIG. 61 shows that the cavity length 1935 can support two optical modes forming standing waves 1930 and 1925 of two different wavelengths. FIG. 61 shows the emission or outcoupling of both wavelength modes (standing waves 1930 and 1925) as wavelengths 1965 and 1960, respectively. That is, both modes propagate. Optical gain medium 1905 substantially fills the optical cavity length 1935. Only the peak optical field intensity nodes 1940, 1945 and 1950 couples to the spatial portions of the gain medium 1905. It is therefore possible in accordance with the present disclosure to configure the gain medium within the optical cavity as shown in FIG. 62.

FIG. 62 shows a spatially selective gain medium 1980 which is contracted in length compared to optical gain medium 1905 of FIGS. 60-61 and is positioned advantageously within cavity length 1935 to amplify only the mode 1925. That is, optical gain medium 1980 favors the outcoupling of wavelength 1960 as the optical mode. The cavity thus preferentially provides gain to the fundamental mode 1925 with output energy selected as wavelength 1960.

Similarly, FIG. 63 shows two spatially selective gain media 1990 and 1995 positioned advantageously to amplify only the mode of standing wave 1930. The cavity preferentially provides gain to the mode of standing wave 1930 with output energy selected as 1965.

This method involving spatially positioning the gain regions within the optical cavity is one example embodiment of the present disclosure. This can be achieved by predetermining the functional regions as a function of the growth direction during film formation process as described herein. A spacer layer between the gain sections can comprise substantially non-absorbing metal-oxide compositions and otherwise provide electronic carrier transport functions, and aid in the optical cavity tuning design.

Attention is now directed towards the optical gain medium design for application to UVLAS using metal-oxide compositions set out in the present disclosure.

FIGS. 64A-64B and 65A-65B disclose bandgap engineered quantum confinement structures of a single quantum well (QW). It is to be understood a plurality of QWs is possible, as is a superlattice. The wide bandgap electronic barrier cladding layers are selected from metal-oxide material composition $A_xB_yO_z$ and the potential well material is selected as $C_pD_qO_r$. Metal cations A, B, C and D are selected from the compositions set out in the present disclosure (0≤x, y, z, p, q, r≤1).

Predetermined selection of materials can achieve the conduction and valence band offsets as shown in FIGS. 64A and 64B. The case of A=Al, B=Ga to form $(Al_{0.95}B_{0.05})_2O_3=Al_{1.9}Ga_{0.1}O_3$ and C=Al, D=Ga to form $(Al_{0.05}B_{0.95})_2O_3=Al_{0.1}Ga_{1.9}O_3$ is shown. The conduction 2005 and valence 2010 band spatial profile along a growth direction, z is shown using the k=0 representation of the respective E-k curves for each material.

FIG. 64A shows the QW having thickness 2015 of $L_{QW}$=5 nm generating quantized energy states 2025 and 2035 for the allowed states of the electrons and holes in the conduction and valence bands, respectively. The lowest lying quantized electron state 2020 and highest quantized valence state 2030 participate in the spatial recombination process to create a photon of energy equal to 2040.

Similarly, FIG. 64B shows the QW having thickness 2050 of $L_{QW}$=2 nm generating quantized energy states within the potential well for the allowed states of the electrons and holes in the conduction and valence bands, respectively. The lowest lying quantized electron state 2055 and highest quantized valence state 2060 participate in the spatial recombination process to create a photon of energy equal to 2065.

Reducing the QW thickness yet further results in the spatial band structures of FIGS. 65A and 65B. FIG. 65A shows the QW having thickness 2070 of $L_{QW}$=1.5 nm generating quantized energy states within the potential well for the allowed states of the electrons and holes in the conduction 2005 and valence 2010 bands, respectively. The lowest lying quantized electron state 2075 and highest quantized valence state 2080 participate in the spatial recombination process to create a photon of energy equal to 2085.

FIG. 65B shows the QW having thickness 2090 of $L_{QW}$=1.0 nm generating quantized energy states within the potential well for the allowed states of the electrons and holes in the conduction and valence bands, respectively. The QW can only support a single quantized electron state 2095 which participates with the highest quantized valence state 2100 in the spatial recombination process to create a photon of energy equal to 2105.

The spontaneous emission due to the spatial recombination of the quantized electron and hole states for the QW structures of FIGS. 64A, 64B, 65A and 65B are shown in FIG. 66. The annihilation of the electron and hole pair creates energetic photons of wavelengths peaked at 2115, 2120, 2125, 2130 and 2135 for the cases of $L_{QW}$=5.0, 2.5, 2.0, 1.5 and 1 nm, respectively. Evident from the emission spectra of 2110 is the excellent tunability of the operating wavelength possible for the gain medium by virtue of using the same barrier and well compositions but controlling $L_{QW}$.

Having fully described the utility of configuring metal-oxide compositions for direct application to UVLAS gain media, refer now to FIGS. 67A and 67B which describe in further detail the electronic configuration of the gain medium. FIG. 67A shows again a QW configured using metal-oxide layers to form an example QW structure as described previously.

The QW thickness 2160 is tuned to achieve recombination energy 2145. The k=0 representation of the QW in FIG. 67A is representative of the non-zero crystal wave vector dispersion of the quantized energy states 2165 and 2180 for the electron (conduction band 2190) and hole (valence band 2205) states. For completeness, the underlying bulk E-k dispersion are also shown as 2170 and 2175 at k=0 and 2185 and 2200 for non-zero k. The schematic E-k diagram is critical for describing the population inversion mechanism for creating excess electrons and holes in the conduction and valence band necessary for providing optical gain.

The band structure shown in FIG. 68A describes the electronic energy configuration states when the conduction band quasi-Fermi energy level 2230 is positioned such that it is above the electronic quantized energy state 2235. Similarly, the valence band quasi-Fermi energy is selected to penetrate the valence band level 2245 creating an excess hole density 2225. The E-k curve of conduction band 2195 shows that electron states 2220 are filled with electrons having non-zero crystal momentum states |k|>0 being possible. Valence band level 2240 is the valence band edge of the bulk material used in the narrow bandgap region of the MQW. When the narrow bandgap material is confined in the MQW, the energy states are quantized, creating the band structure dispersion for conduction band 2195 and valence band 2205. Valence band level 2240 is then the valence band maximum of the MQW region. Valence band level 2245 represents the Fermi energy level of the valence band when configured as a p-type material. This makes excess hole density 2225 region filled with holes that can participate in optical gain.

Optical recombination process can occur for 'vertical transitions' wherein the change in crystal momentum between the electron and holes state is identically zero. The allowed vertical transitions are shown as 2210 at k=0 and 2215 k≠0. Calculation of the integrated gain spectrum for the representative band structure of FIG. 68A is shown in FIG. 68B. Specific input parameters for the gain spectra are $L_{QW}$=2 nm, an electron to hole concentration ratio of 1.0, a carrier relaxation time of T=1 ns and an operating temperature of T=300 K. Curves 2275 to 2280 show an increase in the electron concentration $N_e$ where $0 \le N_e \le 5 \times 10^{24}$ m$^{-3}$.

Net positive gain 2250 is achievable under high electron concentrations with threshold $N_e \sim 4 \times 10^{24}$ m$^3$. These parameters are of the order achievable by other technologically mature semiconductors such as GaAs and GaN. In some embodiments, the metal oxide semiconductor by virtue of having an intrinsically high bandgap will also be less susceptible to gain reduction with operating temperature. This is evidenced by conventional optically pumped high power solid-state Ti-doped $Al_2O_3$ laser crystals.

FIG. 68B shows the net gain 2265 and net absorption 2270 as a function of $N_e$. The range of crystal wave vectors which can contribute to vertical transitions determines the width of the net gain region 2250. This is fundamentally determined by the achievable excess electron 2220 and hole 2225 states possible by manipulating the quasi-Fermi energies.

The region 2255 is below the fundamental bandgaps of the host QW and is therefore non absorbing. Optical modulators are therefore also possible using metal-oxide semiconductor QWs. Of note is the point of induced transparency 2260 where the QW achieves zero loss.

Manipulating the quasi-Fermi energy is not the only method available for creating excess electron and hole pairs in the vicinity of the zone-center band structure enabling optical emission. Consider FIGS. 69A and 69B showing the E-k band structures for the case of direct bandgap materials (FIG. 69A) and pseudo-direct bandgap materials, for example, metal-oxide SL with period selected to create valence maxima as shown in curves 2241 with hole states 2246 of FIG. 69B.

Assuming similar conduction band dispersions 2195, for both valence band types of 2205 and 2241, a configuration can be achieved wherein the same vertical transitions are possible. Substantially similar gain spectra as disclosed in FIG. 68B are possible for both types shown in FIGS. 69A and 69B.

Yet a further method is disclosed for an alternative method of creating electron and hole states suitable for creating optical emission and optical gain with metal-oxide semiconductor structures.

Consider FIGS. 70A and 70B, which show an impact ionization process with a metal-oxide semiconductor having a direct bandgap. While impact ionization is a known phenomenon and process in semiconductors, not so well known is the advantageous properties of extremely wide energy bandgap metal oxides. One of the most promising properties that has been found in accordance with the present disclosure is the exceedingly high dielectric breakdown strength of metal-oxides.

In prior art small bandgap semiconductors such as Si, GaAs and the like, impact ionization processes when leveraged in device functions tend to wear-out the materials by the creation of crystallographic defects/damage. This degrades the material over time and limits the number of breakdown events possible before catastrophic device failure.

Extreme wide bandgap gap metal oxides with Eg>5 eV possess advantageous properties for creating impact ionization light emission devices.

FIG. 70A shows a metal oxide direct bandgap of 2266 with a 'hot' (high energy) electron injected into the conduction band at electron state 2251 with excess kinetic energy 2261 with respect to the conduction band 2256 edge. Metal-oxides can easily withstand excessively high electrical fields placed across thin films ($V_{br}$>1 to 10 MV/cm).

Operating with a metal oxide slab biased at below and close to the breakdown voltage enables an impact ionization event as shown in FIG. 70B. The energetic electron 2251 interacts with the crystal symmetry of the host and can produce a lower energy state by coupling to the available thermalizing with lattice vibration quanta called phonons and pair production. That is, the impact ionization event comprising a hot electron 2251 is converted into two lower energy electron states 2276 and 2281 near the conduction band minimum as well as a new hole state 2286 created at the top of the valence band 2271. The electron-hole pair produced 2291 is a potential recombination pair to create a photon of energy 2266.

It has been found in accordance with the present disclosure that impact ionization pair production is possible for excess electron energy 2261 of about half the bandgap energy 2266. For example, if $E_G$=5 eV 2266 then hot electrons with respect to the conduction band edge of ~2.5 eV can initiate pair production process as described. This is achievable for $Al_2O_3/Ga_2O_3$ heterostructures wherein an electron from $Al_2O_3$ is injected into the $Ga_2O_3$ across the heterojunction. Impact ionization is a stochastic process and requires a minimum interaction length to create a finite energy distribution of electron-hole pairs. In general, 100 nm to 1 micron of interaction length is useful for creating significant pair production.

FIGS. 71A and 71B show that impact ionization is also possible in pseudo-direct and indirect band structure metal oxides. FIG. 71A recites the case previously for direct bandgap, and FIG. 71B shows the same process for an indirect bandgap valence band 2294 wherein the electron-hole pair production 2292 requires a k≠0 hole state 2296 to be created, necessitating a phonon for momentum conservation. As such, FIG. 71B demonstrates that an optical gain medium is also possible in pseudo-direct band structures such as 2294.

FIGS. 72A and 72B disclose further detail of the disclosure using impact ionization processes for optical gain medium by selecting advantageous properties of the band structure.

FIG. 72A describes the band structure of FIGS. 68A-68B, 69A-69B, 70A-70B and 71A-71B for in-plane crystal wave vectors $k_∥$ and the wavevector along the quantization axis $k_z$ that is parallel to the epilayer growth direction z.

The conduction 2320 and valence 2329 band dispersions are shown along $k_z$ in FIG. 72A. If the k=0 spatial band structure of material having bandgap 2266 depicted in FIG. 72A is plotted along the growth direction, the resulting spatial-energy band diagram is shown in FIG. 72B. Along the growth direction z, the hot electron 2251a is injected into the conduction band producing impact ionization process and pair production 2290. If a slab of the metal-oxide material is subjected to a large electric field directed along z, the band structure has a potential energy along z that is linearly decreasing. An impact ionization event producing electron 2276 and hole 2286 pair quasi-particle production 2290 can undergo recombination and produce a bandgap energy photon.

The remaining electron 2276 can be accelerated by the applied electric field to create another hot electron 2252. The hot electron 2252 can then impact ionize and repeat the process. Therefore, the energy supplied by the external electric field can generate the pair product and photon generation process. This process is particularly advantageous for metal-oxide light emission and optical gain formation.

Lastly, there are three laser topologies that can be utilized advantageously in accordance with the principles set out in the present disclosure.

The basic components are: (i) an electronic region forming and generating an optical gain region; and (ii) an optical cavity containing the optical gain region.

FIG. 73 shows a semiconductor optoelectronic device in the form of a vertical emission type UVLAS 2300 comprising an optical gain region 2330 of thickness 2331; an electron injector 2310 region 2325; a hole injector 2315 region 2335. Regions 2325 and 2335 may be n-type and p-type metal oxide semiconductors and substantially transparent to the operating wavelength emitted from the device along axis 2305. The electrical excitation source 200 is operably connected to the device via conductive layers 2340 and 2320 which are also operable as a high reflector and output coupler, respectively. The optical cavity between the reflectors (conductive layers 2340 and 2320) is formed by the sum of the stack of layers 2325, 2330 and 2335.

A portion of the thickness of the reflectors is also included as the cavity thickness if they are partially absorbing and of multilayer dielectric type. For the case of pure and ideal metal reflectors, the mirror thickness can be neglected. Therefore, the optical cavity thickness is governed by the layers 2325, 2330 and 2335, of which the optical gain region 2330 is advantageously positioned with respect to the cavity modes as described in FIGS. 61, 62 and 63. The photon recycling 2350 is shown by the optical reflection from the mirrors/reflectors 2340 and 2320.

Yet another option for creating a UVLAS structure as shown in FIG. 73 is an embodiment in which the reflectors 2320 and 2340 form part of the electrical circuit and therefore must be conducting and must also be operable as reflectors forming the optical cavity. This can be achieved by using elemental Aluminum layers to act as at least one of the HR or OC.

An alternative UVLAS configuration decouples the optical cavity from the electrical portion for the structure. For example, FIG. 74 discloses a UVLAS 2360 having an optical cavity formed comprising HR 2340 and OC 2320 that are not part of the electrical circuit. The optical gain region 2330 is positioned with the cavity enabling photon recycling 2350. The optical axis is directed along axis 2305. Insulating spacer layer metal oxide regions may be provided within the cavity to tailor the position of the gain region 2330 between the reflectors 2340 and 2320. The electron 2325 and hole injectors and 2335 provide laterally transported carriers into the gain region 2330.

Such as structure can be achieved for a vertical emitting UVLAS by creating p-type and n-type regions laterally disposed to connect only a portion of the gain region. The reflectors may be positioned also on a portion of the optical gain region to create the cavity photon recycling 2350.

Yet even a further illustrative embodiment is the waveguide device 2370 shown in FIG. 75.

FIG. 75 shows the waveguide structure 2370 having a major axis 2305 with epitaxial regions formed sequentially along the growth direction z comprising of electron injector 2325, optical gain region 2330 and hole injector region 2335. Single-mode or multimode waveguide structures having refractive indices are selected to create confined optical radiation of forward and reverse propagating modes 2375 and 2380. The cavity length 2385 is terminated at each end with reflectors 2340 and 2320. High reflector 2340 can be metallic or distributed feedback type comprising etched grating or multilayer dielectric conformally coated to a ridge. The OC 2320 can be a metallic semi-transparent film of dielectric coating or even a cleaved facet of the semiconductor slab.

As would be appreciated, optical gain regions may be formed using metal-oxide semiconductors in accordance with the present disclosure that are electrically stimulated and/or optically pumped/stimulated where the optical cavity may be formed in both vertical and waveguide structures as required.

The present disclosure teaches new materials and processes for realizing optoelectronic light emitting devices based on metal oxides capable of generating light deep into the UVC and far/vacuum UV wavelength bands. These processes include tuning or configuring the band structure of different regions of the device using a number of different methods including, but not limited to, composition selection to achieve desired band structure including forming effective compositions by the use of superlattices comprising different layers of repeating metal oxides. The present disclosure also teaches the use of biaxial strain or uniaxial strain to modify band structures of relevant regions of the semiconductor device as well as strain matching between layers, e.g., in a superlattice, to reduce crystal defects during the formation of the optoelectronic device.

As would be appreciated, metal oxide based materials are commonly known in the prior-art for their insulating properties. Metal oxide single crystal compositions, such as Sapphire (corundum-$Al_2O_3$) are available with extremely high crystal quality and are readily grown in large diameter wafers using bulk crystal growth methods, such as Czochralski (CZ), Edge-fed growth (EFG) and Float-zone (FZ) growth. Semiconducting gallium-oxide having monoclinic crystal symmetry has been realized using essentially the same growth methods as Sapphire. The melting point of $Ga_2O_3$ is lower than Sapphire so the energy required for the CZ, EFG and FZ methods is slightly lower and may help reduce the large scale cost per wafer. Bulk alloys of $AlGaO_3$ bulk substrates have not yet been attempted using CZ or EFG. As such, metal oxide layers of the optoelectronic devices may be based on these metal oxide substrates in accordance with examples of the present disclosure.

The two binary metal oxide materials $Ga_2O_3$ and $Al_2O_3$ exist in several technologically relevant crystal symmetry forms. In particular, the alpha-phase (rhombohedral) and beta-phase (monoclinic) are possible for both $Al_2O_3$ and $Ga_2O_3$. $Ga_2O_3$ energetically favors the monoclinic structure whereas $Al_2O_3$ favors the rhombohedral for bulk crystal growth. In accordance with the present disclosure atomic beam epitaxy may be employed using constituent high purity metals and atomic oxygen. As demonstrated in this disclosure, this enables many opportunities for flexible growth of heterogeneous crystal symmetry epitaxial films.

Two example classes of device structures that are particularly suitable to UVLED include: high Al-content $Al_xGa_{1-x}O_3$ deposited on $Al_2O_3$ substrates and high Ga-content $AlGaO_3$ on bulk $Ga_2O_3$ substrates. As has been demonstrated in this disclosure, the use of digital alloys and superlattices further extends the possible designs for application to UVLEDs. As has also been demonstrated in some examples of the present disclosure, the selection of various $Ga_2O_3$ and $Al_2O_3$ surface orientations when presented for $AlGaO_3$ epitaxy can be used in conjunction with growth conditions such as temperature and metal-to-atomic-oxygen ratio and relative metal ratio of Al to Ga in order to predetermine the crystal symmetry type of the epitaxial films which may be exploited to determine the band structure of the optical emission or conductivity type regions Throughout the specification and the claims that follow, unless the context requires otherwise, the words "comprise" and "include" and variations such as "comprising" and "including" will be understood to imply the inclusion of a stated integer or group of integers, but not the exclusion of any other integer or group of integers.

Unless otherwise defined, all terms used in the present disclosure, including technical and scientific terms, have the meaning as commonly understood by one of ordinary skill in the art. By means of further guidance, term definitions are included to better appreciate the teaching of the present disclosure.

As used herein, the following terms have the following meanings:

"A", "an", and "the" as used herein refers to both singular and plural referents unless the context clearly dictates otherwise. By way of example, "a metal oxide" refers to one or more than one metal oxide.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed embodiments. However, it is to be understood that the value to which the modifier "about" refers is itself also specifically disclosed.

The expression "% by weight" (weight percent), here and throughout the description unless otherwise defined, refers to the relative weight of the respective component based on the overall weight of the formulation or element referred to.

The recitation of numerical ranges by endpoints includes all numbers and fractions subsumed within that range, as well as the recited endpoints, except where otherwise explicitly stated by disclaimer and the like.

The reference to any prior art in this specification is not, and should not be taken as, an acknowledgement of any form of suggestion that such prior art forms part of the common general knowledge.

Reference has been made to embodiments of the disclosed invention. Each example has been provided by way of explanation of the present technology, not as a limitation of the present technology. In fact, while the specification has been described in detail with respect to specific embodiments of the invention, it will be appreciated that those skilled in the art, upon attaining an understanding of the foregoing, may readily conceive of alterations to, variations of, and equivalents to these embodiments. For instance, features illustrated or described as part of one embodiment may be used with another embodiment to yield a still further embodiment. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. An optoelectronic semiconductor light emitting device comprising:
   a substrate; and
   a plurality of epitaxial semiconductor layers disposed on the substrate, wherein each of the epitaxial semiconductor layers comprises an epitaxial oxide, wherein at least one of the epitaxial semiconductor layers comprises an optically emissive material of direct bandgap type, wherein at least one of the epitaxial semiconductor layers comprises $(Al_{x1}Ga_{1-x1})_2O_3$ wherein $0 \leq x1 \leq 1$, wherein the plurality of epitaxial semiconductor layers comprises:
      first region comprising a first conductivity type;
      a second region comprising a not-intentionally doped (NID) intrinsic region; and
      a third region comprising a second conductivity type,
   wherein the second region is between the first region and the third region,
   wherein the substrate and the plurality of epitaxial semiconductor layers are a substantially single crystal epitaxially formed device,
   wherein the optoelectronic semiconductor light emitting device is configured to emit light having a wavelength in a range from 150 nm to 425 nm,
   wherein the first, second, or third region comprises a superlattice, and
   wherein the superlattice comprises the $(Al_{x1}Ga_{1-x1})_2O_3$ and comprises $(Al_{x2}Ga_{1-x2})_2O_3$ wherein $0 \leq x2 \leq 1$, wherein x1 is not equal to x2.

2. The optoelectronic semiconductor light emitting device of claim 1, wherein at least one of the plurality of epitaxial semiconductor layers has rhombohedral crystal symmetry.

3. The optoelectronic semiconductor light emitting device of claim 1, wherein at least one of the plurality of epitaxial semiconductor layers comprises uniaxially deformed unit cells.

4. The optoelectronic semiconductor light emitting device of claim 1, wherein at least one of the plurality of epitaxial semiconductor layers comprises biaxially deformed unit cells.

5. The optoelectronic semiconductor light emitting device of claim 1, wherein at least one of the plurality of epitaxial semiconductor layers comprises triaxially deformed unit cells.

6. The optoelectronic semiconductor light emitting device of claim 1, wherein the substrate has a surface on which the plurality of epitaxial semiconductor layers is disposed, wherein the surface of the substrate is configured to enable lattice matching with the plurality of epitaxial semiconductor layers.

7. The optoelectronic semiconductor light emitting device of claim 1, wherein the substrate is a single crystal substrate.

8. The optoelectronic semiconductor light emitting device of claim 7, wherein the substrate is selected from $Al_2O_3$, MgO, LiF, $MgAl_2O_4$, $MgGa_2O_4$, $LiGaO_2$, $LiAlO_2$, $MgF_2$, $LaAlO_3$, $TiO_2$, quartz and SiC.

9. The optoelectronic semiconductor light emitting device of claim 1, wherein the substrate has a surface on which the plurality of epitaxial semiconductor layers is disposed, wherein the surface of the substrate has a crystal symmetry and an in-plane lattice constant configured to enable homoepitaxy or heteroepitaxy of the plurality of epitaxial semiconductor layers.

10. The optoelectronic semiconductor light emitting device of claim 1, wherein at least one of the plurality of epitaxial semiconductor layers has hexagonal crystal symmetry.

11. The optoelectronic semiconductor light emitting device of claim 1, wherein at least one of the plurality of epitaxial semiconductor layers has monoclinic crystal symmetry.

12. The optoelectronic semiconductor light emitting device of claim 1, wherein at least one of the plurality of epitaxial semiconductor layers has orthorhombic crystal symmetry.

13. The optoelectronic semiconductor light emitting device of claim 1, wherein at least one of the plurality of epitaxial semiconductor layers has cubic crystal symmetry.

14. The optoelectronic semiconductor light emitting device of claim 1, wherein at least one of the plurality of epitaxial semiconductor layers has trigonal crystal symmetry.

15. The optoelectronic semiconductor light emitting device of claim 1, wherein an epitaxial semiconductor layer of the plurality of epitaxial semiconductor layers has a crystal symmetry that is different from a crystal symmetry of another epitaxial semiconductor layer of the plurality of epitaxial semiconductor layers.

16. The optoelectronic semiconductor light emitting device of claim 1, wherein x1 is greater than 0, x2 is greater than 0, or x1 and x2 are both greater than 0.

17. The optoelectronic semiconductor light emitting device of claim 1, wherein the second region comprises the superlattice, and the superlattice comprises periodic repetitions of a first layer comprising the $(Al_{x1}Ga_{1-x1})_2O_3$ and a second layer comprising the $(Al_{x2}Ga_{1-x2})_2O_3$ wherein $0 \leq x2 \leq 1$, wherein x1 is not equal to x2.

18. The optoelectronic semiconductor light emitting device of claim 1, wherein the substrate comprises $Ga_2O_3$.

19. The optoelectronic semiconductor light emitting device of claim 1, wherein the substrate comprises $AlGaO_3$.

20. An optoelectronic semiconductor device for generating light of a predetermined wavelength comprising:
   a substrate;
   a first, a second and a third epitaxial oxide layer supported by the substrate, wherein at least one of the first, second and third epitaxial oxide layers comprises $(Al_{x1}Ga_{1-x1})_2O_3$, wherein $0 \leq x1 \leq 1$;
   an optical emission region having an optical emission region band structure configured for generating the light of the predetermined wavelength, the optical emission region comprising the first epitaxial oxide layer supported by the substrate, wherein the first epitaxial oxide layer has an optical emission region band gap energy capable of generating the light of the predetermined wavelength, wherein the first epitaxial oxide layer is of direct bandgap type;
   a first conductivity type region having the second epitaxial oxide layer, the first conductivity type region having a first conductivity type region band structure configured to operate in combination with the optical emission region to generate the light of the predetermined wavelength; and
   a second conductivity type region having the third epitaxial oxide layer, the second conductivity type region having a second conductivity type region band structure configured to operate in combination with the optical emission region and the first conductivity type region to generate the light of the predetermined wavelength, wherein the optical emission region is between the first conductivity type region and the second conductivity type region, wherein the substrate, the first conductivity type region, the second conductivity type region, and the optical emission region are a substantially single crystal epitaxially formed device, wherein the first, second or third epitaxial oxide layer comprises a superlattice comprising two or more layers of epitaxial oxides forming a unit cell and repeating with a fixed unit cell period along a growth direction, and wherein one of the two or more layers of epitaxial oxides forming the unit cell of the superlattice comprises the $(Al_{x1}Ga_{1-x1})_2O_3$ and wherein another of the two or more layers of epitaxial oxides forming the unit cell of the superlattice comprises $(Al_{x2}Ga_{1-x2})_2O_3$ wherein $0 \leq x2 \leq 1$, wherein x1 is not equal to x2.

21. The optoelectronic semiconductor device of claim 20, wherein respective individual layers forming the unit cell of the superlattice each have a thickness less than or approximately equal to an electron de Broglie wavelength in that respective individual layer.

22. The optoelectronic semiconductor device of claim 20, wherein the optical emission region band structure comprises a predetermined strain introduced to the first epitaxial oxide layer.

23. The optoelectronic semiconductor device of claim 20, wherein the first conductivity type region band structure has a first conductivity type region energy band gap greater than the optical emission region band gap energy.

24. The optoelectronic semiconductor device of claim 20, wherein the second epitaxial oxide layer of the first conductivity type region comprises the superlattice.

25. The optoelectronic semiconductor device of claim 20, wherein the second conductivity type region band structure has a second conductivity type region energy band gap greater than the optical emission region band gap energy band gap.

26. The optoelectronic semiconductor device of claim 20, wherein the substrate is selected from $Al_2O_3$, MgO, LiF, $MgAl_2O_4$ and SiC.

27. The optoelectronic semiconductor device of claim 20, wherein the substrate is formed from a metal fluoride.

28. The optoelectronic semiconductor device of claim 20, wherein the predetermined wavelength is in a wavelength range of 150 nm-280 nm.

29. The optoelectronic semiconductor device of claim 20, wherein x1 is greater than 0, x2 is greater than 0, or x1 and x2 are both greater than 0.

30. The optoelectronic semiconductor device of claim 20, wherein the first epitaxial oxide layer comprises the superlattice, and the superlattice comprises periodic repetitions of a first layer comprising the $(Al_{x1}Ga_{1-x1})_2O_3$ and a second layer comprising the $(Al_{x2}Ga_{1-x2})_2O_3$ wherein $0 \leq x2 \leq 1$, wherein x1 is not equal to x2.

31. The optoelectronic semiconductor device of claim 20, wherein the substrate comprises $Ga_2O_3$.

32. The optoelectronic semiconductor device of claim 20, wherein the substrate comprises $AlGaO_3$.

* * * * *